United States Patent
Shibuya et al.

(10) Patent No.: US 9,291,892 B2
(45) Date of Patent: Mar. 22, 2016

(54) ACTINIC RAY-SENSITIVE OR RADIATION-SENSITIVE RESIN COMPOSITION, AND, RESIST FILM, PATTERN FORMING METHOD, ELECTRONIC DEVICE MANUFACTURING METHOD, AND ELECTRONIC DEVICE, EACH USING THE COMPOSITION

(71) Applicant: FUJIFILM Corporation, Minato-ku, Tokyo (JP)

(72) Inventors: Akinori Shibuya, Haibara-gun (JP); Kaoru Iwato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/297,948

(22) Filed: Jun. 6, 2014

(65) Prior Publication Data
US 2014/0287363 A1   Sep. 25, 2014

Related U.S. Application Data

(63) Continuation of application No. PCT/JP2012/082596, filed on Dec. 10, 2012.

(30) Foreign Application Priority Data

Dec. 27, 2011 (JP) ................................. 2011-287026

(51) Int. Cl.
G03F 7/004 (2006.01)
G03F 7/20 (2006.01)
G03F 7/039 (2006.01)
G03F 7/11 (2006.01)

(52) U.S. Cl.
CPC .............. *G03F 7/004* (2013.01); *G03F 7/0045* (2013.01); *G03F 7/0046* (2013.01); *G03F 7/039* (2013.01); *G03F 7/11* (2013.01); *G03F 7/20* (2013.01); *G03F 7/2041* (2013.01)

(58) Field of Classification Search
CPC ....... G03F 7/004; G03F 7/0045; G03F 7/028; G03F 7/029; G03F 7/039; G03F 7/0392; G03F 7/20; G03F 7/2041
See application file for complete search history.

(56) References Cited

U.S. PATENT DOCUMENTS

| | | | |
|---|---|---|---|
| 6,235,446 B1 * | 5/2001 | Ikemura et al. | 430/270.1 |
| 2008/0085469 A1 | 4/2008 | Ohsawa et al. | |
| 2008/0187860 A1 * | 8/2008 | Tsubaki et al. | 430/270.1 |
| 2010/0081086 A1 * | 4/2010 | Hirano et al. | 430/270.1 |
| 2010/0183979 A1 * | 7/2010 | Yamaguchi | 430/270.1 |
| 2012/0295198 A1 * | 11/2012 | Matsuda et al. | 430/270.1 |
| 2013/0136900 A1 * | 5/2013 | Shibuya et al. | 428/174 |

FOREIGN PATENT DOCUMENTS

| | | |
|---|---|---|
| JP | 2008106045 A | 5/2008 |
| WO | 2011/093139 A1 | 8/2011 |
| WO | 2011/093280 A1 | 8/2011 |
| WO | 2011104127 A1 | 9/2011 |

OTHER PUBLICATIONS

International Search Report for PCT/JP2012/082596 dated Feb. 12, 2013, 3 pages.
Written Opinion of PCT/JP2012/082596 dated Feb. 12, 2013, 3 pages.
Notice of Reasons for Rejection, dated Mar. 17, 2015, issued in corresponding JP Application No. 2011-287026, 7 pages in English and Japanese.

* cited by examiner

*Primary Examiner* — Anca Eoff
(74) *Attorney, Agent, or Firm* — Sughrue Mion, PLLC

(57) ABSTRACT

Disclosed are an actinic ray-sensitive or radiation-sensitive resin composition including (A) a compound capable of generating an acid by irradiation of actinic rays or radiation, and (B) a resin of which solubility in an alkali developer increases by being decomposed by the action of an acid, and, a resist film, a pattern forming method, an electronic device manufacturing method, and an electronic device, each using the composition, wherein the actinic ray-sensitive or radiation-sensitive resin composition contains at least one type of a specific compound represented by General Formula (A-I) and at least one type of a specific compound represented by General Formula (A-II) as the compound (A).

25 Claims, No Drawings

ACTINIC RAY-SENSITIVE OR RADIATION-SENSITIVE RESIN COMPOSITION, AND, RESIST FILM, PATTERN FORMING METHOD, ELECTRONIC DEVICE MANUFACTURING METHOD, AND ELECTRONIC DEVICE, EACH USING THE COMPOSITION

CROSS-REFERENCE TO RELATED APPLICATIONS

This application is a Continuation of PCT International Application No. PCT/JP2012/082596 filed on Dec. 10, 2012, which claims priority under 35 U.S.C. §119(a) to Japanese Patent Application No. 2011-287026 filed on Dec. 27, 2011. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition which changes its properties due to a reaction by irradiation of actinic rays or radiation, and, a resist film, a pattern forming method, an electronic device manufacturing method, and an electronic device, each using the composition. In particular, the present invention relates to an actinic ray-sensitive or radiation-sensitive resin composition used for a manufacturing process of a semiconductor such as an IC, a liquid crystal, a manufacturing process of a circuit board such as a thermal head, a photofabrication process in addition to these, a lithographic printing plate and an acid-curable composition, and, a resist film, a pattern forming method, an electronic device manufacturing method and an electronic device, each using the composition.

2. Description of the Related Art

A chemical amplification type resist composition is a pattern forming material which forms a pattern on a substrate by generating an acid in an exposed portion by irradiation of actinic rays such as far ultraviolet light or radiation, and changing solubility of irradiated portions and non-irradiated portions by actinic rays or radiation in a developer using a reaction which uses this acid as a catalyst.

When a KrF excimer laser is used as an exposure light source, high sensitivity and high resolution is obtained and favorable patterns may also be formed since chemical amplification type resist composition using a resin with poly(hydroxystyrene) basic skeleton as a main component usually has a low absorption in the region of 248 nm, therefore, this system is considered more favorable than a naphthoquinonediazide/novolak resin system in the related art.

Meanwhile, when a light source with a shorter wavelength, for example, an ArF excimer laser (193 nm) is used as an exposure light source, there have been cases in which favorable patterns have not been formed in the chemical amplification type resist composition described above since a compound having an aromatic group essentially shows a high absorption in the region of 193 nm. As a result, resists for an ArF excimer laser containing a resin having an alicyclic hydrocarbon structure have been developed.

In addition, a variety of compounds for use as a photoacid generator which is a major component of a chemical amplification type resist composition (for example, see WO2011/093139A, WO2011/093280A and WO2011/104127A) have also been developed. For example, in WO2011/093139A, a sulfonium salt photoacid generator having an ether structure in the sulfonium cation is disclosed.

However, from the viewpoint of overall performances as a resist composition, it is extremely difficult to find a suitable combination of a resin, a photoacid generator, a basic compound, an additive, a solvent and the like used, and it remains not to be sufficient. For example, the development of a resist composition in which the occurrence of particles over time is low, pattern roughness such as Line Width Roughness (LWR) is favorable, and a pattern having a rectangular pattern shape can be formed, has been required.

SUMMARY OF THE INVENTION

The object of the present invention is, in view of the related art described above, to provide an actinic ray-sensitive or radiation-sensitive resin composition in which the occurrence of particles over time is low, pattern roughness such as Line Width Roughness (LWR) is favorable, and a pattern having a rectangular pattern shape can be formed, and, a resist film, a pattern forming method, an electronic device manufacturing method, and an electronic device, each using the composition.

The inventors have completed the present invention as a result of intensive studies to solve the above problems. That is, the present invention is as follows.

[1] An actinic ray-sensitive or radiation-sensitive resin composition including (A) a compound capable of generating an acid by irradiation of actinic rays or radiation, and (B) a resin of which solubility in an alkali developer increases by being decomposed by the action of an acid, wherein the actinic ray-sensitive or radiation-sensitive resin composition contains at least one type of a compound represented by the following General Formula (A-I) and at least one type of a compound represented by the following General Formula (A-II) as the compound (A).

[Chem. 1]

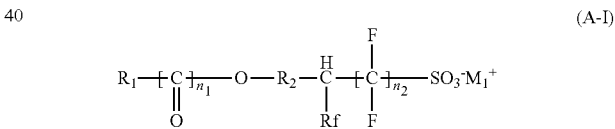

(A-I)

In General Formula (A-I), $R_1$ represents an alkyl group, a monovalent alicyclic hydrocarbon group, an aryl group or a heteroaryl group.

$R_2$ is a divalent linking group.

Rf is a fluorine atom, or an alkyl group substituted with at least one fluorine atom.

$n_1$ and $n_2$ each independently are 0 or 1.

$M_1^+$ is a sulfonium cation represented by the following General Formula (A-III).

[Chem. 2]

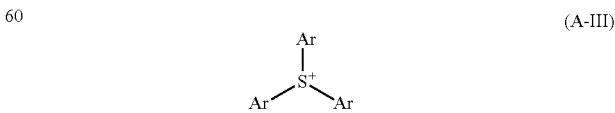

(A-III)

In General Formula (A-III), Ars each independently represent an aryl group or a heteroaryl group

[Chem. 3]

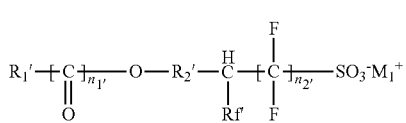
(A-II)

In General Formula (A-II), $R_1'$ represents an alkyl group, a monovalent alicyclic hydrocarbon group, an aryl group or a heteroaryl group.

$R_2'$ is a divalent linking group.

Rf' is a fluorine atom, or an alkyl group substituted with at least one fluorine atom.

$n_1'$ and $n_2'$ each independently are 0 or 1.

$M_2^+$ is a sulfonium cation represented by the following General Formula (A-IV) or (A-V).

[Chem. 4]

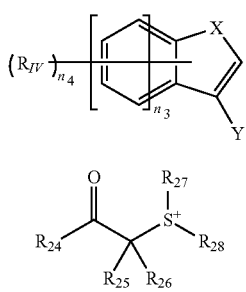
(A-IV)

(A-V)

In General Formula (A-IV), X represents —$CR_{21}$=$CR_{22}$—, —$NR_{23}$—, —S— or —O—.

$R_{21}$, $R_{22}$ and $R_{23}$ each independently represent a hydrogen atom, a hydroxyl group, an alkyl group, a cycloalkyl group, an alkoxy group, an acyl group or an aryl group.

$R_{IV}$ represents a substituent. $R_{IV}$s may be the same as or different from each other when present in plural number.

$n_3$ represents an integer of 0 to 3.

$n_4$ represents an integer of 0 to 9.

Y represents a structure represented by any of the following General Formulae (A-VI-1) to (A-VI-3).

[Chem. 5]

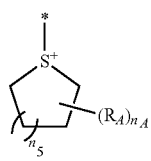
(A-VI-1)

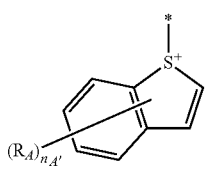
(A-VI-2)

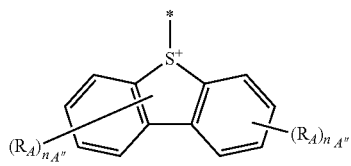
(A-VI-3)

In General Formulae (A-VI-1) to (A-VI-3), $R_A$ represents a substituent. $R_A$s may be the same as or different from each other when present in plural number.

$n_A$ represents an integer of 0 to 12.

$n_A'$ represents an integer of 0 to 6.

$n_A''$s each independently represent an integer of 0 to 4.

$n_5$ represents an integer of 0 to 3.

* represents an atomic bonding.

In General Formula (A-V), $R_{24}$ represents an aryl group $R_{25}$, $R_{26}$, $R_{27}$ and $R_{28}$ each independently represent a hydrogen atom, an alkyl group, a cycloalkyl group, an allyl group or a vinyl group, and $R_{25}$ and $R_{26}$, and $R_{27}$ and $R_{28}$ may be bonded to each other to form a ring.

[2] The actinic ray-sensitive or radiation-sensitive resin composition according to [1], wherein an anion structure of the compound represented by General Formula (A-I) and an anion structure of the compound represented by General Formula (A-II) are the same.

[3] The actinic ray-sensitive or radiation-sensitive resin composition according to [1] or [2], wherein the resin (B) contains a repeating unit having a lactone structure or a sultone structure represented by the following General Formula (VI).

[Chem. 6]

(VI)

In General Formula (VI), B represents an ester bond (a group represented by —COO—) or an amide bond (a group represented by —CONH—).

$R_0$ represents an alkylene group, a cycloalkylene group or a combination thereof. $R_0$s may be the same as or different from each other when present in plural number. Z represents a single bond, an ether bond, an ester bond, an amide bond, a urethane bond,

[Chem. 7]

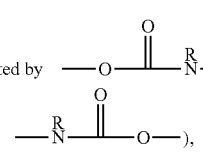

(a group represented by or a urea bond.

(a group represented by 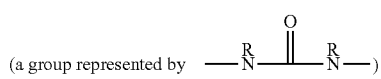)

Zs may be the same as or different from each other when present in plural number. Here, Rs each independently represent a hydrogen atom, an alkyl group, a cycloalkyl group or an aryl group.

$R_8$ represents a monovalent organic group having a lactone structure or a sultone structure.

n is the number of repetitions of the structure represented by —$R_0$—Z—, and represents an integer of 0 to 2.

$R_7$ represents a hydrogen atom, a halogen atom or an alkyl group.

[4] The actinic ray-sensitive or radiation-sensitive resin composition according to [3], wherein n is 1 or 2 in General Formula (VI).

[5] The actinic ray-sensitive or radiation-sensitive resin composition according to any one of [1] to [4], wherein the resin (B) contains a repeating unit having an alicyclic hydrocarbon structure substituted with a hydroxyl group or a cyano group.

[6] The actinic ray-sensitive or radiation-sensitive resin composition according to any one of [1] to [5], wherein the resin (B) contains a repeating unit represented by the following General Formula (AI).

[Chem. 9]

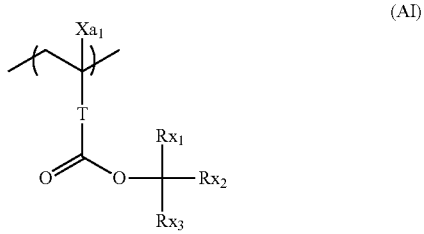

(AI)

In General Formula (AI), $Xa_1$ represents a hydrogen atom, a methyl group which may have a substituent, or a group represented by —$CH_2$—$R_{11}$. $R_{11}$ represents a hydroxyl group or a monovalent organic group.

$Xa_1$ preferably represents a hydrogen atom, a methyl group, a trifluoromethyl group or a hydroxymethyl group.

T represents a single bond or a divalent linking group.

$Rx_1$ to $Rx_3$ each independently represent an alkyl group (linear or branched) or a cycloalkyl group (monocyclic or polycyclic).

Two of $Rx_1$ to $Rx_3$ may be bonded to each other to form a cycloalkyl group (monocyclic or polycyclic).

[7] The actinic ray-sensitive or radiation-sensitive resin composition according to any one of [1] to [6], further including a basic compound.

[8] The actinic ray-sensitive or radiation-sensitive resin composition according to any one of [1] to [7], further including, a hydrophobic resin having at least any of a fluorine atom and a silicon atom.

[9] A resist film which is formed using the actinic ray-sensitive or radiation-sensitive resin composition according to any one of [1] to [8].

[10] A pattern forming method including exposing and developing the resist film according to [9].

[11] The pattern forming method according to [10], wherein the exposure is an immersion exposure.

[12] An electronic device manufacturing method including the pattern forming method according to [10] or [11].

[13] An electronic device which is manufactured using the electronic device manufacturing method according to [12].

According to the present invention, an actinic ray-sensitive or radiation-sensitive resin composition in which the occurrence of particles over time is low, pattern roughness such as Line Width Roughness (LWR) is favorable, and a pattern having a rectangular pattern shape can be formed, may be provided.

In addition, according to the present invention, a resist film, a pattern forming method, an electronic device manufacturing method, and an electronic device, each using the composition, may be provided.

Furthermore, the actinic ray-sensitive or radiation-sensitive resin composition of the present invention may be suitably used in, for example, an ArF liquid immersion exposure process.

DESCRIPTION OF THE PREFERRED EMBODIMENTS

In the notation of a group (an atomic group) in the present specification, a notation in which substituted and unsubstituted are not specified includes not only a group (an atomic group) having no substituents, but also a group (an atomic group) having a substituent. For example, an "alkyl group" includes not only an alkyl group having no substituents (an unsubstituted alkyl group), but also an alkyl group having a substituent (a substituted alkyl group).

"Actinic rays" or "radiation" in the present specification means, for example, a bright line spectrum of a mercury lamp, far ultraviolet rays represented by an excimer laser, extreme ultraviolet rays (EUV light), X-rays, an electron beam (EB) and the like. In addition, in the present invention, "light" means actinic rays or radiation.

In addition, "exposure" in the present specification includes, unless otherwise specified, not only an exposure by a mercury lamp, far ultraviolet rays represented by an excimer laser, X-rays, EUV light and the like, but also a drawing by particle rays such as an electron beam or an ion beam.

[1] An actinic ray-sensitive or radiation-sensitive resin composition including (A) a compound capable of generating an acid by irradiation of actinic rays or radiation, and (B) a resin of which solubility in an alkali developer increases by being decomposed by the action of an acid, wherein the actinic ray-sensitive or radiation-sensitive resin composition contains at least one type of a compound represented by the following General Formula (A-I) and at least one type of a compound represented by the following General Formula (A-II) as the compound (A).

[Chem. 10]

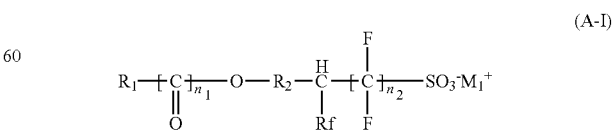

(A-I)

In General Formula (A-I), $R_1$ represents an alkyl group, a monovalent alicyclic hydrocarbon group, an aryl group or a heteroaryl group.

$R_2$ is a divalent linking group.

Rf is a fluorine atom, or an alkyl group substituted with at least one fluorine atom.

$n_1$ and $n_2$ each independently are 0 or 1.

$M_1^+$ is a sulfonium cation represented by the following General Formula (A-III).

[Chem. 11]

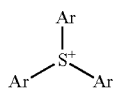

(A-III)

In General Formula (A-III), Ars each independently represent an aryl group or a heteroaryl group.

[Chem. 12]

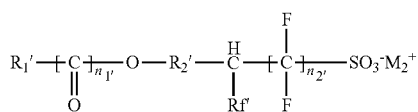

(A-II)

In General Formula (A-II), $R_1'$ represents an alkyl group, a monovalent alicyclic hydrocarbon group, an aryl group or a heteroaryl group.

$R_2'$ is a divalent linking group.

Rf' is a fluorine atom, or an alkyl group substituted with at least one fluorine atom.

$n_1'$ and $n_2'$ each independently are 0 or 1.

$M_2^+$ is a sulfonium cation represented by the following General Formula (A-IV) or (A-V).

[Chem. 13]

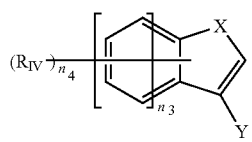

(A-IV)

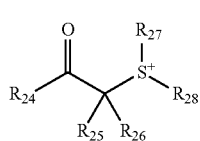

(A-V)

In General Formula (A-IV), X represents —$CR_{21}$=$CR_{22}$—, —$NR_{23}$—, —S— or —O—.

$R_{21}$, $R_{22}$ and $R_{23}$ each independently represent a hydrogen atom, a hydroxyl group, an alkyl group, a cycloalkyl group, an alkoxy group, an acyl group or an aryl group.

$R_{IV}$ represents a substituent. $R_{IV}$s may be the same as or different from each other when present in plural number.

$n_3$ represents an integer of 0 to 3.

$n_4$ represents an integer of 0 to 9.

Y represents a structure represented by any of the following General Formulae (A-VI-1) to (A-VI-3).

[Chem. 14]

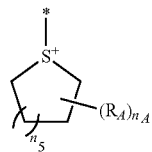

(A-VI-1)

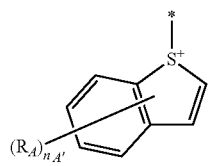

(A-VI-2)

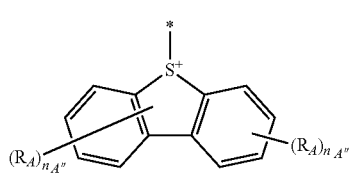

(A-VI-3)

In General Formulae (A-VI-1) to (A-VI-3), $R_A$ represents a substituent. $R_A$s may be the same as or different from each other when present in plural number.

$n_A$ represents an integer of 0 to 12.

$n_A'$ represents an integer of 0 to 6.

$n_A''$s each independently represent an integer of 0 to 4.

$n_5$ represents an integer of 0 to 3.

* represents an atomic bonding.

In General Formula (A-V), $R_{24}$ represents an aryl group.

$R_{25}$, $R_{26}$, $R_{27}$ and $R_{28}$ each independently represent a hydrogen atom, an alkyl group, a cycloalkyl group, an allyl group or a vinyl group, and $R_{25}$ and $R_{26}$, and $R_{27}$ and $R_{28}$ may be bonded to each other to form a ring.

The actinic ray-sensitive or radiation-sensitive resin composition of the present invention uses the compound having sulfonium (the compound represented by General Formula (A-II)) which has a low molar extinction coefficient c at an exposure wavelength (for example, an exposure wavelength of 193 nm) in combination, with the compound having tri (hetero)aryl sulfonium (the compound represented by General Formula (A-I)) as the compound (A) (an acid generator). As a result, the total amount of the acid generator added to the actinic ray-sensitive or radiation-sensitive resin composition increases, therefore, uniform distribution of the acid generated by the exposure becomes possible. In addition, the sulfonate anion structure in the compound represented by General Formula (A-I) and the compound represented by General Formula (A-II) respectively include a structure of —CHRf- and —CRRf'-, and the number of fluorine atoms bonded to carbon atoms corresponding to an α-position when $n_2$ and $n_2'$ in adjacent positions to sulfonate anions are 0, and, the number of fluorine atoms bonded to carbon atoms corresponding to a β-position when $n_2$ and $n_2'$ are 1, are small, respectively, and an ether bond when $n_1$ and $n_1'$ are 0, and, an ester bond when $n_1$ and $n_1'$ are 1, are included. As a result, the sulfonate anion structure in the compound represented by General Formula (A-I) and the compound represented by General Formula (A-II) respectively has appropriate hydrophilicity, and distribution into the film becomes uniformized due to high compatibility with the resin. It is postulated that LWR is improved from these two points.

In addition, it is considered that, by using the compound having sulfonium (the compound represented by General Formula (A-II)) which has a low molar extinction coefficient ε at an exposure wavelength (for example, an exposure wavelength of 193 nm), light transmittance is improved, developability at the lower part of the pattern for which it is hard for light to reach is improved and a pattern shape becomes rectangular since an acid deprotection reaction is promoted in the resin at the lower part of the film.

Furthermore, it is postulated that, two or more types of compounds are used in combination as an acid generator and as a result, compatibility of an actinic ray-sensitive or radiation-sensitive resin composition in a solution increases, and the occurrence of particles over time is suppressed.

The actinic ray-sensitive or radiation-sensitive resin composition of the present invention is, for example, a positive-tone composition, and is typically a positive-tone resist composition.

The present invention also relates to a resist film which is formed using the actinic ray-sensitive or radiation-sensitive resin composition of the present invention.

Hereinafter, each component of the composition will be described.

[1] (A) Compound Generating Acid by Irradiation of Actinic Rays or Radiation

The actinic ray-sensitive or radiation-sensitive resin composition of the present invention, as described above, contains at least one type of a compound represented by General Formula (A-I) and at least one type of a compound represented by General Formula (A-II) as (A) a compound capable of generating an acid by irradiation of actinic rays or radiation (hereinafter, also simply referred to as an acid generator).

Hereinafter, the compound represented by General Formula (A-I) and the compound represented by General Formula (A-II) will be described.

First, the compound represented by General Formula (A-I) will be described.

[Chem. 15]

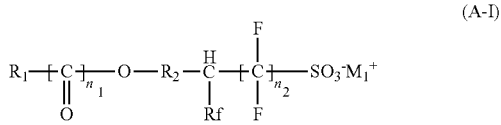

In General Formula (A-I), $R_1$ represents an alkyl group, a monovalent alicyclic hydrocarbon group, an aryl group or a heteroaryl group.

$R_2$ is a divalent linking group.

Rf is a fluorine atom, or an alkyl group substituted with at least one fluorine atom.

$n_1$ and $n_2$ each independently are 0 or 1.

$M_1^+$ is a sulfonium cation represented by the following General Formula (A-III).

[Chem. 16]

In General Formula (A-III), Ars each independently represent an aryl group or a heteroaryl group.

The alkyl group represented by $R_1$ is preferably an alkyl group having 1 to 20 carbon atoms, more preferably an alkyl group having 1 to 10 carbon atoms, even more preferably an alkyl group having 1 to 5 carbon atoms, and particularly preferably an alkyl group having 1 to 4 carbon atoms. Specific examples of the alkyl group include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, a neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, a 3-(3-methylpentyl) group, or the like.

In addition, the alkyl group may have a substituent (preferably a fluorine atom), and the alkyl group having a substituent is preferably an alkyl group having 1 to 5 carbon atoms substituted with at least one fluorine atom, and more preferably a perfluoroalkyl group having 1 to 5 carbon atoms.

The alkyl group represented by $R_1$ is preferably a methyl group, an ethyl group or a trifluoromethyl group, and more preferably a methyl group or an ethyl group.

The monovalent alicyclic hydrocarbon group represented by $R_1$ is preferably a group having 5 or more carbon atoms. In addition, that monovalent alicyclic hydrocarbon group is preferably a group having 20 or less carbon atoms, and more preferably a group having 15 or less carbon atoms. The monovalent alicyclic hydrocarbon group may be a monocyclic alicyclic hydrocarbon group or a polycyclic alicyclic hydrocarbon group.

As the monocyclic alicyclic hydrocarbon group, a group having 5 to 12 carbon atoms is preferable, a cyclopentyl group, a cyclohexyl group, a cycloheptyl group, a cyclooctyl group, a cyclododecanyl group, a cyclopentenyl group, a cyclohexenyl group, a cyclooctadienyl group, a piperidine ring group or the like may be included, and particularly, a cyclopentyl group, a cyclohexyl group or a cyclooctyl group is preferable.

As the polycyclic alicyclic hydrocarbon group, a group having 10 to 20 carbon atoms is preferable, and a bicyclo[4.3.0]nonanyl group, a decahydronaphthalenyl group, a 1,2,3,4-tetrahydronaphthalenyl group, a tricyclo[5.2.1.0$^{2,6}$]decanyl group, a tetracyclodecanyl group, a tetracyclododecanyl group, a bornyl group, an isobornyl group, a norbornyl group, an adamantyl group, a noradamantyl group, a 1,7,7-trimethyltricyclo[2.2.1.0$^{2,6}$]heptanyl group, a 3,7,7-trimethylbicyclo[4.1.0]heptanyl group, a decahydro isoquinoline ring group or the like may be included, and a norbornyl group, an adamantyl group or a noradamantyl group is preferable.

The aryl group represented by $R_1$ is preferably a group having 6 or more carbon atoms. In addition, that aryl group is preferably a group having 20 or less carbon atoms, and more preferably a group having 15 or less carbon atoms.

The heteroaryl group represented by $R_1$ is preferably a group having 2 or more carbon atoms. In addition, that heteroaryl group is preferably a group having 20 or less carbon atoms, and more preferably a group having 15 or less carbon atoms.

The aryl group and the heteroaryl group may be a monocyclic aryl group and a monocyclic heteroaryl group, or a polycyclic aryl group and a polycyclic heteroaryl group.

The monocyclic aryl group may include a phenyl group or the like.

The polycyclic aryl group may include a naphthyl group, an anthracenyl group or the like.

The monocyclic heteroaryl group may include a pyridyl group, a thienyl group, a furanyl group or the like.

The polycyclic heteroaryl group may include a quinolyl group, an isoquinolyl group or the like.

The monovalent alicyclic hydrocarbon group, the aryl group and the heteroaryl group as $R_1$ may further have a substituent and the further substituent may include a hydroxyl group, a halogen atom (a fluorine atom, a chlorine atom, a bromine atom, an iodine atom or the like), a nitro group, a cyano group, an amide group, a sulfonamide group, an alkyl group such as a methyl group, an ethyl group, a propyl group, an n-butyl group, a sec-butyl group, a hexyl group, a 2-ethylhexyl group or an octyl group, an alkoxy group such as a methoxy group, an ethoxy group, a hydroxyethoxy group, a propoxy group, a hydroxypropoxy group or a butoxy group, an alkoxycarbonyl group such as a methoxycarbonyl group or an ethoxycarbonyl group, an acyl group such as a formyl group, an acetyl group or a benzoyl group, an acyloxy group such as an acetoxy group or a butyryloxy group, or a carboxyl group.

$R_1$ is particularly preferably a cyclohexyl group or an adamantyl group.

The divalent linking group represented by $R_2$ is not particularly limited, but may include —COO—, —COO—, —CO—, —O—, —S—, —SO—, —SO$_2$—, an alkylene group (preferably an alkylene group having 1 to 30 carbon atoms), a cycloalkylene group (preferably a cycloalkylene group having 3 to 30 carbon atoms), an alkenylene group (preferably an alkenylene group having 2 to 30 carbon atoms), an arylene group (preferably an arylene group having 6 to 30 carbon atoms), a heteroarylene group (preferably a heteroarylene group having 2 to 30 carbon atoms), and a group in which two or more of these are combined. The alkylene group, the cycloalkylene group, the alkenylene group, the arylene group and the heteroarylene group may further have a substituent, and specific examples of the substituent are the same examples described above as the substituent which may be further included in the monovalent alicyclic hydrocarbon group, the aryl group and the heteroaryl group as $R_1$.

The divalent linking group represented by $R_2$ is preferably an alkylene group, a cycloalkylene group, an alkenylene group, an arylene group and a heteroarylene group, more preferably an alkylene group, even more preferably an alkylene group having 1 to 10 carbon atoms, and particularly preferably an alkylene group having 1 to 5 carbon atoms.

Rf is a fluorine atom, or an alkyl group substituted with at least one fluorine atom. The number of carbon atoms of this alkyl group is preferably 1 to 30, more preferably 1 to 10, and even more preferably 1 to 4. In addition, the alkyl group substituted with at least one fluorine atom is preferably a perfluoroalkyl group.

Rf is preferably a fluorine atom or a perfluoroalkyl group having 1 to 4 carbon atoms. More specifically, Rf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and more preferably a fluorine atom or $CF_3$.

$n_1$ is preferably 1.

$n_2$ is preferably 1.

$M_1$ is a sulfonium cation represented by General Formula (A-III)

In General Formula (A-III), Ars each independently represent an aryl group or a heteroaryl group.

The aryl group represented by Ar is preferably an aryl group having 6 to 15 carbon atoms.

The heteroaryl group represented by Ar is preferably a heteroaryl group having 4 to 15 carbon atoms.

The aryl group and the heteroaryl group represented by Ar may include a phenyl group, a naphthyl group, an anthracenyl group, a pyridyl group, a quinolyl group, an imidazolyl group or the like, and may further have a substituent. Specific examples of the substituent are the same examples described above as the substituent which may be further included in the monovalent alicyclic hydrocarbon group, an aryl group, and a heteroaryl group as $R_1$.

Ars each independently preferably represent a phenyl group, a toluoyl group, a naphthyl group or a 1-alkoxynaphthyl group, and more preferably represent a phenyl group or a naphthyl group.

The sulfonium cation represented by General Formula (A-ITT) as $M_1'$ may include the following specific examples, but is not limited to these.

[Chem. 17]

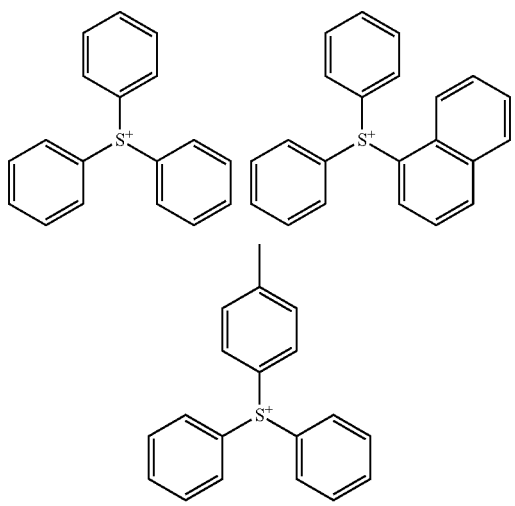

Next, the compound represented by General Formula (A-II) will be described in detail.

[Chem. 18]

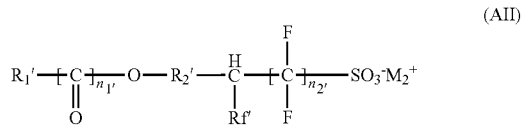

(AII)

In General Formula (A-II), represents an alkyl group, a monovalent alicyclic hydrocarbon group, an aryl group or a heteroaryl group.

$R_2'$ is a divalent linking group.

Rf' is a fluorine atom, or an alkyl group substituted with at least one fluorine atom.

$n_1'$ and $n_2'$ each independently are 0 or 1.

$M_2^+$ is a sulfonium cation represented by the following General Formula (A-IV) or (A-V).

[Chem. 19]

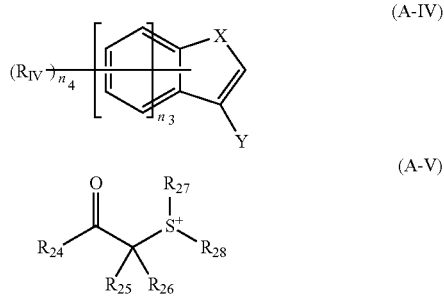

(A-IV)

(A-V)

In General Formula (A-IV), X represents —CR$_{21}$=CR$_{22}$—, —NR$_{23}$—, —S— or —O—. R$_{21}$, R$_{22}$ and R$_{23}$ each independently represent a hydrogen atom, a hydroxyl group, an alkyl group, a cycloalkyl group, an alkoxy group, an acyl group or an aryl group.

R$_{IV}$ represents a substituent. R$_{IV}$s may be the same as or different from each other when present in plural number.

n$_3$ represents an integer of 0 to 3.

n$_4$ represents an integer of 0 to 9.

Y represents a structure represented by any of the following General Formulae (A-VI-1) to (A-VI-3).

[Chem. 20]

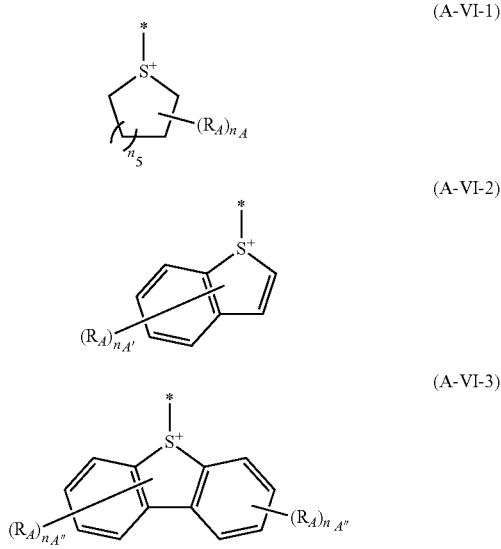

(A-VI-1)

(A-VI-2)

(A-VI-3)

In General Formulae (A-VI-1) to (A-VI-3), R$_A$ represents a substituent. R$_A$s may be the same as or different from each other when present in plural number.

n$_A$ represents an integer of 0 to 12 n$_A$' represents an integer of 0 to 6.

n$_A$"s each independently represent an integer of 0 to 4 n$_5$ represents an integer of 0 to 3.

represents an atomic bonding.

In General Formula (A-V), R$_{24}$ represents an aryl group.

R$_{25}$, R$_{26}$, R$_{27}$ and R$_{28}$ each independently represent a hydrogen atom, an alkyl group, a cycloalkyl group, an allyl group or a vinyl group, and R$_{25}$ and R$_{26}$, and R$_{27}$ and R$_{28}$ may be bonded to each other to form a ring.

Preferable ranges, specific examples and the like of R$_1$', R$_2$', R$_f$', n$_1$' and n$_2$ General Formula (A-II) are the same as those described for R$_1$, R$_2$, Rf, n$_1$ and n$_2$ in General Formula (A-I), respectively.

In the present invention, the anion structure of the compound represented by General Formula (A-I) and the anion structure of the compound represented by General Formula (A-II) being the same (that is, R$_1$, R$_2$, Rf, n$_1$ and n$_2$ in General Formula (A-I) and R$_1$', R$_2$', Rf', n$_1$' and n$_2$' in General Formula (A-II) being the same), respectively, is preferable since the occurrence of particles over time can be decreased, and also forming a pattern in which pattern roughness such as Line Width Roughness (LWR) is more favorable. It is postulated that it is because the compatibility of the actinic ray-sensitive or radiation-sensitive resin composition in the solution and the compatibility with the resin further increases due to the compound represented by General Formula (A-I) and the compound represented by General Formula (A-II) having the same anion structure.

X represents —CR$_{21}$=CR$_{22}$—, —NR$_{23}$—, —S— or —O—. It is preferable that X represent —CR$_{21}$=CR$_{22}$—.

R$_{21}$, R$_{22}$ and R$_{23}$ each independently represent a hydrogen atom, a hydroxyl group, an alkyl group, a cycloalkyl group, an alkoxy group, an acyl group or an aryl group.

The alkyl group in R$_{21}$ to R$_{23}$ may have a substituent, is preferably a linear or branched alkyl group having 1 to 20 carbon atoms, more preferably a linear or branched alkyl group having 1 to 10 carbon atoms, even more preferably a linear or branched alkyl group having 1 to 5 carbon atoms, and may have an oxygen atom, a sulfur atom or a nitrogen atom in the alkyl chain.

In addition, the alkyl group having a substituent may include, particularly, a group in which the linear or branched alkyl group is substituted with a monovalent aliphatic hydrocarbon group (preferably a cycloalkyl group) (for example, an adamantylmethyl group, an adamantylethyl group, a cyclohexylethyl group, a camphor residue group, or the like).

The alkyl group in the alkoxy group and the acyl group in R$_{21}$ to R$_{23}$ may include the same alkyl group described above.

The alkoxy group in R$_{21}$ to R$_{23}$ may include a methoxy group, an ethoxy group, an n-butoxy group, or the like.

The acyl group in R$_{21}$ to R$_{23}$ may include a formyl group, an acetyl group, a propionyl group, or the like.

The cycloalkyl group in R$_{21}$ to R$_{23}$ may have a substituent, is preferably a cycloalkyl group having 3 to 20 carbon atoms, more preferably a cycloalkyl group having 3 to 10 carbon atoms, and may have an oxygen atom within the ring.

The aryl group in R$_{21}$ to R$_{23}$ may have a substituent, is preferably an aryl group having 6 to 14 carbon atoms, and more preferably an aryl group having 6 to 10 carbon atoms.

Examples of the substituent each of the groups may have include a halogen atom, a hydroxyl group, a nitro group, a cyano group, a carboxyl group, a carbonyl group, an alkyl group (preferably having 1 to 10 carbon atoms), an alkenyl group (preferably having 2 to 10 carbon atoms), a monovalent aliphatic hydrocarbon group (preferably having 3 to 10 carbon atoms and more preferably a cycloalkyl group having 3 to 10 carbon atoms), an aryl group (preferably having 6 to 14 carbon atoms), an alkoxy group (preferably having 1 to 10 carbon atoms), an aryloxy group (preferably having 6 to 14 carbon atoms), an acyl group (preferably having 2 to 20 carbon atoms), an acyloxy group (preferably having 2 to 10 carbon atoms), an alkoxycarbonyl group (preferably having 2 to 20 carbon atoms), an aminoacyl group (preferably having 2 to 20 carbon atoms), an alkylthio group (preferably having 1 to 10 carbon atoms), an arylthio group (preferably having 6 to 14 carbon atoms), or the like. An aryl group, a ring-shaped structure in such a monovalent aliphatic hydrocarbon group, and an aminoacyl group may further have an alkyl group (preferably having 1 to 20 carbon atoms) as a substituent.

It is preferable that $R_{21}$, $R_{22}$ and $R_{23}$ each independently represent a hydrogen atom, a hydroxyl group, an alkyl group or an alkoxy group.

$R_{IV}$ represents a substituent. $R_{IV}$s may be the same as or different from each other when present in plural number. The substituent as $R_{IV}$ includes, for example, a corresponding group in General Formulae (ZI-1) to (ZI-4) described below as a preferable cation structure.

$n_3$ represents an integer of 0 to 3. $n_3$ is preferably 0 or 1.

$n_4$ represents an integer of 0 to 9. $n_4$ is preferably an integer of 0 to 4, and most preferably 0.

Y represents a structure represented by any one of General Formulae (A-VI-1) to (A-VI-3). Y preferably represents a structure represented by General Formula (A-VI-1).

In General Formulae (A-VI-1) to (A-VI-3), $R_A$ represents a substituent. $R_A$s may be the same as or different from each other when present in plural number. The substituent as $R_A$ includes, for example, the same substituents each of the groups in $R_{21}$ to $R_{23}$ may have. In addition, the plural $R_A$s may be bonded to each other to form a ring.

$n_A$ represents an integer of 0 to 12. $n_A$ is preferably an integer of 0 to 6, and most preferably 0.

$n_A'$ represents an integer of 0 to 6. $n_A'$ is preferably an integer of 0 to 3, and most preferably 0.

$n_A''$s each independently represent an integer of 0 to 4. $n_A''$s are preferably integers of 0 to 2, and most preferably 0.

$n_5$ represents an integer of 0 to 3. $n_5$ is most preferably 1.

The aryl group in $R_{24}$ may have a substituent, is preferably an aryl group having 6 to 14 carbon atoms, and more preferably an aryl group having 6 to 10 carbon atoms. The aryl group in $R_{24}$ is preferably an aryl group which may be substituted with a monovalent aliphatic hydrocarbon group (preferably having 3 to 10 carbon atoms and more preferably a cycloalkyl group having 3 to 10 carbon atoms).

The alkyl group and the cycloalkyl group in $R_{25}$ to $R_{28}$ are the same alkyl group and the same cycloalkyl group in $R_{21}$ to $R_{23}$ described above, and so are the specific examples and the preferable ranges.

The aryl group in $R_{24}$, and the alkyl group and the cycloalkyl group in $R_{25}$ to $R_{28}$ may have a substituent, and the substituent includes, for example, the same substituents each of the groups in $R_{21}$ to $R_{23}$ may have.

As an embodiment of $R_{25}$ and $R_{26}$, it is preferable that both of them be an alkyl group. In particular, it is preferable that each of $R_{25}$ and $R_{26}$ be a linear or branched alkyl group having 1 to 4 carbon atoms, and particularly, it is preferable that both be a methyl group.

In addition, when $R_{25}$ and $R_{26}$ are bonded to each other to form a ring, the group formed by $R_{25}$ and $R_{26}$ being bonded to each other is preferably an alkylene group having 2 to 10 carbon atoms, and includes, for example, an ethylene group, a propylene group, a butylene group, a pentylene group, a hexylene group, or the like. Furthermore, the ring formed by $R_{25}$ and $R_{26}$ being bonded to each other may have a heteroatom such as an oxygen atom within the ring.

The ring structure which may be formed by $R_{27}$ and $R_{28}$ being bonded to each other may include a 5-membered or 6-membered ring, particularly preferably a 5-membered ring (that is, a tetrahydrothiophene ring) formed by divalent $R_{27}$ and $R_{28}$ (for example, a methylene group, an ethylene group, a propylene group or the like) together with a sulfur atom in General Formula (A-V). The ring which may be formed by $R_{27}$ and $R_{28}$ being bonded to each other may have a heteroatom such as an oxygen atom within the ring in addition to the sulfur atom in General Formula (A-V).

$R_{27}$ and $R_{28}$ are preferably an alkyl group or a cycloalkyl group having 4 or more carbon atoms, more preferably an alkyl group or a cycloalkyl group having 6 or more carbon atoms, and even more preferably an alkyl group or a cycloalkyl group having 8 or more carbon atoms.

The preferable cation structure among the sulfonium cations represented by General Formula (A-IV) or (A-V) may include a cation structure represented by the following General Formulae (ZI-1) to (ZI-5).

The cation structure (ZI-1) is a structure represented by the following General Formulae (ZI-1).

[Chem. 21]

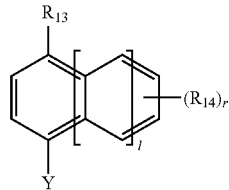

(ZI-1)

In General Formula (ZI-1), $R_{13}$ represents a hydrogen atom, a fluorine atom, a hydroxyl group, an alkyl group, a cycloalkyl group, an alkoxy group or an alkoxycarbonyl group.

$R_{14}$ represents an alkyl group, a cycloalkyl group, an alkoxy group, an alkylsulfonyl group or a cycloalkylsulfonyl group. $R_{14}$s may be the same as or different from each other when present in plural number.

Y is synonymous with Y in General Formula (A-IV).

l represents an integer of 0 to 2.

r represents an integer of 0 to 8.

In General Formula (ZI-1), the alkyl group of $R_{13}$ and $R_{14}$ is linear or branched, preferably has 1 to 10 carbon atoms, and is more preferably a methyl group, an ethyl group, an n-butyl group, a t-butyl group, or the like.

The cycloalkyl group of $R_{13}$ and $R_{14}$ may be either monocyclic or polycyclic, preferably has 3 to 12 carbon atoms, and is more preferably a cyclopropyl group, a cyclopentyl group, a cyclohexyl group or a cyclooctyl group.

The alkoxy group of $R_{13}$ and $R_{14}$ is linear or branched, preferably has 1 to 10 carbon atoms, and is more preferably an n-heptyloxy group, a cyclohexylmethyloxy group, an n-octyloxy group, a cyclohexylethyloxy group, a 2-ethylhexyloxy group, an n-nonyloxy group or an n-decyloxy group.

The alkoxycarbonyl group of $R_{13}$ is linear or branched, preferably has 2 to 11 carbon atoms, and is preferably a methoxycarbonyl group, an ethoxycarbonyl group, an n-butoxycarbonyl group or the like.

The alkylsulfonyl group and the cycloalkylsulfonyl group of $R_{14}$ are linear, branched or cyclic, preferably have 1 to 10 carbon atoms, and are more preferably a methanesulfonyl group, an ethanesulfonyl group, an n-propanesulfonyl group, an n-butanesulfonyl group, a cyclopentanesulfonyl group, a cyclohexanesulfonyl group or the like.

$R_{13}$ and $R_{14}$ preferably include a linear or branched alkoxy group, more preferably include a methoxy group, an ethoxy group, an n-butoxy group, an n-heptyloxy group, a cyclohexylmethyloxy group, an n-octyloxy group, a cyclohexylethyloxy group, a 2-ethylhexyloxy group, an n-nonyloxy group or an n-decyloxy group, and particularly preferably include an alkoxy group having a linear alkyl group such as a methoxy group, an ethoxy group or an n-butoxy group.

l is preferably 0 or 1, and more preferably 1. r is preferably 0 to 2.

Each of the groups in $R_{13}$ and $R_{14}$ may further have a substituent, and the substituent each of the groups may have includes a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group, or the like.

Examples of the alkoxy group include a linear, branched or cyclic alkoxy group having 1 to 20 carbon atoms.

Examples of the alkoxyalkyl group include a linear, branched or cyclic alkoxyalkyl group having 2 to 21 carbon atoms.

Examples of the alkoxycarbonyl group include a linear, branched or cyclic alkoxycarbonyl group having 2 to 21 carbon atoms.

Examples of the alkoxycarbonyloxy group include a linear, branched or cyclic alkoxycarbonyloxy group having 2 to 21 carbon atoms.

Yin General Formula (ZI-1) is synonymous with Yin General Formula (A-IV), and so are the preferable ranges.

The alkyl group, the cycloalkyl group, the alkoxy group or the alkoxycarbonyl group of $R_{13}$, and the alkyl group, the cycloalkyl group, the alkoxy group, the alkylsulfonyl group or the cycloalkylsulfonyl group of $R_{14}$ may be substituted as described above, with the substituent preferably being a hydroxyl group, an alkoxy group an alkoxycarbonyl group, or a halogen atom (particularly a fluorine atom).

Preferable specific examples of the cation structure represented by General Formula (ZI-1) are shown below.

[Chem. 22]

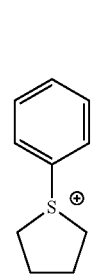
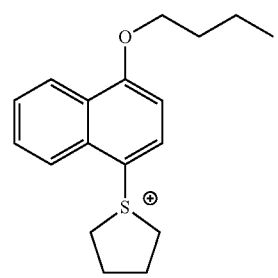
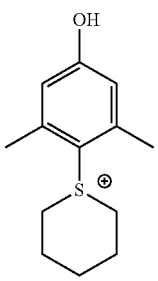
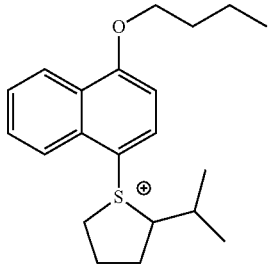
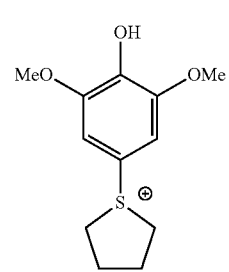
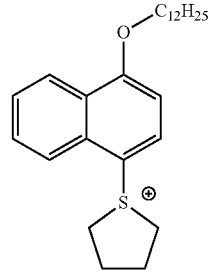
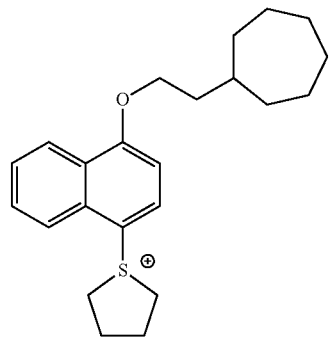
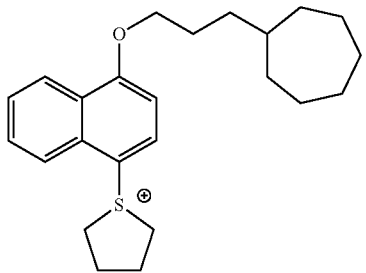
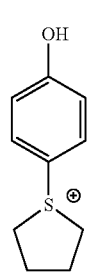
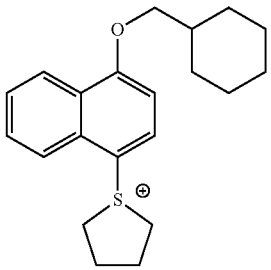
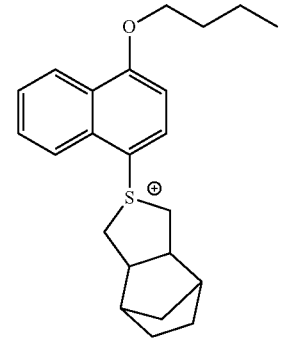
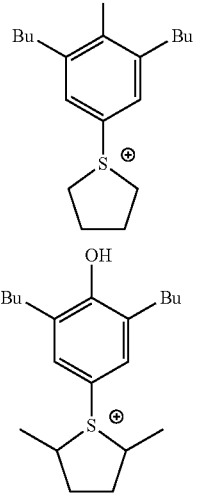

-continued

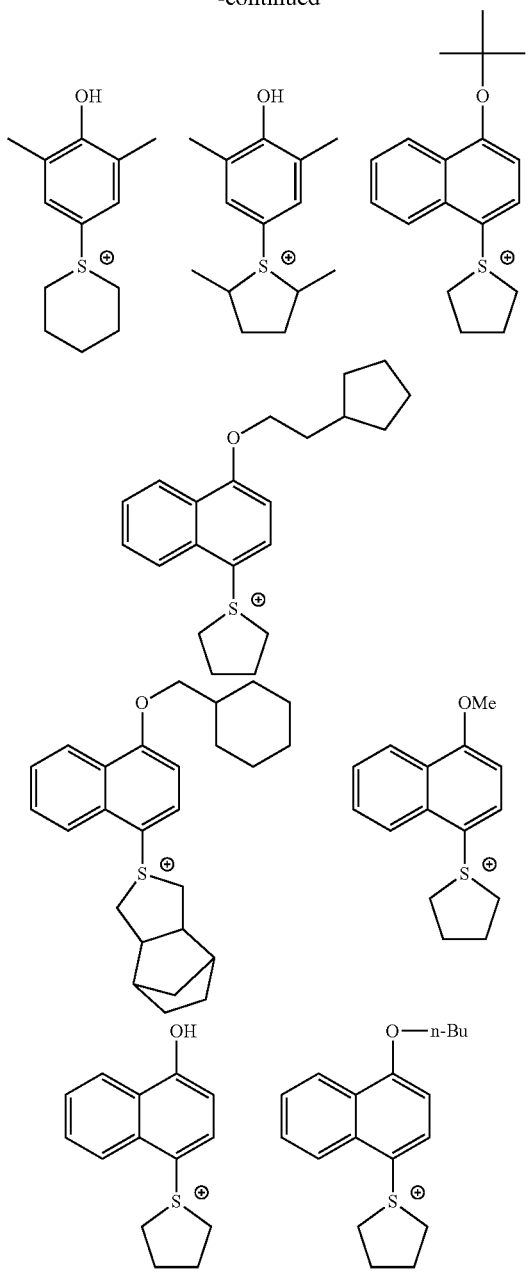

The cation structure (ZI-2) is a structure represented by the following General Formula (ZI-2).

[Chem. 23]

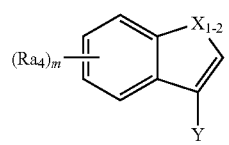

(ZI-2)

In General Formula (ZI-2), $X_{1-2}$ represents an oxygen atom, a sulfur atom or a —$NRa_1$— group, and $Ra_1$ represents a hydrogen atom, an alkyl group, a cycloalkyl group, an aryl group or an acyl group.

Y is synonymous with Y in General Formula (A-IV).

$Ra_4$ represents a monovalent group. $Ra_4$s may be the same as or different from each other when present in plural number.

m represents an integer of 0 to 3.

The alkyl group of $Ra_1$ is preferably a linear or branched alkyl group having 1 to 20 carbon atoms.

The cycloalkyl group of $Ra_1$ is preferably a cycloalkyl group having 3 to 20 carbon atoms.

The aryl group of $Ra_1$ is preferably an aryl group having 6 to 10 carbon atoms.

The acyl group of $Ra_1$ is preferably an acyl group having 2 to 20 carbon atoms.

Each of these groups may have a substituent, and the substituent may include, for example, the same substituents each of the groups in $R_{21}$ to $R_{23}$ in General Formula (A-IV) may have.

Y in General Formula (ZI-2) is synonymous with Y in General Formula (A-IV), and so are the preferable ranges.

Examples of the monovalent group as $Ra_4$ include an alkyl group (preferably having 1 to 20 carbon atoms), a cycloalkyl group (preferably having 3 to 20 carbon atoms), an aryl group (preferably having 6 to 10 carbon atoms), an alkoxy group (preferably having 1 to 20 carbon atoms), an acyl group (preferably having 2 to 20 carbon atoms), an acyloxy group (preferably having 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, an alkenylcarbonyl group, or the like.

Preferable specific examples of the cation structure represented by General Formula (ZI-2) are shown below.

[Chem. 24]

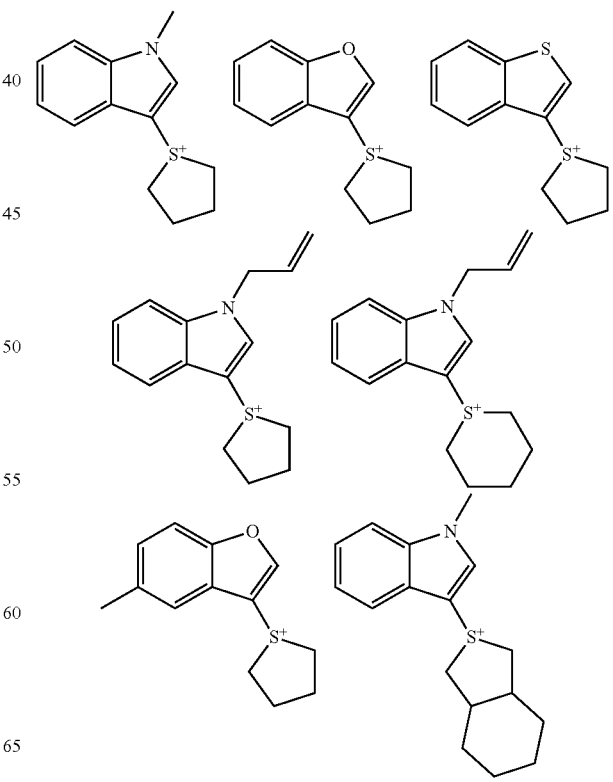

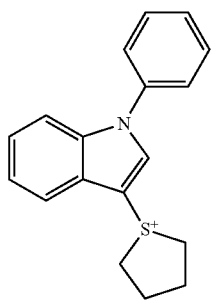

The cation structure (ZI-3) is a structure represented by the following General Formula (ZI-3).

[Chem. 25]

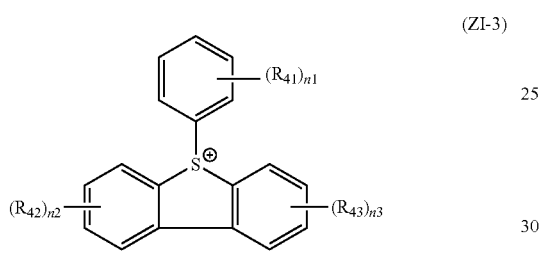

(ZI-3)

In General Formula (ZI-3), $R_{41}$ to $R_{43}$ each independently represent an alkyl group, an acetyl group, an alkoxy group, a carboxyl group, a halogen atom, a hydroxyl group or a hydroxyalkyl group.

In $R_{41}$ to $R_{43}$, the alkyl group is preferably an alkyl group having 1 to 5 carbon atoms, more preferably a linear or branched alkyl group among the alkyl groups having 1 to 5 carbon atoms, and particularly preferably a methyl group, an ethyl group, a propyl group, an n-butyl group or a tert-butyl group.

The alkoxy group is preferably an alkoxy group having 1 to 5 carbon atoms, more preferably a linear or branched alkoxy group among the alkoxy groups having 1 to 5 carbon atoms, and particularly preferably a methoxy group or an ethoxy group.

The hydroxyalkyl group is preferably a group in which one or a plurality of hydrogen atoms of the alkyl group are substituted with a hydroxyl group, and may include a hydroxymethyl group, a hydroxyethyl group, a hydroxypropyl group or the like.

$n_1$ to $n_3$ each independently represent an integer of 0 to 2, preferably each independently represent 0 or 1, and more preferably, all of them are 0.

In addition, when $n_1$ to $n_3$ are 2, the plural $R_{41}$ to $R_{43}$ may be the same as or different from each other.

Each of the groups in $R_{41}$ to $R_{43}$ may have a substituent, and the substituent includes, for example, the same substituents each of the groups in $R_{21}$ to $R_{23}$ in General Formula (A-Iv) may have.

Preferable specific examples of the cation structure represented by General Formula (ZI-3) are shown below.

[Chem. 26]

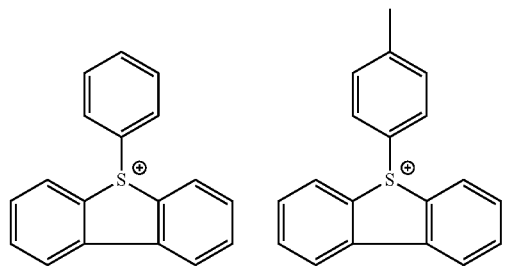

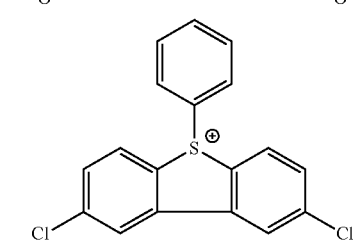

-continued

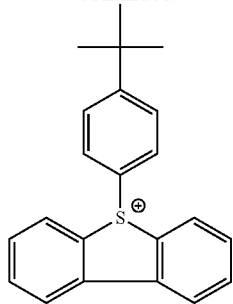

The cation structure (ZI-4) is a structure represented by the following General Formula (ZI-4).

[Chem. 27]

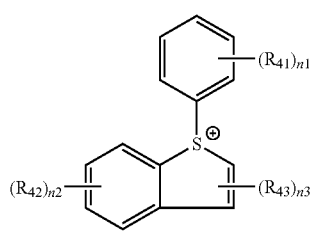

(ZI-4)

In General Formula (ZI-4), $R_{41}$ to $R_{43}$ each independently represent an alkyl group, an acetyl group, an alkoxy group, a carboxyl group, a halogen atom, a hydroxyl group or a hydroxyalkyl group.

The alkyl group and the alkoxy group as $R_{41}$ to $R_{43}$ may include the same alkyl group and the alkoxy group as $R_{41}$ to $R_{43}$ in General Formula (ZI-3).

The hydroxyalkyl group is preferably a group in which one or a plurality of hydrogen atoms of the alkyl group are substituted with a hydroxyl group, and may include a hydroxymethyl group, a hydroxyethyl group, a hydroxypropyl group or the like.

$n_1$ is an integer of 0 to 3, preferably 0 or 1, and more preferably 0.

$n_2$ is an integer of 0 to 3, preferably 0 or 1, and more preferably 0.

$n_3$ is an integer of 0 to 2, preferably 0 or 1, and more preferably 0.

Preferable specific examples of the cation structure represented by General Formula (ZI-4) are shown below.

[Chem. 28]

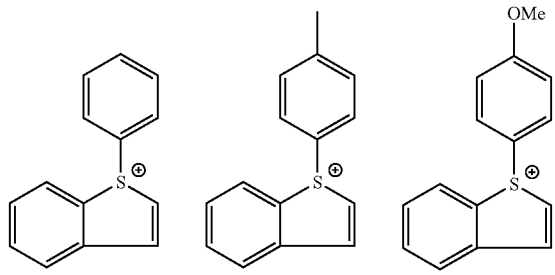

-continued

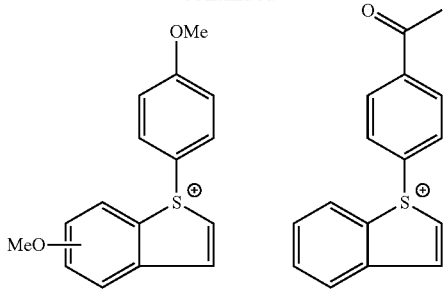

The cation structure (ZI-5) is a structure represented by the following General Formula (ZI-5).

[Chem. 29]

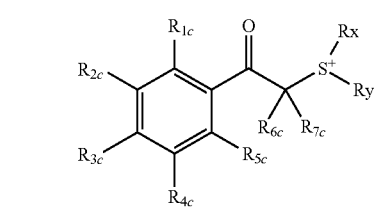

(ZI-5)

In General Formula (ZI-5), $R_{1c}$ to $R_{5c}$ each independently represent a hydrogen atom, a nitro group, a hydroxyl group, an alkyl group, a cycloalkyl group, an alkoxy group, an alkylthio group, a phenylthio group, a phenyloxy group, an aryl group or a halogen atom.

$R_{6c}$ and $R_{7c}$ each independently represent a hydrogen atom, a halogen atom, an alkyl group, an aryl group or a cycloalkyl group.

$R_x$ and $R_y$ each independently represent an alkyl group, a cycloalkyl group, an aryl group, an allyl group or a vinyl group.

Any two or more of $R_{1c}$ to $R_{5c}$, $R_{6c}$ and $R_{7c}$, and $R_x$ and $R_y$, may be bonded to each other to form a ring structure, and the ring structure may also include an oxygen atom, a sulfur atom, an ester bond or an amide bond. The group formed by any two or more of $R_{1c}$ to $R_{5c}$, $R_{6c}$ and $R_{7c}$, and $R_x$ and $R_y$, being bonded to each other may include a butylene group, pentylene group or the like.

The alkyl group as $R_{1c}$ to $R_{7c}$ may be either linear or branched, and may include, for example, an alkyl group having 1 to 20 carbon atoms, preferably a linear or branched alkyl group having 1 to 12 carbon atoms, and the cycloalkyl group may include a cycloalkyl group having 3 to 8 carbon atoms.

The alkoxy group as $R_{1c}$ to $R_{5c}$ may be any of linear, branched and cyclic, and may include, for example, an alkoxy group having 1 to 10 carbon atoms, preferably, a linear and branched alkoxy group having 1 to 5 carbon atoms, or a cyclic alkoxy group having 3 to 8 carbon atoms.

The aryl group as $R_{1c}$ to $R_{7c}$, $R_x$ and $R_y$ may include, for example, an aryl group having 6 to 20 carbon atoms.

The alkyl group in the alkylthio group as $R_{1c}$ to $R_{5c}$ may include the same alkyl group described above.

Preferably, any of $R_{1c}$ to $R_{5c}$ is a linear or branched alkyl group, a cycloalkyl group, or a linear, branched or cyclic alkoxy group, and more preferably, the total number of carbon atoms in $R_{1c}$ to $R_{5c}$ is 2 to 15. As a result, solubility in a solvent is further improved and the generation of particles is suppressed during storage.

The alkyl group and the cycloalkyl group as $R_x$ and $R_y$ are the same alkyl group and the cycloalkyl group as $R_{1c}$ to $R_{7c}$ described above, and more preferably a 2-oxoalkyl group, a 2-oxocycloalkyl group or an alkoxycarbonylmethyl group.

The 2-oxoalkyl group and the 2-oxocycloalkyl group may include a group having $>C=O$ at 2nd-position of the alkyl group and the cycloalkyl group as $R_{1c}$ to $R_{7c}$.

The alkoxy group in the alkoxycarbonylmethyl group may include the same alkoxy groups in $R_{1c}$ to $R_{5c}$.

$R_x$ and $R_y$ are preferably an alkyl group or a cycloalkyl group having 4 or more carbon atoms, more preferably an alkyl group or a cycloalkyl group having 6 or more carbon atoms, and even more preferably an alkyl group or a cycloalkyl group having 8 or more carbon atoms.

The ring structure which may be formed by $R_x$ and $R_y$ being bonded to each other may include a 5-membered or 6-membered ring, particularly preferably a 5-membered ring (that is, a tetrahydrothiophene ring) formed by divalent $R_x$ and $R_y$ (for example, a methylene group, an ethylene group, a propylene group or the like) together with a sulfur atom in General Formula (ZI-5).

Each of the groups described above may have a substituent, and the substituent may include, for example, the same substituents each of the groups in $R_{21}$ to $R_{23}$ in General Formula (A-IV) may have.

Preferable specific examples of the cation represented by General Formula (ZI-5) are shown below.

[Chem. 30]

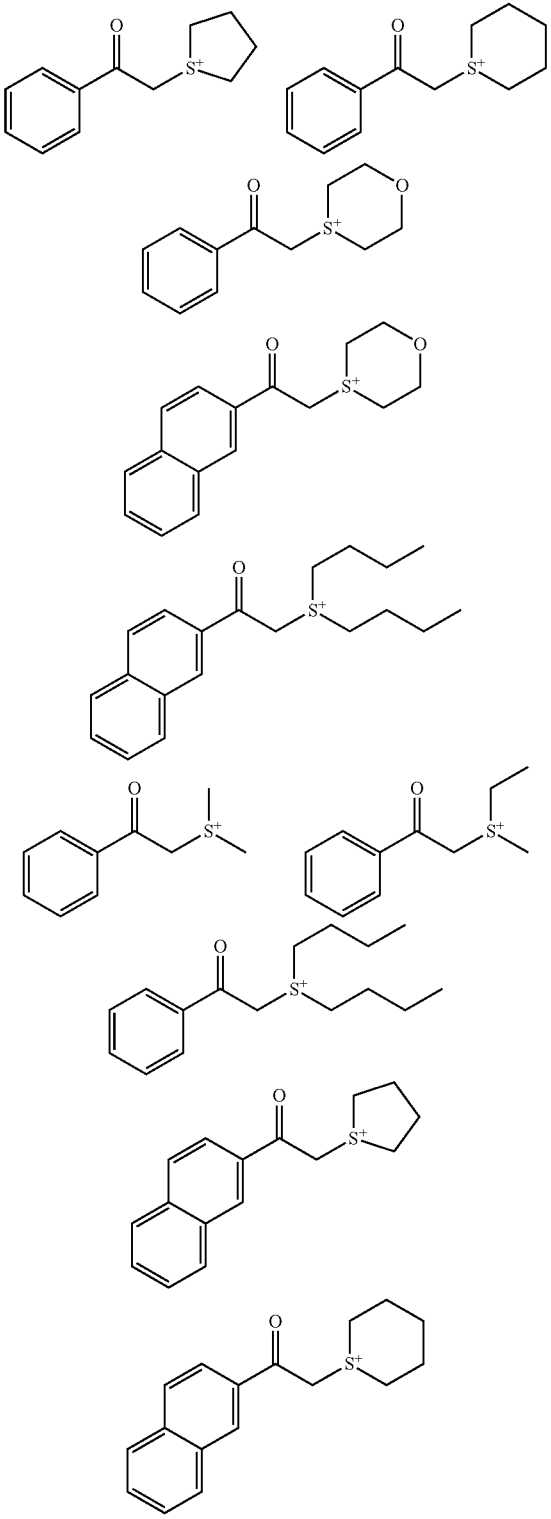

[Chem. 31]

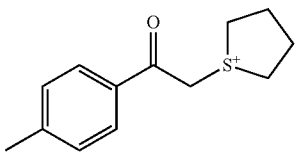

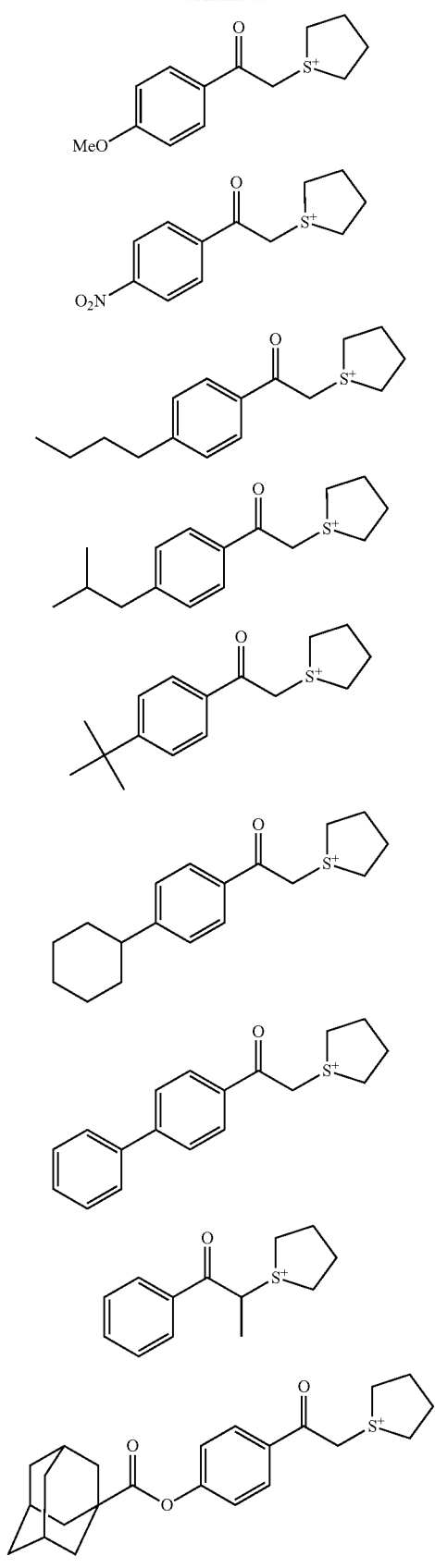
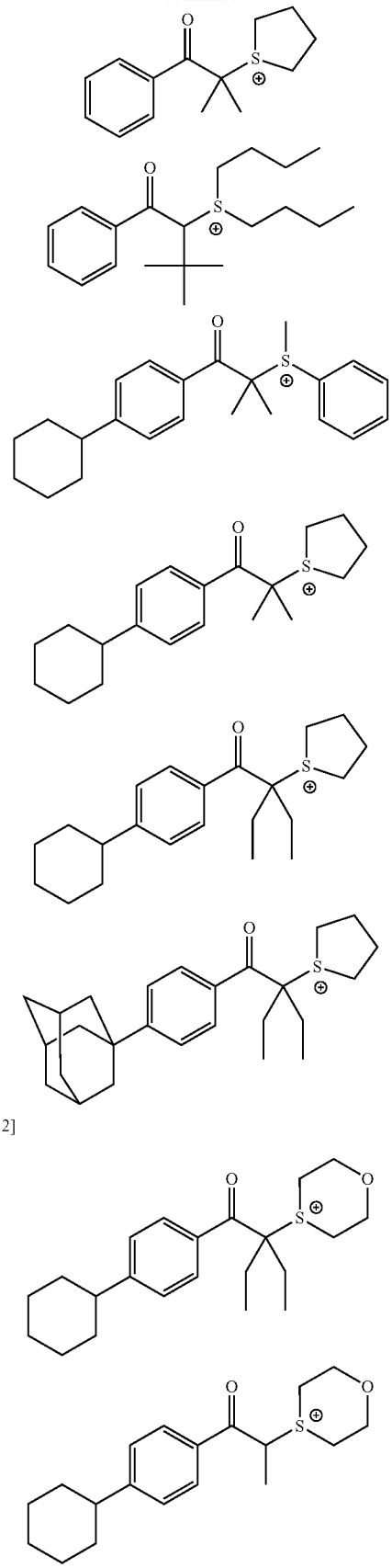
[Chem. 32]

-continued
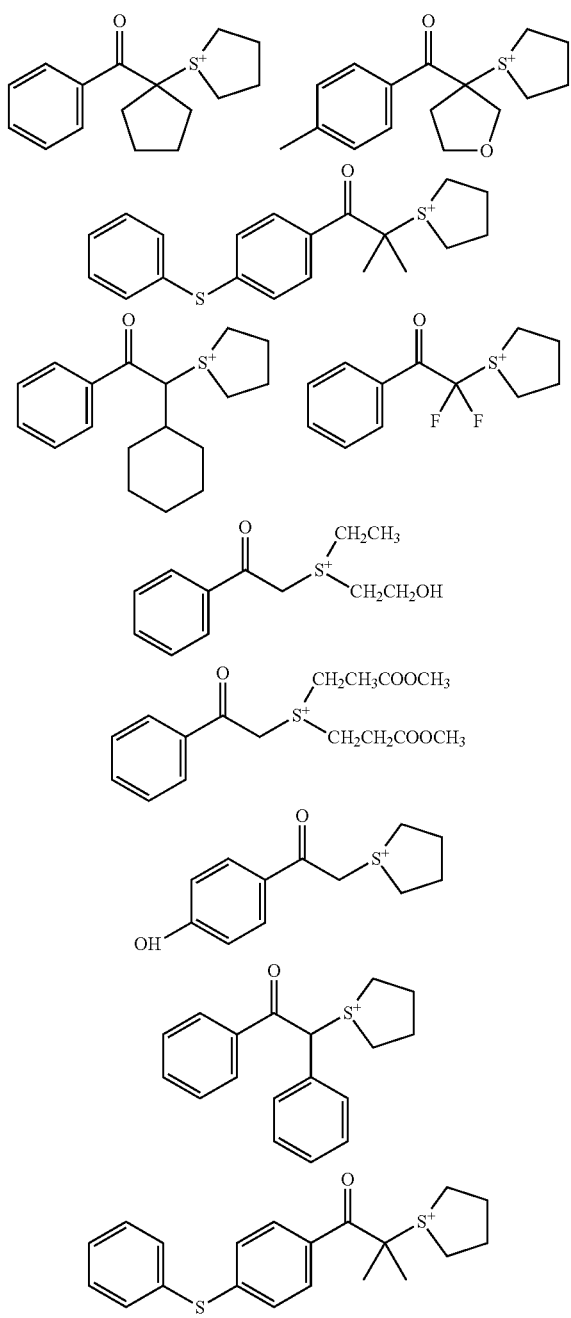
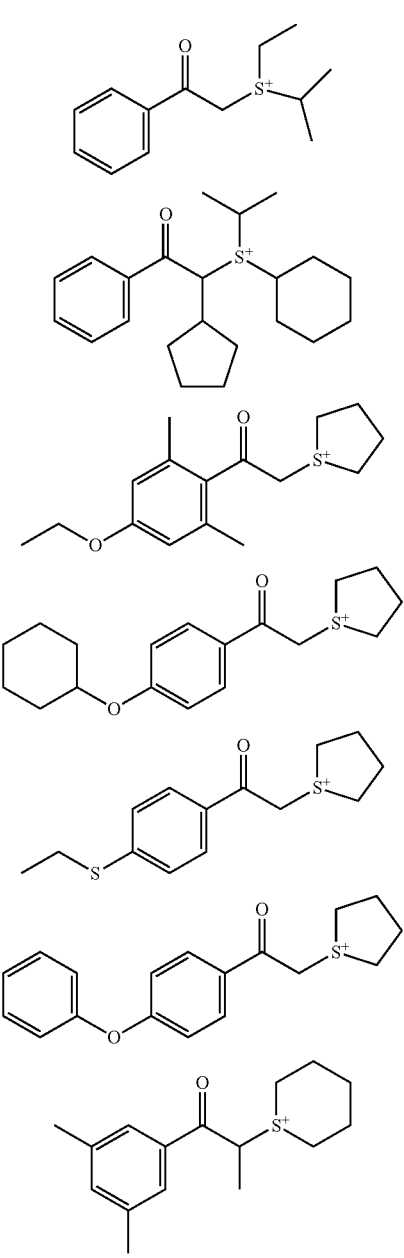
Preferable specific examples of the anion structure in the compound represented by General Formulae (A-I) and (A-II) are shown below, however, the present invention is not limited to these.
[Anion Structure in Compound Represented by General Formulae (A-I) and (A-II)]
[Chem. 36]
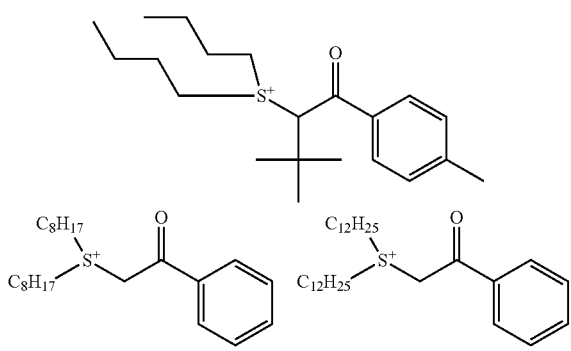
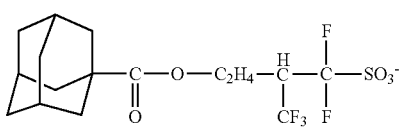

[Chem. 37]
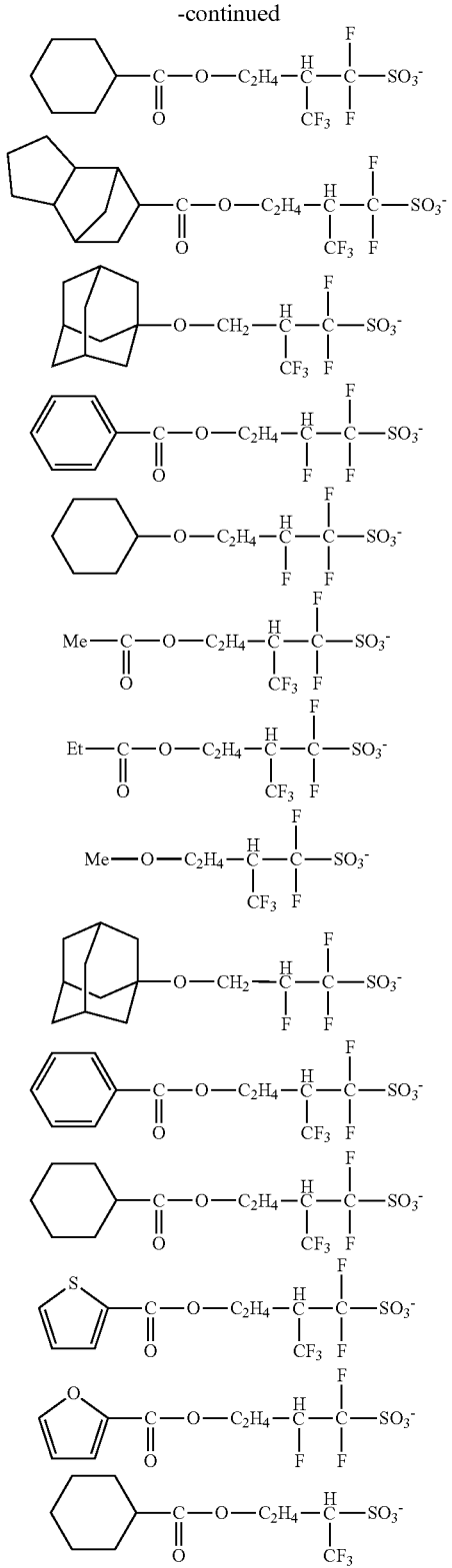
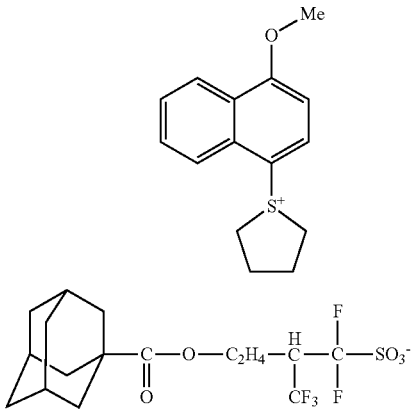
A-1
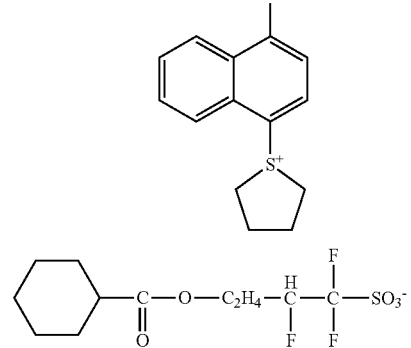
A-2
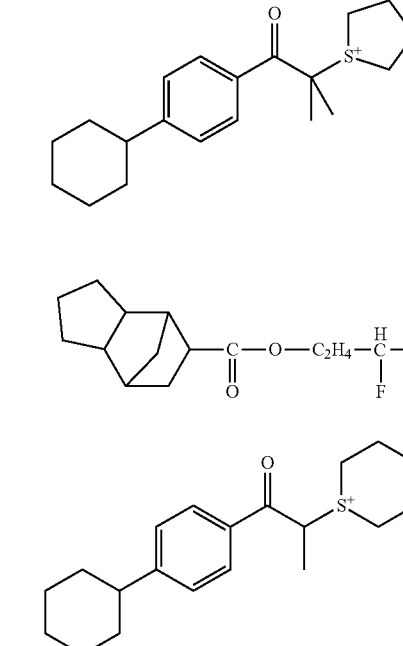
A-3
A-4
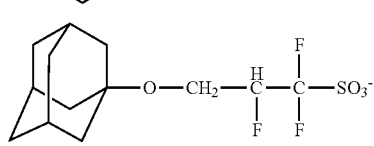
In addition, preferable specific examples of the compound represented by General Formulae (A-I) and (A-II) are shown below, however, the present invention is not limited to these. In the following specific examples, Me means a methyl group, Et means an ethyl group, and n-Bu means an n-butyl group.

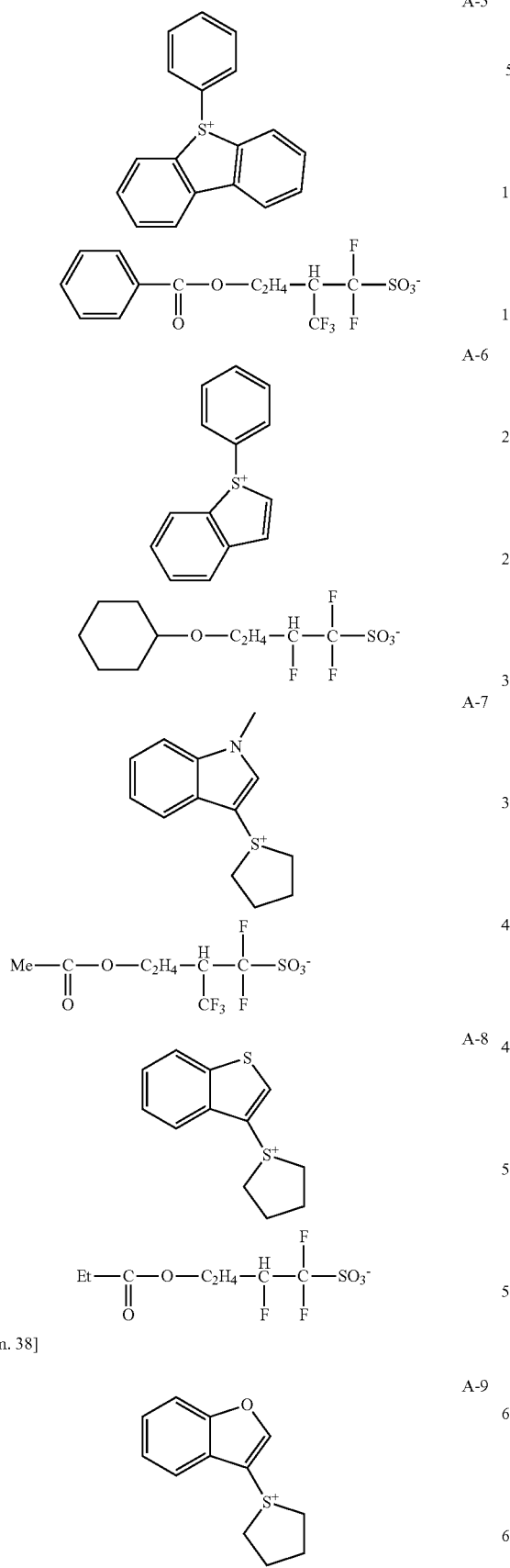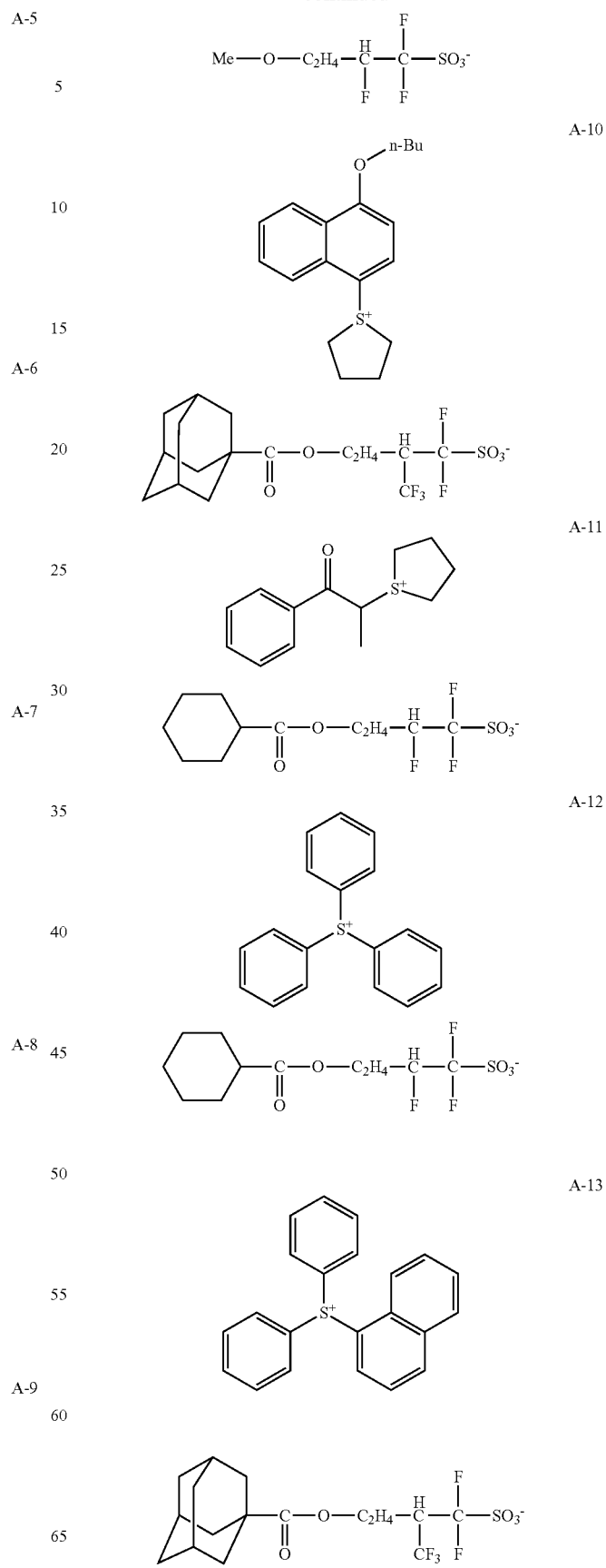

-continued

A-14

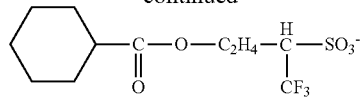

A-15

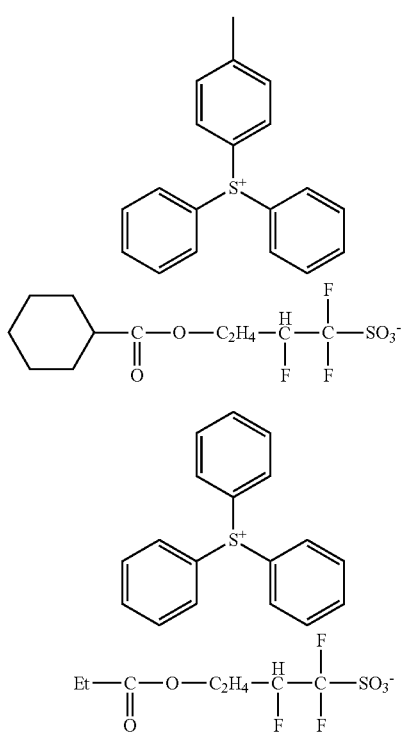

A-19

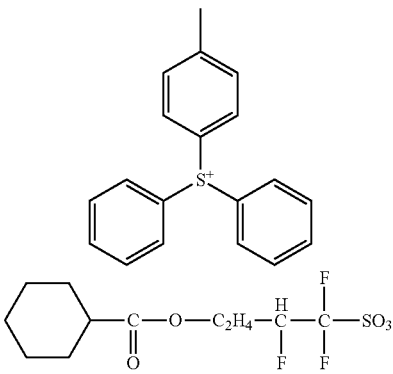

[Chem. 39]

A-16

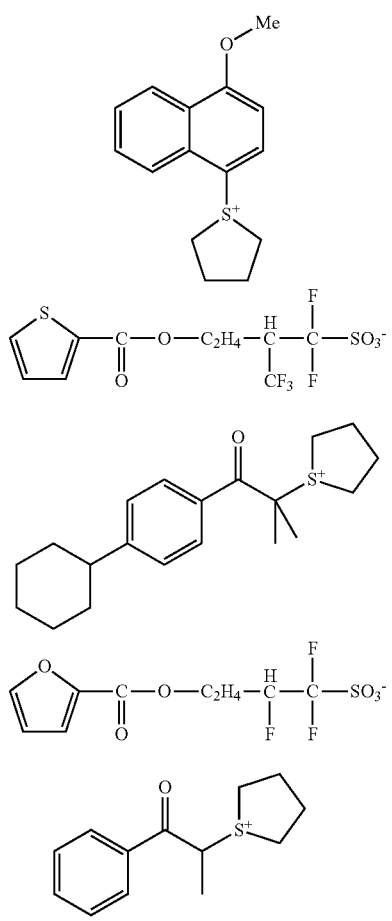

A-17

A-18

The sulfonate anion or a salt thereof in General Formulae (A-I) and (A-II) (for example, an onium salt or a metal salt) can be synthesized using a general sulfonic acid esterification reaction. For example, a method in which a sulfonamide bond, a sulfonate bond or a sulfonimide bond is formed by selectively reacting one of the sulfonyl halide portions of a bissulfonyl halide compound with an amine, an alcohol, an amide compound or the like, and then the other sulfonyl halide portion is hydrolyzed, or a method in which a cyclic sulfonic acid anhydride is ring-opened by an amine, an alcohol or an amide compound, may be used.

The salt of sulfonic acid in General Formulae (A-I) and (A-II) may include a metal salt of sulfonic acid, an onium salt of sulfonic acid or the like. The metal in the metal salt of sulfonic acid may include $Na^+$, $L^+$, $K^+$ or the like. The onium cation in the onium salt of sulfonic acid may include an ammonium cation, a sulfonium cation, an iodonium cation, a phosphonium cation, a diazonium cation, or the like.

The sulfonate anion or a salt thereof in General Formulae (A-I) and (A-II) may be used in the synthesis of a compound represented by General Formulae (A-I) and (A-II) generating sulfonic acid by irradiation of actinic rays or radiation.

The compound represented by General Formulae (A-I) and (A-II) can be synthesized by a salt exchange between the sulfonate anion in General Formulae (A-I) and (A-II) and a photoactive onium salt such as a sulfonium salt corresponding to a sulfonium cation in General Formulae (A-I) and (A-II).

The actinic ray-sensitive or radiation-sensitive resin composition of the present invention may contain other photoacid generators in addition to the combination of at least one type of the compound represented by General Formula (A-I) and at least one type of the compound represented by General Formula (A-II). The other photoacid generators may include known photoacid generators other than the compounds represented by any of General Formulae (A-I) and (A-II).

The content of the compound (A) in the composition of the present invention is preferably 0.1 to 30% by mass, more preferably 0.5 to 25% by mass, and even more preferably to 20% by mass with regard to total solid contents of the composition.

The amount of the acid generator used with the compound represented by (A-I) (a total amount thereof when a plurality types of the compounds are used) and the compound represented by (A-II) (a total amount thereof when a plurality types of the compounds are used) is preferably 99/1 to 5/95, more preferably 50/50 to 10/90, and even more preferably 30/70 to 10/90 in mass ratio (the compound represented by (A-I)/the compound represented by (A-II)).

[2] (B) Resin of which Solubility in Alkali Developer Increases by Being Decomposed by Action of Acid The actinic ray-sensitive or radiation-sensitive resin composition of the present invention may contain (B) a resin of which solubility in an alkali developer increases by being decomposed by the action of an acid (hereinafter, referred to as "an acid decomposable resin", sometimes referred to as "a resin (B)").

The acid decomposable resin has a group generating an alkali-soluble group by being decomposed by the action of an acid in the main chain or the side chain, or, both the main chain and the side chain of the resin (hereinafter, also referred to as an "acid decomposable group").

The resin (B) is preferably insoluble or sparingly soluble in an alkali developer.

The acid decomposable group preferably has a structure which protects the alkali-soluble group with a group detached by being decomposed by the action of an acid.

The alkali-soluble group may include a phenolic hydroxyl group, a carboxyl group, a fluorinated alcohol group, a sulfonic acid group, a sulfonamide group, a sulfonylimide group, an (alkyl sulfonyl)(alkylcarbonyl)methylene group, an (alkylsulfonyl)alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, or the like.

The preferable alkali-soluble group may include a carboxyl group, a fluorinated alcohol group (preferably a hexafluoroisopropanol group) or a sulfonic acid group.

The preferable acid decomposable group is a group in which a hydrogen atom of such an alkali-soluble group is substituted with a group detached by the action of an acid.

Examples of the group detached by the action of an acid include —C($R_{36}$)($R_{37}$)($R_{38}$), —C($R_{36}$)($R_{37}$)(O$R_{39}$), —C($R_{01}$)($R_{02}$)(O$R_{39}$), or the like.

In the formula, $R_{36}$ to $R_{39}$ each independently represent an alkyl group, a cycloalkyl group, an aryl group, an aralkyl group or an alkenyl group $R_{36}$ and $R_{37}$ may be bonded to each other to form a ring.

$R_{0l}$ and $R_{0e}$ each independently represent a hydrogen atom, an alkyl group, a cycloalkyl group, an aryl group, an aralkyl group or an alkenyl group.

The preferable acid decomposable group is a cumyl ester group, an enol ester group, an acetal ester group, a tertiary alkyl ester group, or the like. A tertiary alkyl ester group is more preferable.

As the repeating unit having an acid decomposable group which may be included in the resin (B), the following repeating unit represented by the following General Formula (AI) is preferable.

[Chem. 40]

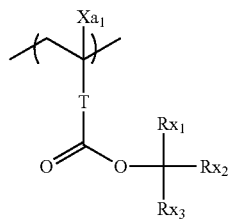

(AI)

In General Formula (AI), $Xa_1$ represents a hydrogen atom, a methyl group which may have a substituent, or a group represented by —$CH_2$—$R_{11}$. $R_{11}$ represents a hydroxyl group or a monovalent organic group, and is, for example, an alkyl group having 5 or less carbon atoms, an acyl group having 5 or less carbon atoms, preferably an alkyl group having 3 or less carbon atoms, and is more preferably a methyl group $Xa_1$ preferably represents a hydrogen atom, a methyl group, a trifluoromethyl group or a hydroxymethyl group.

T represents a single bond or a divalent linking group.

$Rx_1$ to $Rx_3$ each independently represent an alkyl group (linear or branched) or a cycloalkyl group (monocyclic or polycyclic).

Two of $Rx_1$ to $Rx_3$ may be bonded to each other to form a cycloalkyl group (monocyclic or polycyclic).

The divalent linking group of T may include an alkylene group, a —COO—Rt- group, a —O-Rt- group, or the like. In the formula, Rt represents an alkylene group or a cycloalkylene group.

T is preferably a single bond or a —COO-Rt- group. Rt is preferably an alkylene group having 1 to 5 carbon atoms and more preferably a —$CH_2$— group, a —($CH_2$)$_2$— group, a —($CH_2$)$_3$— group.

The alkyl group of $Rx_1$ to $Rx_3$ is preferably an alkyl group having 1 to 4 carbon atoms such as a methyl group, an ethyl group, an n-propyl group, an isopropyl group, an n-butyl group, an isobutyl group or a t-butyl group.

The cycloalkyl group of $Rx_1$ to $Rx_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

As the cycloalkyl group formed by two of $Rx_1$ to $Rx_3$ being bonded to each other, a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group is preferable. A monocylic cycloalkyl group having 5 to 6 carbon atoms is particularly preferable.

One of the methylene groups constituting the ring of the cycloalkyl group formed by two of $Rx_1$ to $Rx_3$ being bonded to each other may be substituted with an oxygen atom.

An embodiment in which $Rx_1$ is a methyl group or an ethyl group, and $Rx_2$ and $Rx_3$ are bonded to each other to form the cycloalkyl group described above is preferable.

Each of the groups may have a substituent, and as the substituent, for example, an alkyl group (having 1 to 4 carbon atoms), a halogen atom, a hydroxyl group, an alkoxy group (having 1 to 4 carbon atoms), a carboxyl group, an alkoxycarbonyl group (having 2 to 6 carbon atoms) or the like may be included, and having 8 or less carbon atoms is preferable.

The content as the sum of the repeating units having an acid decomposable group is preferably 20 to 70 mol %, and more preferably 30 to 60 mol % with regard to all repeating units in the resin.

Preferable specific examples of the repeating unit having an acid decomposable are shown below, however, the present invention is not limited to these.

In the specific examples, Rx and $Xa_1$ represent a hydrogen atom, $CH_3$, $CF_3$ or $CH_2OH$. Each of Rxa and Rxb represents an alkyl group having 1 to 4 carbon atoms. Z represents a substituent including a polar group, and when present in plural number, each of them is independent. p represents 0 or a positive integer. Specific examples and preferable examples of Z are the same specific examples and preferable examples of $R_{10}$ in General Formula (II-1) described later.

[Chem. 41]

1
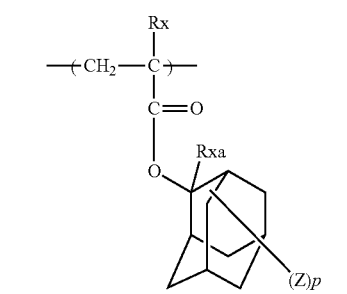

2
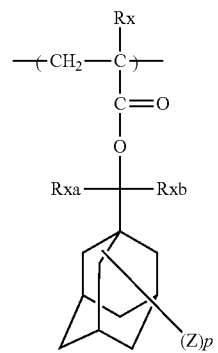

3
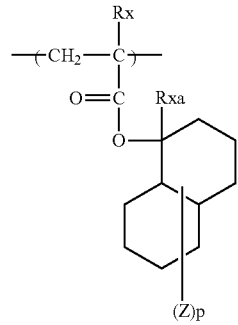

4
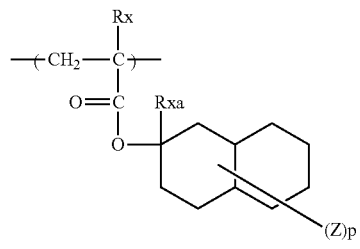

-continued

5
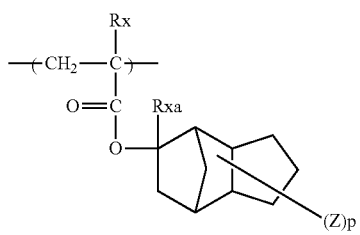

6
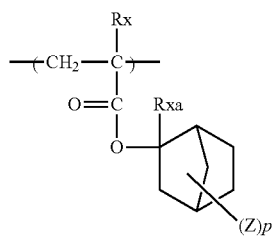

7
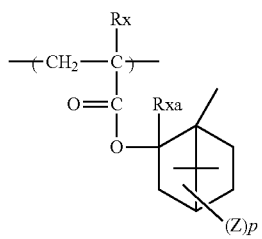

8
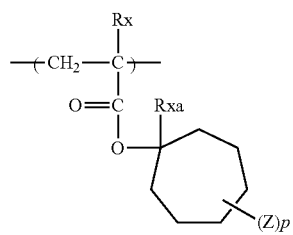

9
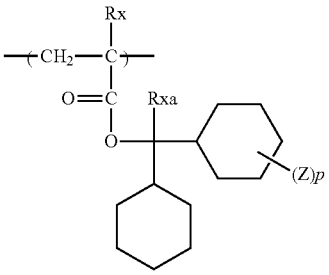

10
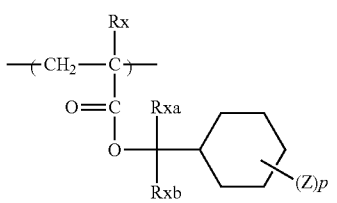

11
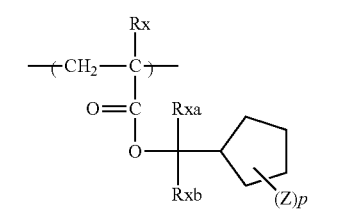

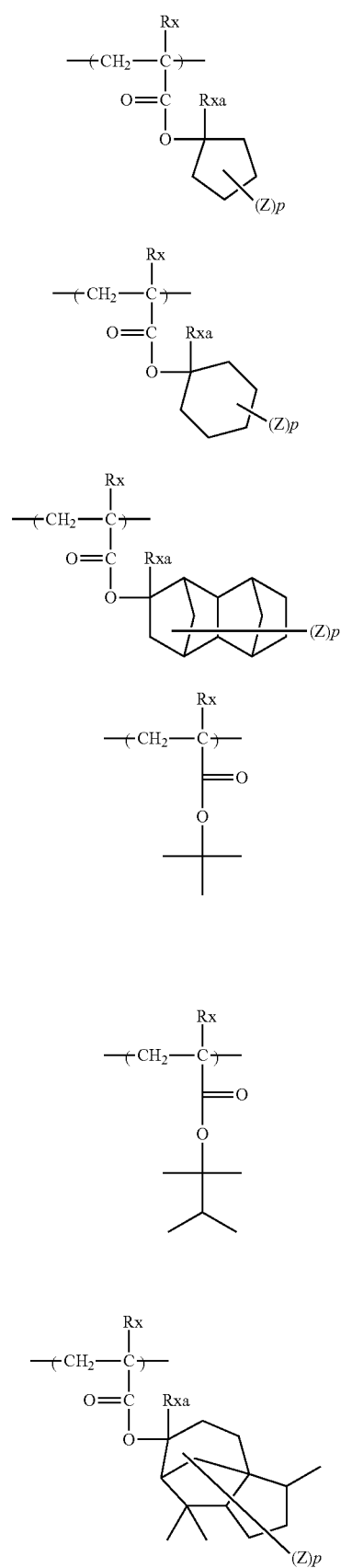
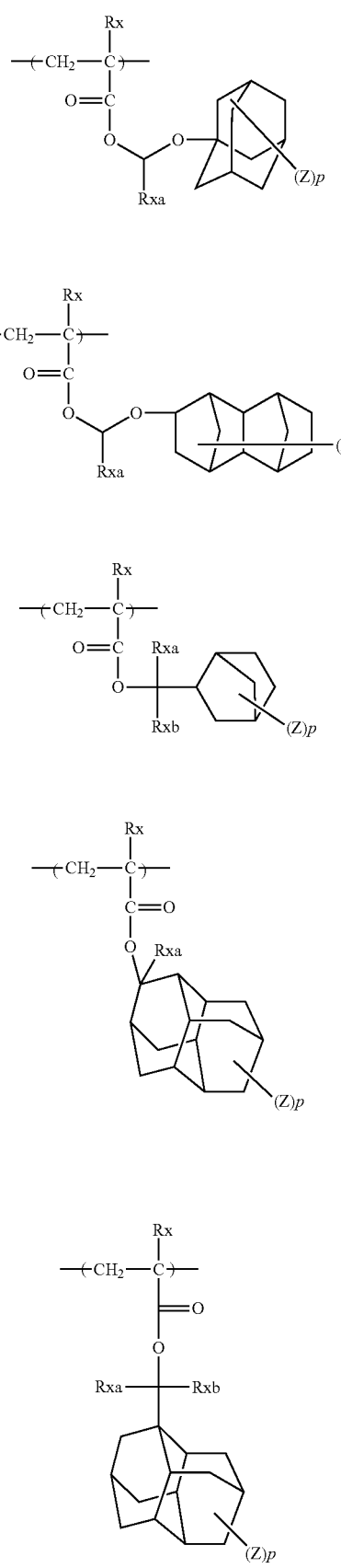

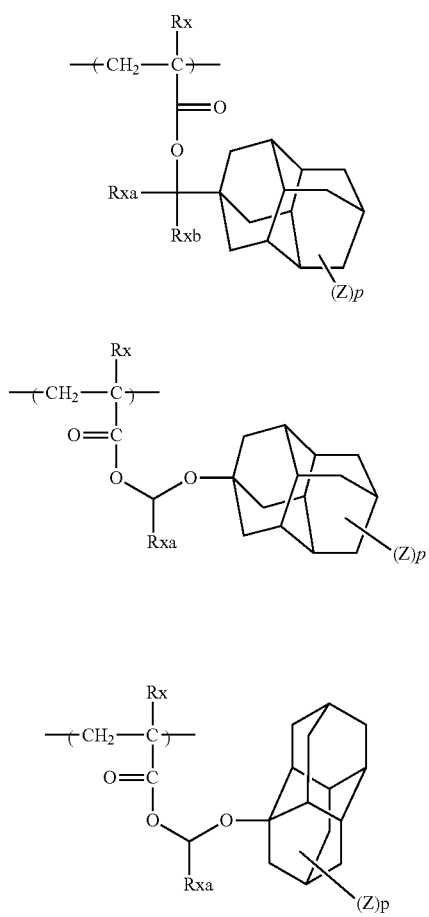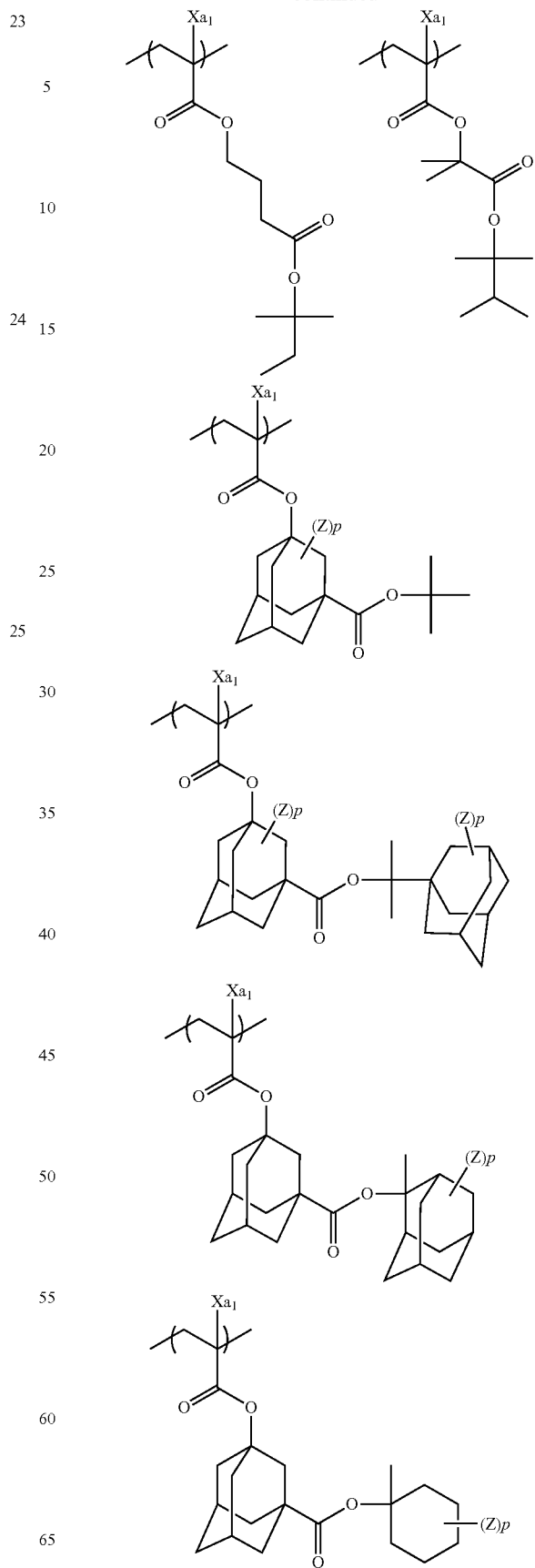

[Chem. 43]
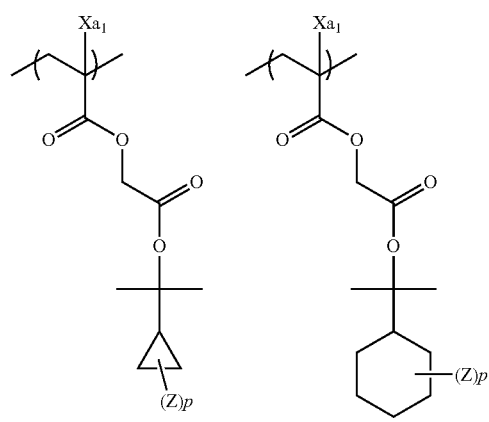
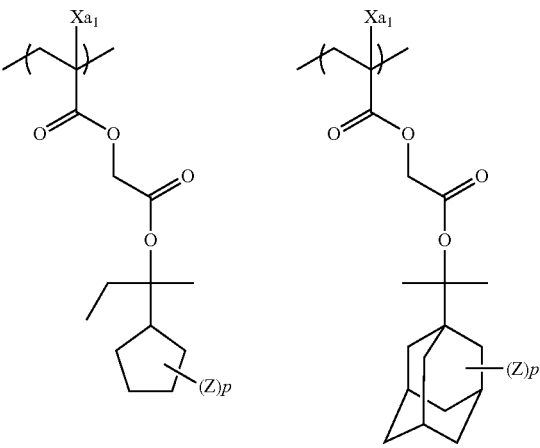
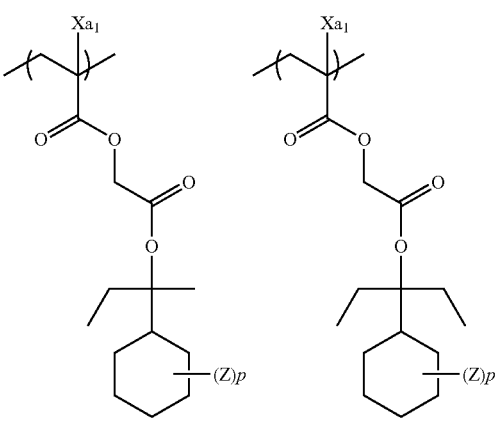
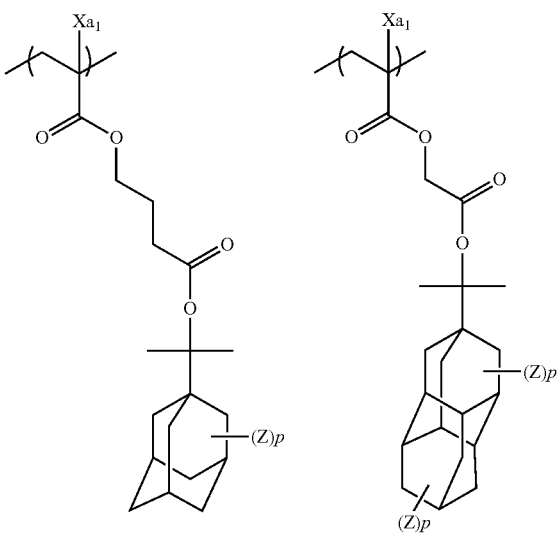
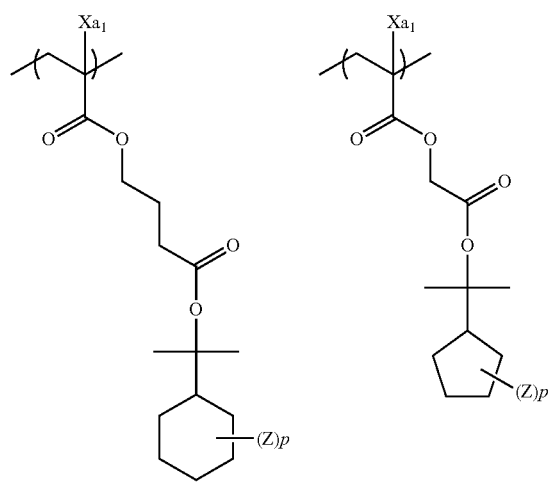
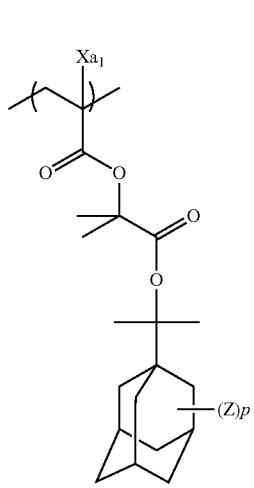

-continued
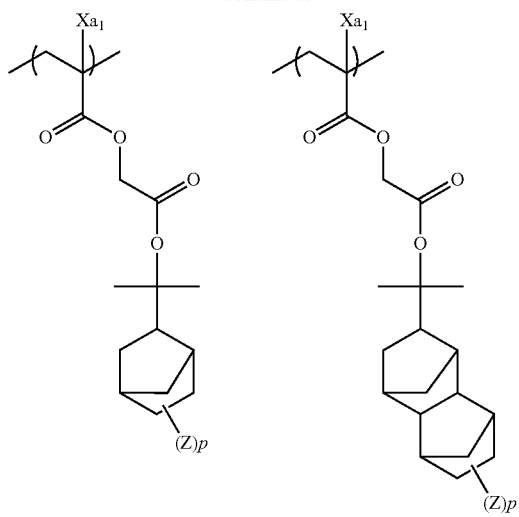
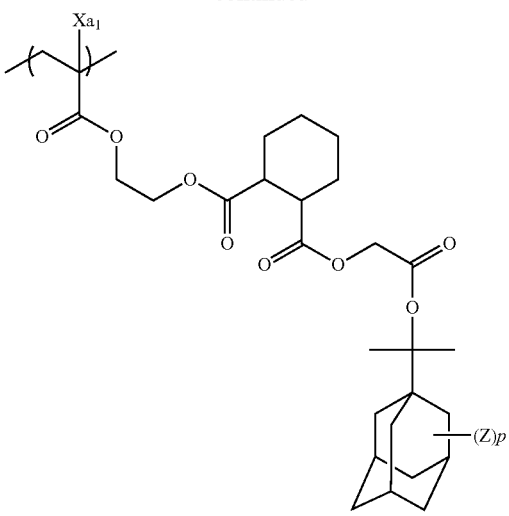
[Chem. 44]
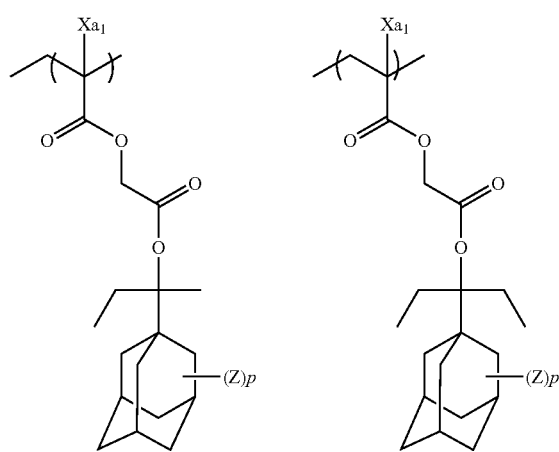
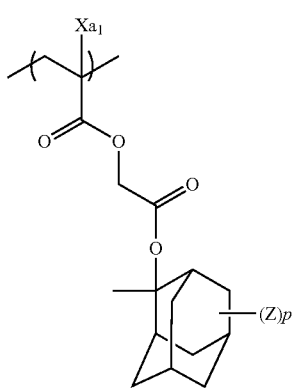
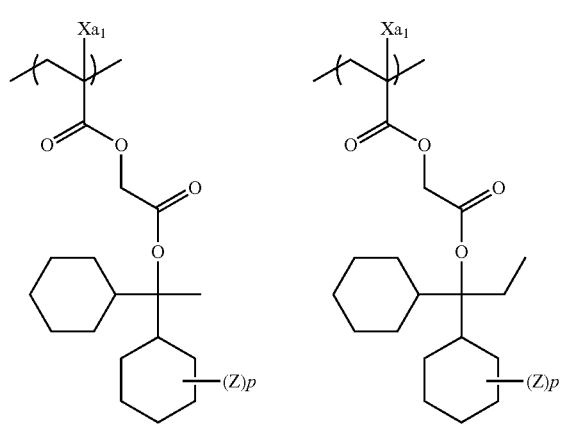
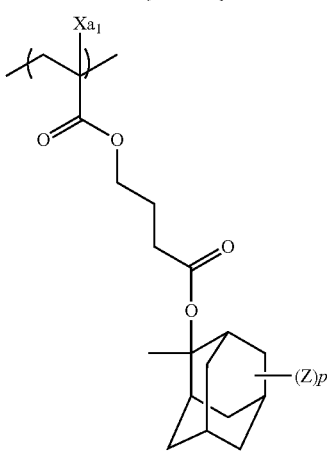

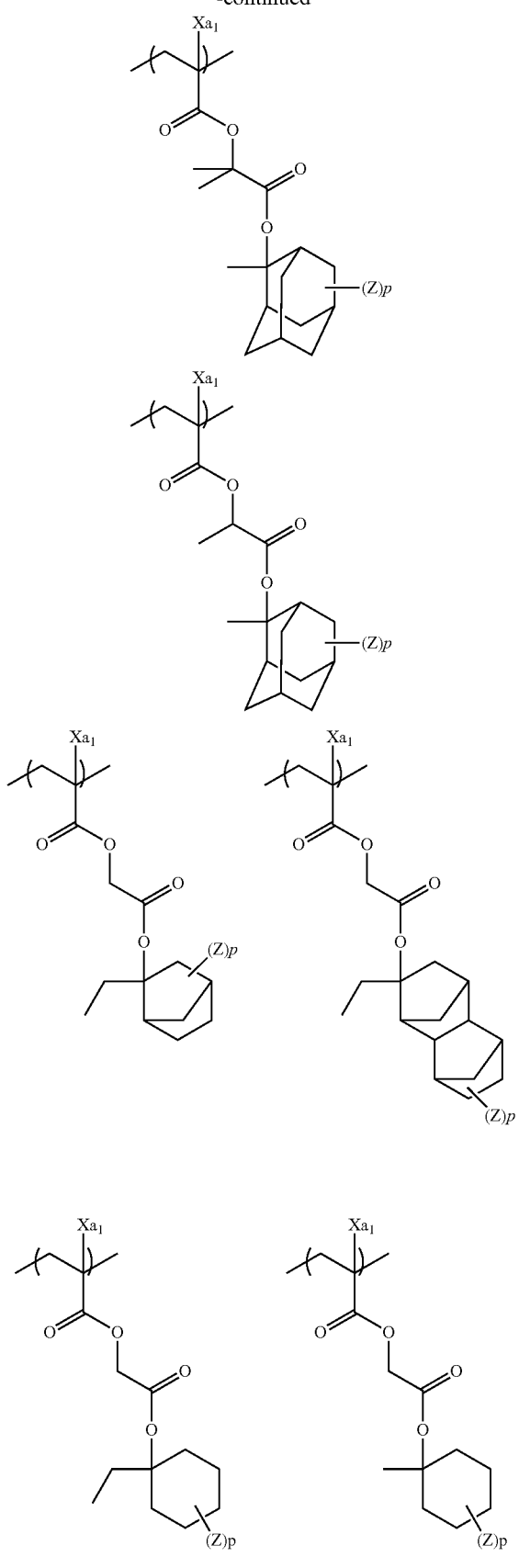
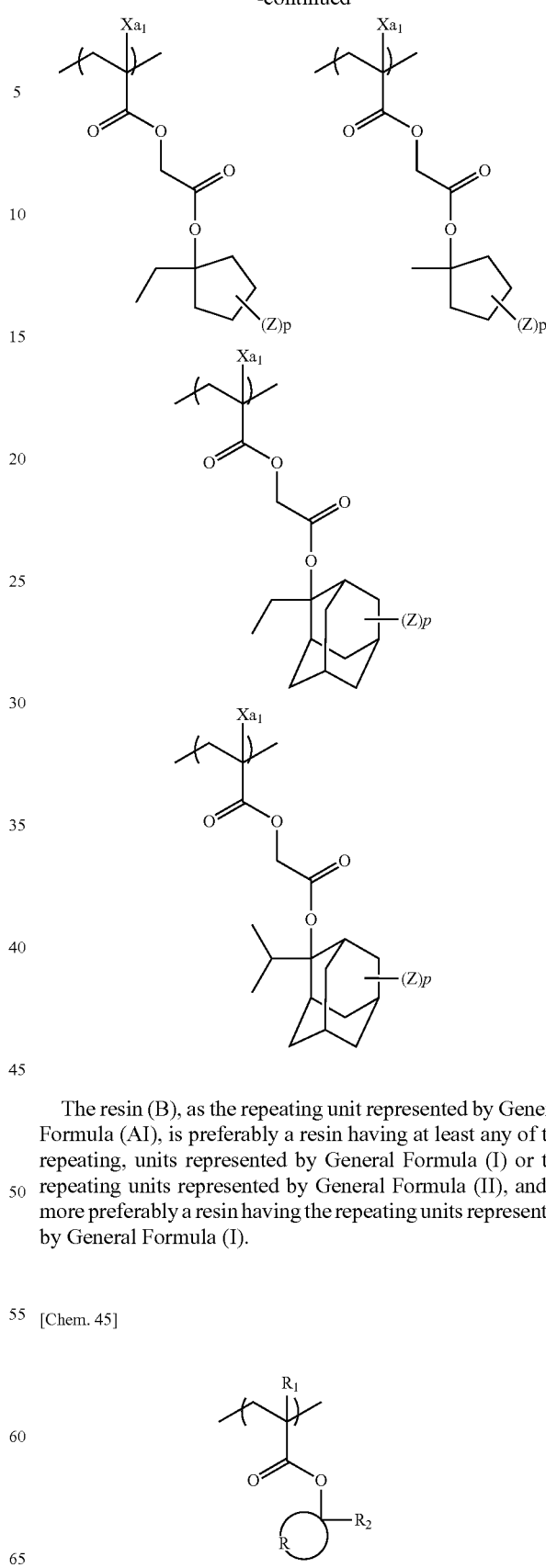
The resin (B), as the repeating unit represented by General Formula (AI), is preferably a resin having at least any of the repeating units represented by General Formula (I) or the repeating units represented by General Formula (II), and is more preferably a resin having the repeating units represented by General Formula (I).
[Chem. 45]

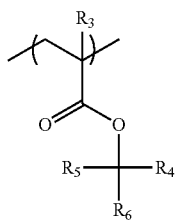

(II)

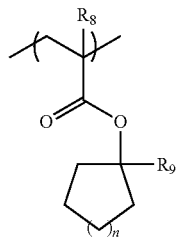

(AIII)

In General Formulae (I) and (II), $R_1$ and $R_3$ each independently represent a hydrogen atom, a methyl group which may have a substituent, or a group represented by —$CH_2$—$R_{11}$. $R_{11}$ represents a hydroxyl group or a monovalent organic group.

$R_2$, $R_4$, $R_5$, and $R_6$ each independently represent an alkyl group or a cycloalkyl group.

R represents an atomic group necessary for forming an alicyclic structure with carbon atoms, and the ring members of the alicyclic structure may include an oxygen atom.

$R_1$ and $R_3$ preferably represent a hydrogen atom, a methyl group, a trifluoromethyl group or a hydroxymethyl group. Specific examples and preferable examples of the monovalent organic group in $R_H$ are the same as those described for $R_{11}$ in General Formula (AI).

The alkyl group in $R_2$ may be linear or branched, and may have a substituent.

The cycloalkyl group in $R_2$ may be monocyclic or polycyclic, and may have a substituent.

$R_2$ is preferably an alkyl group, more preferably an alkyl group having 1 to 10 carbon atoms, even more preferably an alkyl group having 1 to 5 carbon atoms, and includes, for example, a methyl group or an ethyl group.

R represents an atomic group necessary for forming an alicyclic structure with carbon atoms. The alicyclic structure formed by R with the carbon atoms is preferably a monocyclic alicyclic structure, and the number of carbon atoms is preferably 3 to 7 and more preferably 5 or 6.

$R_3$ is preferably a hydrogen atom or a methyl group, and more preferably a methyl group.

The alkyl group in $R_4$, $R_5$, and $R_6$ may be linear or branched, and may have a substituent. The alkyl group is preferably an alkyl group having 1 to 4 carbon atoms such as a methyl group, an ethyl group, an n-propyl group, an isopropyl group, an n-butyl group, an isobutyl, group or a t-butyl group.

The cycloalkyl group in $R_4$, $R_5$, and $R_6$ may be monocyclic or polycyclic, and may have a substituent. The cycloalkyl group is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group or an adamantyl group.

The repeating unit represented by General Formula (I) is preferably a repeating unit represented by the following General Formula (AIII).

In the general formula, $R_8$ represents a hydrogen atom or an alkyl group. $R_9$ represents an alkyl group. n represents an integer of 1 to 6.

The alkyl group of $R_8$ is preferably an alkyl group having 1 to 10 carbon atoms, and may have a substituent.

n is preferably an integer of 1 to 3, and more preferably 1 or 2.

The substituent each of the groups may have includes the same groups described above as the substituents each of the groups in General Formula (AI) may have.

The repeating unit represented by General Formula (II) is preferably a repeating unit represented by the following General Formula (II-1).

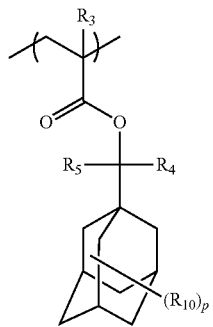

(II-1)

In General Formula (II-1), $R_3$ to $R_5$ each independently are synonymous with those in General Formula (II).

$R_{10}$ represents a substituent including a polar group. $R_{10}$s may be the same as or different from each other when present in plural number. Examples of the substituent including a polar group include a hydroxyl group, a cyano group, an amino group, an alkylamide group or a sulfonamide group itself, or a linear or branched alkyl group or a cycloalkyl group having at least one of these, and an alkyl group having a hydroxyl group is preferable. A branched alkyl group having a hydroxyl group is more preferable. As the branched alkyl group, an isopropyl group is particularly preferable.

p represents an integer of 0 to 15. p is preferably 0 to 2, and more preferably 0 or 1.

The acid decomposable resin is more preferably a resin including at least two types of the repeating units represented by General Formula (I) as the repeating unit represented by General Formula (AI), or a resin including the repeating unit represented by General Formula (I) and the repeating unit represented by General Formula (II) as the repeating unit represented by General Formula (AI).

The resin (B) may be used alone or as a combination of two or more types of the repeating units having an acid decomposable group. As the preferable combination when used as a combination, those included below are preferable. In the following formula, Rs each independently represent a hydrogen atom or a methyl group.
[Chem. 48]
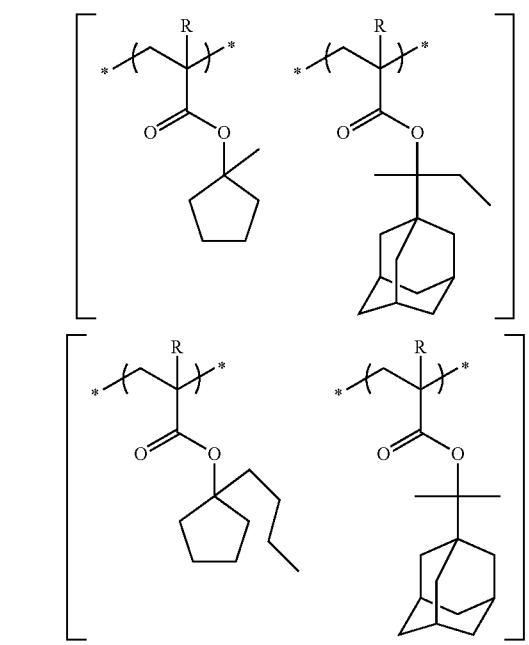
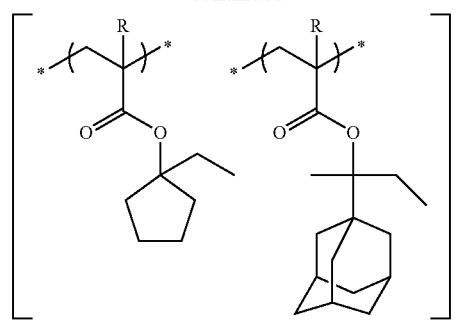
-continued
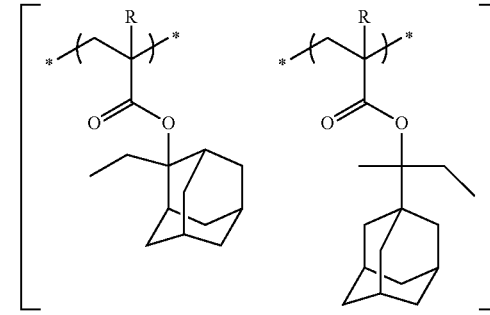
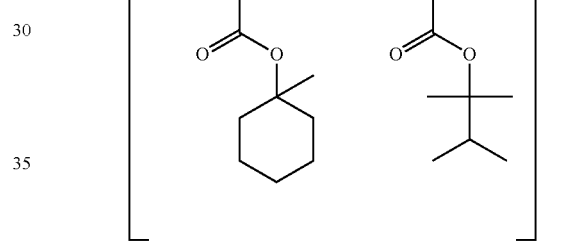
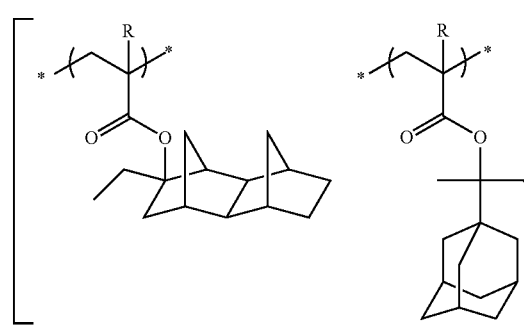
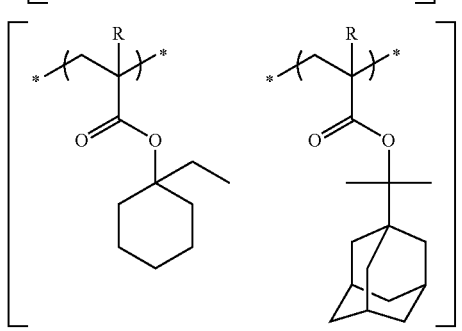
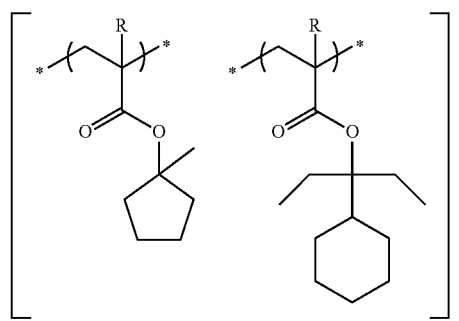
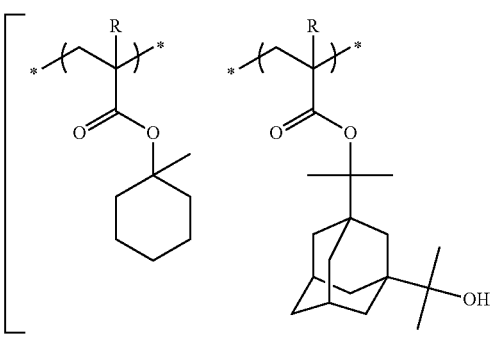

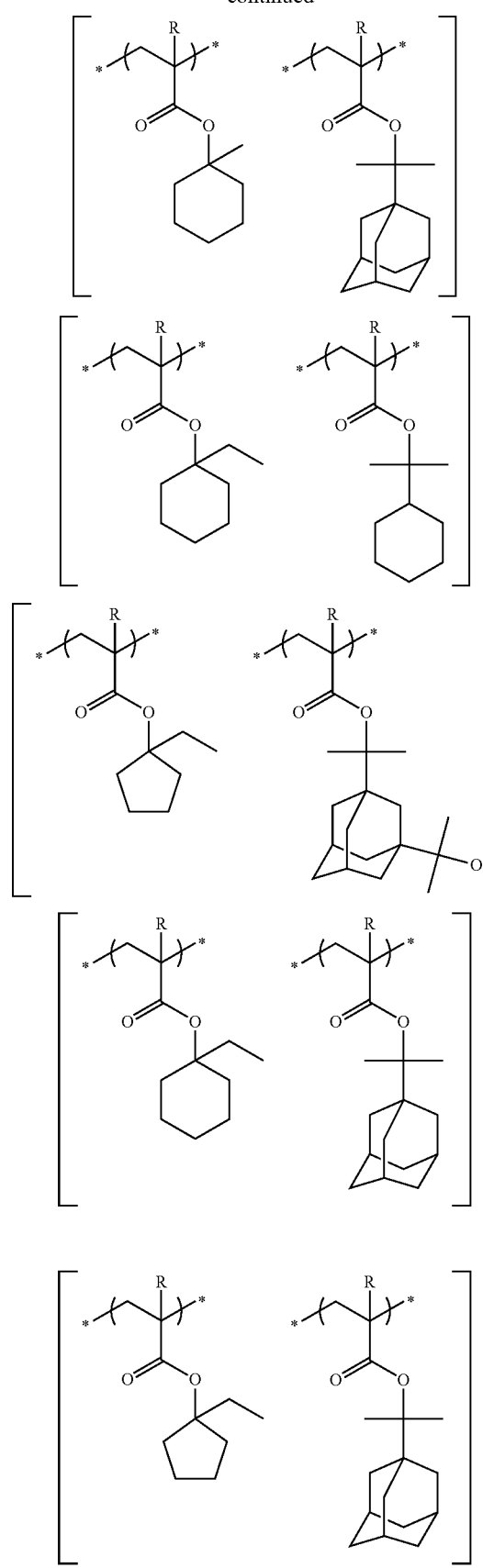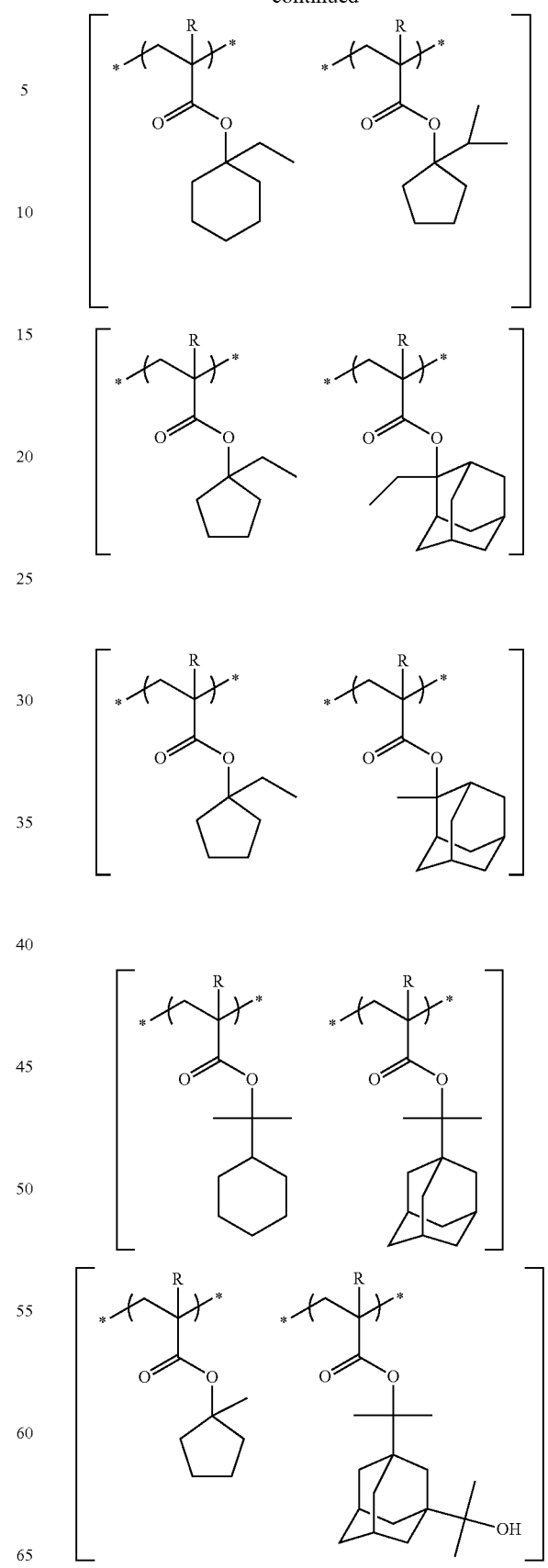

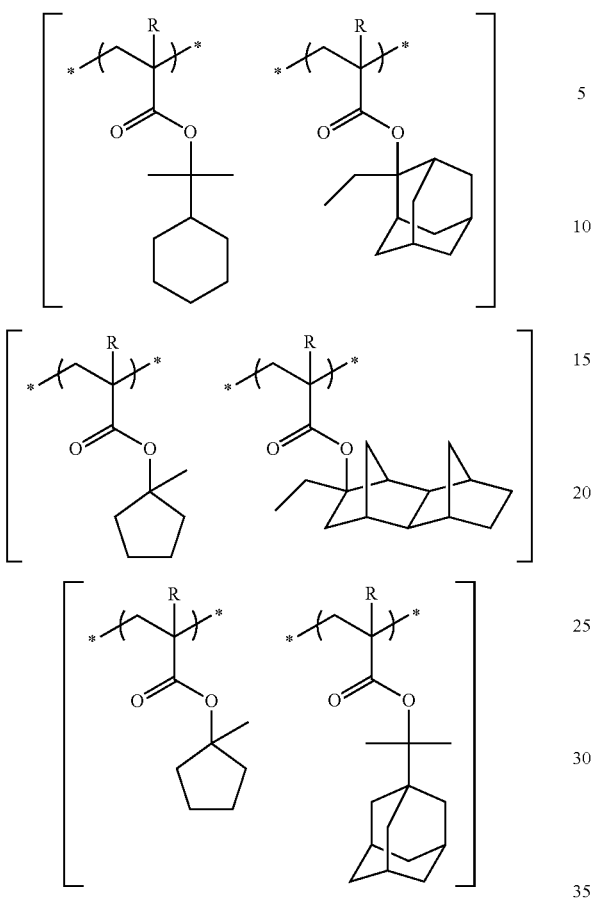

The resin (B) preferably contains a repeating, unit having a lactone structure or a sultone (a cyclic sulfonate) structure.

As the lactone group or a sultone group, any group may be used as long as the group has a lactone structure or a sultone structure, however, a lactone structure or a sultone structure having a 5- to 7-membered ring is preferable, and a structure in which another ring structure is condensed to a lactone structure or a sultone structure having a 5- to 7-membered ring to form a bicyclo structure or a spiro structure is preferable. Containing a repeating unit having a lactone structure represented by any of the following General Formulae (LC1-1) to (LC1-17) or a sultone structure represented by any of the following General Formulae (SL1-1) to (SL1-3) is more preferable. In addition, the lactone structure or the sultone structure may be bonded directly to a main chain. The preferable lactone structures are (LC1-1), (LC1-4), (LC1-5) and (LC1-8), and (LC1-4) is more preferable. By using specific lactone structures or sultone structures, LWR and development defects are improved.

[Chem. 49]

LC1-1

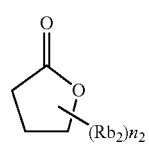

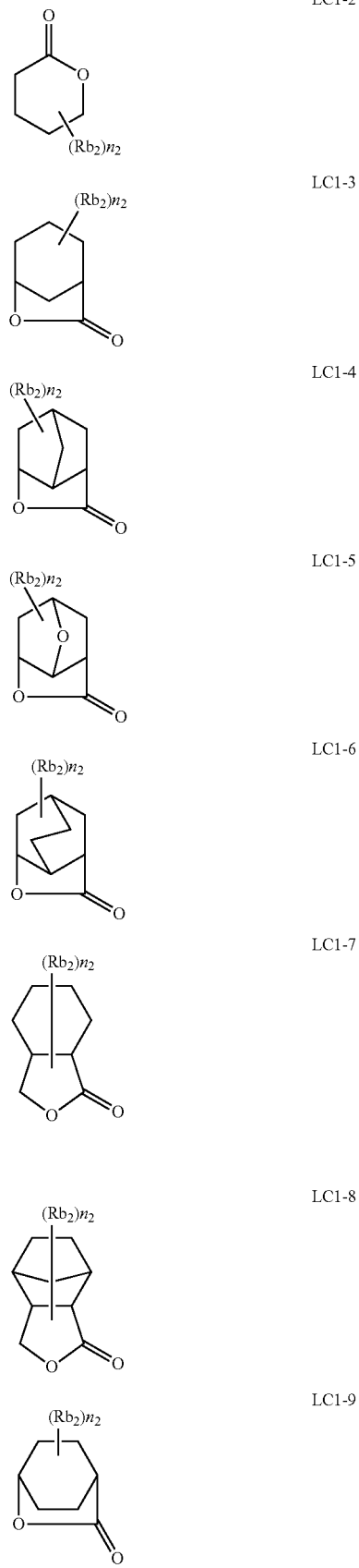

LC1-10 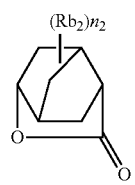

LC1-11 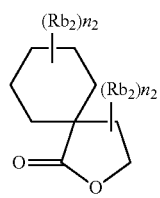

LC1-12 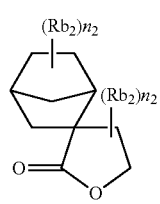

LC1-13 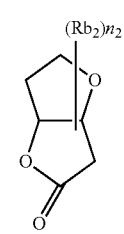

LC1-14 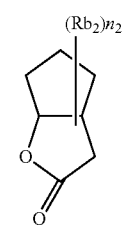

LC1-15 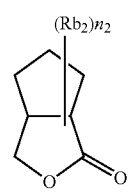

LC1-16 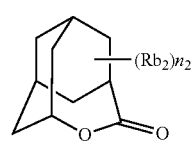

LC1-17 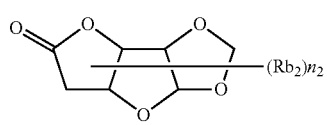

SL1-1 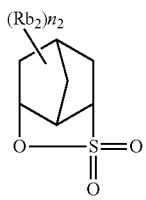

SL1-2 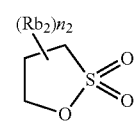

SL1-3 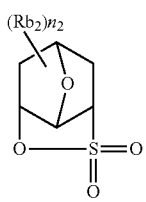

The lactone structure portion or the sultone structure portion may or may not have a substituent ($Rb_2$). As the preferable substituent ($Rb_2$), an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid decomposable group, or the like, may be included. An alkyl group having 1 to 4 carbon atoms, a cyano group or an acid decomposable group is more preferable. $n_2$ represents an integer of 0 to 4. If $n_2$ is 2 or more, the substituents ($Rb_2$)s which are present in plural number may be the same as or different from each other, and the substituents ($Rb_2$)s which are present in plural number may be bonded to each other to form a ring.

The resin (B) preferably contains a repeating unit having a lactone structure or a sultone structure represented by the following General Formula (VI).

[Chem. 51]

(VI)

In General Formula (VI), B represents an ester bond (a group represented by —COO—) or an amide bond (a group represented by —CONH—).

$R_0$ represents an alkylene group, a cycloalkylene group or a combination thereof. $R_0$s may be the same as or different from each other when present in plural number.

Z represents a single bond, an ether bond, an ester bond, an amide bond, a urethane bond,

[Chem. 52]

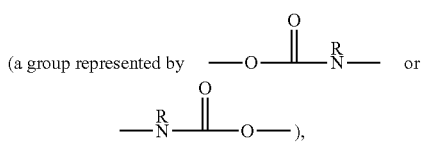

(a group represented by $-O-\overset{O}{\overset{\|}{C}}-\overset{R}{\underset{}{N}}-$  or  $-\overset{R}{\underset{}{N}}-\overset{O}{\overset{\|}{C}}-O-$ ), or a urea bond.

[Chem. 53]

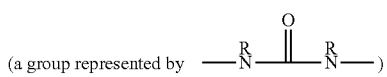

(a group represented by $-\overset{R}{\underset{}{N}}-\overset{O}{\overset{\|}{C}}-\overset{R}{\underset{}{N}}-$ )

Zs may be the same as or different from each other when present in plural number. Here, Rs each independently represent a hydrogen atom, an alkyl group, a cycloalkyl group or an aryl group.

$R_8$ represents a monovalent organic group having at least one lactone structure or at least one sultone structure.

n is the number of repetitions of the structure represented by $-R_0-Z-$, and represents an integer of 0 to 2. When n is 1 or 2, 1 is a preferable embodiment and as a result, pattern roughness such as Line Width Roughness (LWR) can be further improved.

$R_7$ represents a hydrogen atom, a halogen atom or an alkyl group.

The alkylene group or a cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group of $R_7$ may be substituted, respectively, and examples of the substituent include a halogen atom such as a fluorine atom, a chlorine atom or a bromine atom, a mercapto group, a hydroxy group, an alkoxy group such as a methoxy group, an ethoxy group, an isopropoxy group, a t-butoxy group or a benzyloxy group, an acetoxy group such as an acetyloxy group or a propionyloxy group. $R_7$ is preferably a hydrogen atom, a methyl group, a trifluoromethyl group or a hydroxymethyl group.

The chain alkylene group of $R_0$ is preferably a chain alkylene group having 1 to 10 carbon atoms, more preferably having 1 to 5 carbon atoms, and includes, for example, a methylene group, an ethylene group, a propylene group or the like. The cycloalkylene group is preferably a cycloalkylene group having 3 to 20 carbon atoms, and includes, for example, a cyclohexylene group, a cyclopentylene group, a norbornylene group, an adamantylene group or the like. A chain alkylene group is more preferable and a methylene group is particularly preferable in order to express the effects of the present invention.

The monovalent organic group having a lactone structure or a sultone structure represented by $R_8$ is not particularly limited as long as the group has a lactone structure or a sultone structure, and specific examples include the lactone structure or the sultone structure represented by General Formulae (LC1-1) to (LC1-17) and (SL1-1) to (SL1-3) and among these, the structure represented by (LC1-4) is particularly preferable. In addition, $n_2$ is preferably 2 or less in (LC1-1) to (LC1-17) and (SL1-1) to (SL1-3).

In addition, $R_8$ is preferably a monovalent organic group containing an unsubstituted lactone structure or a sultone structure, or a monovalent organic group containing a lactone structure or a sultone structure having a methyl group, a cyano group or an alkoxycarbonyl group as a substituent, and more preferably a monovalent organic group containing a lactone structure having a cyano group as a substituent (cyanolactone) or a sultone structure having a cyano group as a substituent (cyanosultone).

Specific examples of the repeating unit containing a group having a lactone structure or a sultone structure represented by General Formula (VI) are shown below, however, the present invention is not limited to these.

In the following specific examples, R represents a hydrogen atom, an alkyl group which may have a substituent, or a halogen atom, and preferably represents a hydrogen atom, a methyl group, a hydroxymethyl group or an acetyloxymethyl group.

In the following formula, Me represents a methyl group.

[Chem. 54]

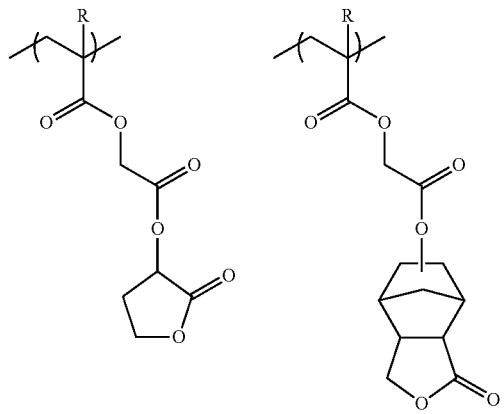

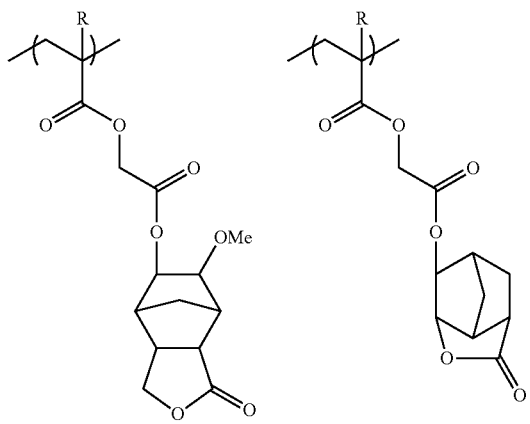

-continued

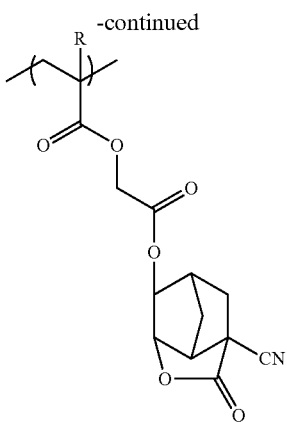

As the repeating unit having a lactone structure or a sultone structure, a repeating unit represented by the following General Formula (VI-1) or (VI-1') is more preferable

[Chem. 55]

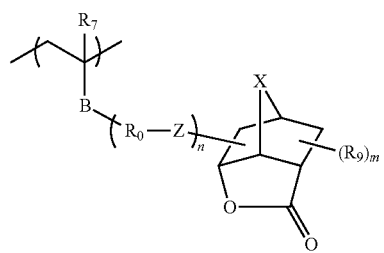
(VI-1)

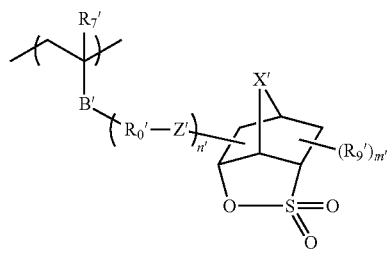
(VI-1')

In General Formulae (VI-1) and (VI-1'), $R_7$, B, $R_0$, Z and n are synonymous with those in General Formula (VI).

$R_7'$, B', $R_0'$, Z' and n' are synonymous with $R_7$, B, $R_0$, Z and n in General Formula (VI), respectively.

$R_9$ represent an alkyl group, a cycloalkyl group, an alkoxycarbonyl group, a cyano group, a hydroxyl group or an alkoxy group, $R_9$s may be the same as or different from each other when present in plural number, and two $R_9$s may be bonded to each other to form a ring when present in plural number.

$R_9'$ represent an alkyl group, a cycloalkyl group, an alkoxycarbonyl group, a cyano group, a hydroxyl group or an alkoxy group, $R_9'$s may be the same as or different from each other when present in plural number, and two $R_9'$s may be bonded to each other to form a ring when present in plural number.

X and X' each independently represent an alkylene group, an oxygen atom or a sulfur atom.

m and m' are the number of substituents, and each independently represents an integer of 0 to 5. It is preferable that m and m' each independently represent 0 or 1.

The alkyl group of $R_9$ and $R_9'$ is preferably an alkyl group having 1 to 4 carbon atoms, more preferably a methyl group or an ethyl group, and most preferably a methyl group. The cycloalkyl group may include a cyclopropyl group, a cyclobutyl group, a cyclopentyl group or a cyclohexyl group. The alkoxycarbonyl group may include a methoxycarbonyl group, an ethoxycarbonyl group, an n-butoxycarbonyl group, a t-butoxycarbonyl group, or the like. The alkoxy group may include a methoxy group, an ethoxy group, a propoxy group, an isopropoxy group, a butoxy group, or the like. These groups may have a substituent, and the substituent may include a hydroxy group, an alkoxy group such as a methoxy group or an ethoxy group, a cyano group, a halogen atom such as a fluorine atom. $R_9$ and $R_9'$ are more preferably a methyl group, a cyano group or an alkoxycarbonyl group, and even more preferably a cyano group.

The alkylene group of X and X' may include a methylene group or an ethylene group. X and X' are preferably an oxygen atom or a methylene group, and more preferably a methylene group.

When m and m' are 1 or more, it is preferable that at least one $R_9$ and $R_9'$ be substituted at the α-position or β-position of the carbonyl group of the lactone, and being substituted at the α-position is particularly preferable.

Specific examples of the group having a lactone structure or the repeating unit having a sultone structure represented by General Formula (VI-1) or (VI-1') are shown below, however, the present invention is not limited to these. In the following specific examples, R represents a hydrogen atom, an alkyl group which may have a substituent or a halogen atom, and preferably represent a hydrogen atom, a methyl group, a hydroxymethyl group, or an acetyloxymethyl group.

[Chem. 56]

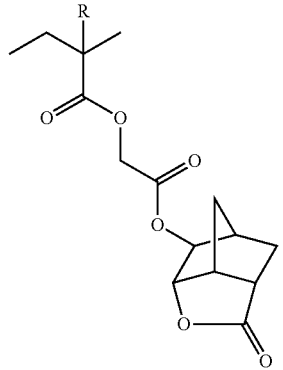

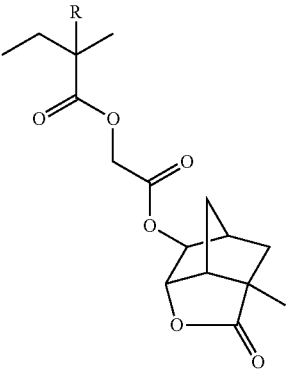

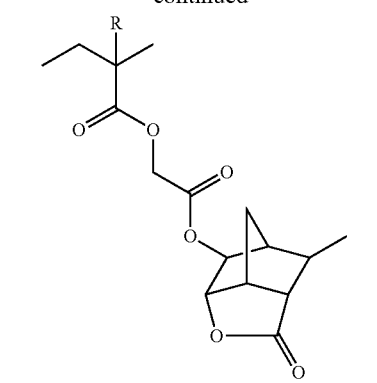
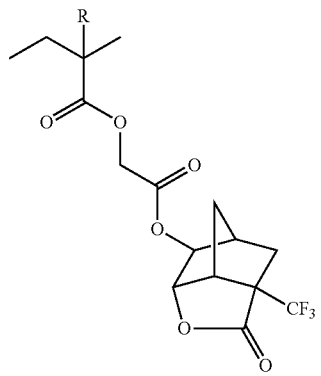
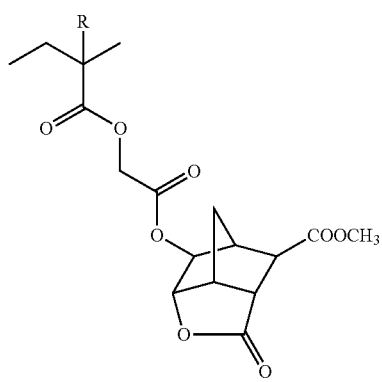
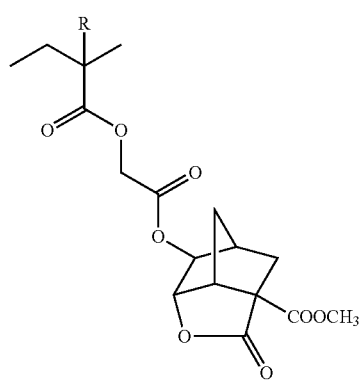
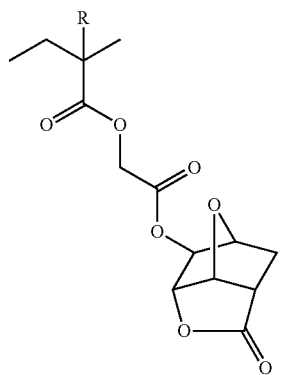
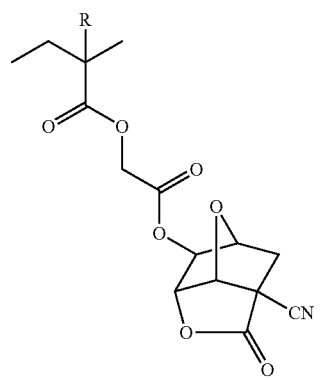
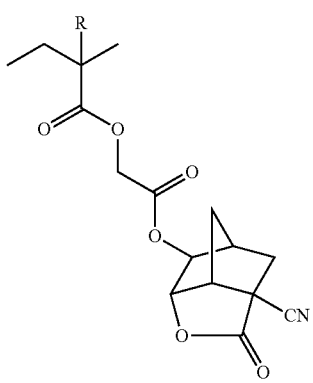
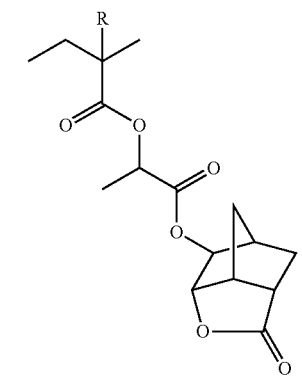

67
-continued
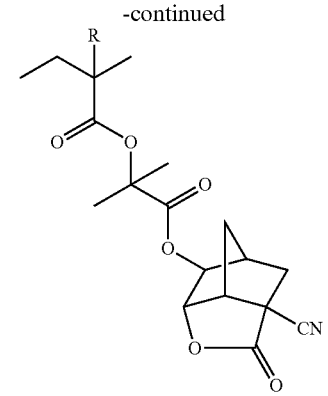
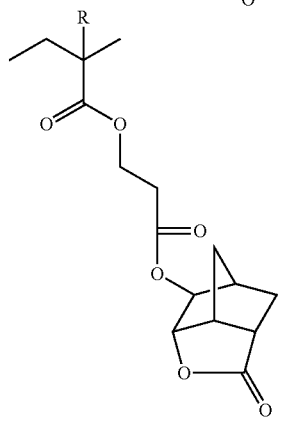
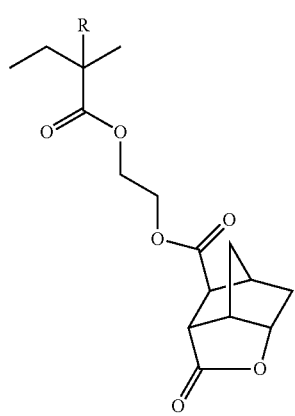
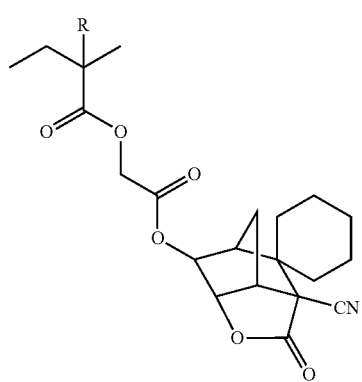
68
-continued
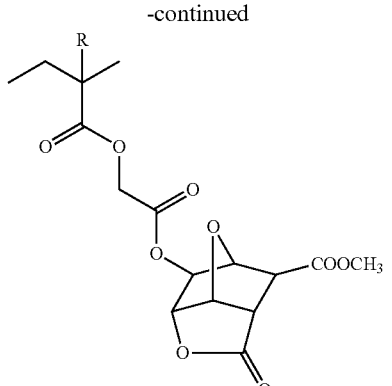
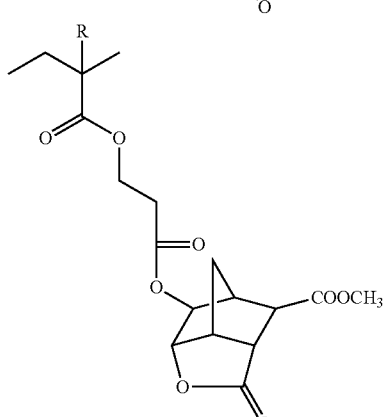
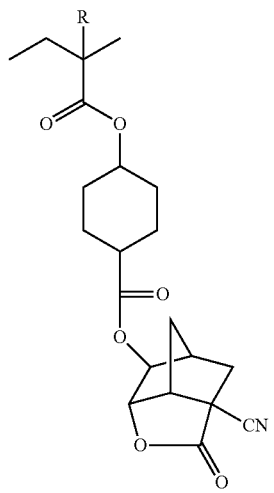
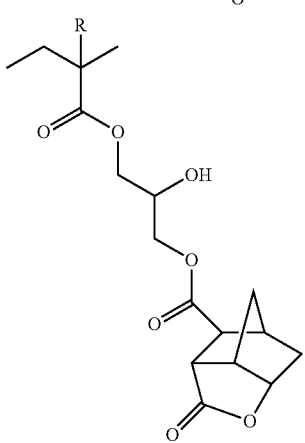

69
-continued
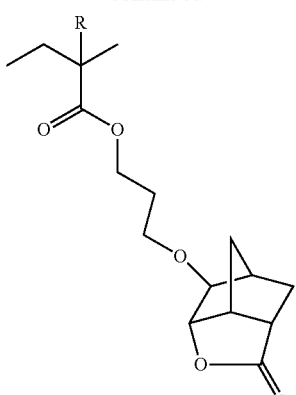
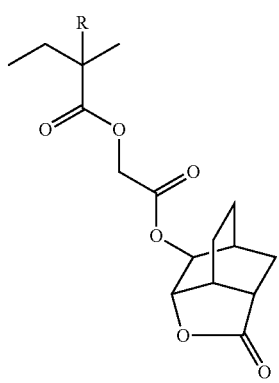
[Chem. 57]
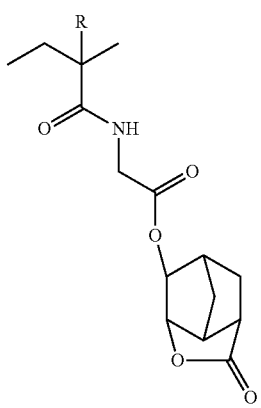
70
-continued
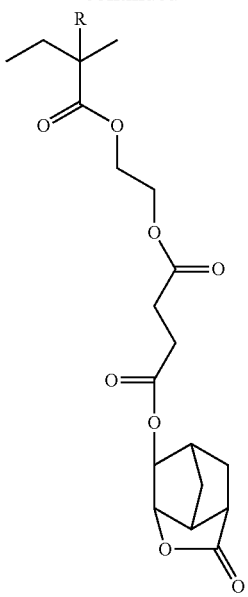
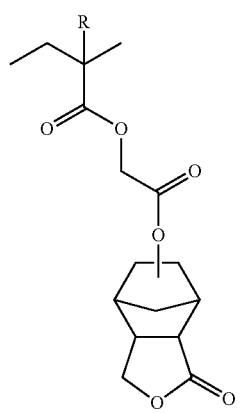
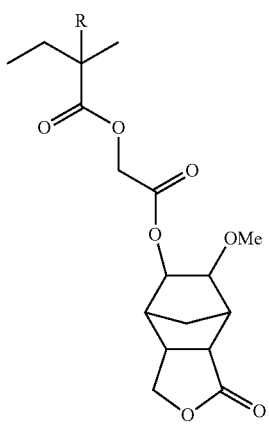

-continued

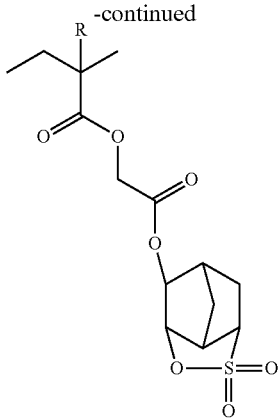

In one embodiment, the unit represented by General Formula (VI) may be a repeating unit represented by the following General Formula (AII').

[Chem. 58]

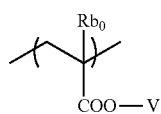

(AII')

In General Formula (AII'), $Rb_0$ represents a hydrogen atom, a halogen atom or an alkyl group having 1 to 4 carbon atoms. The preferable substituent the alkyl group of $Rb_0$ may have includes a hydroxyl group or a halogen atom. The halogen atom of $Rb_0$ may include a fluorine atom, a chlorine atom, a bromine atom or an iodine atom. $Rb_0$ is preferably a hydrogen atom, a methyl group, a hydroxymethyl group or a trifluoromethyl group, and particularly preferably a hydrogen atom or a methyl group.

V represents a group having a structure represented by any of General Formulae (LC1-1) to (LC1-17) and (SL1-1) to (SL1-3).

The resin (B) may also contain the repeating unit having a lactone structure or a sultone structure described above in addition to the unit represented by General Formula (VI).

Specific examples of the repeating unit having a lactone group or a sultone group are shown below in addition to the specific examples included above, however, the present invention is not limited to these. In the formula, Rx represents H, $CH_3$, $CH_2OH$ or $CF_3$.

[Chem. 59]

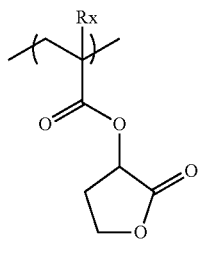 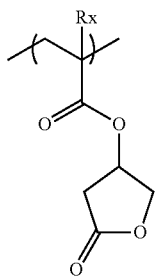 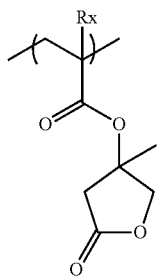

-continued

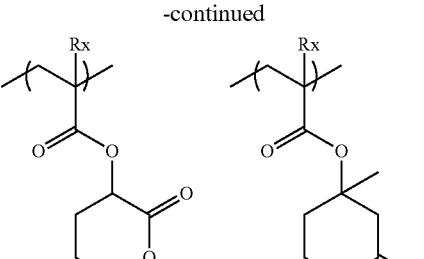

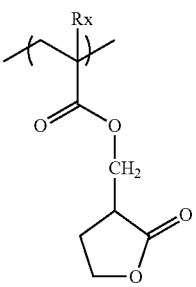

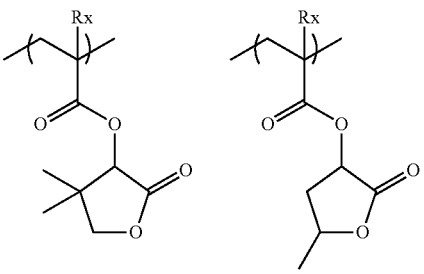

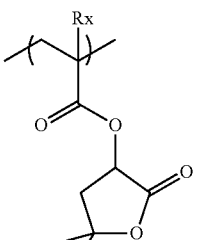

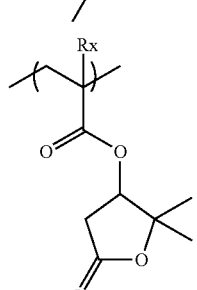

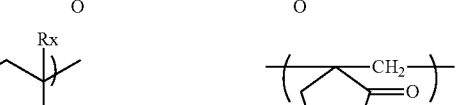

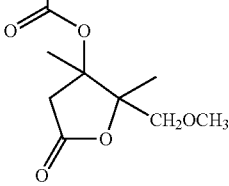

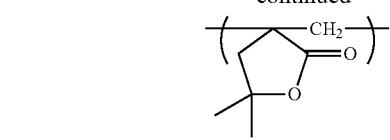
[Chem. 60]
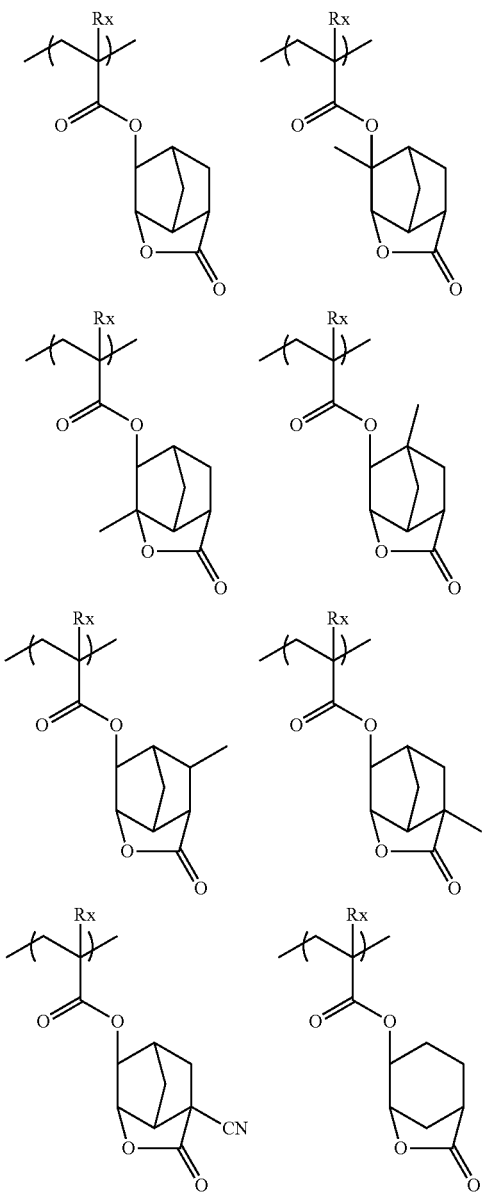
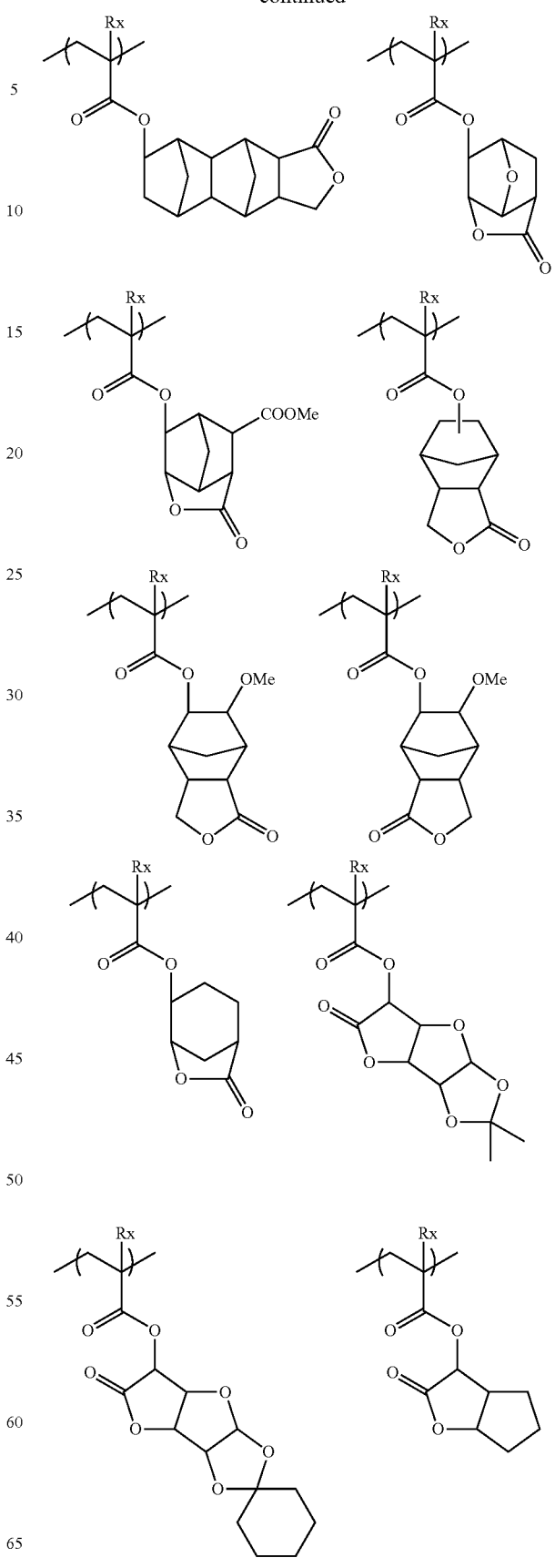

[Chem. 61]
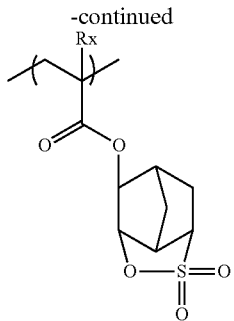
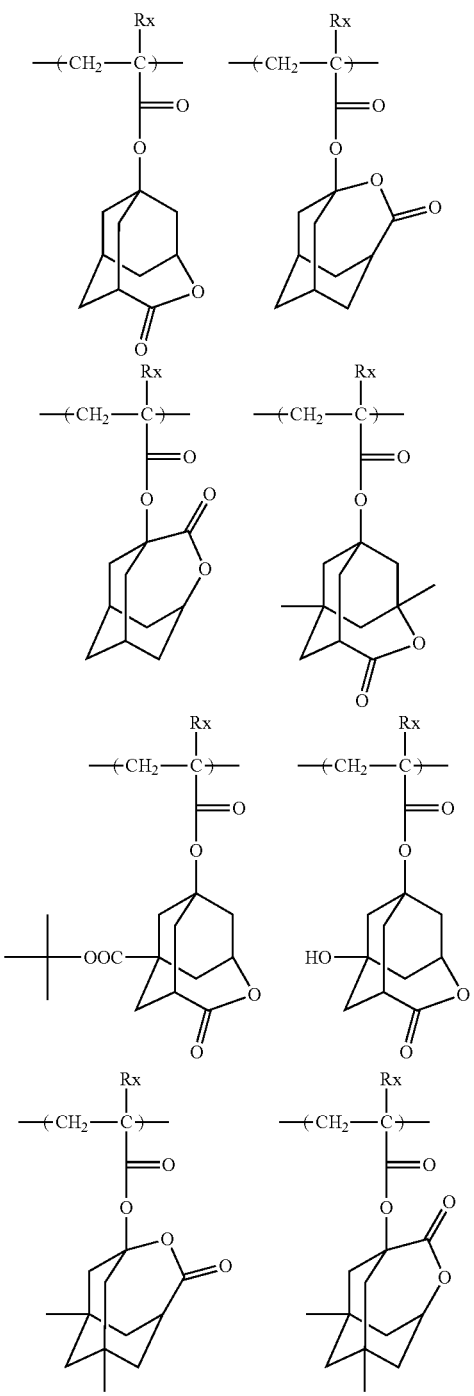
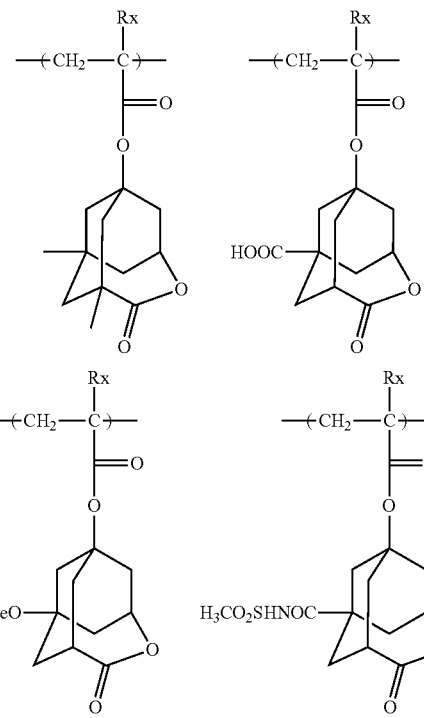
(In the formula, Rx represents H, CH₃, CH₂OH or CF₃)
The repeating units particularly preferable among the above specific examples may include the following repeating units. By selecting the optimal lactone group or sultone group, pattern profile and density dependence are improved.
[Chem. 62]
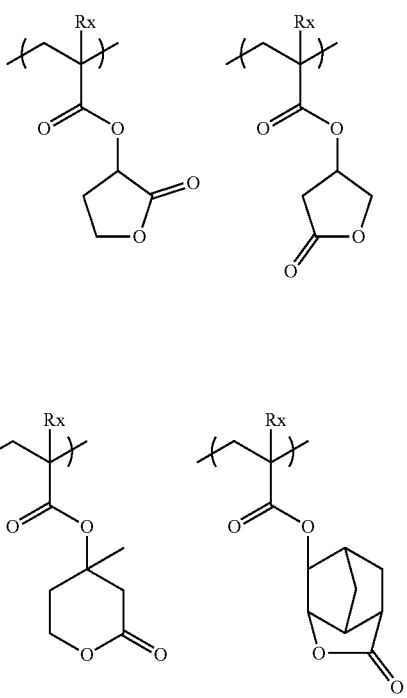

-continued

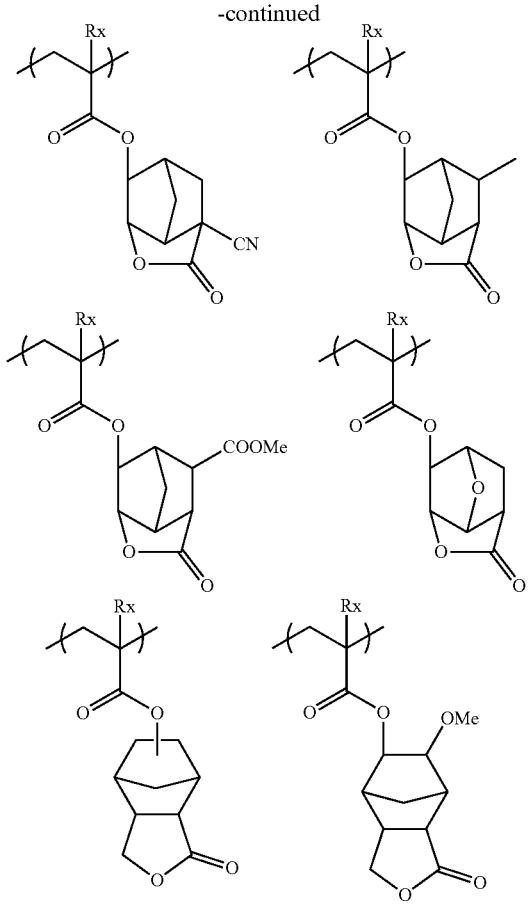

(In the formula, Rx represents H, CH$_3$, CH$_2$OH or CF$_3$)

The repeating unit having a lactone group or a sultone group typically includes optical isomers, however, any optical isomer may be used. In addition, one optical isomer may be used alone or a plurality of optical isomers may be mixed and used. When one optical isomer is mainly used, an optical purity (ee) thereof is preferably 90% or more, and more preferably 95% or more.

The resin (B) may have two or more types of the repeating units having a lactone structure or a sultone structure. In particular, in General Formula (VI), a combination of two or more types selected from the lactone repeating units in which n is 1 is preferable.

The content of the repeating unit having a lactone structure or a sultone structure, the total content when a plurality of types are included, is preferably 15 to 60 mol %, more preferably 20 to 60 mol %, and even more preferably 30 to 50 mol % with regard to all repeating units in the resin.

The resin (B) preferably contains a repeating unit having a hydroxyl group or a cyano group in addition to those in General Formulae (AI) and (VI). As a result, substrate adhesion and developer affinity are improved. The repeating unit having a hydroxyl group or a cyano group is preferably a repeating unit having at least one alicyclic hydrocarbon structure substituted with a hydroxyl group or a cyano group and preferably a repeating unit having no acid decomposable groups. As the alicyclic hydrocarbon structure substituted with a hydroxyl group or a cyano group, an adamantyl group, a diamantyl group or a norbornane group is preferable. As the preferable alicyclic hydrocarbon structure substituted with a hydroxyl group or a cyano group, a partial structure represented by the following General Formulae (VIIa) to (VIId) is preferable.

[Chem. 63]

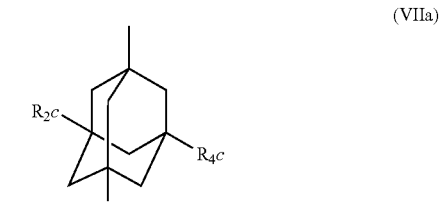
(VIIa)

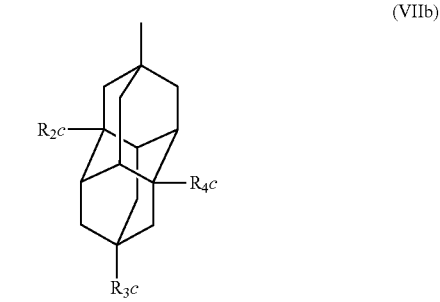
(VIIb)

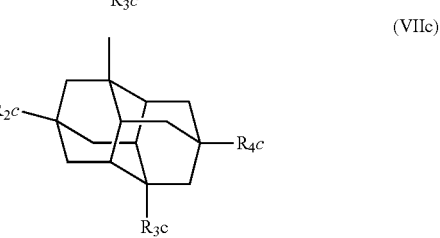
(VIIc)

(VIId)

In General Formulae (VIIa) to (VIIc), R$_2$, to R$_4$, each independently represent a hydrogen atom, a hydroxyl group or a cyano group. However, at least one of R$_2$ to R$_1$ represents a hydroxyl group, or a cyano group. Preferably, one or two of R$_2$, to R$_4$, are hydroxyl groups with the remainder being hydrogen atoms. In General Formula (VIIa), it is more preferable that two of R$_{2c}$ to R$_{4c}$ be hydroxyl groups and the remaining be hydrogen atoms.

The repeating units having a partial structure represented by General Formulae (VIIa) to (VIId) may include a repeating unit represented by the following General Formulae (AIIa) to (AIId).

[Chem. 64]

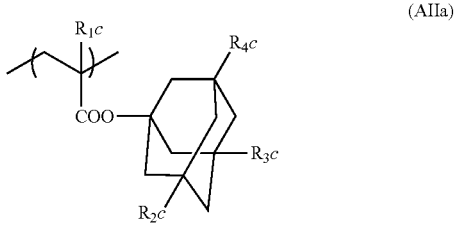
(AIIa)

-continued

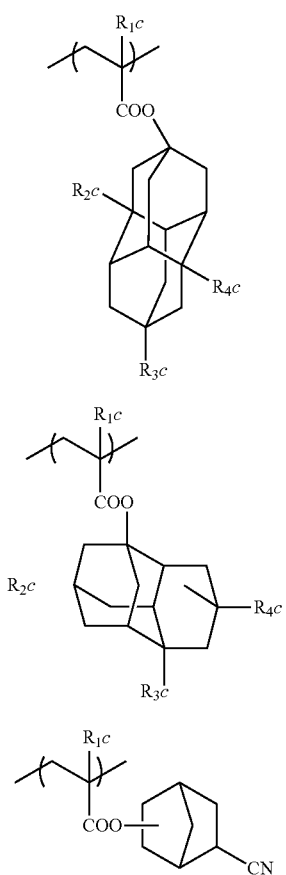

(AIIb)

(AIIc)

(AIId)

In General Formulae (AIIa) to (AIId), $R_{1c}$ represents a hydrogen atom, a methyl group, a trifluoromethyl group or a hydroxymethyl group.

$R_{2c}$ to $R_{4c}$ are synonymous with $R_{2c}$ to $R_{4c}$ in General Formulae (VIIa) to (VIIe).

The resin (B) may or may not contain a repeating unit having a hydroxyl group or a cyano group, but when the resin (B) does, the content of the repeating unit having a hydroxyl group or a cyano group is preferably 5 to 40 mol %, more preferably 5 to 30 mol % and even more preferably 10 to 25 mol % with regard to all repeating units in the resin (B).

Specific examples of the repeating unit having a hydroxyl group, or a cyano group are shown below, however, the present invention is not limited to these.

[Chem. 65]

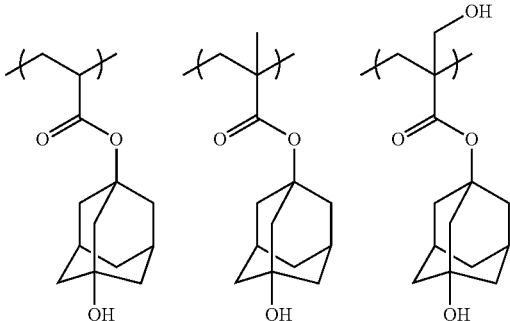

-continued

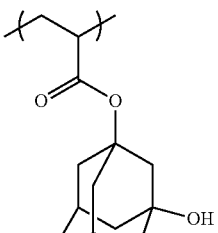 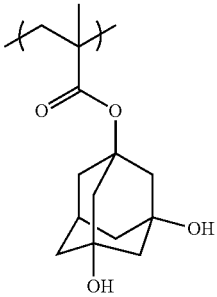

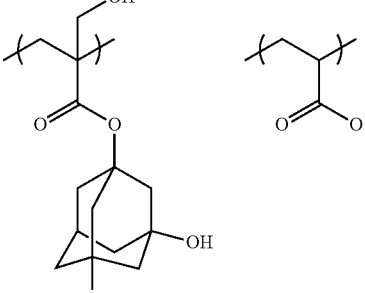

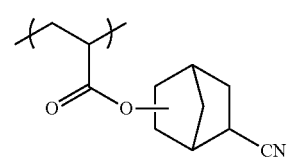

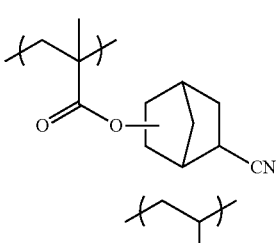 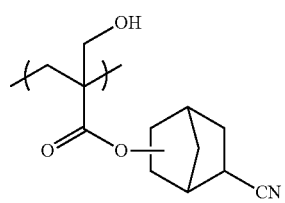

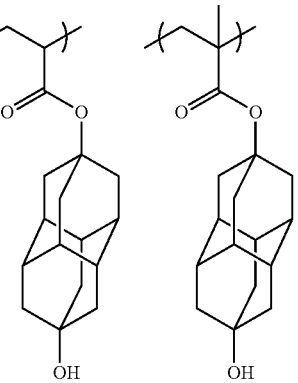

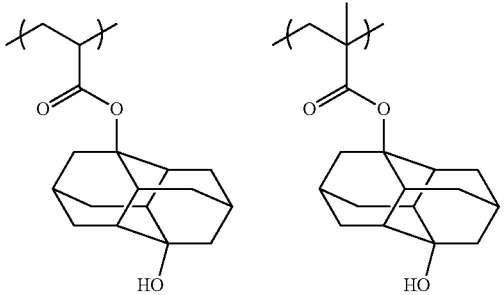

The resin used in the actinic ray-sensitive or radiation-sensitive resin composition of the present invention may contain a repeating unit having an alkali-soluble group. The alkali-soluble group may include a carboxyl group, a sulfonamide group, a sulfonylimide group, a bissulfonylimide group, an aliphatic alcohol of which an α-position is substituted with an electron-withdrawing group (for example, a hexafluoroisopropanol group), and containing a repeating unit having a carboxyl group is more preferable. By containing the repeating unit having an alkali-soluble group, resolution in a contact hole application increases. As the repeating unit having an alkali-soluble group, a repeating unit in which the alkali-soluble group is bonded directly to a main chain of the resin such as a repeating unit of acrylic acid or methacrylic acid, a repeating unit in which the alkali-soluble group is bonded to a main chain of the resin through a linking group, and introducing the repeating unit to the end of the polymer chain using a polymerization initiator or a chain transfer agent having an alkali-soluble group when polymerized are all preferable, and the linking group may have a monocyclic or polycyclic cyclic hydrocarbon structure. A repeating unit of acrylic acid or methacrylic acid is particularly preferable.

The resin (B) may or may not contain the repeating unit having an alkali-soluble group, but when the resin (B) does, the content of the repeating unit having an alkali-soluble group is preferably 1 to 20 mol %, more preferably 3 to 15 mol % and even more preferably 5 to 10 mol % with regard to all repeating units in the resin (B).

Specific examples of the repeating unit having an alkali-soluble group are shown below, however, the present invention is not limited to these.

In the specific examples, Rx represents H, $CH_3$, $CH_2OH$ or $CF_3$.

[Chem. 66]

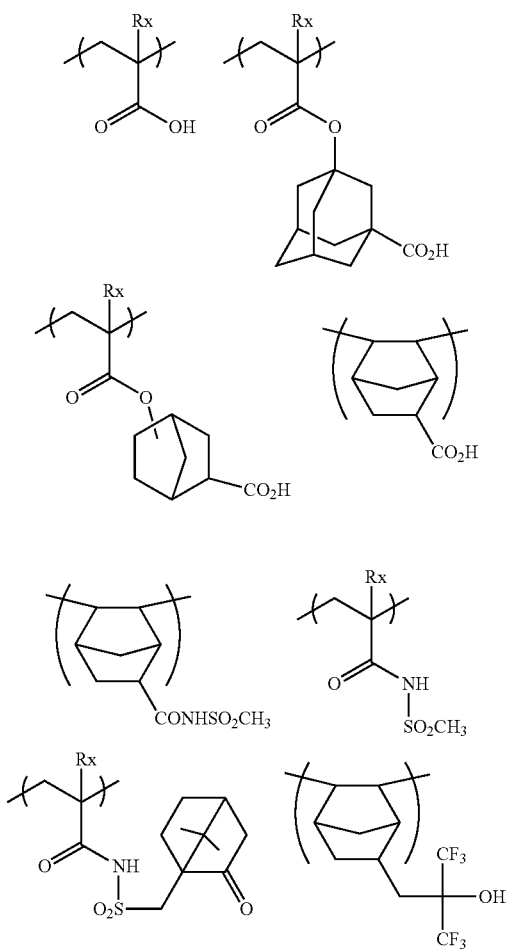

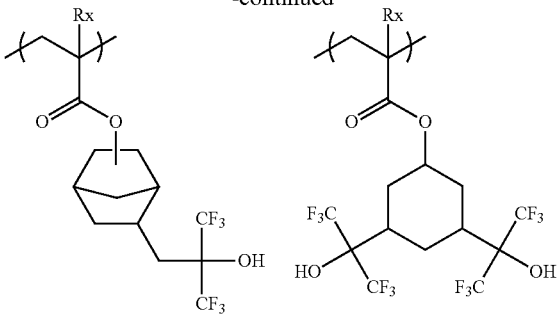

The resin (B) of the present invention may further contain a repeating unit which has an alicyclic hydrocarbon structure having no polar groups (for example, the alkali-soluble group, the hydroxyl group or the cyano group), and does not show acid decomposability. The repeating unit such as this may include a repeating unit represented by General Formula (IV).

[Chem. 67]

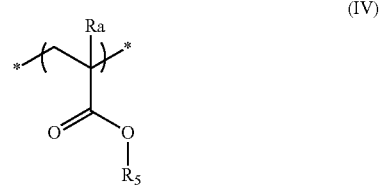

(IV)

In General Formula (IV), $R_5$ represents a hydrocarbon group having at least one cyclic structure and having no polar groups.

Ra represents a hydrogen atom, an alkyl group or a $-CH_2-O-Ra_2$ group. In the formula, $Ra_2$ represents a hydrogen atom, an alkyl group or an acyl group. Ra is preferably a hydrogen atom, a methyl group, a hydroxymethyl group or a trifluoromethyl group, and a hydrogen atom or a methyl group is particularly preferable.

The cyclic structure $R_5$ has includes a monocyclic hydrocarbon group and a polycyclic hydrocarbon group. Examples of the monocyclic hydrocarbon group include a cycloalkyl group having 3 to 12 carbon atoms such as a cyclopentyl group, a cyclohexyl group, a cycloheptyl group or a cyclooctyl group, or a cycloalkenyl group having 3 to 12 carbon atoms such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring-assembled hydrocarbon group and a crosslinked cyclic hydrocarbon group, and examples of the ring-assembled hydrocarbon group include a bicyclohexyl group or a perhydronaphthalenyl group. Examples of the crosslinked cyclic hydrocarbon ring include a dicyclic hydrocarbon ring such as a pinane ring, a bornane ring, a norpinane ring, a norbornane ring or a bicyclooctane ring (a bicyclo[2.2.2] octane ring or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$] undecane ring, a tetracyclic hydrocarbon ring such as a tetracyclo[4.4.0.1$^{2,5}$.1$^{7,10}$]dodecane ring or a perhydro-1,4-methano-5,8-methanonaphthalene ring, or the like. In addition, the crosslinked cyclic hydrocarbon ring may also include a condensed cyclic hydrocarbon ring, for example, a condensed cyclic ring in which a plurality of 5- to 8-membered cycloalkane rings such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring are condensed.

The preferable crosslinked cyclic hydrocarbon ring may include a norbornyl group, an adamantyl group, a bicyclooctanyl group, a tricyclo[5.2.1.0$^{2,6}$]decanyl group, or the like. The more preferable crosslinked cyclic hydrocarbon ring may include a norbornyl group or an adamantyl group.

These alicyclic hydrocarbon groups may have a substituent, and the preferable substituent may include a halogen atom, an alkyl group, a hydroxyl group in which the hydrogen atom is substituted, an amino group in which the hydrogen atom is substituted, or the like. The preferable halogen atom may include a bromine atom, a chlorine atom or a fluorine atom, and the preferable alkyl group may include a methyl group, an ethyl group, a butyl group or a t-butyl group. The alkyl group may further have a substituent, and the substituent the alkyl group may further have includes a halogen atom, an alkyl group, a hydroxyl group in which the hydrogen atom is substituted, or an amino group in which the hydrogen atom is substituted.

Examples of the group in which the hydrogen atom is substituted include an alkyl group, a cycloalkyl group, an aralkyl group, a substituted methyl group, a substituted ethyl group, an alkoxycarbonyl group, an aralkyloxycarbonyl group, or the like. The preferable alkyl group may include an alkyl group having 1 to 4 carbon atoms, the preferable substituted methyl group may include a methoxymethyl group, a methoxythiomethyl group, a benzyloxymethyl group, a t-butoxymethyl group or a 2-methoxyethoxymethyl group, the preferable substituted ethyl group may include a 1-ethoxyethyl group or a 1-methyl-1-methoxyethyl group, the preferable acyl group may include an aliphatic acyl group having 1 to 6 carbon atoms such as a formyl group, an acetyl group, a propionyl group, a butyryl group, an isobutyryl group, a valeryl group or a pivaloyl group, and the alkoxycarbonyl group may include an alkoxycarbonyl group having 1 to 4 carbon atoms, or the like.

The resin (B) may or may not contain a repeating unit which has an alicyclic hydrocarbon structure having no polar groups and does not show acid decomposability, however, when the resin (B) does, the content of this repeating unit is preferably 1 to 40 mol % and more preferably 2 to 20 mol % with regard to all repeating units in the resin (B).

Specific examples of the repeating unit which has an alicyclic hydrocarbon structure having no polar groups and does not show acid decomposability are shown below, however, the present invention is not limited to these. In the formula, Ra represents H, CH$_3$, CH$_2$OH or CF$_3$.

[Chem. 68]

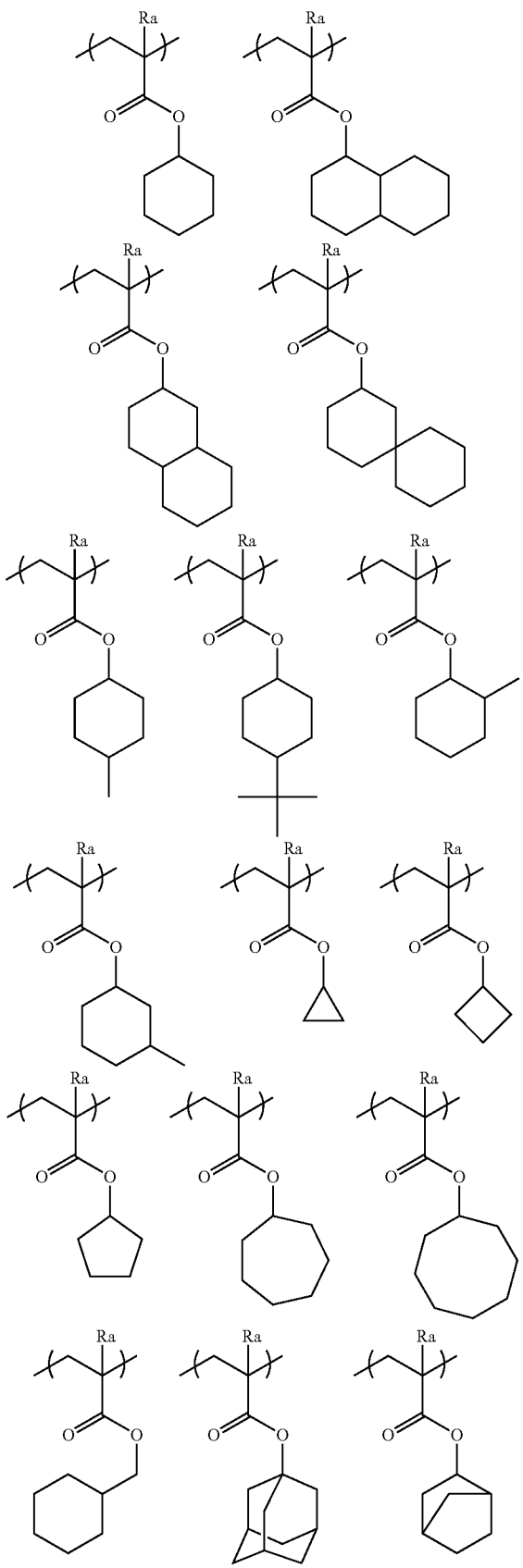

-continued

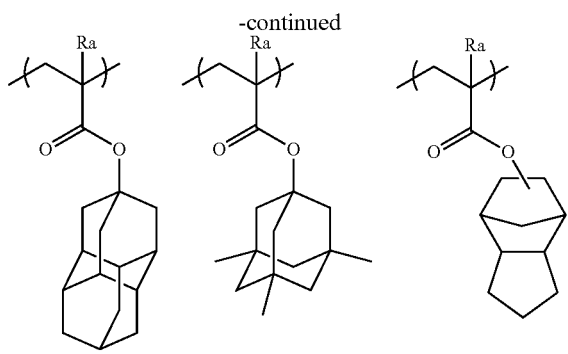

The resin (B) used in the composition of the present invention may have a variety of repeating structural units in addition to the above repeating structural units for the purpose of adjusting dry etching resistance or standard developer suitability, substrate adhesion, a resist profile, or characteristics generally needed for a resist such as resolution, heat resistance and sensitivity.

The repeating unit structures such as this may include, but are not limited to, repeating unit structures corresponding to the following monomers.

As a result, fine-tuning of the performances required for a resin used in the composition of the present invention, particularly, (1) solubility for a coating solvent, (2) film formability (glass transition point), (3) alkali developability, (4) film thinning (hydrophobicity, alkali-soluble group selection), (5) adhesion of the unexposed portion to the substrate, (6) dry etching resistance, or the like, becomes possible.

Examples of the monomer such as this may include a compound having one addition-polymerizable unsaturated bond selected from acrylates, methacrylates, acrylamides, methacrylamides, allyl compounds, vinyl ethers, vinyl esters, or the like.

In addition to these, addition-polymerizable unsaturated compounds copolymerizable with the monomers corresponding to a variety of repeating structural units described above may be copolymerized.

In the resin (B) used in the composition of the present invention, the molar ratio of the content of each repeating structural unit is appropriately determined in order to adjust dry etching resistance of the resist, standard developer suitability, substrate adhesion, a resist profile, and generally required performances of a resist such as resolution, heat resistance and sensitivity.

Practically, the resin (B) used in the composition of the present invention preferably does not have an aromatic ring in terms of transparency to ArF light when the composition of the present invention is for ArF exposure. More specifically, in all repeating units of the resin (B), the ratio of the repeating unit having an aromatic group is preferably 5 mol % or less, more preferably 3 mol % or less, and ideally 0 mol %, that is, an aromatic group being not present is even more preferable. In addition, the resin (B) preferably has a monocyclic or polycyclic alicyclic hydrocarbon structure.

In addition, the resin (B) preferably does not contain a fluorine atom or a silicon atom from the viewpoint of compatibility with a hydrophobic resin described later.

In the resin (B) used in the composition of the present invention, it is preferable that all the repeating units be composed of (meth)acrylate-based repeating units. In this case, any of the repeating units in which all the repeating units are methacrylate-based repeating units, all the repeating units are acrylate-based repeating units, and all the repeating units are methacrylate-based repeating units and acrylate-based repeating units may be used, however, the acrylate-based repeating unit being 50 mol % or less of all the repeating units is preferable. In addition, a copolymer, including 20 to 50 mol % of the (meth)acrylate-based repeating units having an acid decomposable group, 20 to 50 mol % of the (meth)acrylate-based repeating units having a lactone group, 5 to 30 mol % of the (meth)acrylate-based repeating units having an alicyclic hydrocarbon structure substituted with a hydroxyl group or a cyano group, and further including 0 to 20 mol % of other (meth)acrylate-based repeating units, is also preferable.

When KrF excimer laser light, an electron beam, X-rays, and a high-energy light beam with a wavelength of 50 nm or less (EUV and the like) are irradiated on the composition of the present invention, the resin (B) preferably further contains a hydroxystyrene-based repeating unit. More preferably, containing a hydroxystyrene-based repeating unit, a hydroxystyrene-based repeating unit protected by an acid decomposable group and an acid decomposable repeating unit such as tertiary alkyl (meth)acrylate is preferable.

Preferable examples of the hydroxystyrene-based repeating unit having an acid decomposable group include a repeating unit composed of t-butoxycarbonyloxy styrene, 1-alkoxyethoxy styrene, tertiary alkyl (meth)acrylate, or the like, and a repeating unit composed of 2-alkyl-2-adamantyl (meth)acrylate and dialkyl(1-adamantyl)methyl (meth)acrylate is more preferable.

The resin (B) in the present invention can be synthesized in accordance with conventional methods (for example, radical polymerization). Examples of the general synthesis method include a batch polymerization method in which polymerization is carried out by dissolving monomer species and an initiator in a solvent and heating the solution, a dropwise adding polymerization method in which a solution of monomer species and an initiator is added dropwise to a heating solvent over a period of 1 to 10 hours or the like, and a dropwise adding polymerization method is preferable. Examples of the reaction solvent include a solvent which dissolves the composition of the present invention such as ethers such as tetrahydrofuran, 1,4-dioxane or diisopropyl ether, ketones such as methyl ethyl ketone or methyl isobutyl ketone, ester solvents such as ethyl acetate, amide solvents such as dimethyl formamide or dimethyl acetamide, propylene glycol monomethyl ether acetate described later, propylene glycol monomethyl ether or cyclohexanone. Polymerization using the same solvent as the solvent used in the actinic ray-sensitive or radiation-sensitive resin composition of the present invention is more preferable. This suppresses generation of the particles during storage.

The polymerization reaction is preferably carried out under an inert gas atmosphere such as nitrogen or argon. As the polymerization initiator, commercially available radical initiators (an azo-based initiator, peroxide, or the like) are used to start the polymerization. The radical initiator is preferably an azo initiator, and the azo initiator having an ester group, a cyano group or a carboxyl group is preferable. Preferable initiators may include azobisisobutyronitrile, azobisdimethylvaleronitrile, dimethyl 2,2'-azobis(2-methyl propionate), or the like. The initiator is added, or added in installments as necessary, and after the reaction is complete, the resultant is poured into a solvent, and the target polymer is collected using a method such as powder or solid recovery. The concentration of the reaction is 5 to 50% by mass and preferably 10 to 30% by mass. The reaction temperature is normally 10 to 150° C., preferably 30 to 120° C., and more preferably 60 to 100° C.

After the reaction is complete, the resultant is allowed to cool to room temperature and purified. Purification may be carried out using common methods such as a liquid-liquid extraction method in which residual monomers and oligomer components are removed by washing with water or combining appropriate solvents, a purification method in a solution state such as ultrafiltration in which those with less than or equal to a specific molecular weight are extracted and removed, a re-precipitation method in which residual monomers and the like are removed by coagulating the resin in a poor solvent through a dropwise addition of the resin solution to a poor solvent, and a purification method in a solid state in which separated resin slurry is washed with a poor solvent. For example, the resin is precipitated as solids by contacting the resin with a sparingly soluble or insoluble solvent (a poor solvent) in 10 times or less of the volume of the reaction solution, and preferably 5 to 10 times the volume.

The solvent used during precipitation or re-precipitation from the polymer solution (precipitation or re-precipitation solvent) may be a poor solvent of the polymer, and may be appropriately selected and used from hydrocarbons, halogenated hydrocarbons, nitro compounds, ethers, ketones, esters, carbonates, alcohols, carboxylic acids, water, and a mixed solvent including these solvents, depending on the types of the polymer.

The amount of the precipitation or re-precipitation solvent used may be appropriately selected considering efficiency and yield, but in general, is 100 to 10,000 parts by mass, preferably 200 to 2,000 parts by mass, and is more preferably 300 to 1,000 parts by mass with regard to 100 parts by mass of the polymer solution.

The precipitation or re-precipitation temperature may be appropriately selected considering efficiency and operability, but is normally in the order of 0 to 50° C., and preferably in the vicinity of room temperature (for example, approximately 20 to 35° C.). Precipitation or re-precipitation operation may be carried out by well-known methods of batch-type or continuous-type using a commonly employed mixing vessel such as a stirring tank.

Typically, the precipitated or re-precipitated polymer is provided for use after being subjected to commonly employed solid-liquid separation such as filtration and centrifugation, and then dried. Filtration is carried out using a filtration material with solvent resistance, preferably under reduced pressure. Drying is carried out at a temperature of approximately 30 to 100° C., preferably approximately 30 to 50° C. under atmospheric pressure or reduced pressure (preferably under reduced pressure).

In addition, after the resin is precipitated and separated once, the resin is re-dissolved in a solvent, and then the resin may be brought into contact with a solvent in which the resin is sparingly soluble or insoluble. In other words, after the radical polymerization reaction above is complete, a method may be used in which the polymer is brought into contact with a solvent in which the polymer is sparingly soluble or insoluble, and the resin is precipitated (step a), the resin is separated from the solution (step b), then, the resin is re-dissolved in a solvent and the resin solution A is prepared (step c), after that, the resin solid is precipitated by bringing the resin solution A into contact with a solvent in which the resin is sparingly soluble or insoluble in less than 10 times volume of the resin solution A (preferably 5 times or less volume) (step d), and the resin precipitated is separated (step e).

Moreover, in order to suppress aggregation or the like of the resin after the composition is prepared, a step, in which the resin synthesized is dissolved in a solvent to become a solution and the solution is heated at approximately 30 to 90° C. for approximately 30 minutes to 4 hours, may be added as disclosed in, for example, JP2009-037108A.

The weight-average molecular weight of the resin (B) used in the composition of the present invention, as a polystyrene conversion value by a GPC method, is preferably 1,000 to 200,000, more preferably 2,000 to 20,000, even more preferably 3,000 to 15,000, and particularly preferably 3,000 to 12,000. By keeping the weight-average molecular weight as 1,000 to 200,000, deterioration of heat resistance and dry etching resistance may be prevented and deterioration of developability or deterioration of film formability due to an increase in viscosity may be prevented.

The degree of dispersion (molecular weight distribution, Mw/Mn) is typically in the range of 1.0 to 3.0, preferably 1.0 to 2.6, more preferably 1.0 to 2.0, and particularly preferably 1.4 to 2.0. The narrower the molecular weight distribution is, the resolution and the resist shape are excellent, the side wall of the resist pattern is also smooth, and the roughness property is excellent. In the present specification, the weight-average molecular weight (Mw) and the number average molecular weight (Mn) of the resin (B), may be measured using, for example, an HLC-8120 (manufactured by Tosoh Co., Ltd.), and, for a column, a TSK gel Multipore HXL-M (manufactured by Tosoh Co., Ltd., 7.8 mm ID×30.0 cm), and as an eluent, THF (tetrahydrofuran) are used.

In the actinic ray-sensitive or radiation-sensitive resin composition of the present invention, the mixing amount of the resin (B) in the entire composition is preferably 30 to 99% by mass, and more preferably 60 to 95% by mass in total solid contents.

In addition, the resin (B) of the present invention may be used either alone or as a combination of two types or more.

Furthermore, other resins in addition to the resin (B) may be used in combination as long as the effects of the present invention are not impaired. The other resins may include the acid decomposable resin which may contain the repeating unit which the resin (B) is capable of containing, and other well-known acid decomposable resins.

[3] Hydrophobic Resin

The actinic ray-sensitive or radiation-sensitive resin composition of the present invention may contain a hydrophobic resin which has at least any of a fluorine atom and a silicon atom, particularly when applied to liquid immersion exposure (hereinafter, also referred as a "hydrophobic resin (HR)"). As a result, the hydrophobic resin (HR) can be localized on the surface layer of the film, and may improve the immersion liquid traceability by improving a static/dynamic contact angle of the resist film surface for water when a liquid immersion medium is water.

The hydrophobic resin (HR) is preferably designed to be localized on the surface as described above, however, unlike surfactants, does not need to have a hydrophilic group within the molecule and does not necessarily contribute to uniformly mixing the polar/non-polar substances.

The hydrophobic resin (HR) typically includes a fluorine atom and/or a silicon atom. The fluorine atom and/or the silicon atom in the hydrophobic resin (HR) may be included in the main chain of the resin or included in the side chain.

When the hydrophobic resin (HR) includes a fluorine atom, a resin having an alkyl group having a fluorine atom, a cycloalkyl group having a fluorine atom, or an aryl group having a fluorine atom is preferable as the partial structure having a fluorine atom.

The alkyl group having a fluorine atom (preferably having 1 to 10 carbon atoms and more preferably having 1 to 4 carbon atoms) is a linear or branched alkyl group in which at least one hydrogen atom is substituted with a fluorine atom, and may have further substituents in addition to a fluorine atom.

The cycloalkyl group having a fluorine atom is a monocyclic or polycyclic cycloalkyl group of which at least one hydrogen atom is substituted with a fluorine atom, and may have further substituents in addition to a fluorine atom.

The aryl group having a fluorine atom is an aryl group such as a phenyl group, a naphthyl group, or the like, of which at least one hydrogen atom is substituted with a fluorine atom, and may have further substituents in addition to a fluorine atom.

As the alkyl group having a fluorine atom, the cycloalkyl group having a fluorine atom, and the aryl group having a fluorine atom may include a group represented by the following General Formulae (F2) to (F4), however, the present invention is not limited to these.

[Chem. 69]

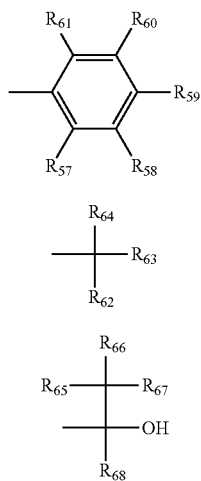

In General Formulae (F2) to (F4), $R_{57}$ to $R_{68}$ each independently represent a hydrogen atom, a fluorine atom, or an alkyl group (linear or branched). However, at least one of $R_{57}$ to $R_{61}$, at least one of $R_{62}$ to $R_{64}$ and at least one of $R_{65}$ to $R_{68}$ each independently represent a fluorine atom or an alkyl group of which at least one hydrogen atom is substituted with a fluorine atom (preferably 1 to 4 carbon atoms).

$R_{57}$ to $R_{61}$ and $R_{65}$ to $R_{67}$ are preferably all fluorine atoms. $R_{62}$, $R_{63}$, and $R_{68}$ are preferably a fluoroalkyl group (preferably having 1 to 4 carbon atoms), and more preferably a perfluoroalkyl group having 1 to 4 carbon atoms. When $R_{62}$ and $R_{63}$ are perfluoroalkyl groups, $R_{64}$ is preferably a hydrogen atom. $R_{62}$ and $R_{63}$ may be bonded to each other to form a ring.

Specific examples of the group represented by General Formula (F2) may include a p-fluorophenyl group, a pentafluorophenyl group, and a 3,5-di(trifluoromethyl)phenyl group, or the like.

Specific examples of the group represented by General Formula (F3) may include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group, or the like. A hexafluoroisopropyl group, heptafluoroisopropyl group, a hexafluoro(2-methyl)isopropyl group, an octafluoroisobutyl group, a nonafluoro-t-butyl group or a perfluoroisopentyl group is preferable, and a hexafluoroisopropyl group or a heptafluoroisopropyl group is more preferable.

Specific examples of the group represented by General Formula (F4) may include —C(CF$_3$)$_2$OH, —C(C$_2$F$_5$)$_2$OH, —C(CF$_3$)(CH$_3$)OH, —CH(CF$_3$)OH, or the like, and —C(CF$_3$)$_2$OH is preferable.

The partial structure including a fluorine atom may be bonded directly to the main chain, or may be bonded to the main chain through a group selected from the group consisting of an alkylene group, a phenylene group, an ether bond, a thioether bond, a carbonyl group, an ester bond, an amide bond, a urethane bond, and a ureylene bond, or a group combining two or more of these.

The suitable repeating unit having a fluorine atom may include units shown below

[Chem. 70]

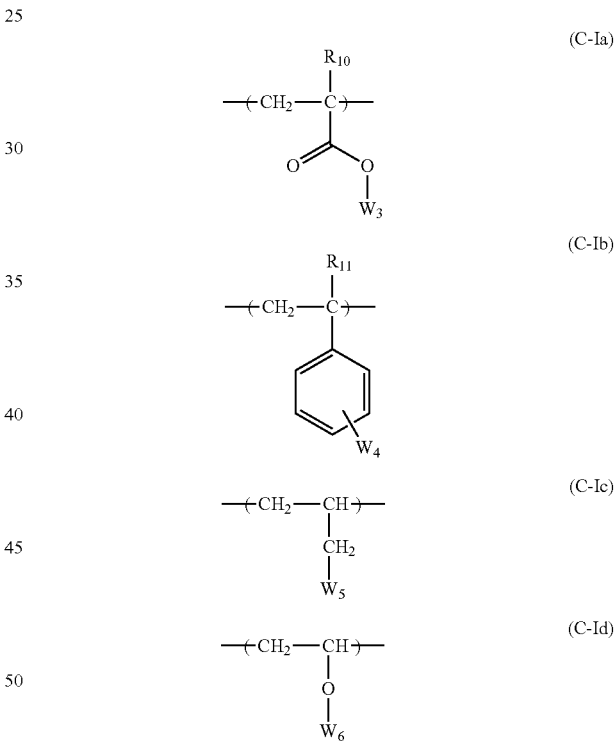

In the formula, $R_{10}$ and $R_{11}$ each independently represent a hydrogen atom, a fluorine atom or an alkyl group. The alkyl group is preferably a linear or branched alkyl group having 1 to 4 carbon atoms, may have a substituent, and the alkyl group having a substituent may particularly include a fluorinated alkyl group.

$W_3$ to $W_6$ each independently represent an organic group containing at least one or more fluorine atom. Specifically, an atomic group of (F2) to (F4) may be included.

Furthermore, in addition to these, the hydrophobic resin may have a unit represented below as a repeating unit having a fluorine atom.

[Chem. 71]

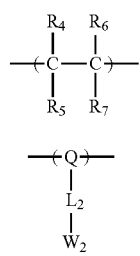

(C-II)

(C-III)

In the formula, $R_4$ to $R_7$ each independently represent a hydrogen atom, a fluorine atom, or an alkyl group. The alkyl group is preferably a linear or branched alkyl group having 1 to 4 carbon atoms, may have a substituent, and the alkyl group having a substituent may particularly include a fluorinated alkyl group.

However, at least one of $R_4$ to $R_7$ represents a fluorine atom. $R_4$ and $R_5$ or $R_6$ and $R_7$ may form a ring.

$W_2$ represents an organic group containing at least one fluorine atom. Specifically, an atomic group of (F2) to (F4) may be included.

$L_2$ represents a single bond or a divalent linking group. The divalent linking group may be a substituted or unsubstituted arylene group, a substituted or unsubstituted alkylene group, a substituted or unsubstituted cycloalkylene group, —O—, —$SO_2$—, —CO—, —N(R)— (in the formula, R represents a hydrogen atom or an alkyl group), —$NHSO_2$— or a divalent linking group combining a plurality of these.

Q represents an alicyclic structure. The alicyclic structure may have a substituent, be a monocyclic type, or a polycyclic type, and may be a bridge type in case of a polycyclic type. The monocyclic type is preferably a cycloalkyl group having 3 to 8 carbon atoms, and may include, for example, a cyclopentyl group, a cyclohexyl group, a cyclobutyl group, a cyclooctyl group or the like. The polycyclic type may include a group having a bicyclo structure, a tricyclo structure, a tetracyclo structure, or the like, having 5 or more carbon atoms, is preferably a cycloalkyl group having 6 to 20 carbon atoms, and may include, for example, an adamantyl group, a norbornyl group, a dicyclopentyl group, a tricyclodecanyl group, a tetracyclododecyl group, or the like. In addition, at least one carbon atom in the cycloalkyl group may be substituted with a hetero atom such as an oxygen atom. The particularly preferable Q may include a norbornyl group, a tricyclodecanyl group, a tetracyclododecyl group, or the like.

The hydrophobic resin may also contain a silicon atom.

As the partial structure having a silicon atom, a resin having an alkylsilyl structure (preferably a trialkylsilyl group) or a cyclic siloxane structure is preferable.

The alkylsilyl structure or the cyclic siloxane structure may include, specifically, a group represented by the following General Formulae (CS-1) to (CS-3).

[Chem. 72]

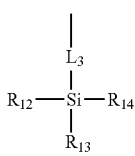

(CS-1)

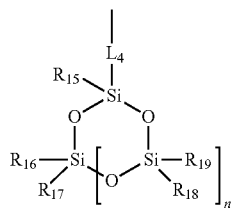

(CS-2)

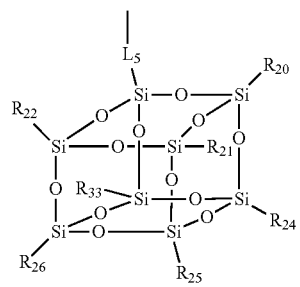

(CS-3)

In General Formulae (CS-1) to (CS-3), $R_{12}$ to $R_{26}$ each independently represent a linear or branched alkyl group (preferably 1 to 20 carbon atoms) or a cycloalkyl group (preferably 3 to 20 carbon atoms).

$L_3$ to $L_5$ represent a single bond or a divalent linking group. As the divalent linking group, a single group or a combination of two or more selected from the group consisting of an alkylene group, a phenylene group, an ether bond, a thioether bond, a carbonyl group, an ester bond, an amide bond, a urethane bond or a ureylene bond, may be included.

n represents an integer of 1 to 5. n is preferably an integer of 2 to 4.

The repeating unit having at least any of a fluorine atom or a silicon atom is preferably a (meth)acrylate-based repeating unit.

Specific examples of the repeating unit having at least any of a fluorine atom or a silicon atom are shown below, however, the present invention is not limited to these. In addition, in the specific examples, $X_1$ represents a hydrogen atom, —$CH_3$, —F or —$CF_3$, and $X_2$ represents —F or —$CF_3$.

[Chem. 73]

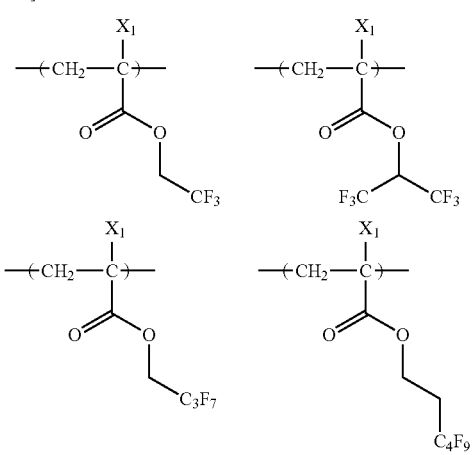

93
-continued
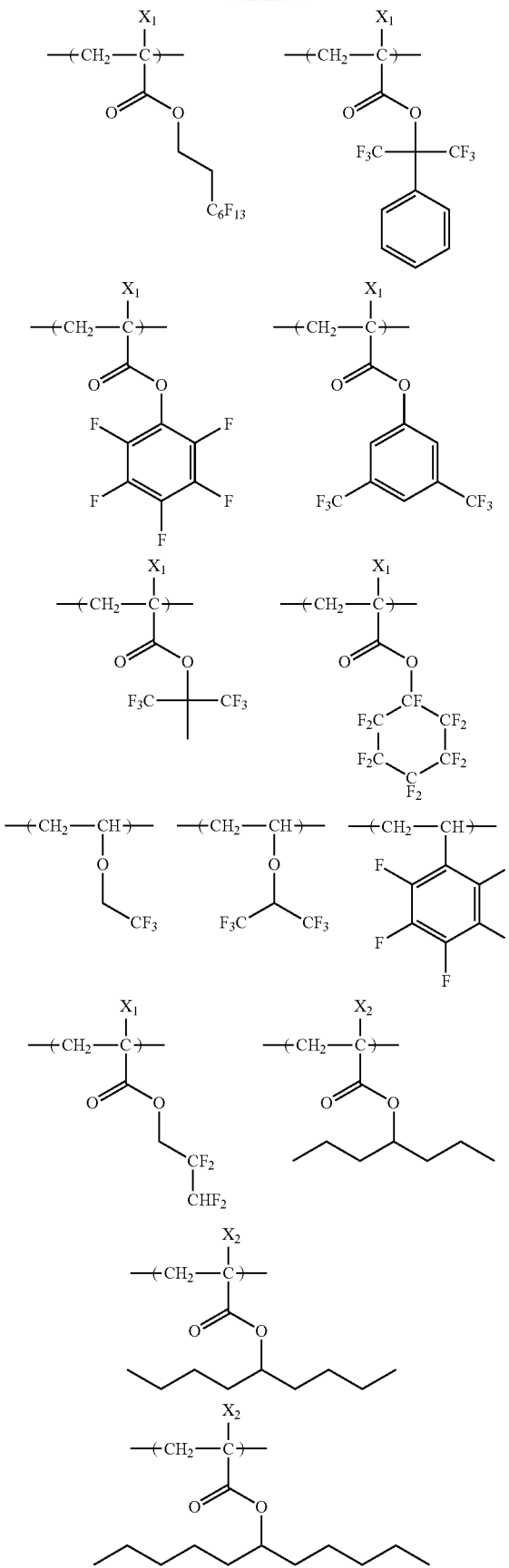
94
-continued
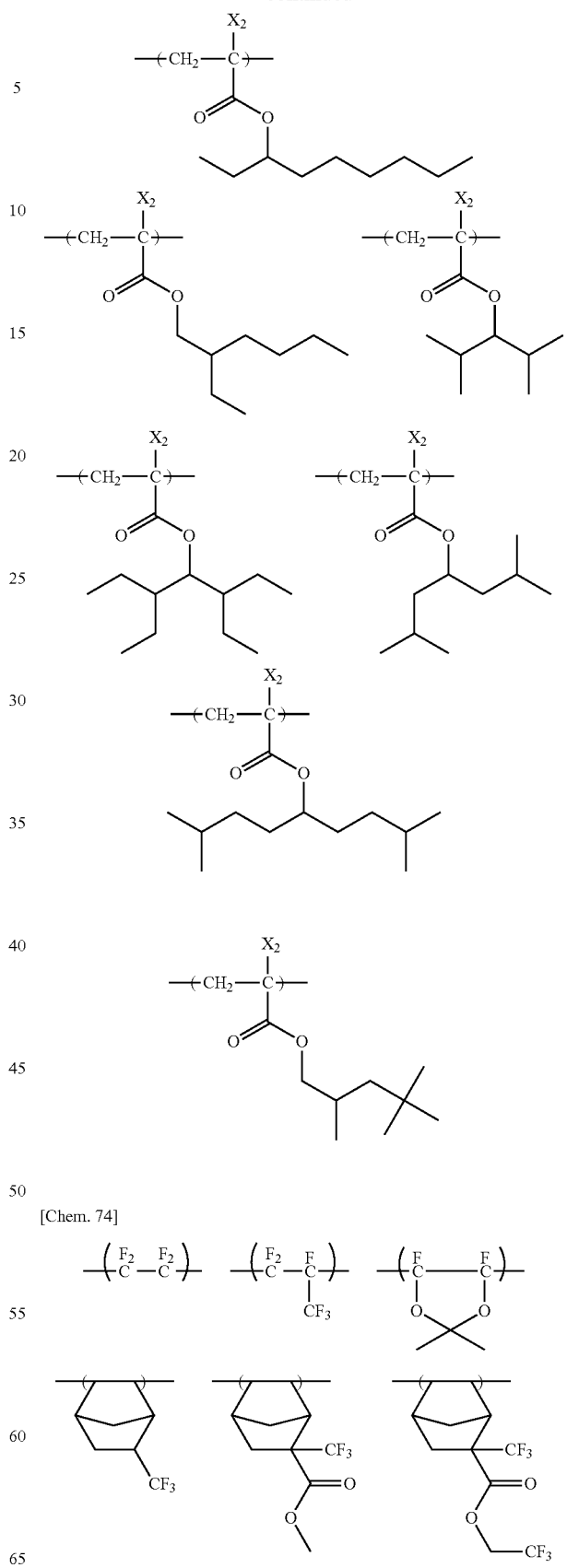
[Chem. 74]

-continued
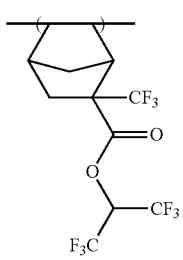
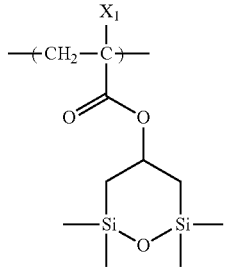
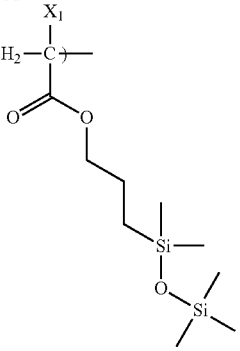
[Chem. 75]
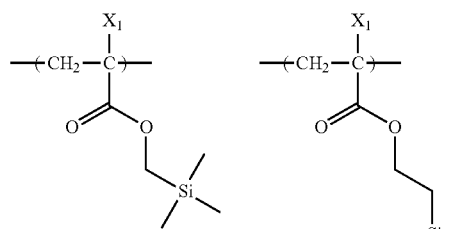
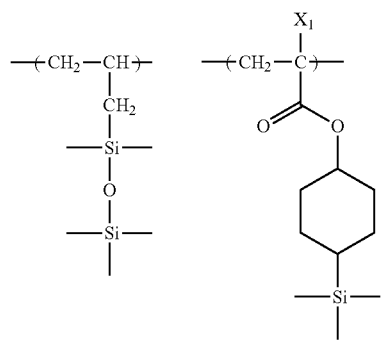
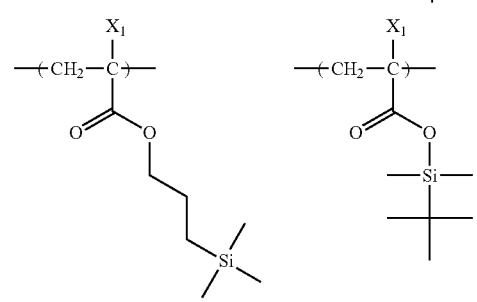
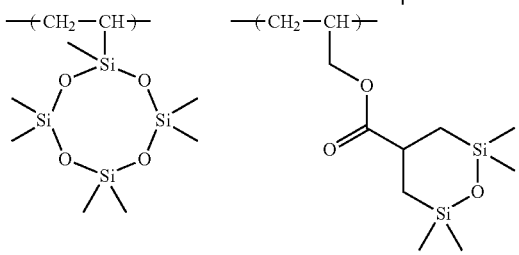
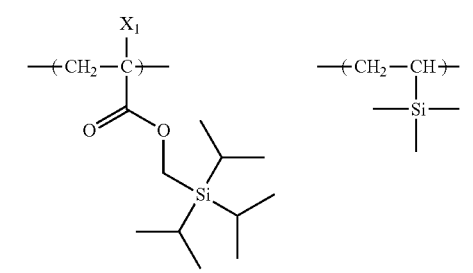
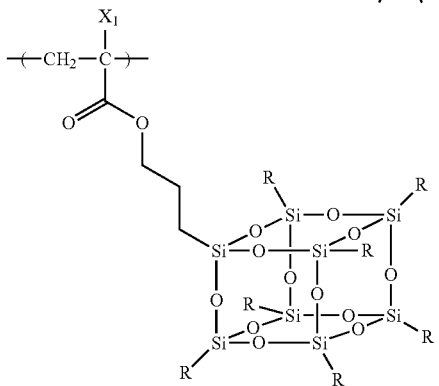
R = $CH_3$, $C_2H_5$, $C_3H_7$, $C_4H_9$
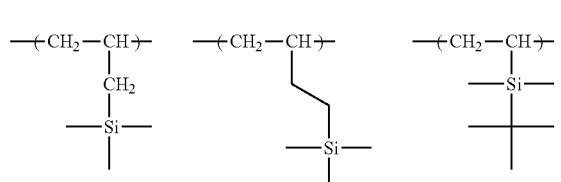
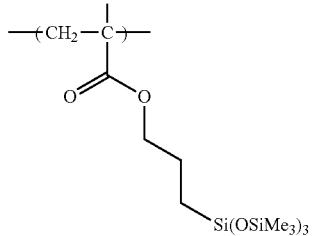
$Si(OSiMe_3)_3$
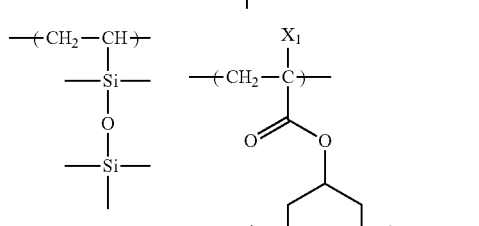
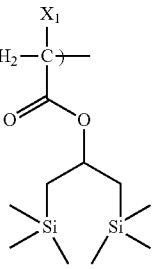
Furthermore, the hydrophobic resin may contain a repeating unit (b) having at least one group selected from the group consisting of the following (x) to (z).
(x) an alkali-soluble group (y) a group of which solubility in an alkali developer increases by being decomposed by the action of an alkali developer (hereinafter, also referred to as a polarity conversion group)

(z) a group of which solubility in an alkali developer increases by being decomposed by the action of an acid The repeating unit (b) may include the following types A repeating unit (b' j which has at least any of a fluorine atom and a silicon atom on one side chain, and at least one group selected from the group consisting of the (x) to (z)

A repeating unit (b*) which has at least one group selected from the group consisting of the (x) to (z), and does not have a fluorine atom and a silicon atom A repeating unit (b") which has at least one group selected from the group consisting of the (x) to (z) on one side chain, and has at least any of a fluorine atom and a silicon atom on a side chain different from the side chain within the same repeating unit The hydrophobic resin preferably has the repeating unit (b') as the repeating unit (b). That is, it is more preferable that the repeating unit (b) having at least one group selected from the group consisting of the (x) to (z) have at least any of a fluorine atom and a silicon atom.

Furthermore, when the hydrophobic resin has the repeating unit (b*), a copolymer with a repeating unit which has at least any of a fluorine atom and a silicon atom (a repeating unit different from the repeating units (b') and (b")) is preferable. In addition, in the repeating unit (b"), the side chain having at least one group selected from the group consisting of the (x) to (z), and the side chain having at least any of a fluorine atom and a silicon atom are bonded to the same carbon atom in the main chain. That is, a positional relation such as the following Formula (K1) is preferable.

In the formula, B1 represents a partial structure having at least one group selected from the group consisting of the (x) to (z), and B2 represents a partial structure having at least any of a fluorine atom and a silicon atom.

[Chem. 76]

(K1)

The group selected from the group consisting of the (x) to (z) is preferably (x) the alkali-soluble group or (y) the polarity conversion group, and more preferably (y) the polarity conversion group.

The alkali-soluble group (x) may include a phenolic hydroxyl group, a carboxylate group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group or the like.

The preferable alkali-soluble group may include a fluorinated alcohol group (preferably hexafluoroisopropanol), a sulfonamide group, and a bis(alkylcarbonyl)methylene group.

As the repeating unit (bx) having an alkali-soluble group (x), a repeating unit in which the alkali-soluble group is bonded directly to the main chain of the resin such as a repeating unit of acrylic acid or methacrylic acid, a repeating unit in which the alkali-soluble group is bonded to the main chain of the resin through a linking group, or the like, may be included, or introducing the repeating unit to the end of the polymer chain using a polymerization initiator or a chain transfer agent having an alkali-soluble group when polymerized is also possible, and any of these cases is preferable.

When the repeating unit (bx) is a repeating unit having at least any of a fluorine atom and a silicon atom (that is, when corresponding to the repeating unit (b') or (b")), the partial structure having a fluorine atom in the repeating unit (bx) may include the same structure included in the above repeating unit having at least any of a fluorine atom and a silicon atom, and preferably include a group represented by General Formulae (F2) to (F4). Furthermore, in this case, the partial structure having a silicon atom in the repeating unit (bx) may include the same structure included in the above repeating unit having at least any of a fluorine atom and a silicon atom, and preferably include a group represented by General Formulae (CS-1) to (CS-3).

The content of the repeating unit (bx) having an alkali-soluble group (x) is preferably 1 to 50 mol %, more preferably 3 to 35 mol %, and even more preferably 5 to 20 mol % with regard to all repeating units in the hydrophobic resin.

Specific examples of the repeating unit (bx) having an alkali-soluble group (x) are shown below, however, the present invention is not limited to these. In addition, in the specific examples, $X_1$ represents a hydrogen atom, —$CH_3$, —F, or —$CF_3$.

[Chem. 77]

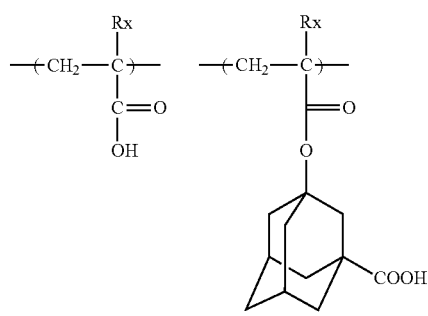

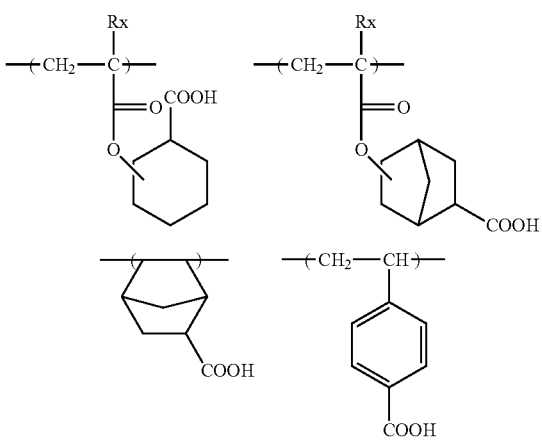

-continued
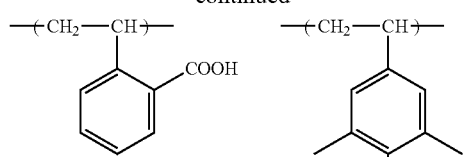
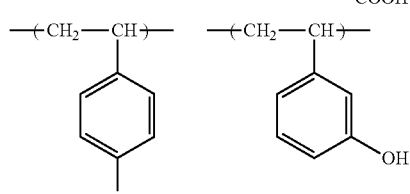
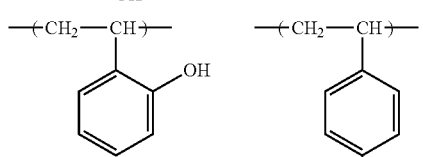
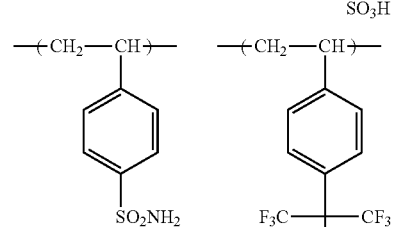
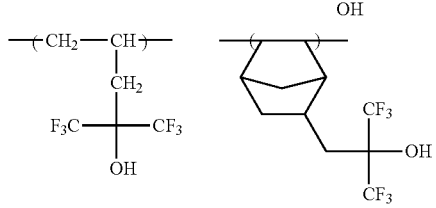
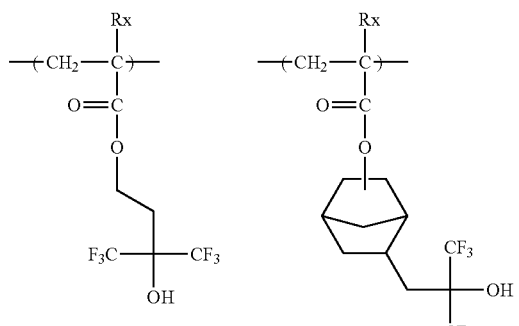
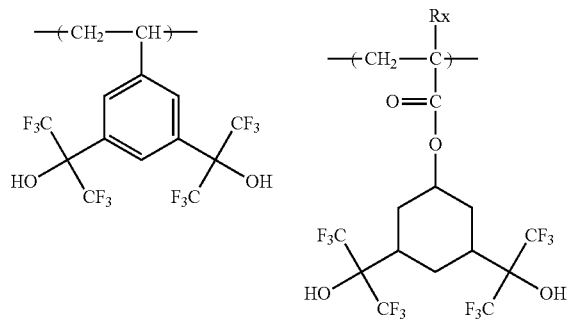
-continued
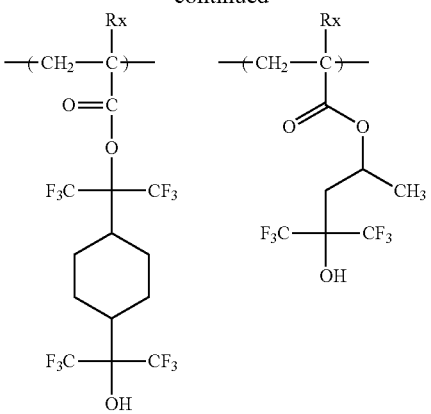
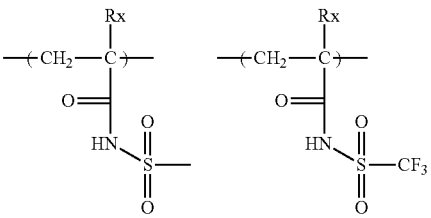
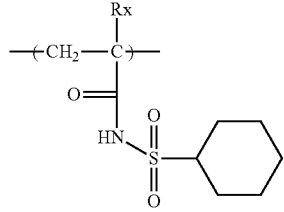
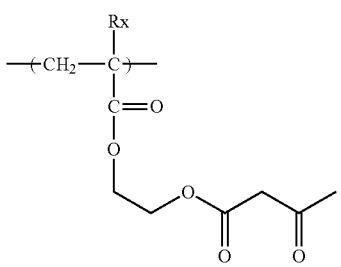
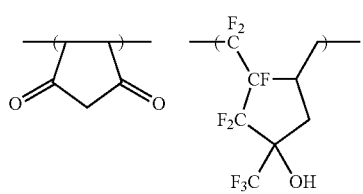

-continued

[Chem. 78]

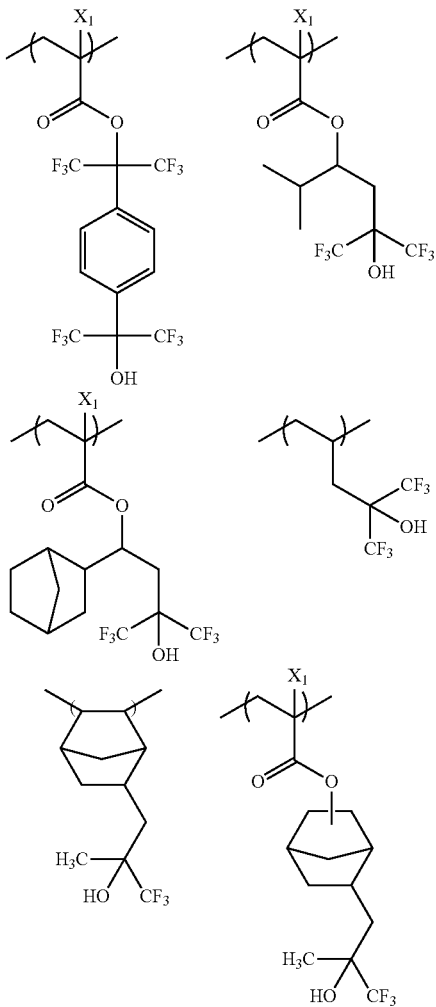

Examples of the polarity conversion group (y) include a lactone group, a carboxylate group (—COO—), an acid anhydride group (—C(O)OC(O)—), an acid imide group (—NHCONH—), a thiocarboxylate group (—COS—), a carbonate group (—OC(O)O—), a sulfate group (—OSO₂O—), a sulfonate group (—SO₂O—) or the like, and is preferably a lactone group.

The polarity conversion group (y) is preferably, for example, introduced to the side chain of the resin by being included in the repeating unit composed of an acrylate or a methacrylate, or introduced to the end of the polymer chain using a polymerization initiator or a chain transfer agent having a polarity conversion group (y) when polymerized.

Specific examples of the repeating unit (by) having a polarity conversion group (y) include a repeating unit having a lactone structure represented by the following Formulae (KA-1-1) to (KA-1-17).

The repeating unit (by) having a polarity conversion group (y) is preferably a repeating unit having at least any of a fluorine atom and a silicon atom (that is, corresponding to the repeating unit (b') or (b")). The resin having such a repeating unit (by) has hydrophobicity, but is preferable in terms of the reduction of development defects, in particular.

Examples of the repeating unit (by) include a repeating unit represented by Formula (K0).

[Chem. 79]

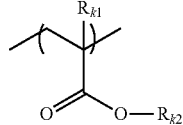

(K0)

In the formula, $R_{k1}$ represents a hydrogen atom, a halogen atom, a hydroxyl group, an alkyl group, a cycloalkyl group, an aryl group or a group including a polarity conversion group.

$R_{k2}$ represents an alkyl group, a cycloalkyl group, an aryl group or a group including a polarity conversion group.

However, at least one of $R_{k1}$ and $R_{k2}$ represents a group including a polarity conversion group.

The polarity conversion group, as described above, represents a group of which solubility in an alkali developer increases by being decomposed by the action of an alkali developer. The polarity conversion group is preferably a group represented by X in the partial structure represented by General Formula (KA-1) or (KB-1).

[Chem. 80]

(KA-1)

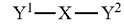

(KB-1)

X in General Formula (KA-1) or (KB-1) represents a carboxylate group: —COO—, an acid anhydride group: —C(O)OC(O)—, an acid imide group: —NHCONH—, a thiocarboxylate group: —COS—, a carbonate group: —OC(O)O—, a sulfate group: —OSO₂O—, a sulfonate group: —SO₂O—.

$Y^1$ and $Y^2$ may be the same as or different from each other, and represent an electron-withdrawing group.

In addition, the repeating unit (by) preferably has a group of which solubility in an alkali developer increases due to inclusion of a partial structure represented by General Formula (KA-1) or (KB-1), but when that partial structure does not have a bond such as a partial structure represented by General Formula (KA-1) or a partial structure represented by General Formula (KB-1) when $Y^1$ and $Y^2$ are monovalent, the group having that partial structure is a group having a monovalent or higher group excluding at least one arbitrary hydrogen atom in that partial structure.

The partial structure represented by General Formula (KA-1) or (KB-1) is bonded to the main chain of the hydrophobic resin through a substituent at an arbitrary position.

The partial structure represented by General Formula (KA-1) is a structure which forms a ring structure with the group as X.

The X in General Formula (KA-1) is preferably a carboxylate group (that is, a case in which a lactone ring structure is formed as KA-1), an acid anhydride group and a carbonate group, and more preferably a carboxylate group.

The ring structure represented by General Formula (KA-1) may have a substituent, and for example, may have an nka number of substituents $Z_{ka1}$.

$Z_{ka1}$ represents a halogen atom, an alkyl group, a cycloalkyl group, an ether group, a hydroxyl group, an amide group, an aryl group, a lactone ring group, or an electron-withdrawing group. $Z_{ka1}$s may be the same as or different from each other when present in plural number.

$Z_{ka1}$s may be bonded to each other to form a ring. Examples of the ring formed by $Z_{ka1}$s being bonded to each other include a cycloalkyl ring or a heteroring (a cyclic ether ring, a lactone ring, or the like).

nka represents an integer of 0 to 10. nka is preferably an integer of 0 to 8, more preferably an integer of 0 to 5, even more preferably an integer of 1 to 4, and most preferably an integer of 1 to 3.

The electron-withdrawing group as $Z_{ka1}$ is the same electron-withdrawing group as $Y^1$ and $Y^2$ described later. In addition, other electron-withdrawing groups may be substituted on the electron-withdrawing group.

$Z_{ka1}$ is preferably an alkyl group, a cycloalkyl group, an ether group, a hydroxyl group or an electron-withdrawing group and more preferably a cycloalkyl group or an electron-withdrawing group. In addition, the ether group is preferably an ether group substituted with an alkyl group or cycloalkyl group and the like, that is, an alkyl ether group or the like. The electron-withdrawing group is synonymous with the above electron-withdrawing group.

The halogen atom as $Z_{ka1}$ may include a fluorine atom, a chlorine atom, a bromine atom, an iodine atom, and the like, and is preferably a fluorine atom.

The alkyl group as $Z_{ka1}$ may have a substituent, and may be either linear or branched. The linear alkyl group is preferably an alkyl group having 1 to 30 carbon atoms, and more preferably an alkyl group having 1 to 20 carbon atoms, and includes, for example, a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, an n-decanyl group, or the like. The branched alkyl group is preferably an alkyl group having 3 to 30 carbon atoms, and more preferably an alkyl group having 3 to 20 carbon atoms, and includes, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decanyl group, or the like. An alkyl group having 1 to 4 carbon atoms such as a methyl group, an ethyl group, an n-propyl group, an i-propyl group, an n-butyl group, an i-butyl group or a t-butyl group is preferable.

The cycloalkyl group as $Z_{ka1}$ may have a substituent, and may be either monocyclic or polycyclic. In the case of being polycyclic, the cycloalkyl group may be a bridged type. That is, in this case, the cycloalkyl group may have a crosslinked structure. The monocyclic cycloalkyl group is preferably a cycloalkyl group having 3 to 8 carbon atoms, and includes, for example, a cyclopropyl group, a cyclopentyl group, a cyclohexyl group, a cyclobutyl group, a cyclooctyl group or the like. The polycyclic cycloalkyl group may include a group having a bicyclo, tricyclo or tetracyclo structure having 5 or more carbon atoms, is preferably a cycloalkyl group having 6 to 20 carbon atoms, and includes, for example, an adamantyl group, a norbornyl group, an isobornyl group, a camphanyl group, a dicyclopentyl group, an α-pinel group, a tricyclodecanyl group, a tetracyclodecanyl group or an androstanyl group. The following structures are also preferable as the cycloalkyl group. Furthermore, at least one carbon atom in the cycloalkyl group may be substituted with a heteroatom such as an oxygen atom.

[Chem. 81]

 (1)

 (2)

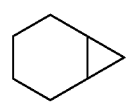 (3)

 (4)

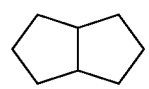 (5)

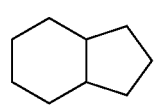 (6)

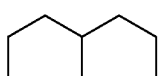 (7)

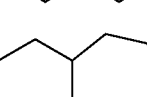 (8)

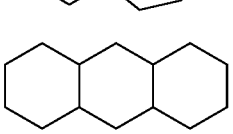 (9)

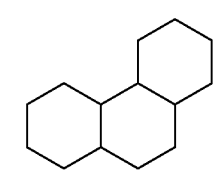 (10)

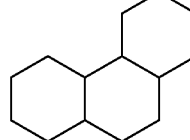 (11)

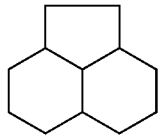 (12)

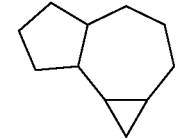 (13)

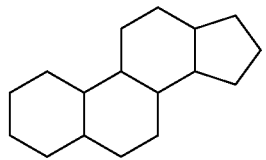

| | |
|---|---|
| (14) 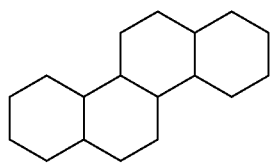 | (26) 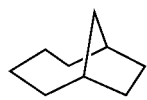 |
| (15) 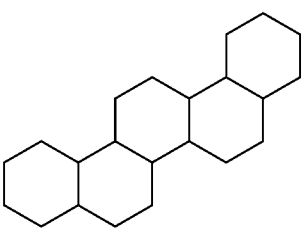 | (27) 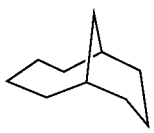 |
| (16)  | (28) 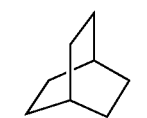 |
| (17)  | (29) 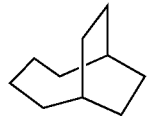 |
| (18)  | (30) 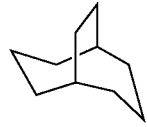 |
| (19)  | (31) 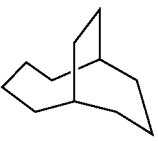 |
| (20)  | (32) 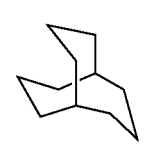 |
| (21)  | (33) 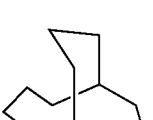 |
| (22)  | (34)  |
| (23)  | (35)  |
| (24) 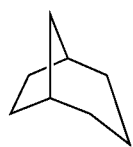 | (35)  |
| (25)  | (36) 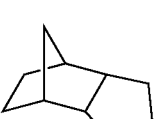 |

(37) 

(38) 

(39) 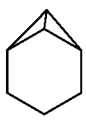

(40) 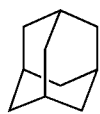

(41) 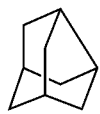

(42) 

(43) 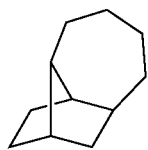

(44) 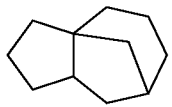

(45) 

(46) 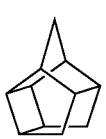

(47) 

(48) 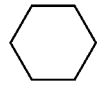

(49) 

(50) 

The preferable alicyclic portion may include an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group. An adamantyl group, a decalin group, a norbornyl group, a cedrol group, a cyclohexyl group, a cycloheptyl group, a cyclooctyl group, a cyclodecanyl group, a cyclododecanyl group or a tricyclodecanyl group is more preferable.

The substituent of these alicyclic structures may include an alkyl group, a halogen atom, a hydroxyl group, an alkoxy group, a carboxyl group or an alkoxycarbonyl group. The alkyl group is preferably a lower alkyl group such as a methyl group, an ethyl group, a propyl group, an isopropyl group or a butyl group, and more preferably represents a methyl group, an ethyl group, a propyl group, an isopropyl group. The alkoxy group described above may preferably include an alkoxy group having 1 to 4 carbon atoms such as a methoxy group, an ethoxy group, a propoxy group, a butoxy group. The substituent which the alkyl group and the alkoxy group may have includes a hydroxyl group, a halogen atom, an alkoxy group (preferably having 1 to 4 carbon atoms), or the like.

In addition, the group may further have a substituent, and the substituent may include a hydroxyl group, a halogen atom (fluorine, chlorine, bromine, iodine), a nitro group, a cyano group, the alkyl group described above, an alkoxy group such as a methoxy group, an ethoxy group, a hydroxyethoxy group, a propoxy group, a hydroxypropoxy group, an n-butoxy group, an isobutoxy group, a sec-butoxy group or a t-butoxy group, an alkoxycarbonyl group such as a methoxycarbonyl group or an ethoxycarbonyl group, an aralkyl group such as a benzyl group, a phenethyl group or a cumyl group, an aralkyloxy group, an acyl group such as a formyl group, an acetyl group, a butyryl group, a benzoyl group, a cyanamyl group or a valeryl group, an acyloxy group such as a butyryloxy group, an alkenyl group such as a vinyl group, a propenyl group or an allyl group, an alkenyloxy group such as a vinyloxy group, a propenyloxy group, an allyloxy group or a butenyloxy group, an aryl group such as a phenyl group or a naphthyl group, an aryloxy group such as a phenoxy group, an aryloxycarbonyl group such as a benzoyloxy group, or the like.

It is preferable that X in General Formula (KA-1) be a carboxylate group, and the partial structure represented by General Formula (KA-1) be a lactone ring and be a 5- to 7-membered lactone ring.

In addition, as in the following (KA-1-1) to (KA-1-17), it is preferable that other ring structure be condensed to a lactone ring having a 5- to 7-membered ring represented by General Formula (KA-1) in a way to form a bicyclo structure or a spiro structure.

The surrounding ring structures to which the ring structure represented by General Formula (KA-1) may be bonded may include those in the following (KA-1-1) to (KA-1-17), or those conforming with these.

The structure containing a lactone ring structure represented by General Formula (KA-1) is more preferably a structure represented by any of the following (KA-1-1) to (KA-1-17). In addition, the lactone structure may be bonded directly to a main chain. The preferable structures are (KA-1-1), (KA-1-4), (KA-1-5), (KA-1-6), (KA-1-13), (KA-1-14) and (KA-1-17).

[Chem. 82]

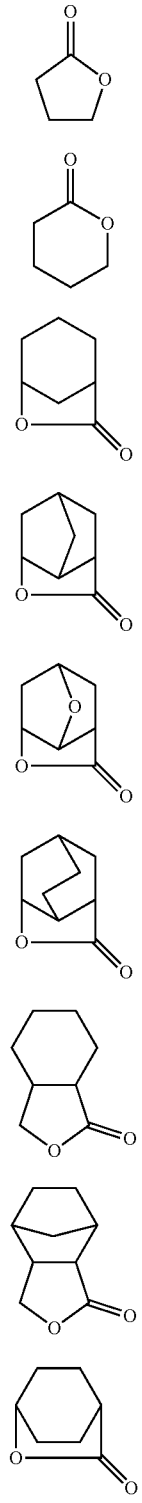

KA-1-1
KA-1-2
KA-1-3
KA-1-4
KA-1-5
KA-1-6
KA-1-7
KA-1-8
KA-1-9

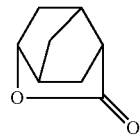

KA-1-10

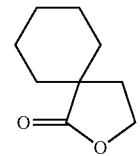

KA-1-11

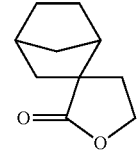

KA-1-12

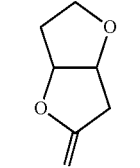

KA-1-13

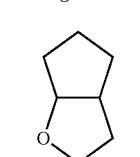

KA-1-14

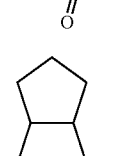

KA-1-15

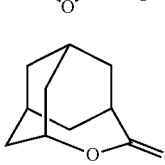

KA-1-16

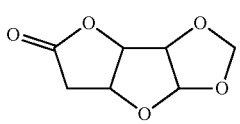

KA-1-17

The structure containing the lactone ring structure may or may have a substituent.

The preferable substituent may include the same substituents as the substituent $Z_{ka1}$ which the ring structure represented by General Formula (KA-1) may have.

X in General Formula (KB-1) may preferably include a carboxylate group (—COO—).

$Y^1$ and $Y^2$ in General Formula (KB-1) each independently represent an electron-withdrawing group.

The electron-withdrawing group is a partial structure represented by the following Formula (EW). * in Formula (EW) represents an atomic bonding directly connected to (KA-1) or an atomic bonding directly connected to X in (KB-1).

[Chem. 83]

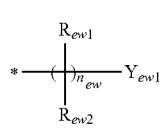

(EW)

In Formula (EW), $R_{ew1}$ and $R_{ew2}$ each independently represent an arbitrary substituent, and represent, for example, a hydrogen atom, an alkyl group, a cycloalkyl group or an aryl group.

$n_{ew}$ is the number of repetitions of the linking group represented by $-C(R_{ew1})(R_{ew2})-$, and represents an integer of 0 or 1. When $n_{ew}$ is 0, it represents a single bond, and indicates that $Y_{ew1}$ is bonded directly.

$Y_{ew1}$ may include a halogen atom, a cyano group, a nitrile group, a nitro group, a halo(cyclo)alkyl group or haloaryl group represented by $-C(R_{f1})(R_{f2})-R_{f3}$, an oxy group, a carbonyl group, a sulfonyl group, a sulfinyl group or a combination thereof, and the electron-withdrawing group may be, for example, the following structure. The term "a halo(cyclo) alkyl group" represents an alkyl group and an at least partially halogenated cycloalkyl group, and the group "a haloaryl group" represents an at least partially halogenated aryl group. In the following structural formulae, $R_{ew3}$ and $R_{ew4}$ each independently represent an arbitrary structure. The partial structure represented by the formula (EW) has an electron-withdrawing property regardless of the structure $R_{ew3}$ and $R_{ew4}$ has, and, for example, may be connected to the main chain of the resin, but is preferably an alkyl group, a cycloalkyl group or a fluorinated alkyl group.

[Chem. 84]

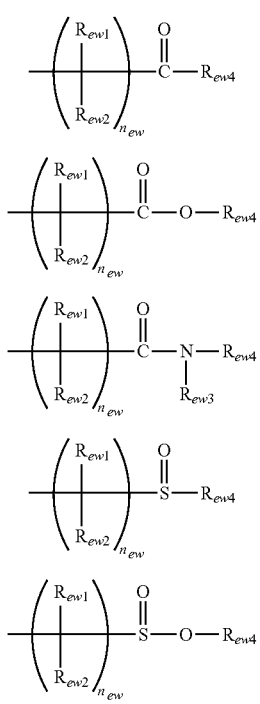

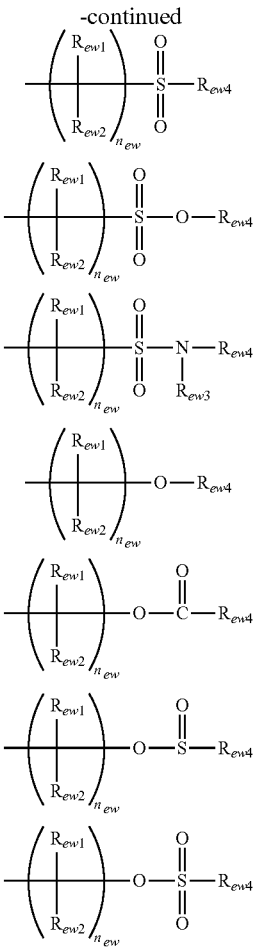

When $Y_{ew1}$ is a divalent or higher group, the remaining bond forms a bond with an arbitrary atom or a substituent. At least any group of $Y_{ew1}$, $R_{ew1}$ and $R_{ew2}$ may be further connected to the main chain of the hydrophobic resin through a substituent.

$Y_{ew1}$ is preferably a halogen atom, or a halo(cyclo)alkyl group or haloaryl group represented by $-C(R_{f1})(R_{f2})-R_{f3}$.

At least two of $R_{ew1}$, $R_{ew2}$ and $Y_{ew1}$ may be bonded to each other to form a ring.

Here, $R_{f1}$ represents a halogen atom, a perhaloalkyl group, a perhalocycloalkyl group or a perhalo aryl group, more preferably represents a fluorine atom, a perfluoroalkyl group or a perfluorocycloalkyl group, and even more preferably a fluorine atom or a trifluoromethyl group.

$R_{f2}$ and $R_{f3}$ each independently represent a hydrogen atom, a halogen atom or an organic group, and $R_{f2}$ and $R_{f3}$ may be bonded to each other to form a ring. The organic group represents for example, an alkyl group, a cycloalkyl group, an alkoxy group or the like. It is more preferable that $R_{f2}$ represent the same group as $R_{f1}$, or be bonded to $R_{f3}$ to form a ring.

$R_{f1}$ to $R_{f3}$ may be bonded to each other to form a ring and the ring formed may include a (halo)cycloalkyl ring, a (halo) aryl ring, or the like.

Examples of the (halo)alkyl group in $R_{f1}$ to $R_{f3}$ include an alkyl group in $Z_{ka1}$ described above, and a structure in which this is halogenated.

Examples of the (per)halocycloalkyl group and the (per) haloaryl group in $R_{f1}$ to $R_{f3}$, or in the ring formed by $R_{f2}$ and $R_{f3}$ being bonded to each other include a structure in which the cycloalkyl group in $Z_{ka1}$ described above is halogenated, more preferably include a fluorocycloalkyl group represented by —$C_{(n)}F_{(2n-2)}H$ and a perfluoroaryl group represented by —$C_{(n)}F_{(n-1)}$. Here, the number of carbon atoms n is not particularly limited, however, 5 to 13 is preferable, and 6 is more preferable.

The ring which may be formed by at least two of $R_{ew1}$, $R_{ew2}$ and $Y_{ew1}$ being bonded to each other may preferably include a cycloalkyl group or a heteroring group, and a lactone ring group is preferable as the heteroring group. Examples of the lactone ring group include a structure represented by Formulae (KA-1-1) to (KA-1-17).

Furthermore, the repeating unit (by) may have a plurality of partial structures represented by General Formula (KA-1), or a plurality of partial structures represented by General Formula (KB-1), or both partial structures represented by General Formula (KA-1) or General Formula (KB-1).

In addition, the portion of or the whole partial structure of General Formula (KA-1) may also serve as an electron-withdrawing group as $Y^1$ or $Y^2$ in General Formula (KB-1). For example, when X in General Formula (KA-1) is a carboxylate group, that carboxylate group may also function as an electron-withdrawing group as $Y^1$ or $Y^2$ in General Formula (KB-1).

Furthermore, when the repeating unit (by) corresponds to the repeating unit (b*) or the repeating unit (b") and has a partial structure represented by General Formula (KA-1), the partial structure represented by General Formula (KA-1) is more preferably a partial structure in which a polarity conversion group is represented by —COO— in the structure represented by General Formula (KA-1).

The repeating unit (by) may be a repeating unit having a partial structure represented by General Formula (KY-0).

[Chem. 85]

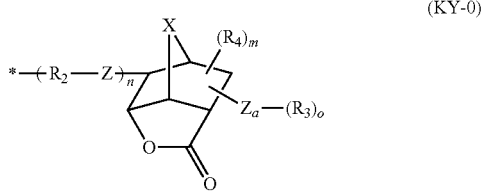

(KY-0)

In General Formula (KY-0), $R_2$ represents a chain or cyclic alkylene group, and Res may be the same as or different from each other when present in plural number.

$R_3$ represents a linear, branched or cyclic hydrocarbon group, and a part or all of the hydrogen atoms on the constituent carbon atoms are substituted with a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(=O)— or R—C(=O)O— (R represents an alkyl group or a cycloalkyl group). $R_4$s may be the same as or different from each other when present in plural number, and two or more of $R_4$s may be bonded to each other to form a ring.

X represents an alkylene group, an oxygen atom or a sulfur atom.

Z and Za represent a single bond, an ether bond, an ester bond, an amide bond, a urethane bond or a urea bond, and Z and Za may be the same as or different from each other when present in plural number.

* represents an atomic bonding to the main chain or side chain of the resin.

o is the number of substituents, and represents an integer of 1 to 7.

m is the number of substituents, and represents an integer of 0 to 7.

n is the number of repetitions, and represents an integer of 0 to 5.

The structure of —$R_2$—Z— is preferably a structure represented by —$(CH_2)_l$—COO— (l represents an integer of 1 to 5).

The preferable carbon number and specific examples of the chain or cyclic alkylene group as $R_2$ are the same as those described in the chain alkylene group and the cyclic alkylene group in $Z_2$ of General Formula (bb).

The number of carbon atoms of the linear, branched or cyclic hydrocarbon group as $R_3$ is preferably 1 to 30 and more preferably 1 to 20 in the case of linear, preferably 3 to 30 and more preferably 3 to 20 in the case of branched, and preferably 6 to 20 in the case of cyclic. Specific examples of $R_3$ may include the specific examples of the alkyl group and the cycloalkyl groups as $Z_{ka1}$ described above.

The preferable carbon number ranges and specific examples of the alkyl group and the cycloalkyl group as $R_4$ and R are the same as those described in the alkyl group and the cycloalkyl group as $Z_{ka1}$ described above.

The acyl group as $R_4$ is preferably an acyl group having 1 to 6 carbon atoms and may include, for example, a formyl group, an acetyl group, a propionyl group, a butyryl group, an isobutyryl group, a valeryl group, a pivaloyl group or the like.

The alkyl moiety in the alkoxy group and the alkoxycarbonyl group as $R_4$ may include a linear, branched or cyclic alkyl moiety, and the preferable carbon number and specific examples of the alkyl moiety are the same as those described in the alkyl group and the cycloalkyl groups as $Z_{ka1}$ described above.

The alkylene group as X may include a chain or cyclic alkylene group, and preferable carbon number and specific examples are the same as those described in the chain alkylene group and the cyclic alkylene group as $R_2$.

A receding contact angle of the resist film with water after alkali development can be lowered due to a polarity conversion by the polarity conversion group being decomposed by the action of an alkaline developer. The receding contact angle of the film with water being decreased after the alkali development is preferable from the viewpoint of the suppression of development defects.

The receding contact angle of the resist film with water after alkali development is preferably 50° or less at a temperature of 23±3° C. and a humidity of 45±5%, more preferably 40° or less, even more preferably 35° or less, and most preferably 30° or less.

The receding contact angle is a contact angle measured when the contact line at a droplet-substrate interface is retracted, and is generally known to be useful in simulating the ease of movement of the droplets in a dynamic state. Simply, it can be defined as a contact angle at the time of the interface of the droplet being retracted when the droplets are sucked into the needle again after the droplets discharged from the needle tip end are deposited on a substrate, and the contact angle can be measured using a contact angle measuring method generally referred to as an expansion and contraction method.

A hydrolysis rate in the alkaline developer of the hydrophobic resin is preferably 0.001 nm/second or more, more preferably 0.01 nm/second or more, even more preferably 0.1 nm/second or more, and most preferably 1 nm/second or more.

Here, the hydrolysis rate in the alkaline developer of the hydrophobic resin is a rate at which the film thickness is reduced when the resin film was formed using only the hydrophobic resin in TMAH (an aqueous solution of tetramethylammonium hydroxide) (2.38% by mass) of 23° C.

Furthermore, it is more preferable that the repeating unit (by) be a repeating unit having at least two or more polarity conversion groups.

When the repeating unit (by) has at least two polarity conversion groups, it is preferable that the repeating unit (by) have a group containing a partial structure having two polarity conversion groups represented by the following General Formula (KY-1). In addition, when the structure represented by General Formula (KY-1) does not have a bond, the structure is a group having a monovalent or higher group with at least any one hydrogen atom in the structure being removed.

[Chem. 86]

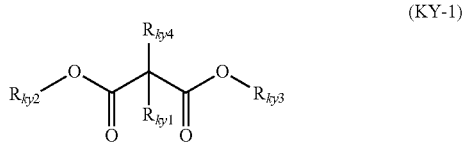

(KY-1)

In General Formula (KY-1), $R_{ky1}$ and $R_{ky4}$ each independently represents a hydrogen atom, a halogen atom, an alkyl group, a cycloalkyl group, a carbonyl group, carbonyloxy group, an oxycarbonyl group, an ether group, a hydroxyl group, a cyano group, a amide group or an aryl group. $R_{ky1}$ and $R_{ky4}$ may be bonded to the same atom to form a double bond and, for example, $R_{ky1}$ and $R_{ky4}$ may be bonded to the same oxygen atom to form part of a carbonyl group (=O).

$R_{ky2}$ and $R_{ky3}$ each independently are an electron-withdrawing group or $R_{ky3}$ is an electron-withdrawing group together with $R_{ky1}$ and $R_{ky2}$ being connected to form a lactone ring. The lactone ring formed is preferably a structure of (KA-1-1) to (KA-1-17). The electron-withdrawing group includes the same as $Y^1$ and $Y^2$ in Formula (KB-1), and preferably a halogen atom, or a halo(cyclo)alkyl group or haloaryl group represented by the above —C($R_{f1}$)($R_{f2}$)—$R_{f3}$. Preferably, $R_{ky3}$ is a halogen atom, or a halo(cyclo)alkyl group or haloaryl group represented by the above —C($R_{f1}$)($R_{f2}$)—$R_{f3}$, and $R_{ky2}$ forms a lactone ring by being connected to $R_{ky1}$, or is an electron-withdrawing group which does not have a halogen atom.

$R_{ky1}$, $R_{ky2}$, and $R_{ky4}$ may be connected to each other to form a monocyclic or polycyclic structure.

Specifically, $R_{ky1}$ and $R_{ky4}$ may include the same group as $Z_{ka1}$ in Formula (KA-1).

The lactone ring formed by $R_{ky1}$ and $R_{ky2}$ being connected is preferably a structure of (KA-1-1) to (KA-1-17). The electron-withdrawing group may include the same as $Y^1$ and $Y^2$ in Formula (KB-1).

The structure represented by General Formula (KY-1) is more preferably a structure represented by the following General Formula (KY-2). In addition, the structure represented by General Formula (KY-2) is a group having a monovalent or higher group with at least any one hydrogen atom in the structure being removed.

[Chem. 87]

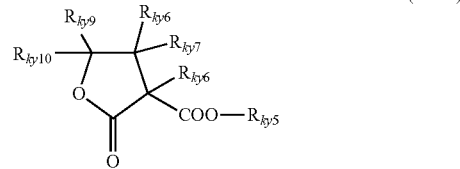

(KY-2)

In Formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more of $R_{ky6}$ to $R_{ky10}$ may be connected to one another to form a monocyclic or polycyclic structure.

$R_{ky5}$ represents an electron-withdrawing group. The electron-withdrawing group may include the same as those in $Y^1$ and $Y^2$, and is preferably a halogen atom, or a halo(cyclo)alkyl group or haloaryl group represented by the above —C($R_{f1}$)($R_{f2}$)—$R_{f3}$.

Specifically, $R_{ky6}$ to $R_{ky10}$ may include the same group as $Z_{ka1}$ in Formula (KA-1).

The structure represented by Formula (KY-2) is more preferably a partial structure represented by the following General Formula (KY-3).

[Chem. 88]

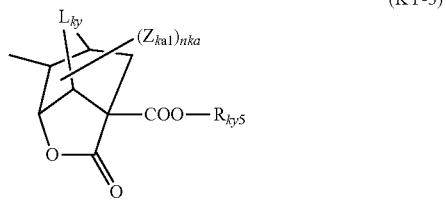

(KY-3)

In Formula (KY-3), $Z_{ka1}$ and nka are synonymous with $Z_{ka1}$ and nka in General Formula (KA-1), respectively. $R_{ky5}$ is synonymous with $R_{ky5}$ in Formula (KY-2).

$L_{ky}$ represents an alkylene group, an oxygen atom or a sulfur atom. The alkylene group of $L_{ky}$ may include a methylene group, an ethylene group or the like. $L_{ky}$ is preferably an oxygen atom or a methylene group, and more preferably a methylene group.

The repeating unit (b) is not particularly limited as long as the repeating unit is obtained by a polymerization such as an addition polymerization, a condensation polymerization or an addition condensation, however, a repeating unit obtained by an addition polymerization of a carbon-carbon double bond is preferable. Examples thereof may include an acrylate-based repeating unit (including the system having a substituent on the α-position or the β-position), a styrene-based repeating unit (including the system having a substituent on the α-position or the β-position), a vinyl ether-based repeating unit, a norbornene-based repeating unit, a repeating unit of a maleic acid derivative (a maleic anhydride or derivative thereof, maleimide, or the like) or the like, an acrylate-based repeating unit, a styrene-based repeating unit, a vinyl ether-based repeating unit or a norbornene-based repeating unit is preferable, an acrylate-based repeating unit, a vinyl ether-based repeating unit or a norbornene-based repeating unit is more preferable, and an acrylate-based repeating unit is most preferable.

When the repeating unit (by) is a repeating unit having at least any of a fluorine atom and a silicon atom (that is, when corresponding to the repeating unit (b') or (b")), the partial structure having a fluorine atom in the repeating unit (by) may include the same structure included in the repeating unit having at least any of a fluorine atom and a silicon atom, and preferably include a group represented by General Formulae (F2) to (F4). Furthermore, in this case, the partial structure having a silicon atom in the repeating unit (by) may include the same structure included in the repeating unit having at least any of a fluorine atom and a silicon atom, and preferably include a group represented by General Formulae (CS-1) to (CS-3).

The content of the repeating unit (by) in the hydrophobic resin is preferably 10 to 100 mol %, more preferably 20 to 99 mol %, even more preferably 30 to 97 mol %, and most preferably 40 to 95 mol % with regard to all repeating units in the hydrophobic resin.

Specific examples of the repeating unit (by) having a group of which solubility increases in an alkali developer are shown below, however, the present invention is not limited to these.

In the specific examples shown below, Ra represents a hydrogen atom, a fluorine atom, a methyl group or a trifluoromethyl group.

[Chem. 89]

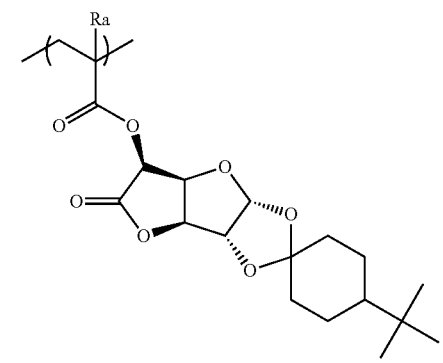

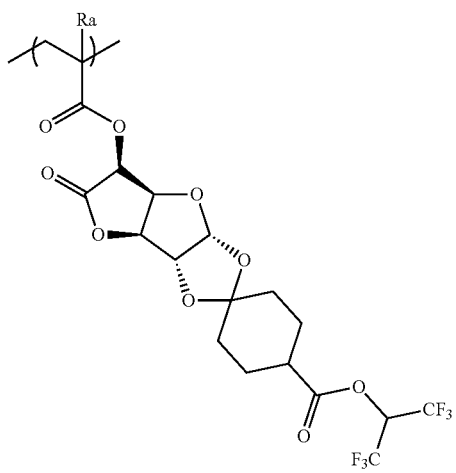

-continued

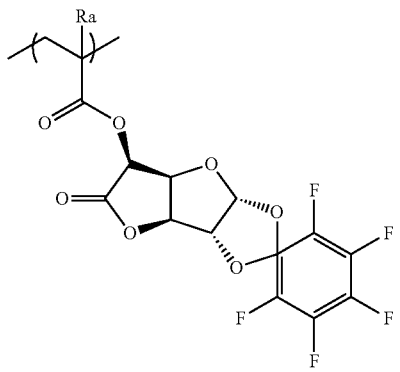

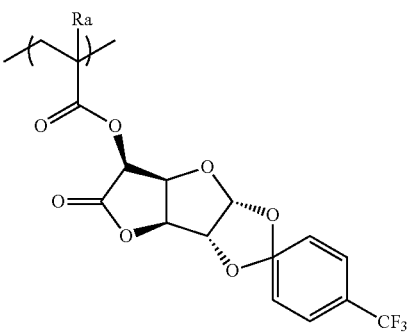

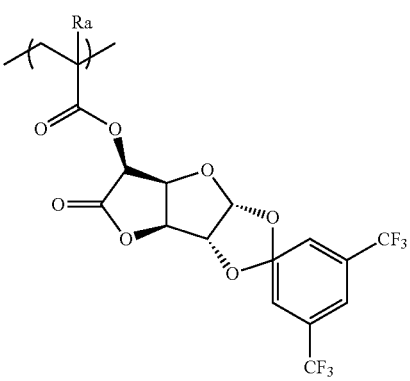

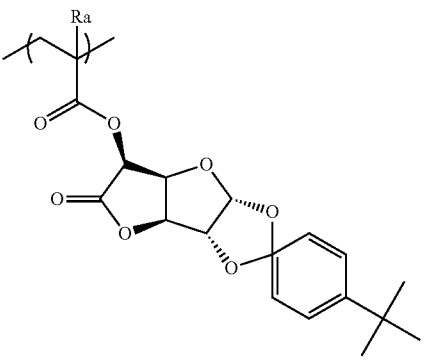

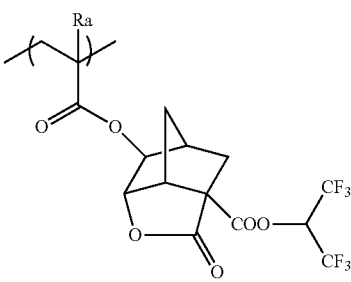

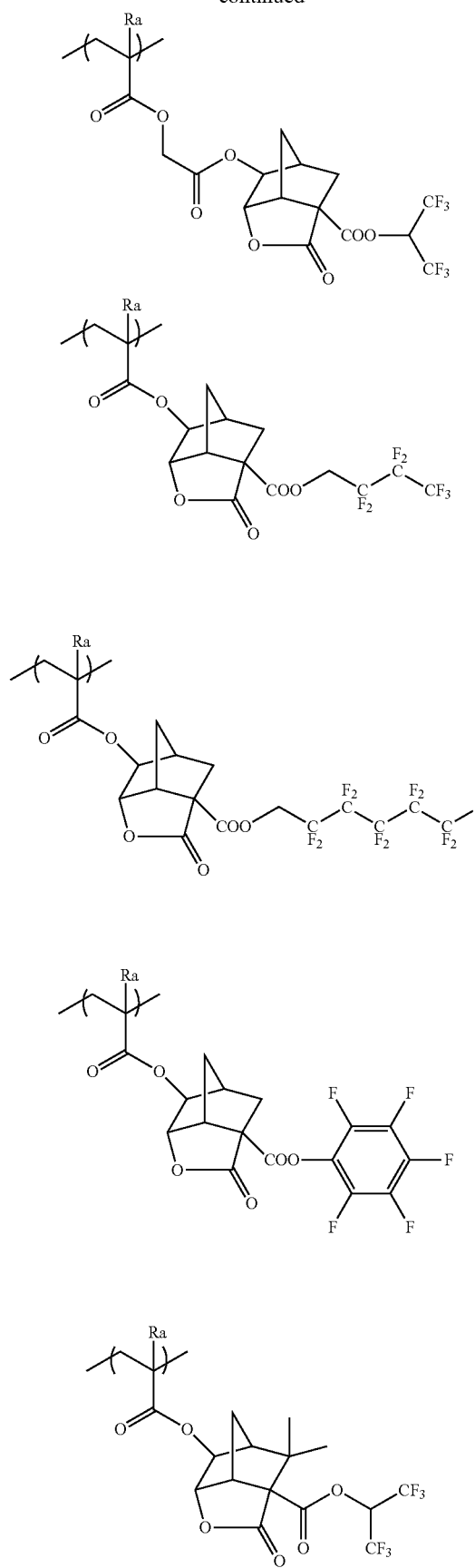
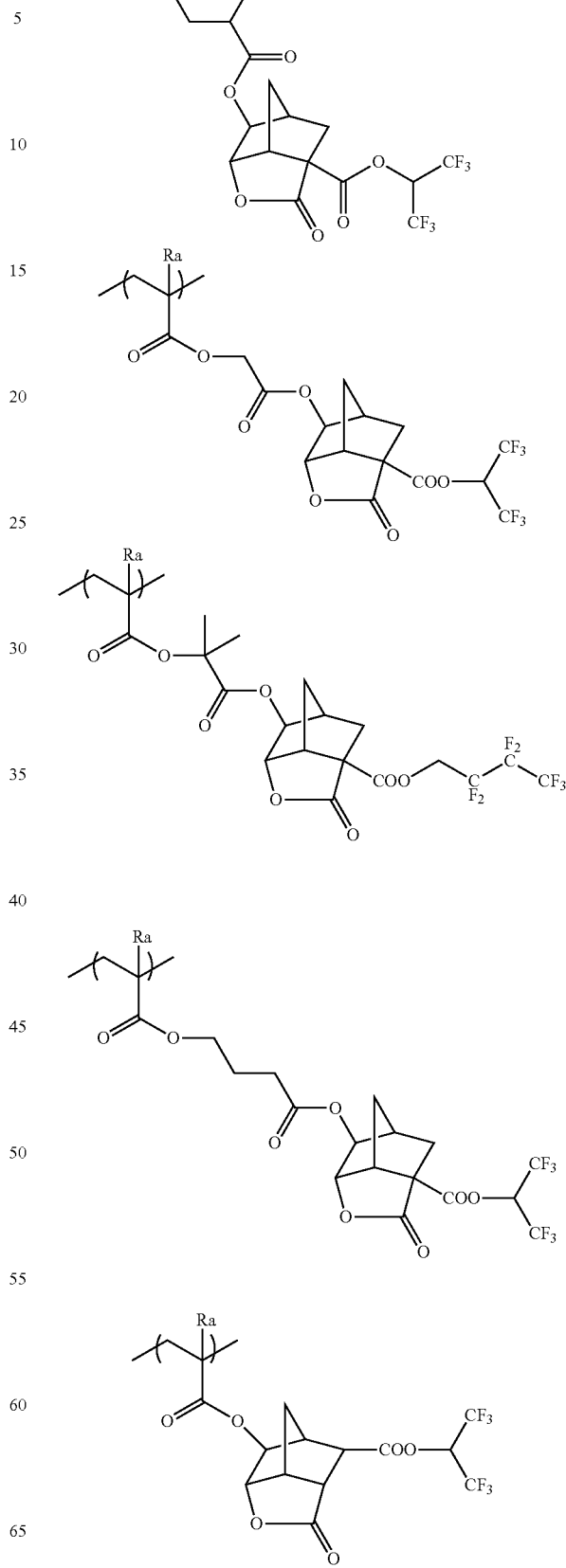

-continued

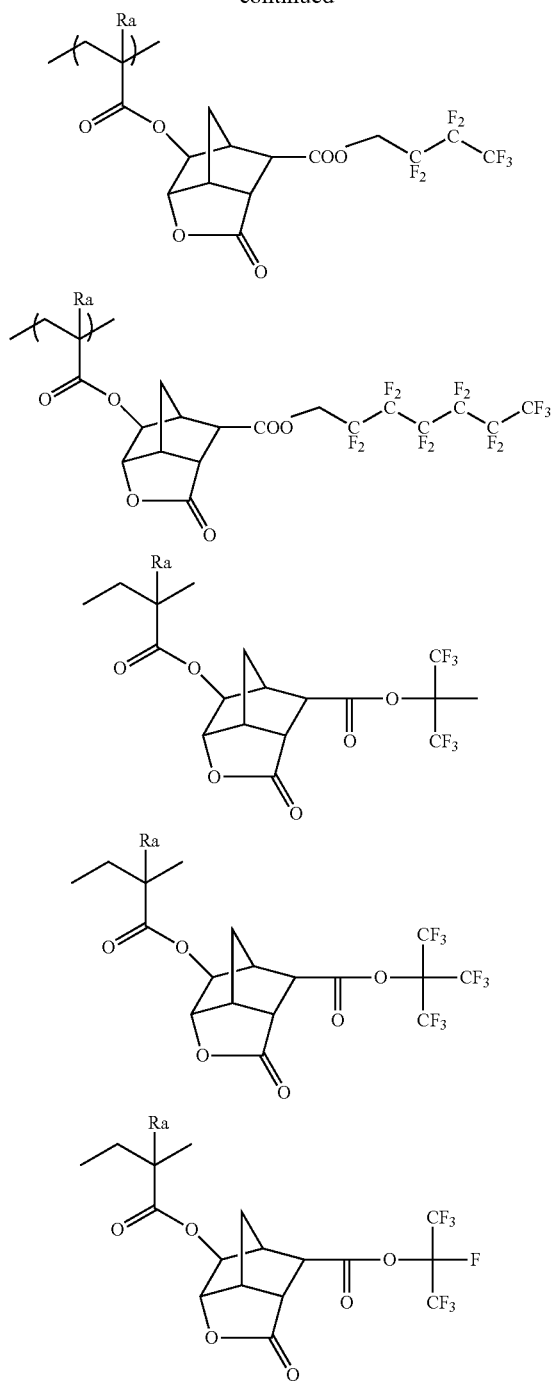

[Chem. 90]

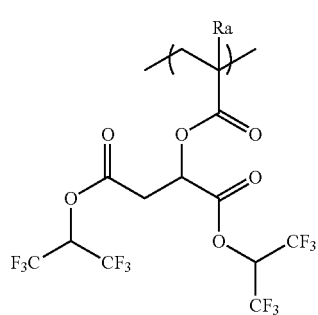

-continued

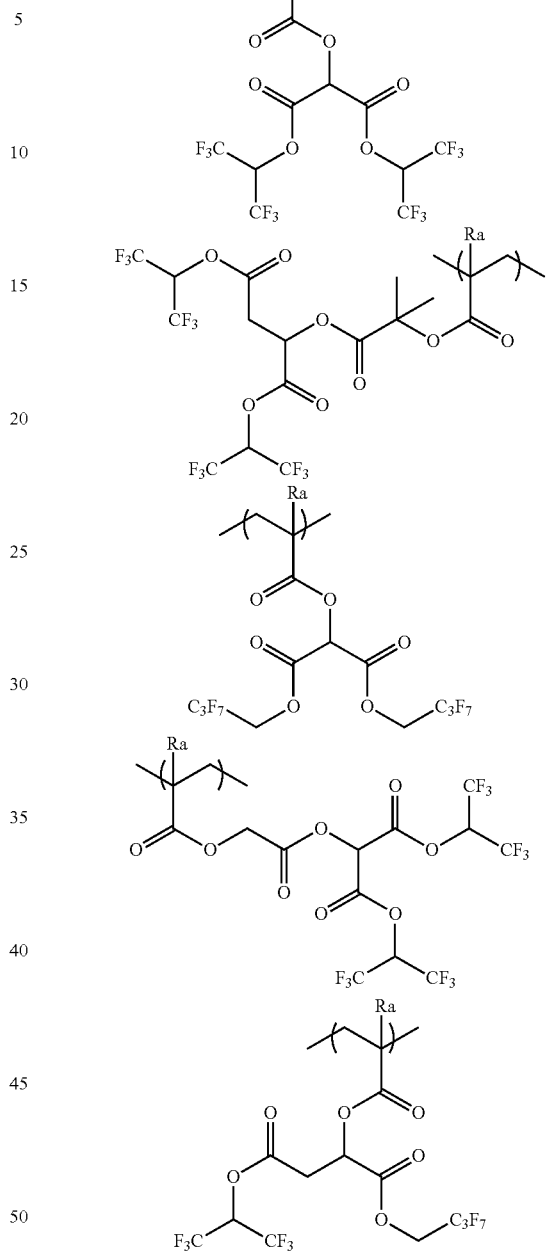

The monomers corresponding to the repeating unit (by) having a polarity conversion group (y) as described above may be synthesized with reference to, for example, a method disclosed in WO2010/067905A.

In the hydrophobic resin, the repeating unit (bz) having a group decomposed by the action of an acid (z) may include the same repeating unit having an acid decomposable group included in the resin (B).

When the repeating unit (bz) is a repeating unit having at least any of a fluorine atom and a silicon atom (that is, when corresponding to the repeating unit (b') or (b")), the partial structure having a fluorine atom in the repeating unit (bz) may include the same structure included in the above repeating unit having at least any of a fluorine atom and a silicon atom, and preferably include a group represented by General Formulae (F2) to (F4) Furthermore, in this case, the partial structure having a silicon atom in the repeating unit (bz) may include the same structure included in the above repeating unit having at least any of a fluorine atom and a silicon atom, and preferably include a group represented by General Formulae (CS-1) to (CS-3).

The content of the repeating unit (bz) having a group decomposed by the action of an acid (z) is preferably 1 to 80 mol %, more preferably 10 to 80 mol %, and even more preferably 20 to 60 mol % with regard to all repeating units in the hydrophobic resin.

Hereinbefore, the repeating unit (b) having at least one group selected from the group consisting of the (x) to (z) has been described, however, in the hydrophobic resin, the content of the repeating unit (b) is preferably 1 to 98 mol %, more preferably 3 to 98 mol %, even more preferably 5 to 97 mol %, and most preferably 10 to 95 mol % with regard to all repeating units in the hydrophobic resin.

The content of the repeating unit (b') is preferably 1 to 100 mol %, more preferably 3 to 99 mol %, even more preferably 5 to 97 mol %, and most preferably 10 to 95 mol % with regard to all repeating units in the hydrophobic resin.

The content of the repeating unit (b*) is preferably 1 to 90 mol %, more preferably 3 to 80 mol %, even more preferably 5 to 70 mol %, and most preferably 10 to 60 mol % with regard to all repeating units in the hydrophobic resin. The content of the repeating unit having at least any of a fluorine atom and a silicon atom used with the repeating unit (b*) is preferably 10 to 99 mol %, more preferably 20 to 97 mol %, even more preferably 30 to 95 mol %, and most preferably 40 to 90 mol % with regard to all repeating units in the hydrophobic resin.

The content of the repeating unit (b") is preferably 1 to 100 mol %, more preferably 3 to 99 mol %, even more preferably 5 to 97 mol %, and most preferably 10 to 95 mol % with regard to all repeating units in the hydrophobic resin.

The hydrophobic resin may further have a repeating unit represented by the following General Formula (CIII).

[Chem. 91]

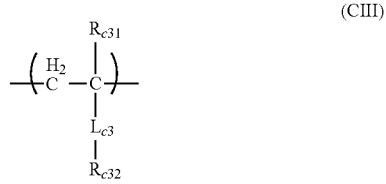

In General Formula (CIII), $R_{c31}$ represents a hydrogen atom, an alkyl group, (may be substituted with a fluorine atom or the like), a cyano group, or a —$CH_2$—O—$R_{ac2}$ group. In the formula, $R_{ac2}$ represents a hydrogen atom, an alkyl group or an acyl group. $R_{c31}$ is preferably a hydrogen atom, a methyl group, a hydroxymethyl group or a trifluoromethyl group, and particularly preferably a hydrogen atom or a methyl group.

$R_{c32}$ represents an alkyl group, a cycloalkyl group, an alkenyl group, a cycloalkenyl group or an aryl group. These groups may be substituted with a group including a fluorine atom or a silicon atom.

$L_{c3}$ represents a single bond or a divalent linking group.

In General Formula (CIII), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group or a naphthyl group having 6 to 20 carbon atoms, and these may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an oxy group, a phenylene group or an ester bond (a group represented by —COO—).

The hydrophobic resin may preferably further have a repeating unit represented by the following General Formula (BII-AB)

[Chem. 92]

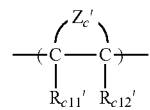

In Formula (BII-AB), $R_{c11}'$ and $R_{c12}'$ each independently represent a hydrogen atom, a cyano group, a halogen atom or an alkyl group.

Zc', including the two carbon atoms (C—C) to which Zc' is bonded, represents an atomic group to form an alicyclic structure.

When each group in the repeating unit represented by General Formulae (CIII) and (BII-AB) is substituted with a group including a silicon atom or a fluorine atom, the repeating unit also corresponds to the repeating unit having at least any of a fluorine atom or a silicon atom.

Specific examples of the repeating unit represented by General Formulae (CIII) and (BII-AB) are shown below, however, the present invention is not limited to these. In the formula, Ra represents H, $CH_3$, $CH_2OH$, $CF_3$, or CN. In addition, the repeating unit when Ra is $CF_3$ also corresponds to the above repeating unit having at least any of a fluorine atom or a silicon atom.

[Chem. 93]

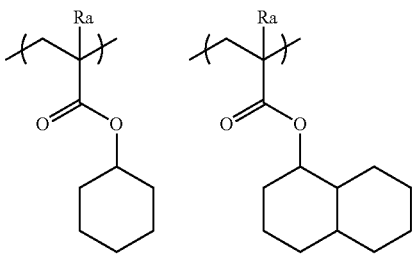

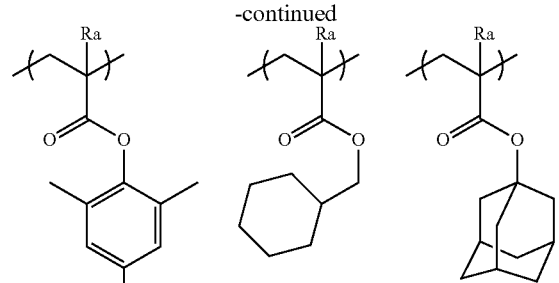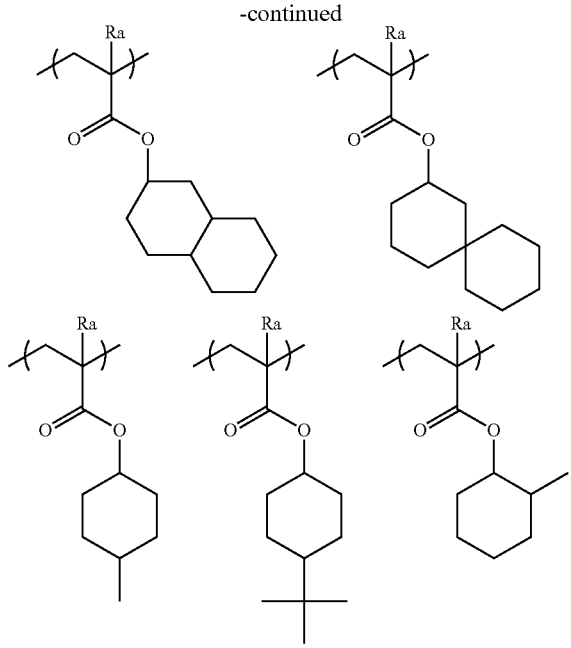

The hydrophobic resin, similar to the resin (B) described above, naturally has fewer impurities such as metal, and also a residual monomer or an oligomer component is preferably 0 to 10% by mass, more preferably 0 to 5% by mass, and even more preferably 0% to 1% by mass. As a result, a resist composition that does not have temporal changes such as the impurities in the liquid, sensitivity or the like may be obtained. In addition, a molecular weight distribution (Mw/Mn, also referred to as a degree of dispersion) is preferably in the range of 1 to 3, more preferably 1 to 2, even more preferably is in the range of 1 to 1.8, and most preferably is in the range of 1 to 1.5 from the viewpoint of resolution, a resist shape, a sidewall of the resist pattern, roughness, and the like.

A variety of commercially available products may be used as the hydrophobic resin, or the hydrophobic resin may be synthesized in accordance with conventional methods (for example, radical polymerization). For example, as the general synthesis method, a bulk polymerization method in which polymerization is carried out by dissolving monomer species and an initiator in a solvent and heating the solution, a dropwise adding polymerization method in which a solution of monomer species and an initiator is added dropwise to a heating solvent over 1 to 10 hours, or the like may be included, and a dropwise adding polymerization method is preferable.

The reaction solvent, the polymerization initiator, the reaction condition (temperature, concentration, and the like), and the purification method after the reaction, are similar to those described in the resin (B).

Specific examples of the hydrophobic resin (HR) are shown below. In addition, the molar ratio of the repeating unit in each resin (corresponding to each repeating unit from left to right), the weight-average molecular weight, and the degree of dispersion are shown in the Table 1 below.

[Chem. 94]

(B-1)
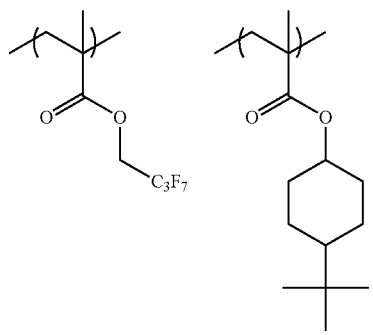

(B-2)
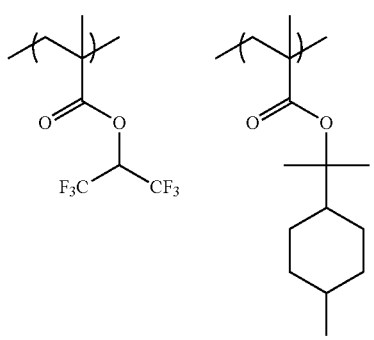

-continued (B-3)
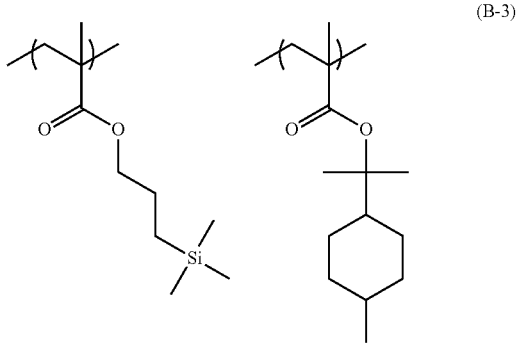

(B-4)
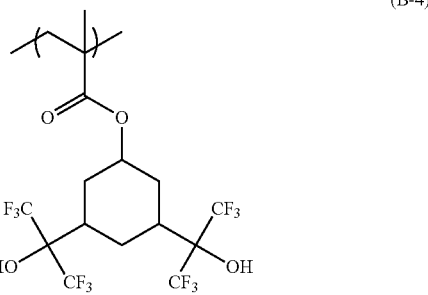

(B-5)
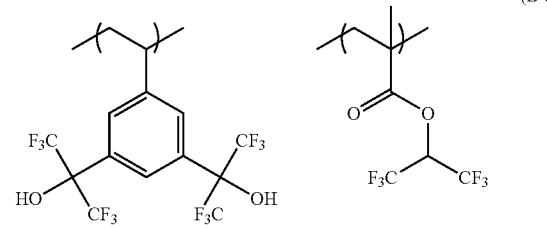

(B-6)
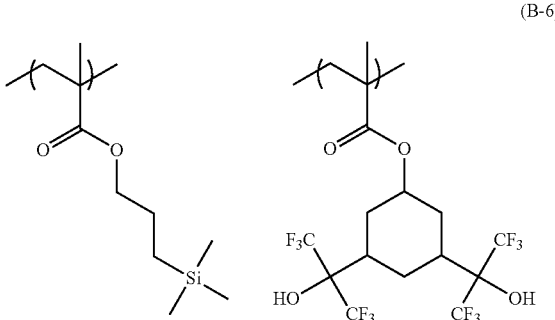

(B-7)
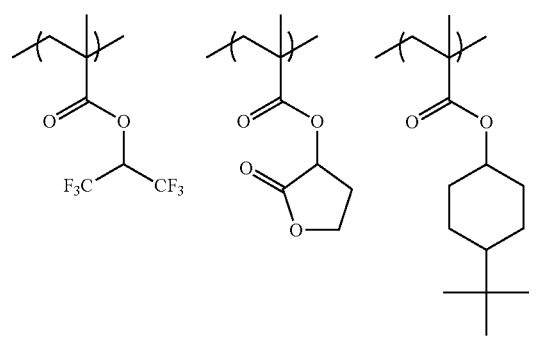

(B-8)
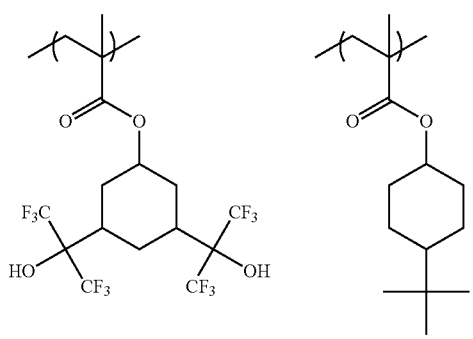
(B-9)
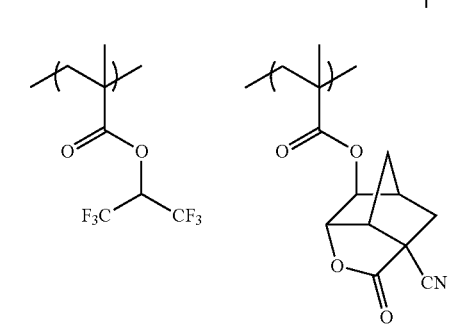
(B-10)
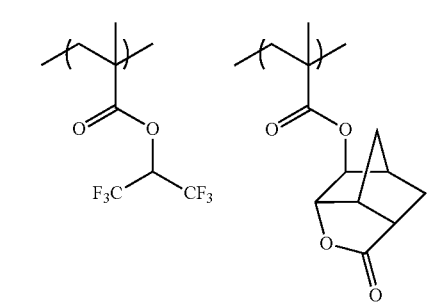
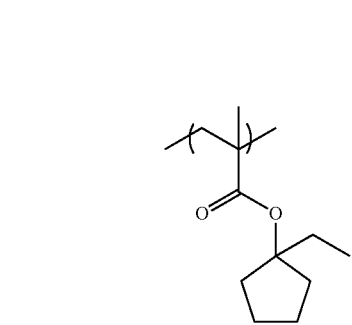
(B-11)
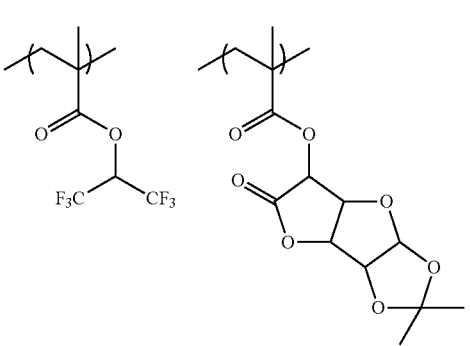
(B-12)
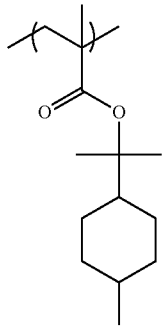
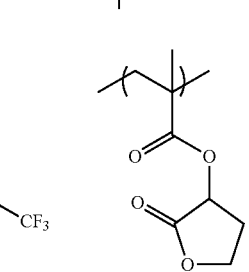
(B-13)
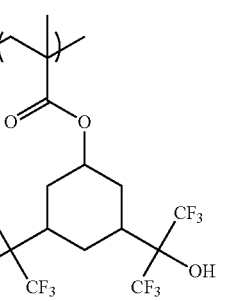
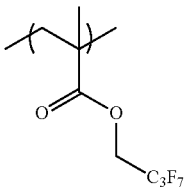
(B-14)
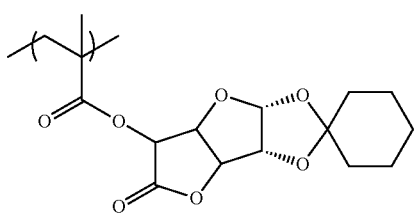

(B-15)
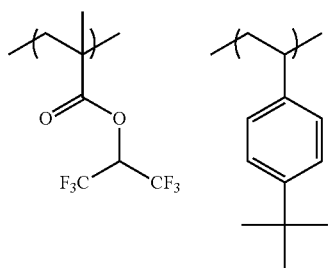
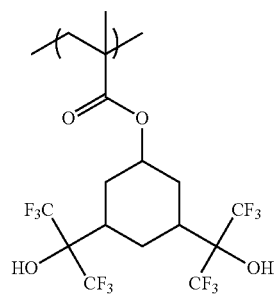
(B-16)
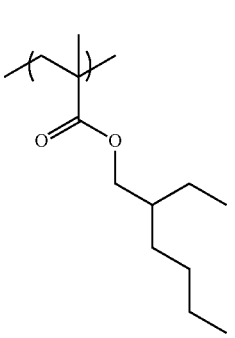
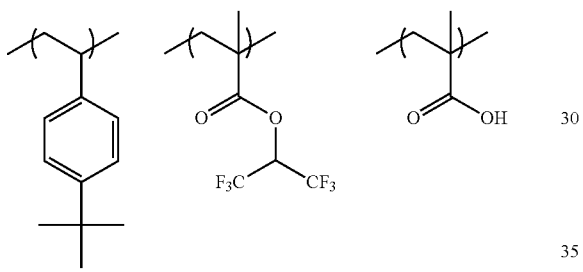
(B-17)
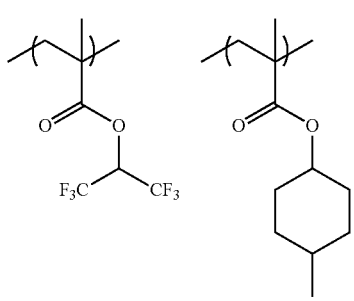
-continued
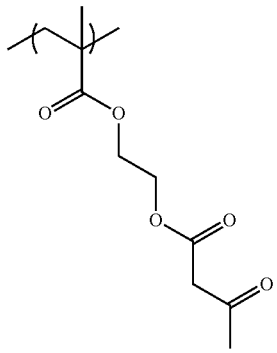
(B-18)
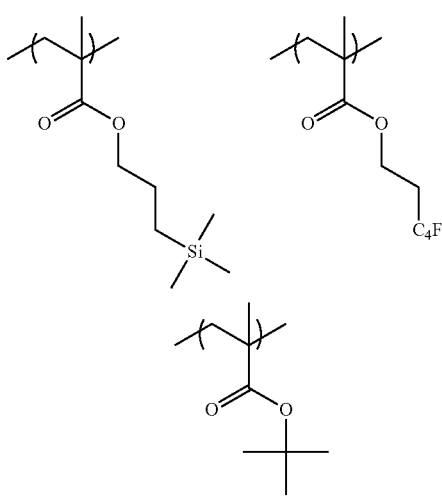
(B-19)
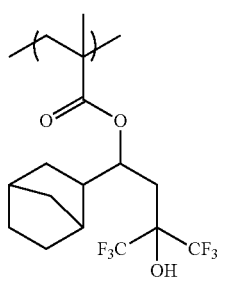
(B-20)
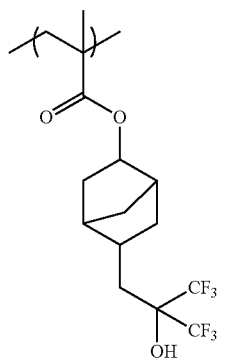

(B-21)
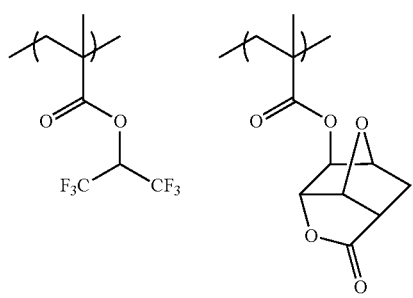
(B-22)
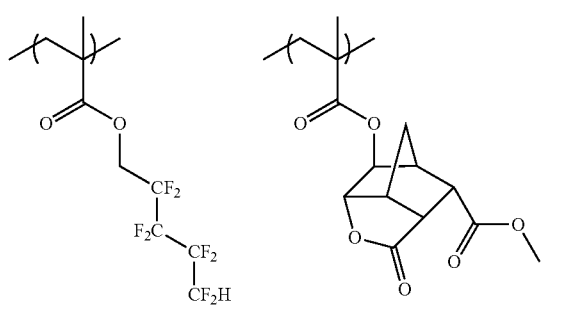
[Chem. 95]
(B-23)
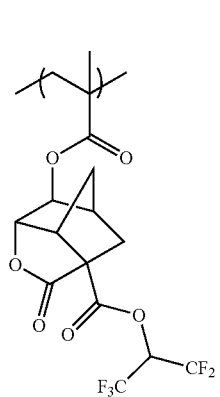
(B-24)
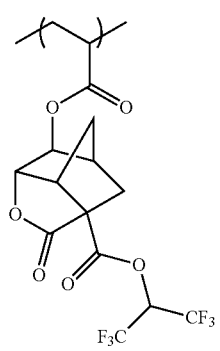
(B-25)
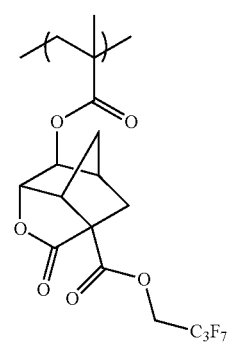
(B-26)
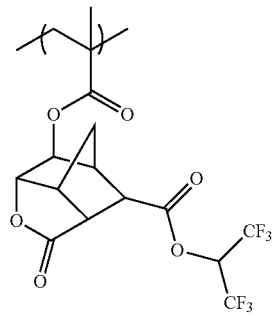
(B-27)
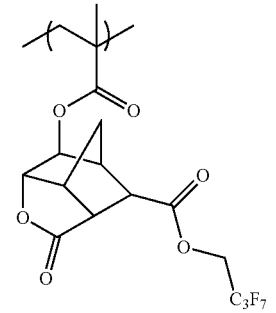
(B-28)
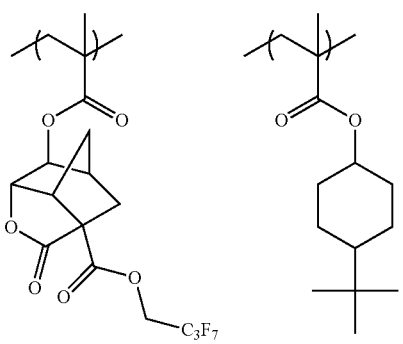

(B-29) 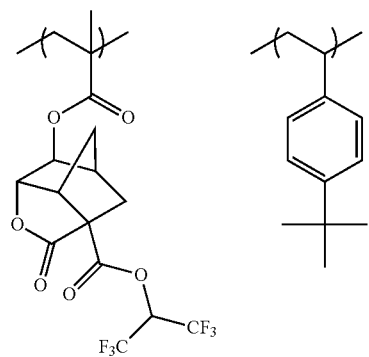
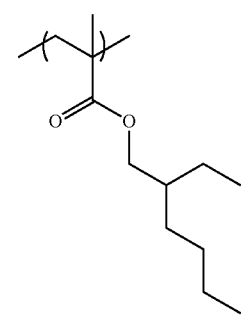
(B-30) 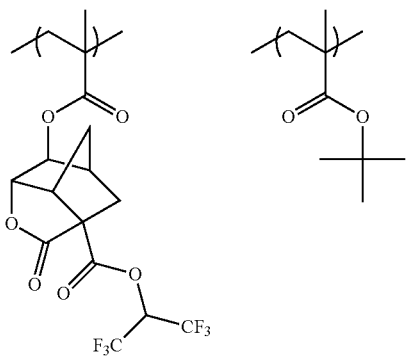
(B-31) 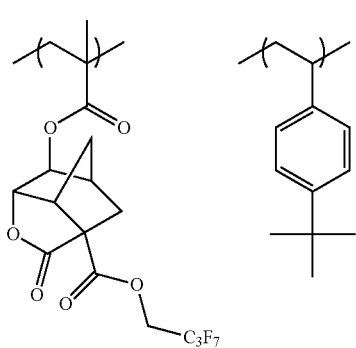
(B-32) 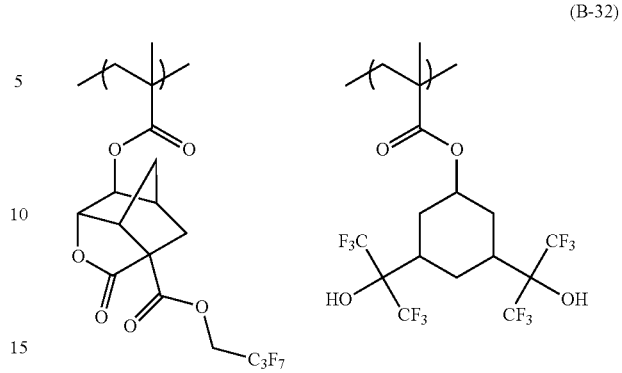
(B-33) 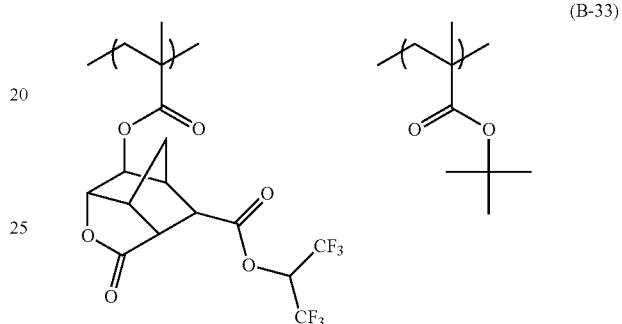
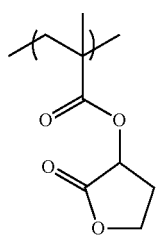
(B-34) 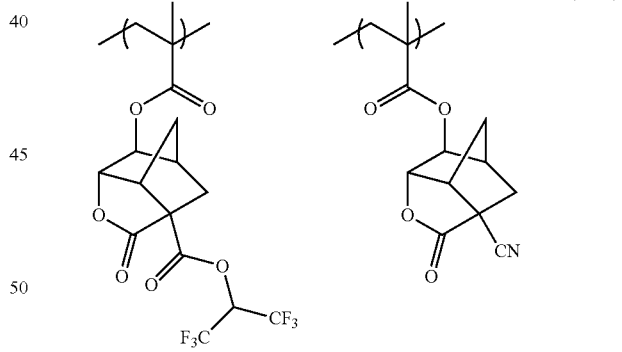
(B-35) 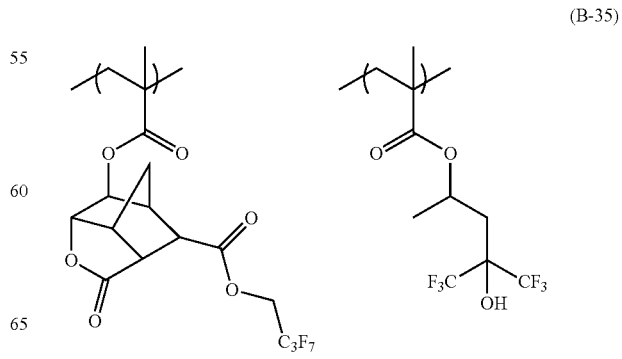

(B-36) 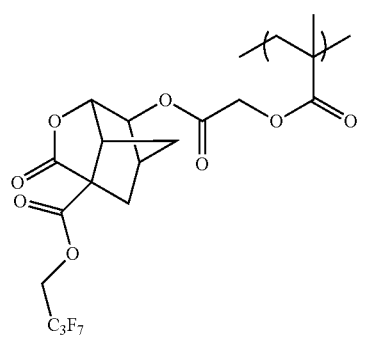
(B-37) 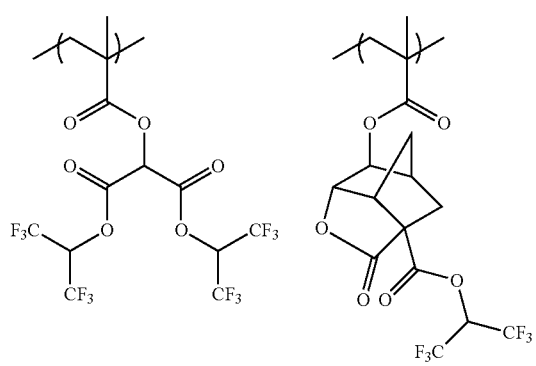
(B-38) 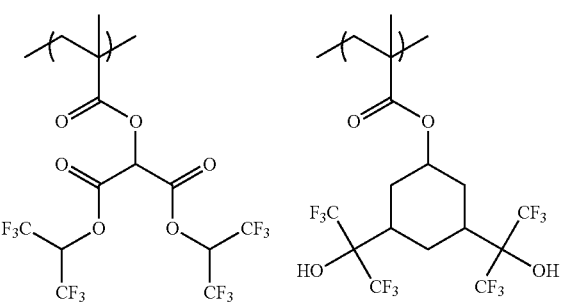
(B-39) 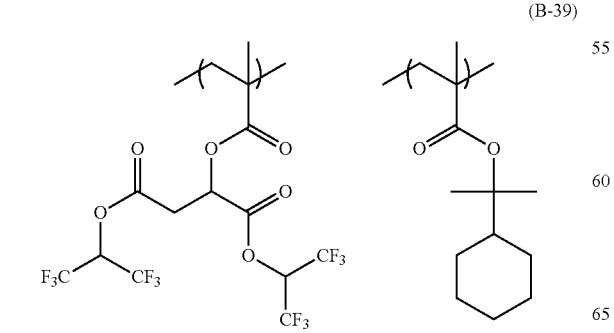
(B-40) 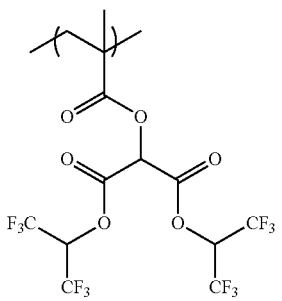
(B-41) 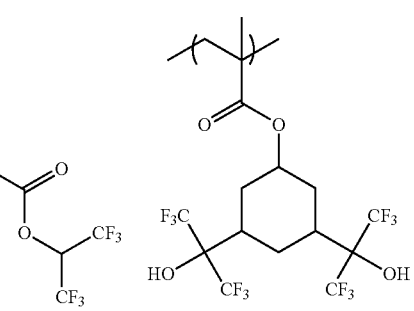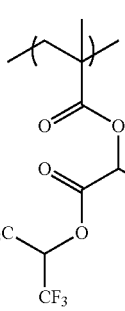
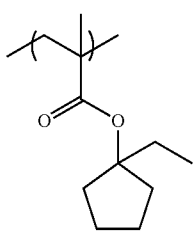
(B-42) 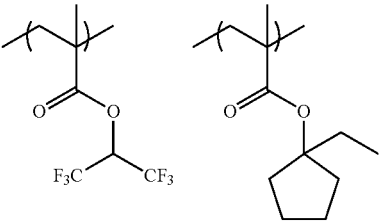
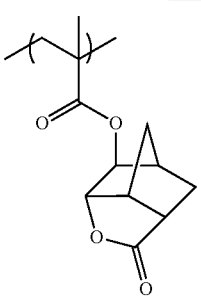

[Chem. 96]
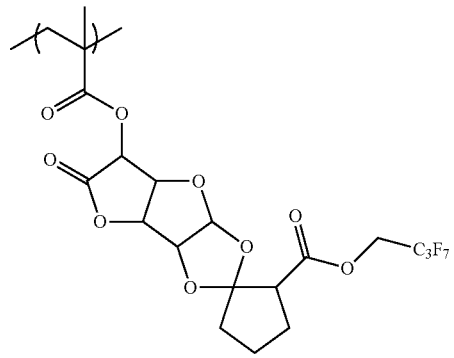
(B-43)
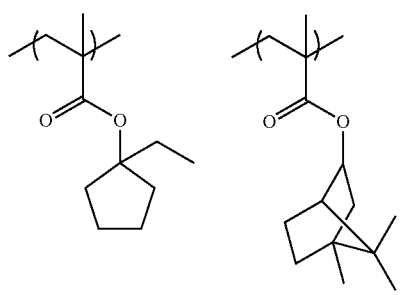
(B-44)
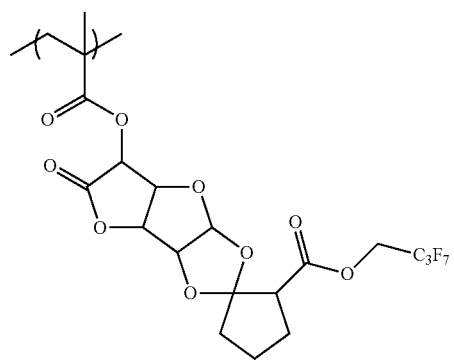
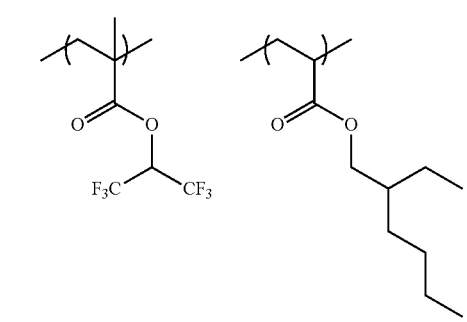
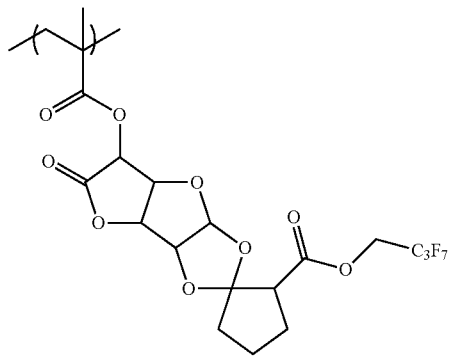
(B-45)
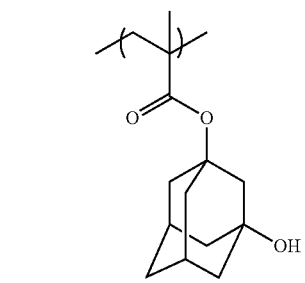
(B-46)
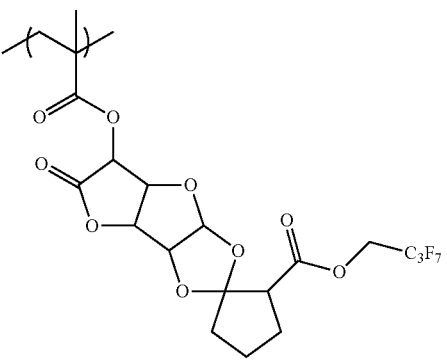
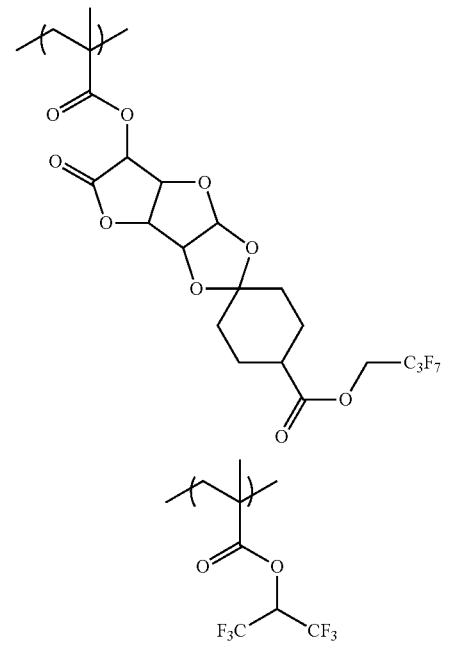
(B-47)

(B-48)
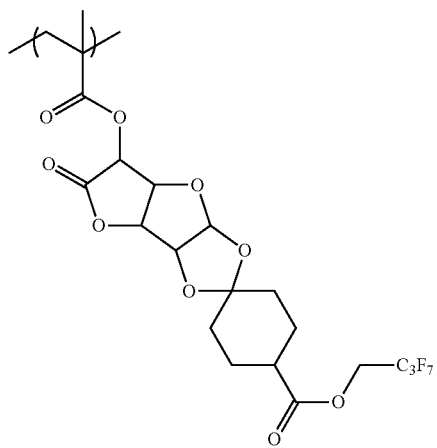
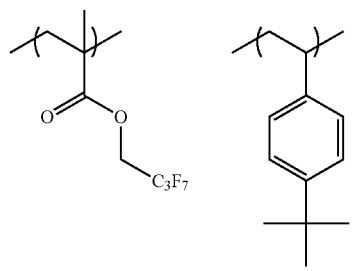
(B-49)
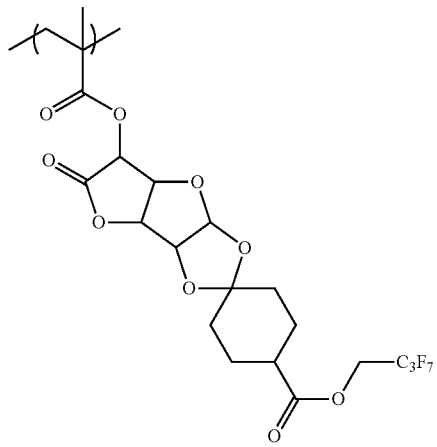
(B-50)
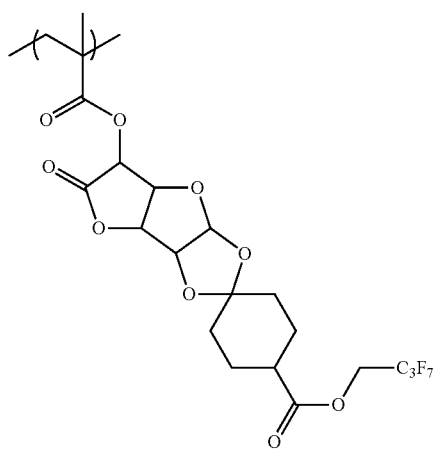
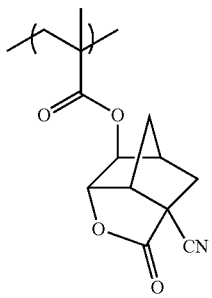
(B-51)
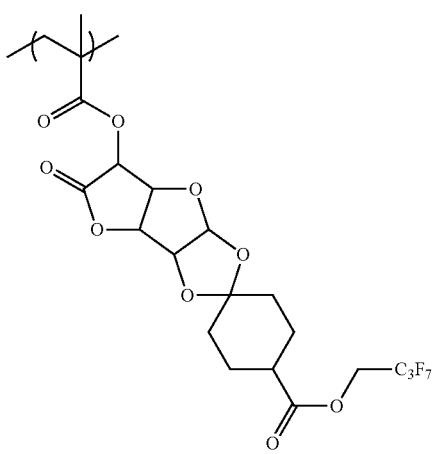
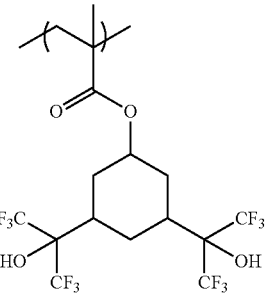
(B-52)

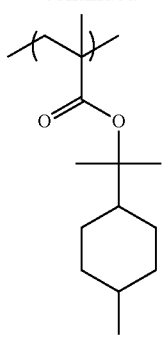
(B-53)
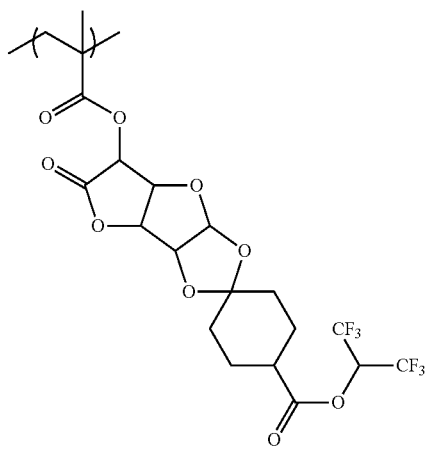
(B-54)
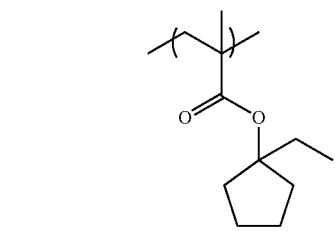
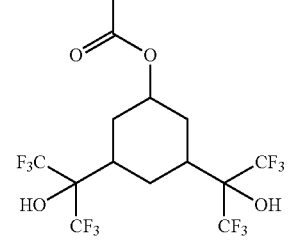
(B-55)
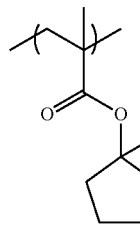
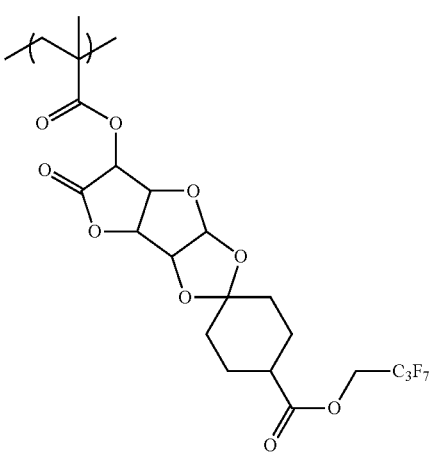
TABLE 1
| Polymer | Composition (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |
| B-6 | 40/60 | 8000 | 1.4 |
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |

TABLE 1-continued

| Polymer | Composition (mol %) | Mw | Mw/Mn |
|---|---|---|---|
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |

By the actinic ray-sensitive or radiation-sensitive resin composition in the present invention containing a hydrophobic resin which has at least one of a fluorine atom and a silicon atom, the hydrophobic resin can be localized on the surface layer of the film formed from the actinic ray-sensitive or radiation-sensitive resin composition, and may improve the immersion liquid traceability by improving the receding contact angle of the film surface for water after the baking or before the exposure when a liquid immersion medium is water.

The receding contact angle of the film after baking or before exposing the film composed of the actinic ray-sensitive or radiation-sensitive resin composition of the present invention is preferably 60° to 90° at a normal room temperature of 23±3° C. and a humidity of 45±5%, more preferably 65° or more, even more preferably 70° or more, and particularly preferably 75° or more.

The hydrophobic resin is localized on the interface as described above, but, unlike surfactants, necessarily does not need to have a hydrophilic group within the molecule and does not contribute to uniformly mixing the polar/non-polar substances.

In the liquid immersion exposure step, the contact angle of the immersion liquid for the resist film in a dynamic state becomes critical since the immersion liquid needs to move on a wafer following the movement of an exposure head scanning on the wafer at a high speed to form an exposure pattern, therefore, the resist is required to have an ability to follow the high-speed scan of the exposure head without leaving any droplets.

In the hydrophobic resin, a development residue (scum) and BLOB defects are easily deteriorated after alkali development since the hydrophobic resin is hydrophobic, however, a development residue (scum) and BLOB defect performance are improved since the hydrophobic resin has three or more polymer chains through at least one branch portion, therefore, the alkali dissolution rate is improved compared to a linear resin.

When the hydrophobic resin has a fluorine atom, the content of the fluorine atom is preferably 5 to 80% by mass and more preferably 10 to 80% by mass with regard to a molecular weight of the hydrophobic resin. In addition, the repeating unit including a fluorine atom is preferably 10 to 100 mol % and more preferably 30 to 100 mol % with regard to all repeating units in the hydrophobic resin.

When the hydrophobic resin has a silicon atom, the content of the silicon atom is preferably 2 to 50% by mass and more preferably 2 to 30% by mass with regard to a molecular weight of the hydrophobic resin. In addition, the repeating unit including a silicon atom is preferably 10 to 90 mol % and more preferably 20 to 80 mol % with regard to all repeating units in the hydrophobic resin.

The weight-average molecular weight of the hydrophobic resin is preferably 1,000 to 100,000, more preferably 2,000 to 50,000, and even more preferably 3,000 to 35,000. Here, the weight-average molecular weight of the resin represents a polystyrene converted molecular weight measured by GPC (a carrier: tetrahydrofuran (THF)).

The content of the hydrophobic resin in the actinic ray-sensitive or radiation-sensitive resin composition may be appropriately adjusted and used so that the receding contact angle of the actinic ray-sensitive or radiation-sensitive resin film becomes the above range, but is preferably 0.01 to 20% by mass, more preferably 0.1 to 15% by mass, even more preferably 0.1 to 10% by mass, and particularly preferably 0.2 to 8% by mass with regard to total solid contents in the actinic ray-sensitive or radiation-sensitive resin composition.

The hydrophobic resin may be used either alone or a plurality of resins may be used in combination.

[4] Basic Compound

The actinic ray-sensitive or radiation-sensitive resin composition of the present invention preferably contains a basic compound in order to reduce performance changes over time from exposure to heating.

The basic compound may preferably include a compound having a structure represented by the following Formulae (A) to (E).

[Chem. 97]

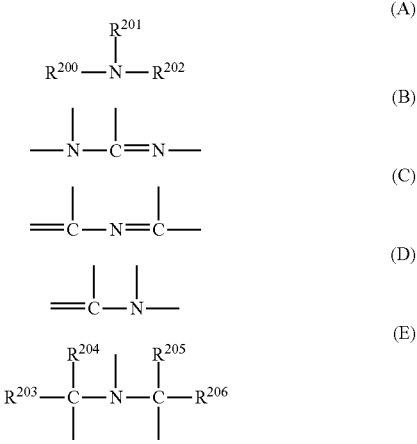

In General formulae (A) and (E), $R^{200}$, $R^{201}$ and $R^{202}$ may be the same as or different from each other, and represent a hydrogen atom, an alkyl group (preferably having 1 to 20 carbon atoms), a cycloalkyl group (preferably having 3 to 20 carbon atoms) or an aryl group (preferably having 6 to 20 carbon atoms), and $R^{201}$ and $R^{202}$ may be bonded to each other to form a ring.

$R^{203}$, $R^{204}$, $R^{205}$ and $R^{206}$ may be the same as or different from each other, and represent an alkyl group having 1 to 20 carbon atoms.

For the alkyl group, an alkyl group having a substituent is preferably an aminoalkyl group having 1 to 20 carbon atoms, a hydroxyalkyl group having 1 to 20 carbon atoms or a cyanoalkyl group having 1 to 20 carbon atoms.

The alkyl group in General Formulae (A) and (E) is more preferably unsubstituted.

The preferable compound may include, guanidine, aminopyrrolidine, pyrazole, pyrazoline, piperazine, amino morpholine, aminoalkyl morpholine, piperidine or the like, and the more preferable compound may include a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, an aniline derivative having a hydroxyl group and/or an ether bond, or the like.

The compound having an imidazole structure may include imidazole, 2,4,5-triphenyl imidazole, benzimidazole, 2-phenylbenzimidazole, or the like. The compound having a diazabicycle structure may include 1,4-diazabicyclo[2,2,2]octane, 1,5-diazabicyclo[4,3,0]nona-5-ene, 1,8-diazabicyclo[5,4,0]undeca-7-ene, or the like. The compound having an onium hydroxide structure may include tetrabutylammonium hydroxide, triarylsulfonium hydroxide, phenacylsulfonium hydroxide, sulfonium hydroxide having an 2-oxoalkyl group, specifically, triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide, or the like. The compound having an onium carboxylate structure is a compound having an onium hydroxide structure of which anion portion is carboxylated, and may include, for example, acetate, adamantane-1-carboxylate, perfluoroalkyl carboxylate, or the like. The compounds having a trialkylamine structure may include tri(n-butyl)amine, tri(n-octyl)amine, or the like. The aniline compound may include 2,6-diisopropylaniline, N,N-dimethylaniline, N,N-dibutylaniline, N,N-dihexylaniline, or the like. The alkylamine derivative having a hydroxyl group and/or an ether bond may include ethanolamine, diethanolamine, triethanolamine, N-phenyldiethanolamine, and tris(methoxyethoxyethyl)amine, or the like. The aniline derivative having a hydroxyl group and/or an ether bond may include N,N-bis(hydroxyethyl)aniline, or the like.

The preferable basic compound may further include an amine compound having a phenoxy group, an ammonium salt compound having a phenoxy group, an amine compound having a sulfonate group, and an ammonium salt compound having a sulfonate group.

As for the amine compound having a phenoxy group, the ammonium salt compound having a phenoxy group, the amine compound having a sulfonate group, and the ammonium salt compound having a sulfonate group, it is preferable that at least one alkyl group be bonded to the nitrogen atom. In addition, it is preferable that the compound have an oxygen atom in the alkyl chain to form an oxyalkylene group. The number of the oxyalkylene groups within the molecule is one or more, preferably 3 to 9, and more preferably 4 to 6. As the oxyalkylene group, the structure of —CH$_2$CH$_2$O—, —CH(CH$_3$)CH$_2$O—, or —CH$_2$CH$_2$CH$_2$O— is preferable.

Specific examples of the amine compound having a phenoxy group, the ammonium salt compound having a phenoxy group, the amine compound having a sulfonate group, and the ammonium salt compound having a sulfonate group include, but are not limited to, the compounds (C1-1) to (C3-3) exemplified in 0066 of US2007/0224539A.

These basic compounds may be used either alone or as a combination of two types or more.

The composition of the present invention may or may not contain the basic compound, but when the composition does, the content of the basic compound is typically 0.001 to 10% by mass, and preferably 0.01 to 5% by mass with regard to solid contents of the actinic ray-sensitive or radiation-sensitive resin composition.

The ratio between the acid generator and the basic compound used in the composition is preferably a ratio of acid generator/basic compound (molar ratio)=2.5 to 300. In other words, the molar ratio is preferably 2.5 or more from the viewpoint of sensitivity and resolution, and is preferably 300 or less from the viewpoint of suppressing the reduction of the resolution by an enlargement of the resist pattern over time from post-exposure to the heat treatment. The acid generator/basic compound (molar ratio) is more preferably 5.0 to 200, and even more preferably 7.0 to 150.

These basic compounds are preferably used in a molar ratio of low molecular compound (D)/basic compound=100/0 to 10/90, more preferably used in 100/0 to 30/70, and particularly preferably used in 100/0 to 50/50 with regard to a low molecular compound (D) described in the following section [5].

Furthermore, the basic compound here does not include (D) a low molecular compound having a nitrogen atom and having a group detached by the action of an acid which is also a basic compound sometimes.

[5] Low Molecular Compound having Nitrogen Atom and Having Group Detached by Action of Acid The composition of the present invention may contain a low molecular compound having a nitrogen atom and having a group detached by the action of an acid (hereinafter also referred to as "low molecular compound (D)" or "Compound (D)").

The group detached by the action of an acid is not particularly limited, but is preferably an acetal group, a carbonate group, a carbamate group, a tertiary ester group, a tertiary hydroxyl group or a hemiaminal ether group, and particularly preferably a carbamate group or a hemiaminal ether group.

The molecular weight of the low molecular compound having a group detached by the action of an acid (D) is preferably 100 to 1000, more preferably 100 to 700, and particularly preferably 100 to 500.

The compound (D) is preferably an amine derivative having a group detached by the action of an acid on the nitrogen atom.

The compound (D) may have a carbamate group having a protecting group on the nitrogen atom. The protecting group constituting the carbamate group may be represented by the following General Formula (d-1).

[Chem. 98]

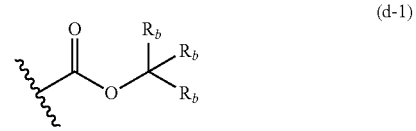

In General Formula (d-1), Rbs each independently represent a hydrogen atom, an alkyl group, a cycloalkyl group, an aryl group, an aralkyl group or an alkoxyalkyl group. Rbs may be bonded to each other to form a ring.

The alkyl group, the cycloalkyl group, the aryl group, the aralkyl group represented by Rbs may be substituted with a functional group such as a hydroxyl group, a cyano group, an amino group, a pyrrolidino group, a piperidino group, a morpholino group or an oxo group, an alkoxy group, or a halogen atom. The same applies to the alkoxyalkyl group represented by Rbs.

Examples of the alkyl group, the cycloalkyl group, the aryl group, the aralkyl group of the Rb (these alkyl group, cycloalkyl group, aryl group and aralkyl group may be substituted with the functional group described above, an alkoxy group, or a halogen atom) may include a group derived from a linear or branched alkane such as methane, ethane, propane, butane, pentane, hexane, heptane, octane, nonane, decane, undecane or dodecane, a group in which the group derived from alkane is substituted with one type or more, or one or more cycloalkyl groups such as, for example, a cyclobutyl group, cyclopentyl group or cyclohexyl group, a group derived from cycloalkane such as cyclobutane, cyclopentane, cyclohexane, cycloheptane, cyclooctane, norbornane, adamantine or noradamantane, a group in which the group derived from cycloalkane is substituted with one type or more, or one or more linear or branched alkyl groups such as, for example, a methyl group, an ethyl group, an n-propyl group, an i-propyl group, an n-butyl group, a 2-methylpropyl group, a 1-methylpropyl group or a t-butyl group, a group derived from an aromatic compound such as benzene, naphthalene, or anthracene, a group in which the group derived from an aromatic compound is substituted with one type or more, or one or more linear or branched alkyl groups such as, for example, a methyl group, an ethyl group, an n-propyl group, an i-propyl group, an n-butyl group, a 2-methylpropyl group, a 1-methylpropyl group or a t-butyl group, a group derived from a heterocyclic compound such as pyrrolidine, piperidine, morpholine, tetrahydrofuran, tetrahydropyran, indole, indoline, quinoline, perhydroquinoline, indazole or benzimidazole, a group in which the group derived from a heterocyclic compound is substituted with one type or more, or one or more linear or branched alkyl groups or groups derived from an aromatic compound, a group in which the group derived from linear or branched alkane the group derived from cycloalkane is substituted with one type or more, or one or more groups derived from an aromatic compound such as a phenyl group, a naphthyl group, or an anthracenyl group, or the like, or a group in which the substituents described above are substituted with a functional group such as a hydroxyl group, a cyano group, an amino group, a pyrrolidino group, a piperidino group, a morpholino group or an oxo group, or the like.

Rb is preferably a linear or branched alkyl group, a cycloalkyl group or an aryl group. A linear or branched alkyl group or a cycloalkyl group is more preferable.

The ring formed by two Rbs being bonded to each other may include an alicyclic hydrocarbon group, an aromatic hydrocarbon ring, a heterocyclic hydrocarbon group, or a derivative thereof.

Specific structures of the group represented by General Formula (d-1) are shown below.

[Chem. 99]

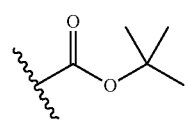

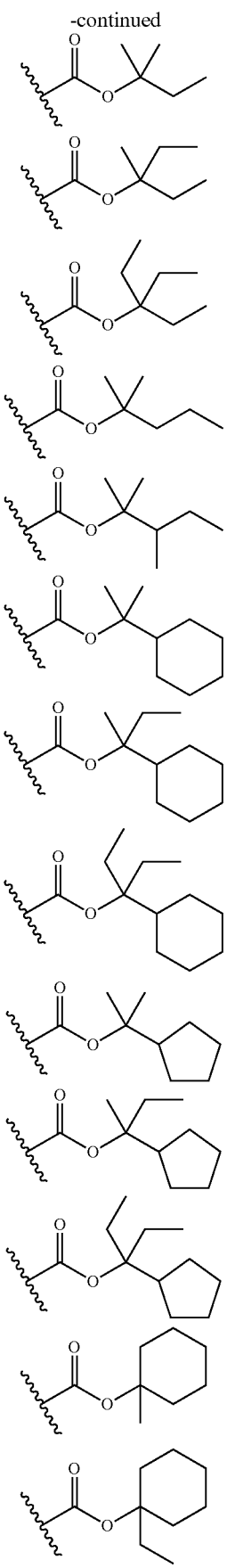

151
-continued
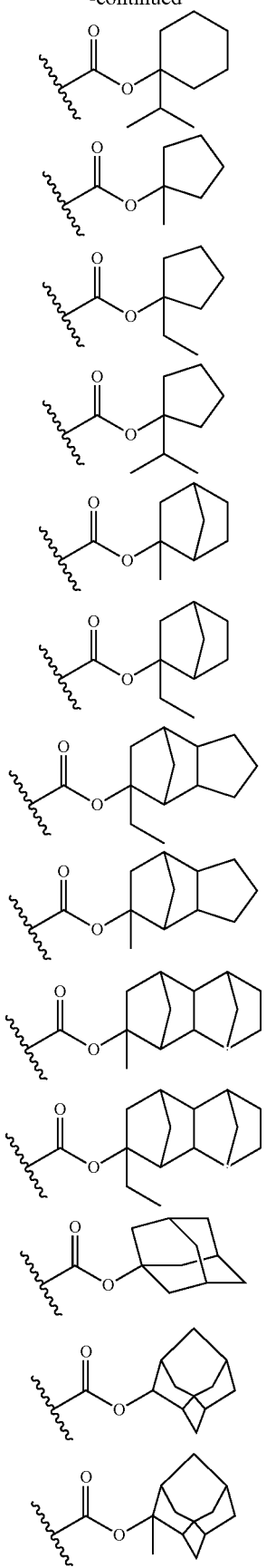
152
-continued
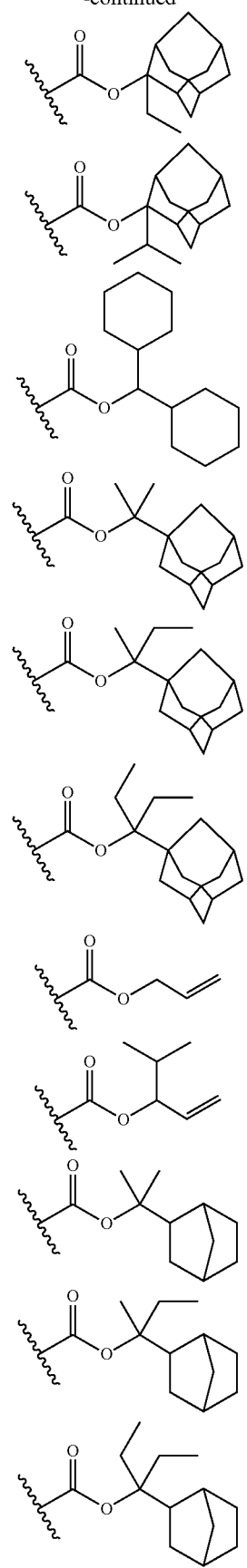

-continued

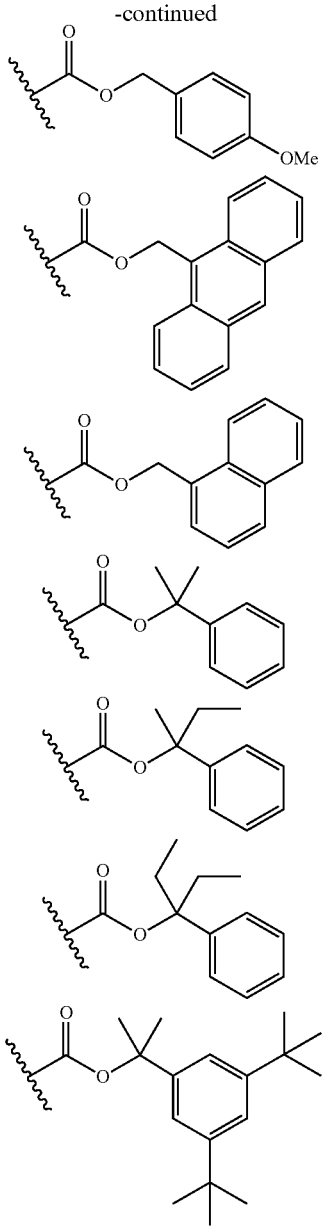

The compound (D) may also be formed by arbitrary combinations of the basic compound and a structure represented by General Formula (d-1).

The compound (D) particularly preferably has a structure represented by the following General Formula (A), In addition, the compound (D) may correspond to the basic compound as long as it is a low molecular compound having a group detached by the action of an acid.

[Chem. 100]

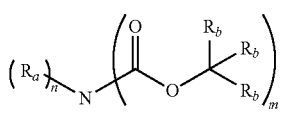

(A)

In General Formula (A), Ra represents a hydrogen atom, an alkyl group, a cycloalkyl group, an aryl group or an aralkyl group. In addition, when n=2, the two Ras may be the same as or different from each other, two of Ra may be bonded to each other to form a divalent heterocyclic hydrocarbon group (preferably having 20 or less carbon atoms) or a derivative thereof.

Rbs are synonymous with Rbs in General Formula (d-1) and so are the preferable examples. However, in —C(Rb)(Rb)(Rb), when one or more of Rbs are hydrogen atoms, at least one of the remaining Rbs is a cyclopropyl group, an 1-alkoxyalkyl group or an aryl group.

n represents an integer of 0 to 2, m represents an integer of 1 to 3, respectively, and n+m=3

In General Formula (A), the alkyl group, the cycloalkyl group, the aryl group and the aralkyl group represented by Ra may be substituted with the same group described above as the group in which the alkyl group, the cycloalkyl group, the aryl group and the aralkyl group represented by $R_b$ may be substituted.

Specific examples of the alkyl group, the cycloalkyl group, the aryl group, and the aralkyl group of the Ra (these alkyl group, cycloalkyl group, aryl group and aralkyl group may be substituted with the above groups) include the same specific examples for Rb described above.

In addition, examples of the divalent heterocyclic hydrocarbon group (preferably having 1 to 20 carbon atoms) formed by the Ras being bonded to each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, 1,5,9-triazacyclododecane, or a group in which the group derived from these heterocyclic compounds is substituted with one type or more or one or more groups derived from linear or branched alkanes, groups derived from cycloalkane, groups derived from an aromatic compound, groups derived from a heterocyclic compound, functional groups such as a hydroxyl group, a cyano group, an amino group, a pyrrolidino group, a piperidino group, a morpholino group or an oxo group, or the like.

Specific examples of the particularly preferable compound (D) of the present invention are shown below, however, the present invention is not limited to these.

[Chem. 101]

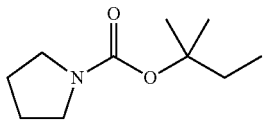

(D-1)

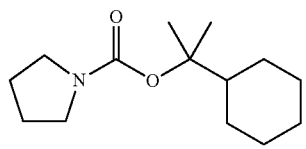

(D-2)

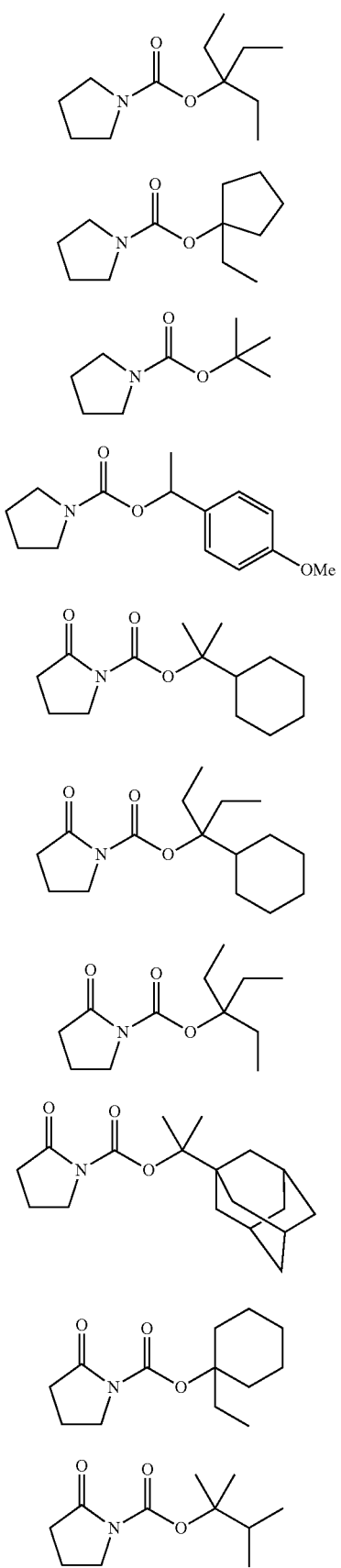
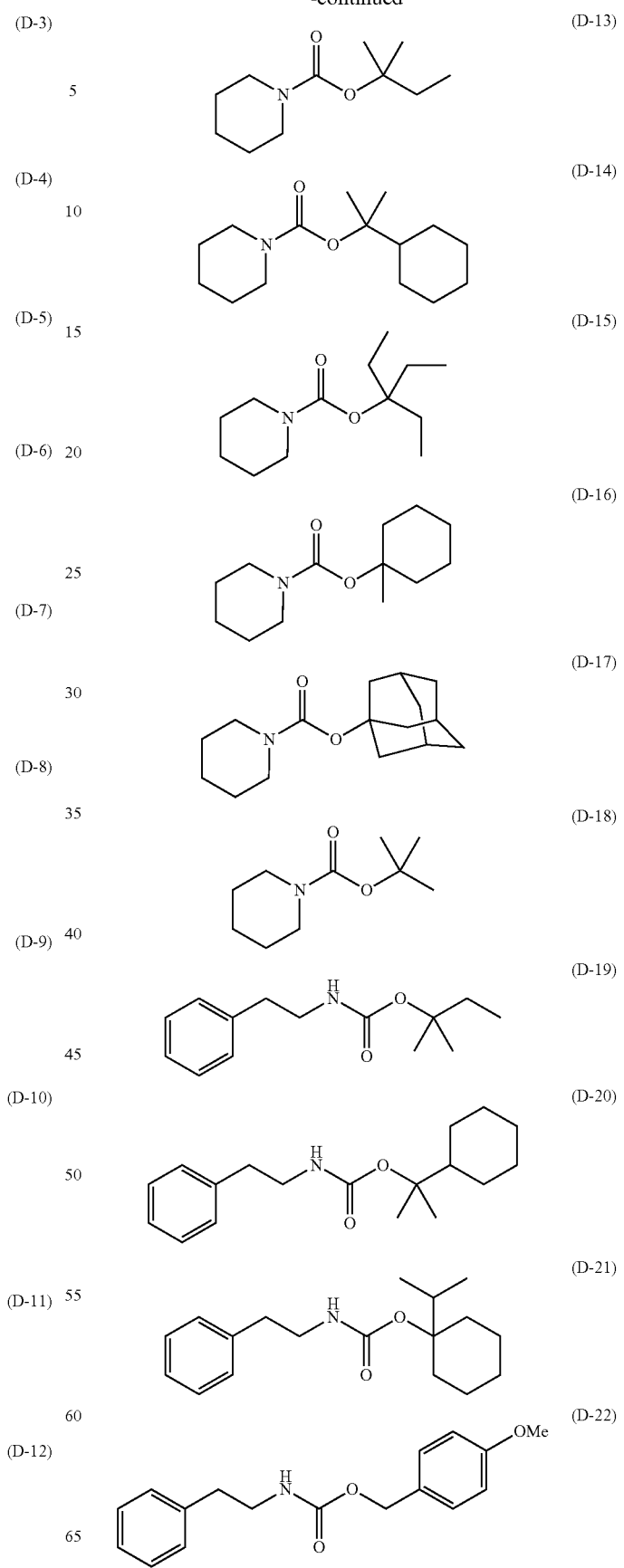

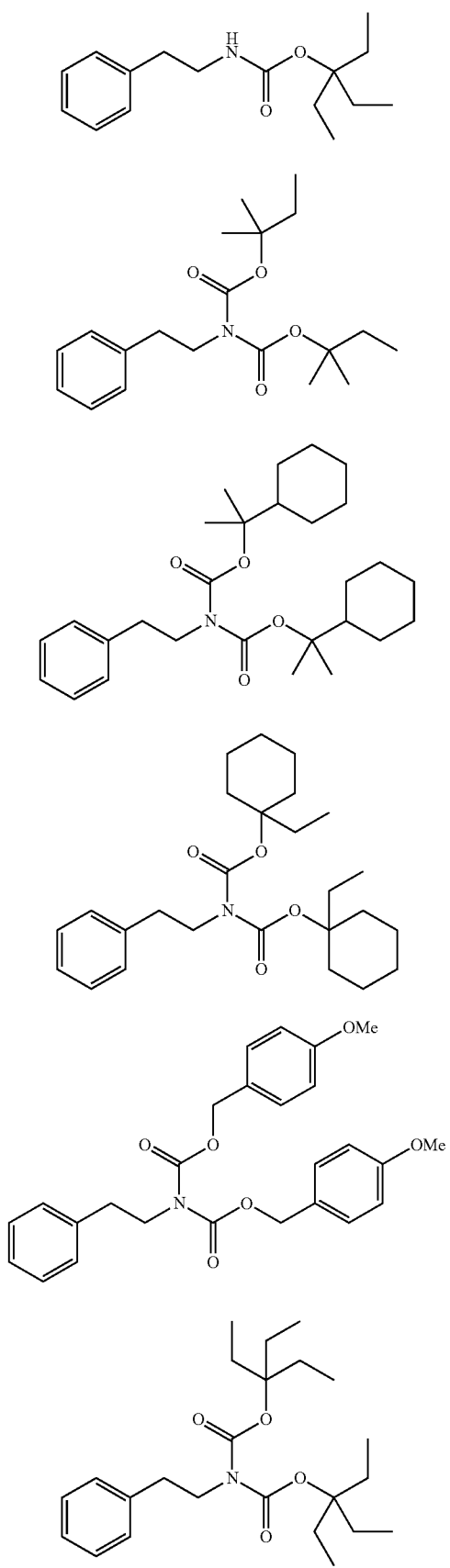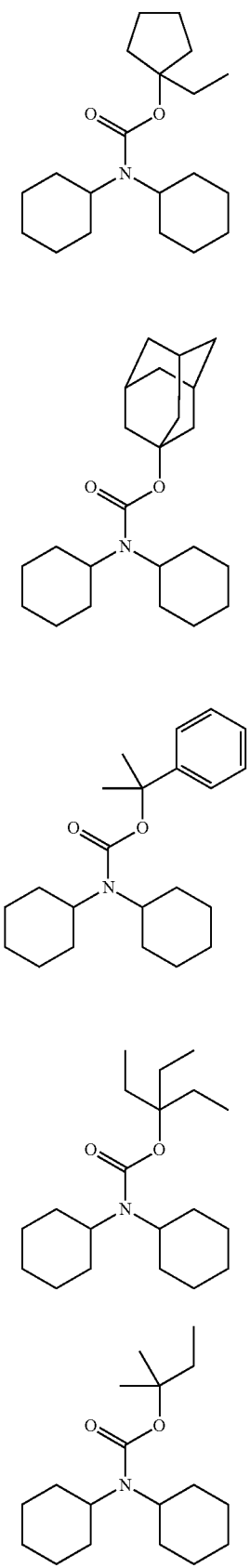

[Chem. 102]
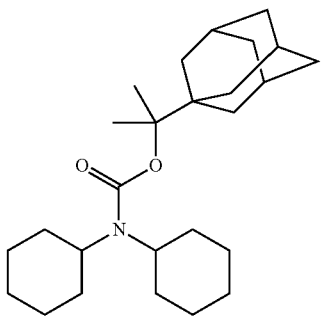 (D-34)
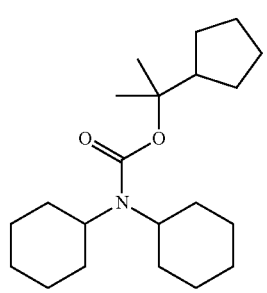 (D-35)
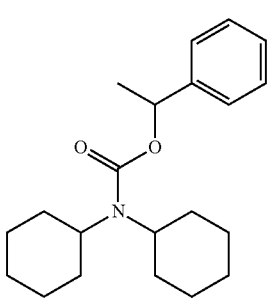 (D-36)
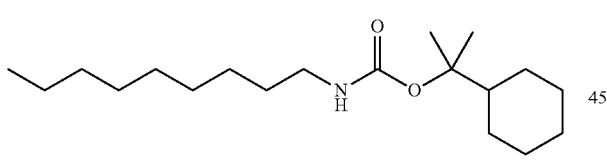 (D-37)
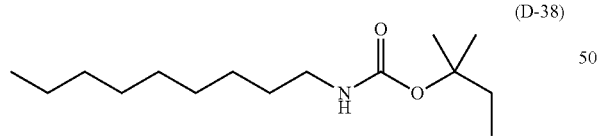 (D-38)
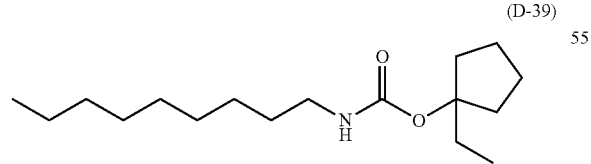 (D-39)
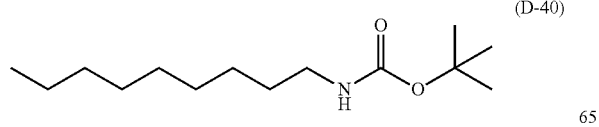 (D-40)
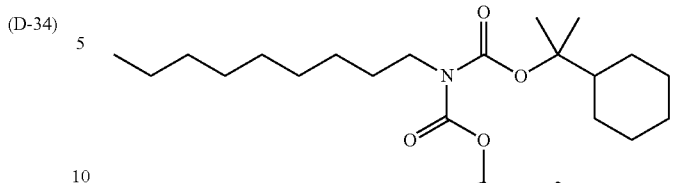 (D-41)
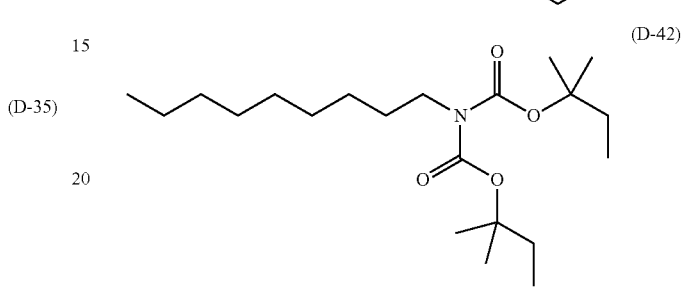 (D-42)
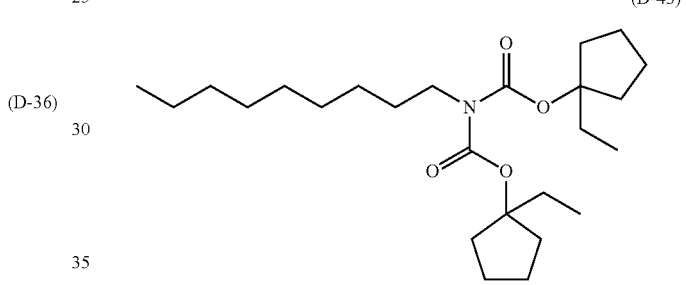 (D-43)
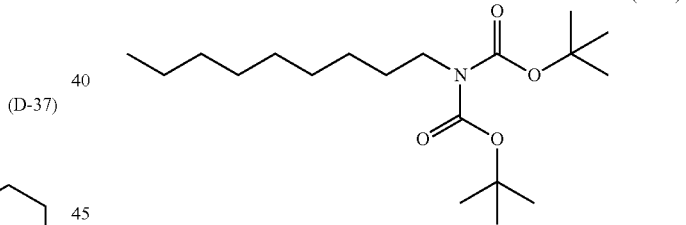 (D-44)
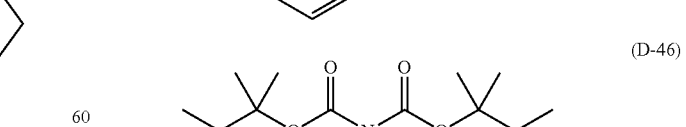 (D-45)
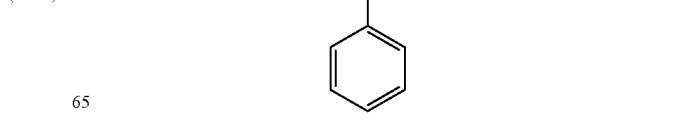 (D-46)

-continued (D-47) 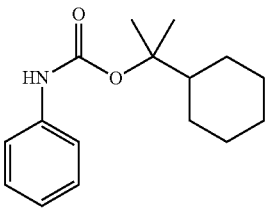

(D-48) 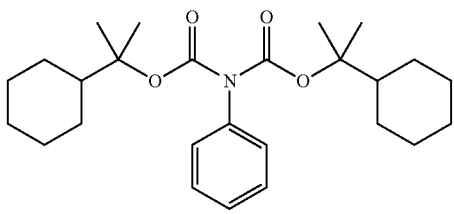

(D-49) 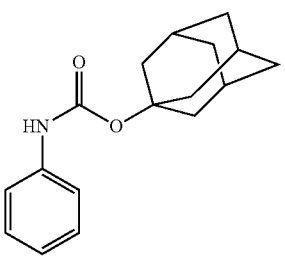

(D-50) 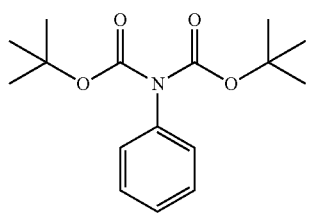

(D-51) 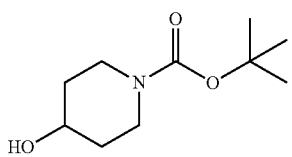

(D-52) 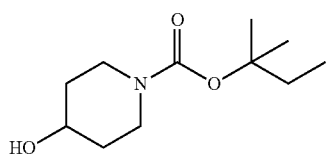

(D-53) 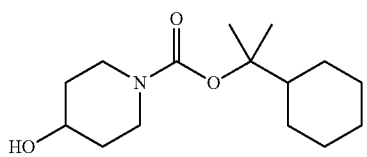

(D-54) 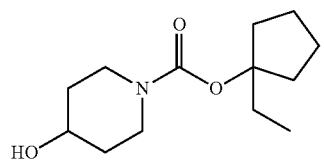

-continued (D-55) 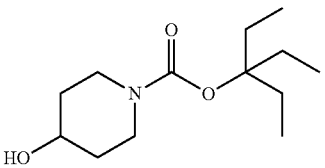

The compound represented by General Formula (A) can be synthesized based on JP2007-298569A, JP2009-199021A, and the like.

In the present invention, (D) the low molecular compound having a nitrogen atom and having a group detached by the action of an acid may be used either alone or as a combination of two types or more.

The actinic ray-sensitive or radiation-sensitive resin composition of the present invention may or may not contain (D) the low molecular compound having a nitrogen atom and having a group detached by the action of an acid, but when the composition does, the content of the compound (D) is typically 0.001 to 20% by mass, preferably 0.001 to 10% by mass, and more preferably 0.01 to 5% by mass with regard to total solid contents of the composition combined with the basic compound.

[6] Surfactant

The composition in the present invention may further or may not contain a surfactant. The surfactant is preferably a fluorine- and/or silicon-based surfactant. The surfactant corresponding to these may include Megaface F176 and Megaface R08 manufactured by DIC Corporation, PF656 and PF6320 manufactured by OMNOVA Solutions Inc., Troysol S-366 manufactured by Troy Chemical Co., Ltd., Fluorad FC430 manufactured by Sumitomo 3M Limited, a polysiloxane polymer KP-341 manufactured by Shin-Etsu Chemical Co., Ltd. or the like.

Other surfactants besides the fluorine-based and/or silicon-based surfactants may also be used. More specifically, polyoxyethylene alkyl ethers, polyoxyethylene alkyl aryl ethers or the like may be included.

In addition to these, well-known surfactants may be used as appropriate. Examples of the surfactant which can be used include surfactants disclosed after 0273 of US2008/0248425A1.

These surfactants may be used either alone or as a combination of two types or more.

The actinic ray-sensitive or radiation-sensitive resin composition of the present invention may or may not contain the surfactant, but when the composition does, the amount of the surfactant used is preferably 0 to 2% by mass, more preferably 0.0001 to 2% by mass, and particularly preferably 0.0005 to 1% by mass with regard to total solid contents of the composition.

Meanwhile, keeping the addition amount of the surfactant to be 10 ppm or less or containing no surfactants is also preferable. As a result, surface localization of the hydrophobic resin is enhanced, thereby traceability of water may be improved when liquid immersion exposure is carried out since the surface of the resist film is made to be more hydrophobic.

[7] Solvent

The actinic ray-sensitive or radiation-sensitive resin composition according to the present invention typically further contains a solvent.

Examples of the solvent include an organic solvent such as alkylene glycol monoalkyl ether carboxylate, alkylene glycol monoalkyl ether, alkyl lactate, alkyl alkoxy propionate, cyclic lactone (preferably having 4 to 10 carbon atoms), a monoketone compound which may have a ring (preferably having 4 to 10 carbon atoms), alkylene carbonate, alkyl alkoxy acetate, or alkyl pyruvate.

Examples of the alkylene glycol monoalkyl ether carboxylate preferably include propylene glycol monomethyl ether acetate (PGMEA, alias 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate or ethylene glycol monoethyl ether acetate.

Examples of the alkylene glycol monoalkyl ether preferably include propylene glycol monomethyl ether (PGME, alias 1-methoxy-2-propanol), propylene glycol monoethyl ether, propylene glycol monopropyl ether, propylene glycol monobutyl ether, ethylene glycol monomethyl ether or ethylene glycol monoethyl ether.

Examples of the alkyl lactate preferably include methyl lactate, ethyl lactate, propyl lactate or butyl lactate.

Examples of the alkyl alkoxy propionate preferably include 3-ethoxyethyl propionate, 3-methoxymethyl propionate, 3-ethoxymethyl propionate or 3-methoxyethyl propionate.

Examples of the cyclic lactone preferably include β-propiolactone, β-butyrolactone, γ-butyrolactone, α-methyl-γ-butyrolactone, β-methyl-γ-butyrolactone, γ-valerolactone, γ-caprolactone, γ-octanoiclactone or α-hydroxy-γ-butyrolactone.

Examples of the monoketone compound which may have a ring preferably include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methyl cycloheptanone or 3-methyl cycloheptanone.

Examples of the alkylene carbonate preferably include propylene carbonate, vinylene carbonate, ethylene carbonate or butylene carbonate.

Examples of the alkyl alkoxy acetate preferably include 2-methoxyethyl acetate, 2-ethoxyethyl acetate, 2-(2-ethoxyethoxy)ethyl acetate, 3-methoxy-3-methylbutyl acetate or 1-methoxy-2-propyl acetate.

Examples of the alkyl pyruvate preferably include methyl pyruvate, ethyl pyruvate or propyl pyruvate.

The solvent which may be preferably used may include a solvent having a boiling point or 130° C. or higher. Specifically, cyclopentanone, γ-butyrolactone, cyclohexanone, ethyl lactate, ethylene glycol monoethyl ether acetate, propylene glycol monomethyl ether acetate, 3-ethoxyethyl propionate, ethyl pyruvate, 2-ethoxyethyl acetate, 2-(2-ethoxyethoxy) ethyl acetate or propylene carbonate.

In the present invention, the solvent may be used either alone or as a combination of two types or more.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, however, alkylene glycol monoalkyl ether, alkyl lactate or the like is preferable, and propylene glycol monomethyl ether or ethyl lactate is more preferable as the solvent containing a hydroxyl group. In addition, alkylene glycol monoalkyl ether acetate or alkyl alkoxy propionate, a monoketone compound which may have a ring, cyclic lactone, alkyl acetate or the like is preferable, propylene glycol monomethyl ether acetate, ethoxyethyl propionate, 2-heptanone, γ-butyrolactone, cyclohexanone or butyl acetate is particularly preferable, propylene glycol monomethyl ether acetate, ethoxyethyl propionate or 2-heptanone is most preferable as the solvent not containing a hydroxyl group.

The mixing ratio (mass) of the solvent containing a hydroxyl group and the solvent not containing a hydroxyl group is 1/99 to 99/1, preferably 10/90 to 90/10, more preferably is 20/80 to 60/40. A mixed solvent containing 50% by mass or more of the solvent not containing a hydroxyl group is particularly preferable in terms of coating uniformity.

The solvent may preferably contain propylene glycol monomethyl ether acetate, and is preferably a single solvent of propylene glycol monomethyl ether acetate or is a mixed solvent of two types or more containing propylene glycol monomethyl ether acetate.

[8] Other Components

In addition to the components described above, the composition of the present invention may appropriately contain an onium carboxylate salt, a dissolution inhibiting compound with a molecular weight of 3,000 or less described in Proceedings of SPIE, 2724, 355 (1996), a dye, a plasticizer, a photosensitizer, a light absorbing agent or the like.

[9] Pattern Forming Method

A pattern forming method of the present invention includes a step of exposing and a step of developing the resist film. In the present invention, the exposure is preferably a liquid immersion exposure.

The resist film of the present invention is formed from the actinic ray-sensitive or radiation-sensitive resin composition of the present invention described above, and more specifically, is preferably formed on a substrate. In the pattern forming method of the present invention, the step of forming a film using a resist composition on a substrate, the step of exposing the film and the step of developing may be performed using generally known methods.

The actinic ray-sensitive or radiation-sensitive resin composition of the present invention is preferably used in a film thickness of 30 to 250 nm and more preferably used in a film thickness of 30 to 200 nm from the viewpoint of improving resolution. Such film thicknesses may be obtained by setting the solid content concentration in the actinic ray-sensitive or radiation-sensitive resin composition in an appropriate range, therefore, giving appropriate viscosity, and as a result, improving coating properties and film-forming properties.

The solid content concentration in the actinic ray-sensitive or radiation-sensitive resin composition is generally 1 to 10% by mass, more preferably from 1 to 8.0% by mass, and even more preferably 1.0 to 6.0% by mass.

The actinic ray-sensitive or radiation-sensitive resin composition in the present invention is used by dissolving the above component in a solvent, filtering using a filter, and then coating on a support. The filter is preferably made of polytetrafluoroethylene, polyethylene, or nylon with a pore size of preferably 0.1 µm or less, more preferably 0.05 µm or less, and more preferably 0.03 µm or less. In addition, a plurality of types of filters may be used by being connected in series or in parallel. The composition may also be filtered a plurality of times. Furthermore, the composition may be subjected to a deaeration treatment or the like before and after filtration.

The composition is applied by a suitable coating method such as a spinner on the substrate used in the manufacture of integrated circuit elements (for example: silicon/silicon dioxide coating). After that and being dried, a photosensitive resist film may be formed.

The film is irradiated with actinic rays or radiation through a predetermined mask, and is preferably baked (heated), developed, and rinsed. As a result, a favorable pattern may be obtained. In addition, a drawing which is not through a mask (a direct drawing) is common in the irradiation of an electron beam.

It is preferable that a pre-heating step (PB: Prebaking) be included after the film formation and prior to the exposure step.

It is also preferable that, a heating step after exposure (PEB: Post Exposure Baking) be included after the exposure step and prior to the development step.

The heating temperature for both PB and PEB is preferably 70 to 120° C., and more preferably 80 to 110° C.

The heating time is preferably 30 to 300 seconds, more preferably 30 to 180 seconds, and even more preferably 30 to 90 seconds.

Heating may be carried out using means included in normal exposure and development apparatus, and may also be carried out using a hot plate or the like.

The reaction of the exposed portion is accelerated due to the baking, and therefore, sensitivity or pattern profile is improved.

Actinic rays or radiation is not particularly limited, but is, for example, a KrF excimer laser, an ArF excimer laser, EUV light, an electron beam or the like, and is preferably an ArF excimer laser, EUV light or an electron beam.

As the alkali developer in the development step, quaternary ammonium salts represented by tetramethylammonium hydroxide are typically used, however, in addition to these, an alkaline aqueous solution such as inorganic alkalis, primary to tertiary amines, alcoholamines or cyclic amines may also be used.

In addition, an appropriate amount of alcohols or surfactants may be added to the alkali developer.

The alkali concentration of the alkali developer is typically 0.1 to 20% by mass.

The pH of the alkali developer is typically 10.0 to 15.0.

As the rinsing liquid, pure water may be used with an appropriate amount of surfactants being added.

As the development method, for example, a method in which a substrate is immersed in a tank filled with a developer for a certain period of time (a dipping method), a method in which a developer is heaped up on the surface of a substrate by surface tension and developed by resting for a certain period of time (a paddle method), a method in which a developer is sprayed on the substrate surface (a spraying method), a method in which a developer is continuously discharged on a substrate rotated at a constant rate while scanning a developer discharging nozzle at a constant rate (a dynamic dispense method), or the like, may be applied.

In a rinsing step, the wafer developed is cleaned using a rinsing liquid. The cleaning method is not particularly limited, however, a method in which a rinsing liquid is continuously discharged on a substrate rotating at a constant rate (a spin coating method), a method in which a substrate is immersed in a tank filled with a rinsing liquid for a certain period of time (a dipping method), a method in which a rinsing liquid is sprayed on a substrate surface (a spraying method), or the like, may be applied, and among these, it is preferable that cleaning be carried out using a spin coating method, the substrate be rotated at a rotational speed of 2,000 rpm to 4,000 rpm after the cleaning, and the rinsing liquid be removed from the substrate. It is also preferable that a heating step (Post Baking) be included after the rinsing step. The residual developer and the rinsing liquid between and inside the patterns are removed by the baking. The heating step after the rinsing step is typically performed at 40 to 160° C. and preferably at 70 to 95° C., and typically for 10 seconds to 3 minutes and preferably for 30 seconds to 90 seconds.

Furthermore, a treatment for removing the developer or the rinsing liquid deposited on the pattern may be carried out using supercritical fluid after the development step or the rinsing step.

In addition, an antireflection film may be provided by coating on the substrate in advance before forming a photosensitive film (resist film).

As the antireflection film, both an inorganic film type such as titanium, titanium dioxide, titanium nitride, chromium oxide, carbon or amorphous silicon, or an organic film type made of a light absorber and a polymeric material may be used. Furthermore, as the organic antireflection film, commercially available organic antireflection films such as DUV30 series or DUV-40 series manufactured by Brewer Science, Inc., AR-2, AR-3 or AR-5 manufactured by Shipley Company L.L.C., or the like may be used.

An exposure (immersion exposure) may be carried out by filling the area between the film and the lens with liquid (immersion medium) having a higher refractive index than air upon irradiation with actinic rays or radiation. As a result, resolution can be enhanced. The immersion medium used is preferably water. Water is also suitable in terms that it has a small temperature coefficient of refractive index, is readily available, and easy to handle.

In addition, a medium having a refractive index of 1.5 or more may be used in terms of improving the refractive index. This medium may be either an aqueous solution or an organic solvent.

When water is used as the immersion liquid, an additive may be added in a small percentage for the purpose of improving the refractive index, and the like. Examples of the additive are described in detail in Chapter 12 of "Process and Material of Liquid Immersion Lithography" published by CMC Publishing. Meanwhile, if materials opaque to light of 193 nm or impurities whose refractive index is significantly different from water are incorporated, they cause a distortion of the optical image projected on the film, therefore, distilled water is preferable as the water used. Pure water filtered through an ion exchange filter or the like may also be used. Electrical resistance of the pure water is preferably 18.3 MΩ cm or more, TOC (Total Organic Carbon) is preferably 20 ppb or less, and it is preferable that a deaeration treatment be carried out.

A film sparingly soluble in the immersion liquid (hereinafter, also referred to as "top coat") may be provided between the resist film and the immersion liquid so that the resist film is not in direct contact with the immersion liquid. As a function required for the top coat, coating suitability on the resist film, transparency to radiation, particularly, radiation with a wavelength of 193 nm, and sparing solubility in the immersion liquid may be included. As the top coat, a top coat which does not mix with the resist film, and can be coated uniformly on the resist film is preferable.

The top coat is preferably a polymer which does not contain an aromatic group from the viewpoint of transparency in 193 nm. Examples of the polymer such as this include a hydrocarbon polymer, an acrylate polymer, polymethacrylate, polyacrylate, polyvinyl ether, a silicon-containing polymer and a fluorine-containing polymer. The hydrophobic resin described above is also suitable as a top coat. The residual monomer component of the polymer included in the top coat is preferably smaller since an optical lens is contaminated when impurities are eluted to the immersion liquid from the top coat.

When stripping the top coat, a developer may be used or a separate stripping agent may be used. As the stripping agent, a solvent with low penetration to the resist film is preferable. Stripping by an alkali developer is preferable in terms that the stripping step may be performed simultaneously with the developing treatment step of the resist. The top coat is preferably an acid from the viewpoint of stripping with the alkali developer, however, from the viewpoint of a non-intermixing property with the resist, the top coat may be either neutral or alkaline.

The refractive index difference between the top coat and the immersion liquid is preferably none or small. In this case, improving the resolution is possible. When the exposure light source is an ArF excimer laser (wavelength: 193 nm), the use of water is preferable as the immersion liquid, therefore, the top coat for ArF liquid immersion exposure preferably has a refractive index closer to that of water (1.44).

In addition, the top coat is preferably a thin film from the viewpoint of transparency and refractive index. The top coat preferably does not mix either with the resist film or with the immersion liquid. From this point of view, when the immersion liquid is water, it is preferable that the solvent used for the top coat be sparingly soluble in the solvent used in the actinic ray-sensitive or radiation-sensitive resin composition of the present invention, and be a non-water-soluble medium. In addition, when the immersion liquid is an organic solvent, the top coat may be either water-soluble or non-water-soluble.

In addition, the present invention also relates to an electronic devices manufacturing method including the pattern forming method of the present invention described above, and an electronic device manufactured by this manufacturing method.

The electronic device of the present invention is suitably installed in electrical and electronic devices (home appliances, OA and media-related devices, optical devices, communication devices, and the like).

Example

Synthesis Example 1

Synthesis of Acid Generator

The compounds A-1 to A-15, and A19 (the compounds represented by General Formula (A-I) or (A-II)) listed in the acid generator (1) and (2) columns of the following Table 2 were, for example, synthesized in accordance with synthesis methods disclosed in WO2011/093139A1.

Synthesis Example 2

Synthesis of Resin C 11.5 g of cyclohexanone was placed in a three-neck flask and was heated to 85° C. under a stream of nitrogen. A solution in which 1.48 g, 3.66 g, 0.95 g, 2.19 g and 1.57 g of the following compounds (monomers) from left to right, and a polymerization initiator V-601 (manufactured by Wako Pure Chemical Industries, Ltd., 0.68 g) were dissolved in 21.0 g of cyclohexanone was added dropwise thereto over 6 hours. After completion of the dropwise addition, the mixture was further reacted for 2 hours at 85° C. After cooling the reaction solution, the reaction solution was added dropwise to a mixed solution of 420 g of hexane/180 g of ethyl acetate over 20 minutes, the obtained precipitate was collected by filtration and dried, and 9.1 g of a resin C was obtained. The polymer composition ratio calculated from NMR was 15/30/10/30/15. The weight-average molecular weight (Mw) of the resin C obtained was 9,100 using polystyrene conversion, and the degree of dispersion (Mw/Mn) was 1.51.

[Chem. 103]

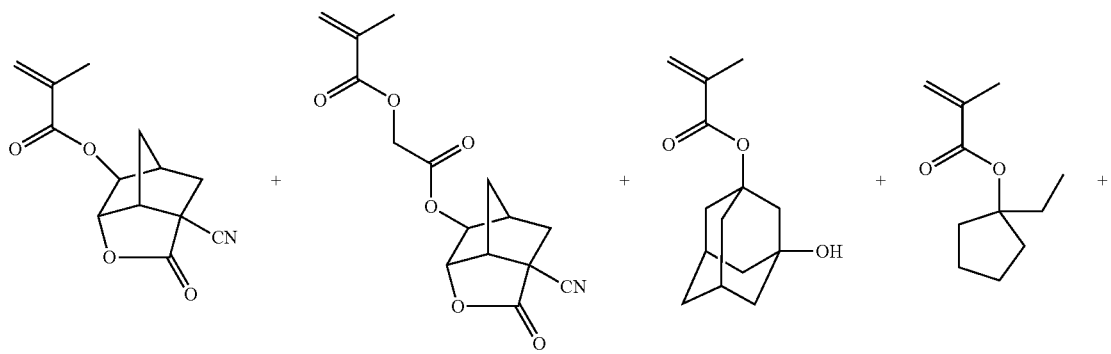

Resin C

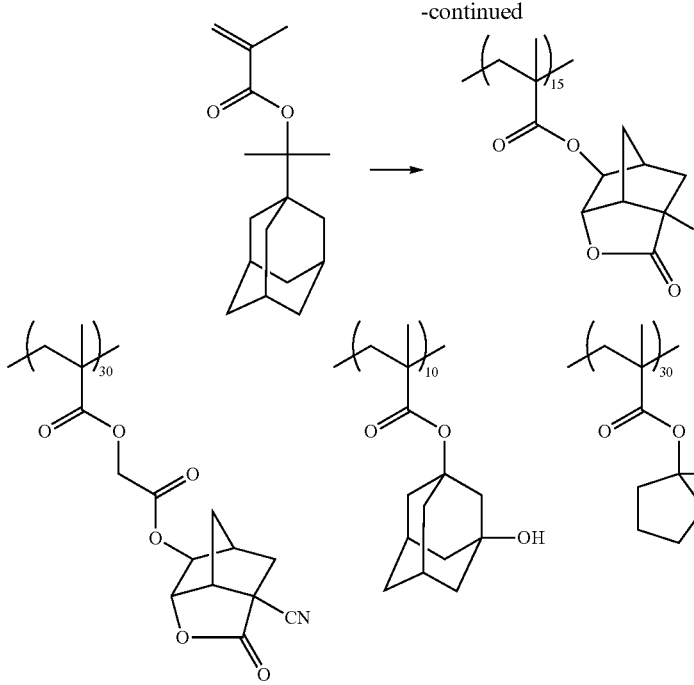
The resins A, B D to H were synthesized in the same manner as that of Synthesis Example 2. The polymer structure, the weight-average molecular weight (Mw), and the degree of dispersion (Mw/Mn) of the resins A to H are shown below. In addition, the composition ratios of each repeating unit of the following polymer structures are shown in molar ratios.
[Chem. 104]
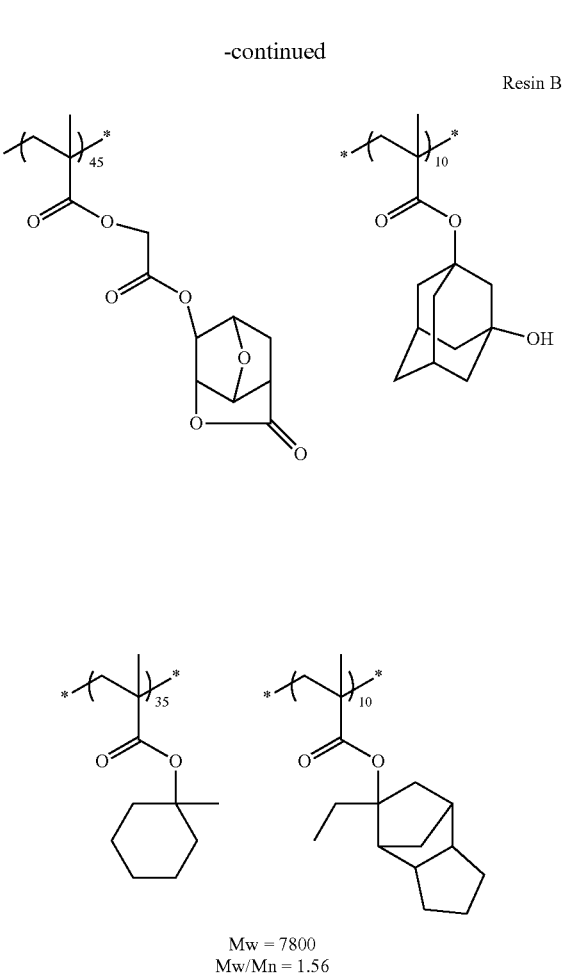

-continued
Resin C
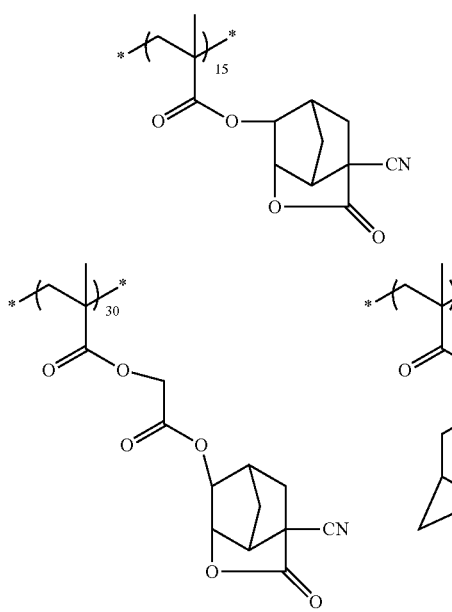
Mw = 9100
Mw/Mn = 1.51
Resin D
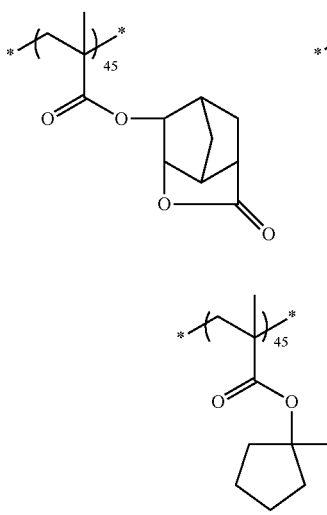
Mw = 6700
Mw/Mn = 1.53
-continued
Resin E
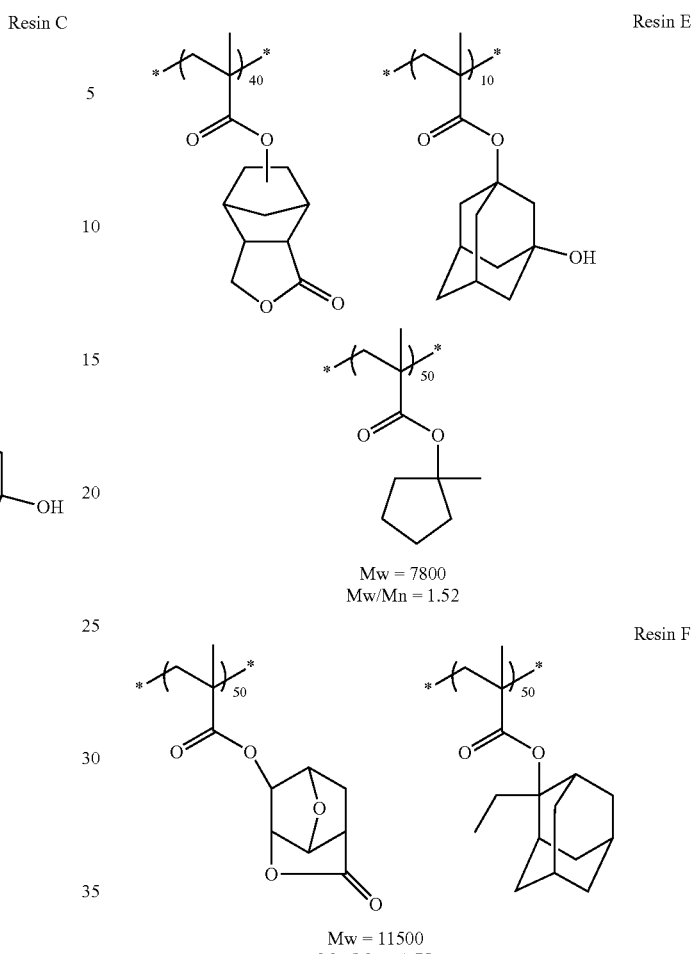
Mw = 7800
Mw/Mn = 1.52
Resin F
Mw = 11500
Mw/Mn = 1.75
Resin G
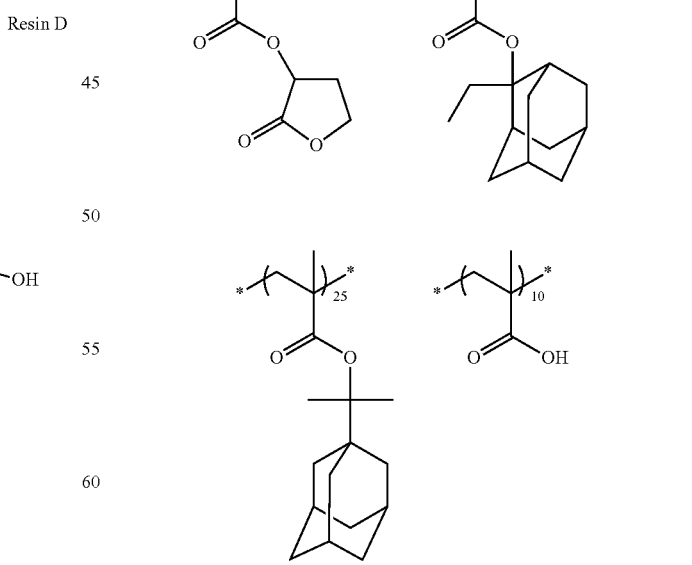
Mw = 9200
Mw/Mn = 1.65

-continued

[Chem. 105]

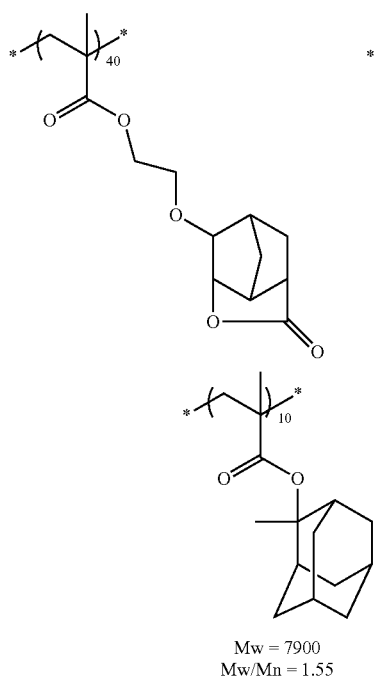

Resin H

Mw = 7900
Mw/Mn = 1.55

Preparation of Resist Composition

The components shown in the following Table 2 were dissolved in the solvents shown in the following Table 2, and a solution with a solid content concentration of 4% by mass was prepared, respectively. This solution was filtered using a polyethylene filter with a pore size of 0.05 μm, and the actinic ray-sensitive or radiation-sensitive resin composition (a positive-tone resist solution) was prepared. The actinic ray-sensitive or radiation-sensitive resin composition was evaluated using the following methods, and the results are shown in Table 2.

In addition, in Table 2, when the actinic ray-sensitive or radiation-sensitive resin composition contains a hydrophobic resin (HR), the form of use was labeled as "addition". When the actinic ray-sensitive or radiation-sensitive resin composition does not contain a hydrophobic resin (HR), and the topcoat protective film containing a hydrophobic resin (HR) is formed on the upper layer after the film is formed using the composition, the form of use was labeled as "TC".

Resist Evaluation (Exposure Conditions: ArF Liquid Immersion Exposure)

ARC29SR (manufactured by Nissan Chemical Industries, Ltd.) for forming an organic anti-reflective film was coated on a silicon wafer, baking was carried out for 60 seconds at 205° C., and the anti-reflective film with a film thickness of 98 nm was formed. The actinic ray-sensitive or radiation-sensitive resin composition prepared was coated thereon, baking was carried out for 60 seconds at 130° C., and the film with a film thickness of 120 nm was formed. When a top coat was used, a solution of 3% by mass in which the resin for a top coat (the hydrophobic resin (HR)) was dissolved in decane/octanol (mass ratio 9/1) was coated on the film obtained as described above, baking was carried out for 60 seconds at 85° C., and the top coat layer with a film thickness of 50 nm was formed. An exposure was carried out thereon through a 6% half-tone mask of 1:1 line and space pattern with a line width of 48 nm using an ArF excimer laser liquid immersion scanner (manufactured by ASML; XT1700i, NA1.2). Ultra-pure water was used as an immersion liquid. After that, heating was carried out for 60 seconds at 130° C., then, development was carried out for 30 seconds using an aqueous solution of tetramethylammonium hydroxide (2.38% by mass), and the pattern was formed after rinsing with pure water and spin drying.

LWR Evaluation

The 1:1 line and space pattern with a line width of 48 nm obtained was observed using a scanning microscope (manufactured by Hitachi, Ltd. S9380), the line width was measured at 50 points for the range of 2 μm edge in the longitudinal direction of the line pattern, and 3σ was calculated by obtaining the standard deviation for the measurement variation. A smaller value indicates a favorable performance.

Pattern Shape Evaluation

The cross section of the 1:1 line and space pattern with a line width of 48 nm obtained was observed using a scanning microscope (S9380 manufactured by Hitachi, Ltd.). A rectangular shape was indicated as A, a skirt shape was indicated as C, and a slight skirt shape was indicated as B.

Particle Evaluation

For the positive-tone resist solution prepared, the number of particles immediately after the preparation (particles initial value) in solution, and the number of particles allowed to stand for 1 week at 4° C. (the number of particles after the passage of time) in solution were counted using a particle counter KS-41 manufactured by Rion Co. Ltd., and the increase in the number of particles calculated using (the number of particles after the passage of time)-(particle initial value). Here, the particles with a particle diameter of 0.25 μm or more included in 1 mL of solution were counted.

In the particle evaluation, the amount of increases being less than or equal to 0.2 pieces/ml was determined as A, greater than 0.2 pieces/ml and less than or equal to 1 pieces/ml as B, greater than 1 pieces/ml and less than or equal to 5 pieces/ml as C, and greater than 5 pieces/ml as D.

TABLE 2

| | Acid Generator (1) (g) | Acid Generator (2) (g) | Resin (B) (10 g) | Basic Compound or Compound (D) (g) | Hydrophobic Resin (HR) (35 mg) | Solvent (Mass Ratio) | Surfactant (10 mg) | Evaluation Results | | |
|---|---|---|---|---|---|---|---|---|---|---|
| | | | | | | | | LWR (nm) | Pattern Shape | Particle |
| Example 1 | A-12 (0.2) | A-1 (1.7) | A | D-52 (0.33) | Addition B-2 | A1 (100) | W-1 | 5.0 | A | B |
| Example 2 | A-12 (0.5) | A-2 (1.5) | C | DIA (0.3) | Addition B-10 | A1/B1 (60/40) | W-2 | 4.3 | A | A |

TABLE 2-continued

| | Acid Generator (1) (g) | Acid Generator (2) (g) | Resin (B) (10 g) | Basic Compound or Compound (D) (g) | Hydrophobic Resin (HR) (35 mg) | Solvent (Mass Ratio) | Surfactant (10 mg) | Evaluation Results | | |
|---|---|---|---|---|---|---|---|---|---|---|
| | | | | | | | | LWR (nm) | Pattern Shape | Particle |
| Example 3 | A-12 (0.4) | A-3 (1.3) | B | DBA (0.35) | Addition B-12 | A1/A2/A3 (90/7/3) | W-1 | 4.7 | A | B |
| Example 4 | A-13 (0.2) | A-4 (1.8) | A | D-13 (0.28) | Addition B-41 | A1/A3 (95/5) | W-3 | 4.8 | A | B |
| Example 5 | A-13 (0.2) | A-5 (1.6) | D | TEA/PBI (0.36/0.38) | TC B-52 | A1/B2 (90/10) | — | 5.3 | A | B |
| Example 6 | A-13 (0.3) | A-10 (1.8) | E | PBI (0.38) | TC B-41 | A1 (100) | W-4 | 4.1 | A | A |
| Example 7 | A-14 (0.4) | A-7 (1.5) | A/D (5 g/5 g) | PBI (0.38) | Addition B-30 | A1/A3 (97/3) | W-1 | 5.1 | A | B |
| Example 8 | A-14 (0.6) | A-8 (0.9) | A | D-13 (0.33) | Addition B-52 | A1 (100) | — | 5.2 | A | B |
| Example 9 | A-14 (0.3) | A-11 (1.6) | B | DIA/D-13 (0.1/0.2) | Addition B-16 | A1/A2 (90/10) | W-1 | 4.0 | A | A |
| Example 10 | A-12 (0.6) | A-6 (0.6) | F | D-52 (0.33) | TC B-52 | A1 (100) | W-1 | 5.7 | A | B |
| Example 11 | A-12 (0.5) | A-9 (1.2) | G | D-13 (0.33) | Addition B-2 | A1 (100) | W-1 | 5.8 | A | B |
| Example 12 | A-12 (0.2) | A-1 (1.7) | H | D-52 (0.33) | Addition B-2 | A1 (100) | W-1 | 4.8 | A | B |
| Example 13 | A-19 (0.3) | A-11 (1.8) | B/E (5 g/5 g) | DIA/D-13 (0.1/0.2) | Addition B-16 | A1 (100) | W-1 | 4.1 | A | A |
| Example 14 | A-12/A-14 (0.1/0.1) | A-1/A-10 (0.6/1.0) | A | D-52 (0.33) | Addition B-2 | A1 (100) | W-1 | 5.0 | A | B |

TABLE 3

| | Acid Generator (1) (g) | Acid Generator (2) (g) | Resin (B) (10 g) | Basic Compound or Compound (D) (g) | Hydrophobic Resin (HR) (35 mg) | Solvent (Mass Ratio) | Surfactant (10 mg) | Evaluation Results | | |
|---|---|---|---|---|---|---|---|---|---|---|
| | | | | | | | | LWR (nm) | Pattern Shape | Particle |
| Comparative Example 1 | A-12 (1.0) | — | A | PEA (0.42) | Addition B-12 | A1 (100) | W-1 | 7.3 | C | D |
| Comparative Example 2 | A-12 (1.0) | A-13 (1.0) | A | DIA (0.3) | Addition B-10 | A1 (100) | W-1 | 7.0 | C | C |
| Comparative Example 3 | A-12 (0.5) | A-X (1.3) | A | PEA (0.42) | Addition B-12 | A1 (100) | W-1 | 6.4 | B | C |
| Comparative Example 4 | A-12 (0.4) | A-Y (1.3) | B | DBA (0.35) | Addition B-12 | A1/A2/A3 (90/7/3) | W-1 | 6.1 | B | C |

Abbreviations in the tables are shown in the above specific examples, or shown below.

Acid Generator (Compound (A))

The compounds A-X and A-Y are the following compounds, and do not correspond to General Formula (A-I) or (A-II). Abbreviations of the acid generators other than these in the tables are shown in the specific examples described above.

[Chem. 106]

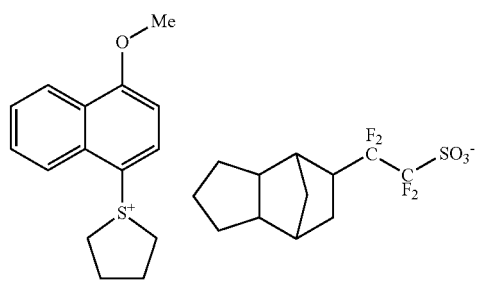

A-X

-continued

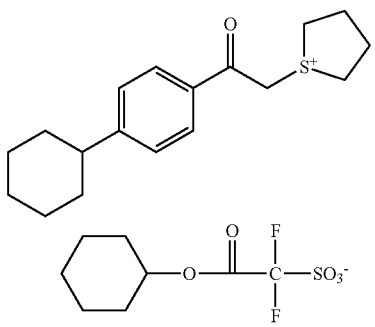

A-Y

Basic Compound

DIA: 2,6-diisopropyl aniline
TEA: triethanolamine
DBA: N,N-dibutyl aniline
PBI: 2-phenylbenzimidazole
PEA: N-phenyldiethanolamine Low Molecular Compound (D) Having Group Detached by the Action of Acid (Compound (D))

[Chem. 107]

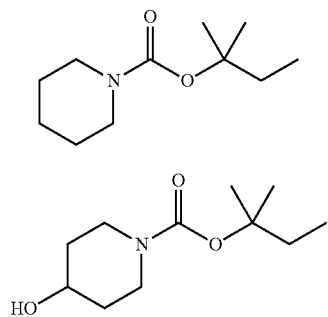

D-13

D-52

Hydrophobic Resin (HR)

Abbreviations in the tables are shown in the above specific examples.

Surfactant

W-1: Megaface F176 (manufactured by DIC Corporation) (fluorine-based)
W-2: Megaface R08 (manufactured by DIC Corporation) (fluorine- and silicon-based)
W-3: PF6320 (manufactured by OMNOVA Solutions Inc.) (fluorine-based)
W-4: Troysol S-366 (manufactured by Troy Chemical Co., Ltd.)

Solvent

A1: propylene glycol monomethyl ether acetate (PGMEA)
A2 cyclohexanone
A3 γ-butyrolactone B1: propylene glycol monomethyl ether (PGME)
B2: ethyl lactate As is seen from Table 2, in the compositions of the examples, particle occurrence over time was low, Line Width Roughness (LWR) was favorable as well, and it was possible to form a pattern having a rectangular pattern shape. Meanwhile, in the acid generator, the effects of the above examples were not obtained in the compositions of the comparative examples which did not have the combination of the compound represented by General Formula (A-I) and the compound represented by General Formula (A-II).

Furthermore, in Examples 2, 6 and 9 which use the combination of acid generators in which the anion structure of the compound represented by General Formula (A-I) and the anion structure of the compound represented by General Formula (A-II) are the same, more excellent effects were obtained regarding LWR and particle occurrence over time.

What is claimed is:

1. An actinic ray-sensitive or radiation-sensitive resin composition comprising:
    (A) a compound capable of generating an acid by irradiation of actinic rays or radiation; and
    (B) a resin of which solubility in an alkali developer increases by being decomposed by the action of an acid,
    wherein the actinic ray-sensitive or radiation-sensitive resin composition contains at least one type of a compound represented by the following General Formula (A-I) and at least one type of a compound represented by the following General Formula (A-II) as the compound (A),

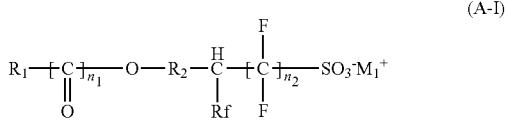

(A-I)

wherein in General Formula (A-I), $R_1$ represents an alkyl group, a monovalent alicyclic hydrocarbon group, an aryl group or a heteroaryl group, $R_2$ is a divalent linking group, Rf is a fluorine atom, or an alkyl group substituted with at least one fluorine atom, $n_1$ and $n_2$ each independently are 0 or 1, and $M_1^+$ is a sulfonium cation represented by the following General Formula (A-III),

(A-III)

wherein in General Formula (A-III), each Ar independently represents an aryl group or a heteroaryl group,

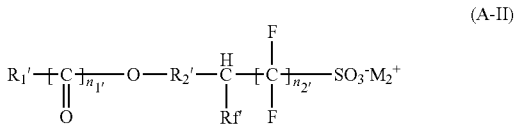

(A-II)

wherein in General Formula (A-II), $R_1'$ represents an alkyl group, a monovalent alicyclic hydrocarbon group, an aryl group or a heteroaryl group, $R_2'$ is a divalent linking group, Rf' is a fluorine atom, or an alkyl group substituted with at least one fluorine atom, $n_1'$ and $n_2'$ each independently are 0 or 1, and $M_2^+$ is a sulfonium cation represented by the following General Formula (A-IV) or (A-V),

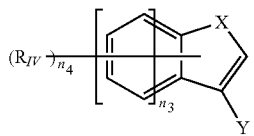
(A-IV)

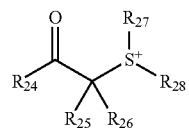
(A-V)

wherein in General Formula (A-IV), X represents —$CR_{21}$=$CR_{22}$—, —$NR_{23}$—, —S— or —O—, $R_{21}$, $R_{22}$ and $R_{23}$ each independently represents a hydrogen atom, a hydroxyl group, an alkyl group, a cycloalkyl group, an alkoxy group, an acyl group or an aryl group, $R_{IV}$ represents a substituent, $R_{IV}$s may be the same as or different from each other when present in plural number, $n_3$ represents an integer of 0 to 3, $n_4$ represents an integer of 0 to 9, and Y represents a structure represented by any of the following General Formulae (A-VI-1) to (A-VI-3),

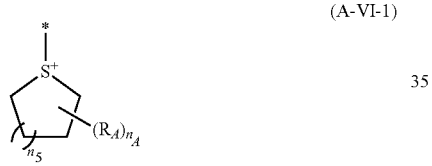
(A-VI-1)

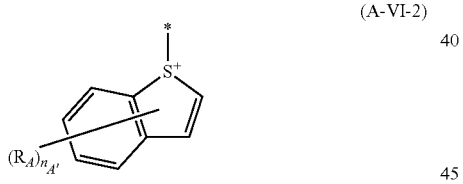
(A-VI-2)

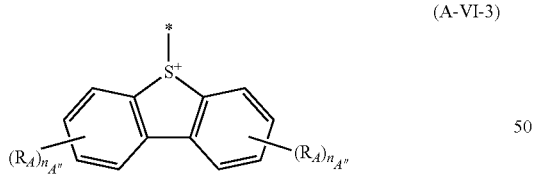
(A-VI-3)

wherein in General Formulae (A-VI-1) to (A-VI-3), $R_A$ represents a substituent, $R_A$s may be the same as or different from each other when present in plural number, $n_A$ represents an integer of 0 to 12, $n_A'$ represents an integer of 0 to 6, each $n_A''$ independently represents an integer of 0 to 4, $n_5$ represents an integer of 0 to 3, * represents an atomic bonding, and in General Formula (A-V), $R_{24}$ represents an aryl group, and $R_{25}$, $R_{26}$, $R_{27}$ and $R_{28}$ each independently represents a hydrogen atom, an alkyl group, a cycloalkyl group, an allyl group or a vinyl group, and $R_{25}$ and $R_{26}$, and $R_{27}$ and $R_{28}$ may be bonded to each other to form a ring, and wherein the ratio of the compound represented by (A-I) and the compound represented by (A-II) is 30/70 to 10/90 in terms of the compound represented by (A-I)/the compound represented by (A-II).

2. The actinic ray-sensitive or radiation-sensitive resin composition according to claim 1,
wherein the anion structure of the compound represented by General Formula (A-I) and the anion structure of the compound represented by General Formula (A-II) are the same.

3. The actinic ray-sensitive or radiation-sensitive resin composition according to claim 1,
wherein the resin (B) contains a repeating unit having a lactone structure or a sultone structure represented by the following General Formula (VI),

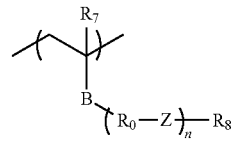
(VI)

wherein in General Formula (VI), B represents an ester bond (a group represented by —COO—) or an amide bond (a group represented by —CONH—), $R_0$ represents an alkylene group, a cycloalkylene group or a combination thereof, $R_0$s may be the same as or different from each other when present in plural number, and Z represents a single bond, an ether bond, an ester bond, an amide bond, a urethane bond, (a group represented by 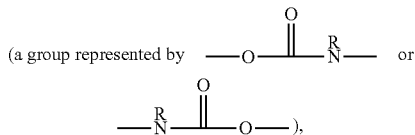 or or a urea bond, (a group represented by 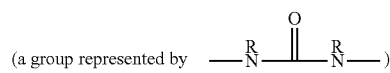 )

Zs may be the same as or different from each other when present in plural number, each R independently represents a hydrogen atom, an alkyl group, a cycloalkyl group or an aryl group, $R_8$ represents a monovalent organic group having a lactone structure or a sultone structure, n is the number of repetitions of the structure represented by —$R_0$—Z— and represents an integer of 0 to 2, and $R_7$ represents a hydrogen atom, a halogen atom or an alkyl group.

4. The actinic ray-sensitive or radiation-sensitive resin composition according to claim 2,
wherein the resin (B) contains a repeating unit having a lactone structure or a sultone structure represented by the following General Formula (VI), (VI)

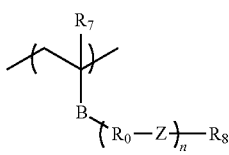

wherein in General Formula (VI), B represents an ester bond (a group represented by —COO—) or an amide bond (a group represented by —CONH—), $R_0$ represents an alkylene group, a cycloalkylene group or a combination thereof, $R_0$s may be the same as or different from each other when present in plural number, and Z represents a single bond, an ether bond, an ester bond, an amide bond, a urethane bond,

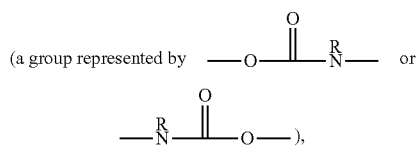

or a urea bond,

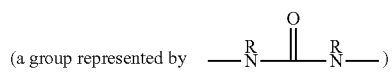

Zs may be the same as or different from each other when present in plural number, each R independently represents a hydrogen atom, an alkyl group, a cycloalkyl group or an aryl group, $R_8$ represents a monovalent organic group having a lactone structure or a sultone structure, n is the number of repetitions of the structure represented by —$R_0$—Z— and represents an integer of 0 to 2, and $R_7$ represents a hydrogen atom, a halogen atom or an alkyl group.

5. The actinic ray-sensitive or radiation-sensitive resin composition according to claim 3,
wherein n is 1 or 2 in General Formula (VI).

6. The actinic ray-sensitive or radiation-sensitive resin composition according to claim 1,
wherein the resin (B) contains a repeating unit having an alicyclic hydrocarbon structure substituted with a hydroxyl group or a cyano group.

7. The actinic ray-sensitive or radiation-sensitive resin composition according to claim 4,
wherein the resin (B) contains a repeating unit having an alicyclic hydrocarbon structure substituted with a hydroxyl group or a cyano group.

8. The actinic ray-sensitive or radiation-sensitive resin composition according to claim 1,
wherein the resin (B) contains a repeating unit represented by the following General Formula (AI), (AI)

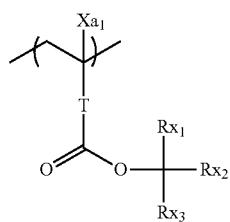

wherein in General Formula (AI), $Xa_1$ represents a hydrogen atom, a methyl group which may have a substituent, or a group represented by —$CH_2$—$R_{11}$, $R_{11}$ represents a hydroxyl group or a monovalent organic group, $Xa_1$ preferably represents a hydrogen atom, a methyl group, a trifluoromethyl group or a hydroxymethyl group, T represents a single bond or a divalent linking group, $Rx_1$ to $Rx_3$ each independently represents an alkyl group (linear or branched) or a cycloalkyl group (monocyclic or polycyclic), and two of $Rx_1$ to $Rx_3$ may be bonded to each other to form a cycloalkyl group (monocyclic or polycyclic).

9. The actinic ray-sensitive or radiation-sensitive resin composition according to claim 1, further comprising:
a basic compound.

10. The actinic ray-sensitive or radiation-sensitive resin composition according to claim 1, further comprising:
a hydrophobic resin having at least any of a fluorine atom and a silicon atom.

11. A resist film which is formed using the actinic ray-sensitive or radiation-sensitive resin composition according to claim 1.

12. A pattern forming method including exposing and developing the resist film according to claim 11.

13. The pattern forming method according to claim 12, wherein the exposure is an immersion exposure.

14. An electronic device manufacturing method including the pattern forming film according to claim 12.

15. The actinic ray-sensitive or radiation-sensitive resin composition according to claim 1,
wherein in General Formula (A-I), $R_1$ represents a monovalent polycyclic alicyclic hydrocarbon group.

16. The actinic ray-sensitive or radiation-sensitive resin composition according to claim 1,
wherein in General Formula (A-II), $R_1'$ represents a monovalent polycyclic alicyclic hydrocarbon group.

17. The actinic ray-sensitive or radiation-sensitive resin composition according to claim 1,
wherein the (B) resin includes at least one of a repeating unit represented by the following General Formula (I) and a repeating unit represented by the following General Formula (II), (I)

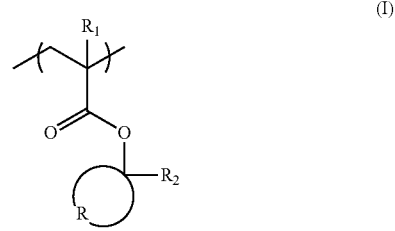

-continued

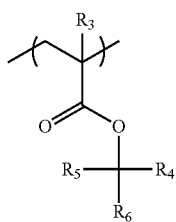

(II)

wherein in General Formulae (I) and (II), $R_1$ and $R_3$ each independently represents a hydrogen atom, a methyl group which may have a substituent, or a group represented by —$CH_2$—$R_{11}$, where $R_{11}$ represents a hydroxyl group or a monovalent organic group, $R_2$, $R_4$, $R_5$, and $R_6$ each independently represents an alkyl group or a cycloalkyl group, and R represents an atomic group necessary for forming an alicyclic structure with carbon atoms, and the ring members of the alicyclic structure may include an oxygen atom.

18. The actinic ray-sensitive or radiation-sensitive resin composition according to claim 1,
wherein the (B) resin includes a repeating unit represented by the following General Formula (AIII),

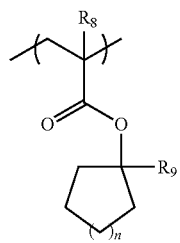

(AIII)

wherein in General Formula (AIII), $R_8$ represents a hydrogen atom or an alkyl group, $R_9$ represents an alkyl group, and n represents an integer of 1 to 6.

19. The actinic ray-sensitive or radiation-sensitive resin composition according to claim 1,
wherein the (B) resin includes a repeating unit represented by the following General Formula (II-1),

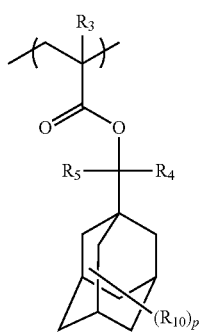

(II-1)

wherein in General Formula (II-1), $R_3$ represents a hydrogen atom, a methyl group which may have a substituent, or a group represented by —$CH_2$—$R_{11}$, where $R_{11}$ represents a hydroxyl group or a monovalent organic group, $R_4$ and $R_5$ each independently represents an alkyl group or a cycloalkyl group, $R_{10}$ represents a substituent including a polar group, and $R_{10}$s may be the same as or different from each other when present in plural number, and p represents an integer of 0 to 15.

20. The actinic ray-sensitive or radiation-sensitive resin composition according to claim 17,
wherein the (B) resin includes at least two types of the repeating units represented by General Formula (I), or both the repeating unit represented by General Formula (I) and the repeating unit represented by General Formula (II).

21. The actinic ray-sensitive or radiation-sensitive resin composition according to claim 9,
wherein the basic compound has a structure represented by the following General Formula (A),

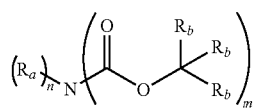

(A)

wherein in General Formula (A),

Ra represents a hydrogen atom, an alkyl group, a cycloalkyl group, an aryl group or an aralkyl group, when n=2, the two Ras may be the same as or different from each other, two of Ra may be bonded to each other to form a divalent heterocyclic hydrocarbon group or a derivative thereof, each Rb independently represents a hydrogen atom, an alkyl group, a cycloalkyl group, an aryl group, an aralkyl group or an alkoxyalkyl group, Rbs may be bonded to each other to form a ring, with the proviso that in —C(Rb)(Rb)(Rb), when one or more of Rbs are hydrogen atoms, at least one of the remaining Rbs is a cyclopropyl group, an 1-alkoxyalkyl group or an aryl group, and n represents an integer of 0 to 2, m represents an integer of 1 to 3, respectively, and n+m=3.

22. The actinic ray-sensitive or radiation-sensitive resin composition according to claim 1,
wherein the content of the compound (A) in the composition is 5 to 20% by mass with regard to the total solid contents of the resin composition.

23. An actinic ray-sensitive or radiation-sensitive resin composition comprising:

(A) a compound capable of generating an acid by irradiation of actinic rays or radiation; and (B) a resin of which solubility in an alkali developer increases by being decomposed by the action of an acid, wherein the actinic ray-sensitive or radiation-sensitive resin composition contains at least one type of a compound represented by the following General Formula (A-I) and at least one type of a compound represented by the following General Formula (A-II) as the compound (A),

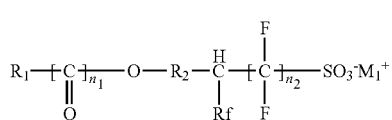
(A-I)

wherein in General Formula (A-I), $R_1$ represents an alkyl group, a monovalent alicyclic hydrocarbon group, an aryl group or a heteroaryl group, $R_2$ is a divalent linking group, Rf is a fluorine atom, or an alkyl group substituted with at least one fluorine atom, $n_1$ and $n_2$ each independently are 0 or 1, and $M_1^+$ is a sulfonium cation represented by the following General Formula (A-III),

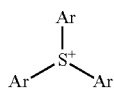
(A-III)

wherein in General Formula (A-III), each Ar independently represents an aryl group or a heteroaryl group,

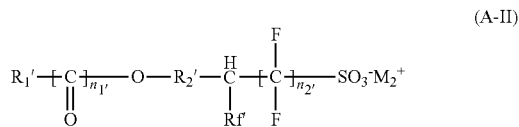
(A-II)

wherein in General Formula (A-II), $R_1'$ represents an alkyl group, a monovalent alicyclic hydrocarbon group, an aryl group or a heteroaryl group, $R_2'$ is a divalent linking group, Rf' is a fluorine atom, or an alkyl group substituted with at least one fluorine atom, $n_1'$ and $n_2'$ each independently are 0 or 1, and $M_2^+$ is a sulfonium cation represented by the following General Formula (A-IV) or (A-V),

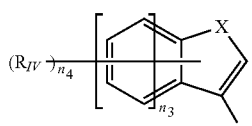
(A-IV)

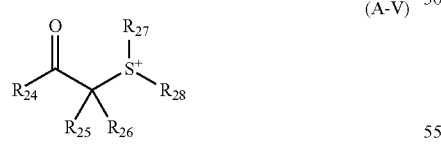
(A-V)

wherein in General Formula (A-IV), X represents —$CR_{21}$=$CR_{22}$—, —$NR_{23}$—, —S— or —O—, $R_{21}$, $R_{22}$ and $R_{23}$ each independently represents a hydrogen atom, a hydroxyl group, an alkyl group, a cycloalkyl group, an alkoxy group, an acyl group or an aryl group, $R_{IV}$ represents a substituent, $R_{IV}$s may be the same as or different from each other when present in plural number, $n_3$ represents an integer of 0 to 3, $n_4$ represents an integer of 0 to 9, and Y represents a structure represented by the General Formula (A-VI-2) or (A-VI-3),

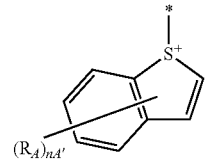
(A-VI-2)

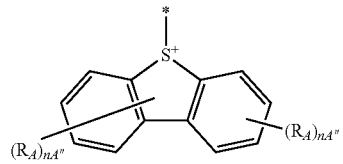
(A-VI-3)

wherein in General Formulae (A-VI-2) and (A-VI-3), $R_A$ represents a substituent, $R_A$s may be the same as or different from each other when present in plural number, $n_A'$ represents an integer of 0 to 6, each $n_A''$ independently represents an integer of 0 to 4, * represents an atomic bonding, and in General Formula (A-V), $R_{24}$ represents an aryl group, and $R_{25}$, $R_{26}$, $R_{27}$ and $R_{28}$ each independently represents a hydrogen atom, an alkyl group, a cycloalkyl group, an allyl group or a vinyl group, and $R_{25}$ and $R_{26}$ and $R_{27}$ and $R_{28}$ may be bonded to each other to form a ring, and wherein the ratio of the compound represented by (A-I) and the compound represented by (A-II) is 50/50 to 10/90 as the compound represented by (A-I)/the compound represented by (A-II).

24. An actinic ray-sensitive or radiation-sensitive resin composition comprising:
(A) a compound capable of generating an acid by irradiation of actinic rays or radiation; and
(B) a resin of which solubility in an alkali developer increases by being decomposed by the action of an acid,
wherein the actinic ray-sensitive or radiation-sensitive resin composition contains at least one type of a compound represented by the following General Formula (A-I) and at least one type of a compound represented by the following General Formula (A-II) as the compound (A),

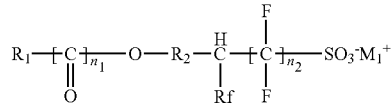
(A-I)

wherein in General Formula (A-I), $R_1$ represents an alkyl group, a monovalent alicyclic hydrocarbon group, an aryl group or a heteroaryl group, $R_2$ is a divalent linking group, Rf is a fluorine atom, or an alkyl group substituted with at least one fluorine atom, $n_1$ and $n_2$ each independently are 0 or 1, and $M_1^+$ is a sulfonium cation represented by the following General Formula (A-III),

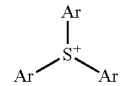
(A-III)

wherein in General Formula (A-III), each Ars independently represent an aryl group or a heteroaryl group,

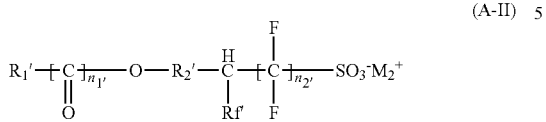
(A-II)

wherein in General Formula (A-II), $R_1'$ represents an alkyl group, a monovalent alicyclic hydrocarbon group, an aryl group or a heteroaryl group, $R_2'$ is a divalent linking group, Rf' is a fluorine atom, or an alkyl group substituted with at least one fluorine atom, $n_1'$ and $n_2'$ each independently are 0 or 1, and $M_2^+$ is a sulfonium cation represented by the following General Formula (ZI-2) or (ZI-4),

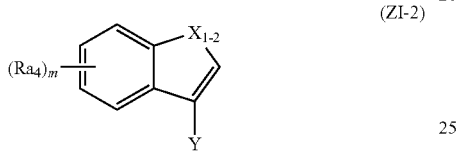
(ZI-2)

wherein in General Formula (ZI-2),
$X_{I-2}$ represents an oxygen atom, a sulfur atom or a —$NRa_1$— group, $Ra_1$ represents a hydrogen atom, an alkyl group, a cycloalkyl group, an aryl group or an acyl group,
Y represents a structure represented by any of the following General Formulae (A-VI-1) to (A-VI-3),

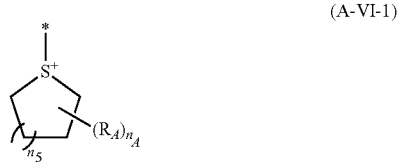
(A-VI-1)

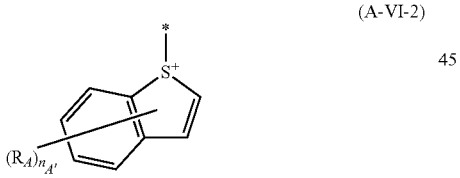
(A-VI-2)

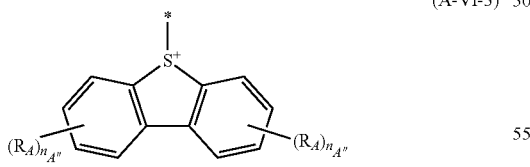
(A-VI-3)

wherein in General Formulae (A-VI-1) to (A-VI-3), $R_A$ represents a substituent, $R_A$s may be the same as or different from each other when present in plural number, $n_A$ represents an integer of 0 to 12, $n_A'$ represents an integer of 0 to 6, each $n_A''$ independently represents an integer of 0 to 4, $n_5$ represents an integer of 0 to 3, * represents an atomic bonding, and
$Ra_4$ represents a monovalent group, $Ra_4$s may be the same as or different from each other when present in plural number, and m represents an integer of 0 to 3,

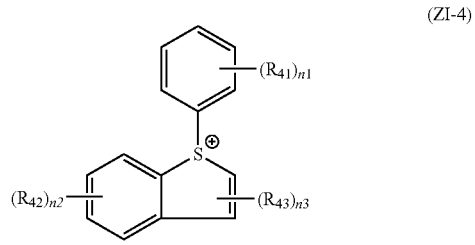
(ZI-4)

wherein in General Formula (ZI-4),
$R_{41}$ to $R_{43}$ each independently represents an alkyl group, an acetyl group, an alkoxy group, a carboxyl group, a halogen atom, a hydroxyl group or a hydroxyalkyl group,
$n_1$ is an integer of 0 to 3,
$n_2$ is an integer of 0 to 3, and
$n_3$ is an integer of 0 to 2, and
wherein the ratio of the compound represented by (A-I) and the compound represented by (A-II) is 50/50 to 10/90 as the compound represented by (A-I)/the compound represented by (A-II).

25. An actinic ray-sensitive or radiation-sensitive resin composition comprising:

(A) a compound capable of generating an acid by irradiation of actinic rays or radiation; and (B) a resin of which solubility in an alkali developer increases by being decomposed by the action of an acid, wherein the actinic ray-sensitive or radiation-sensitive resin composition contains at least one type of a compound represented by the following General Formula (A-I) and at least one type of a compound represented by the following General Formula (A-II) as the compound (A),

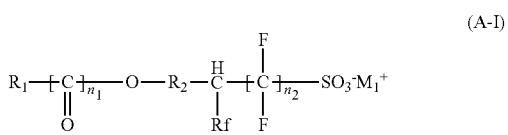
(A-I)

wherein in General Formula (A-I), $R_1$ represents a monovalent monocyclic alicyclic hydrocarbon group, $R_2$ is a divalent linking group, Rf is a fluorine atom, or an alkyl group substituted with at least one fluorine atom, $n_1$ and $n_2$ each independently are 0 or 1, and $M_1^+$ is a sulfonium cation represented by the following General Formula (A-III),

(A-III)

wherein in General Formula (A-III), each Ar independently represents an aryl group or a heteroaryl group, (A-II)

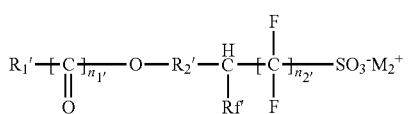

wherein in General Formula (A-II), $R_1'$ represents an alkyl group, a monovalent alicyclic hydrocarbon group, an aryl group or a heteroaryl group, $R_2'$ is a divalent linking group, $Rf'$ is a fluorine atom, or an alkyl group substituted with at least one fluorine atom, $n_1'$ and $n_2'$ each independently are 0 or 1, and $M_2^+$ is a sulfonium cation represented by the following General Formula (A-IV) or (A-V), (A-IV)

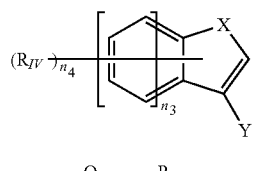

(A-V)

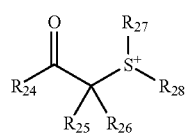

wherein in General Formula (A-IV), X represents $-CR_{21}=CR_{22}-$, $-NR_{23}-$, $-S-$ or $-O-$, $R_{21}$, $R_{22}$ and $R_{23}$ each independently represents a hydrogen atom, a hydroxyl group, an alkyl group, a cycloalkyl group, an alkoxy group, an acyl group or an aryl group, $R_{IV}$ represents a substituent, $R_{IV}$s may be the same as or different from each other when present in plural number, $n_3$ represents an integer of 0 to 3, $n_4$ represents an integer of 0 to 9, and Y represents a structure represented by any of the following General Formulae (A-VI-1) to (A-VI-3), (A-VI-1)

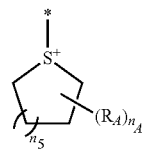

(A-VI-2)

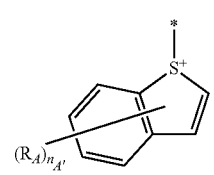

(A-VI-3)

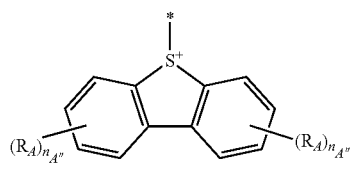

wherein in General Formulae (A-VI-1) to (A-VI-3), $R_A$ represents a substituent, $R_A$s may be the same as or different from each other when present in plural number, $n_A$ represents an integer of 0 to 12, $n_A'$ represents an integer of 0 to 6, each $n_A''$ independently represents an integer of 0 to 4, $n_5$ represents an integer of 0 to 3, * represents an atomic bonding, and in General Formula (A-V), $R_{24}$ represents an aryl group, and $R_{25}$, $R_{26}$, $R_{27}$ and $R_{28}$ each independently represents a hydrogen atom, an alkyl group, a cycloalkyl group, an allyl group or a vinyl group, and $R_{25}$ and $R_{26}$ and $R_{27}$ and $R_{28}$ may be bonded to each other to form a ring, and wherein the ratio of the compound represented by (A-I) and the compound represented by (A-II) is 50/50 to 10/90 as the compound represented by (A-I)/the compound represented by (A-II).

* * * * *